(12) United States Patent
Minano et al.

(10) Patent No.: US 6,639,733 B2
(45) Date of Patent: Oct. 28, 2003

(54) HIGH EFFICIENCY NON-IMAGING OPTICS

(75) Inventors: Juan C. Minano, Madrid (ES); Pablo Benitez, Madrid (ES); Juan C. Gonzalez, Madrid (ES); Waqidi Falicoff, Solana Beach, CA (US); H. J. Caulfield, Cornersville, TN (US)

(73) Assignee: Light Prescriptions Innovators, LLC., Irvine, CA (US)

( * ) Notice: Subject to any disclaimer, the term of this patent is extended or adjusted under 35 U.S.C. 154(b) by 369 days.

(21) Appl. No.: 09/810,959

(22) Filed: Mar. 16, 2001

(65) Prior Publication Data

US 2003/0016539 A1 Jan. 23, 2003

Related U.S. Application Data

(60) Provisional application No. 60/190,130, filed on Mar. 16, 2000.

(51) Int. Cl.[7] .......................... G02B 17/00; G02B 3/02; F21V 5/00
(52) U.S. Cl. ...................... 359/728; 359/726; 359/718; 362/327
(58) Field of Search ................................ 359/708, 718, 359/726, 728; 362/327, 347

(56) References Cited

U.S. PATENT DOCUMENTS

| | | | |
|---|---|---|---|
| 4,337,759 A | 7/1982 | Popovich et al. | 126/684 |
| 4,767,172 A | 8/1988 | Nichols et al. | 385/146 |
| 5,001,609 A | 3/1991 | Gardner et al. | 362/555 |
| 5,055,892 A | 10/1991 | Gardner et al. | 257/99 |
| 5,237,170 A | * 8/1993 | Shatz | 250/216 |
| 5,289,356 A | 2/1994 | Winston | 362/217 |
| 5,365,354 A | 11/1994 | Jannson et al. | 359/15 |
| 5,404,869 A | 4/1995 | Parkyn, Jr. et al. | 126/699 |
| 5,486,940 A | 1/1996 | Fergason et al. | 349/122 |
| 5,526,190 A | 6/1996 | Hubble, III et al. | 359/719 |
| 5,534,386 A | 7/1996 | Petersen et al. | 430/320 |
| 5,586,013 A | 12/1996 | Winston et al. | 362/347 |
| 5,609,939 A | 3/1997 | Petersen et al. | 428/141 |
| 5,676,453 A | 10/1997 | Parkyn, Jr. et al. | 362/260 |
| 5,757,557 A | 5/1998 | Medvedev et al. | 359/708 |
| 5,767,935 A | 6/1998 | Ueda et al. | 349/112 |
| 5,816,693 A | 10/1998 | Winston et al. | 362/347 |
| 5,825,542 A | 10/1998 | Cobb, Jr. et al. | 359/487 |
| 5,882,774 A | 3/1999 | Jonza et al. | 428/212 |
| 5,982,541 A | 11/1999 | Li et al. | 359/497 |
| 6,019,485 A | 2/2000 | Winston et al. | 362/347 |

(List continued on next page.)

OTHER PUBLICATIONS

Benitez, P., Design in 3D Geometry with the Simultaneous Multiple Surface Design Method of Nonimaging Optics. Nonimaging Optics: Maximum Efficiency Light Transfer V, SPIE, (1999).

(List continued on next page.)

*Primary Examiner*—David N. Spector
(74) *Attorney, Agent, or Firm*—Law Offices of James D. McFarland

(57) ABSTRACT

A highly efficient optical device comprises two opposing active non-spherical optical surfaces defined by a two-dimensional representation that is symmetrically extended to provide a three-dimensional device. A focal area, spaced apart from the optical surface and non-contiguous therewith, is defined by the two opposing active optical surfaces. The active optical surfaces each have a continuous second derivative, and the optical surfaces are defined by a polynomial with an order of at least about twenty. The optical device may comprise a transparent dielectric core, and the optical surfaces may be formed on the core. A receiver may be situated at the focal area to provide a concentrator. An extended light source such as an LED may be situated at the focal area, to provide a collimator. Faceted embodiments can provide a low aspect optical device. In some embodiments a diffuser may be used to transform incident radiation into a predetermined shape.

56 Claims, 45 Drawing Sheets

U.S. PATENT DOCUMENTS

| | | | | |
|---|---|---|---|---|
| 6,101,032 | A | 8/2000 | Wortman et al. | 359/500 |
| 6,336,738 | B1 * | 1/2002 | Feuermann et al. | 362/583 |
| 6,501,877 | B1 * | 12/2002 | Weverka et al. | 385/31 |
| 2003/0016539 | A1 * | 1/2003 | Minano et al. | 362/347 |
| 2003/0026002 | A1 * | 2/2003 | Lopez-Hernandez et al. | 349/641 |
| 2003/0075167 | A1 * | 4/2003 | Minano-Dominguez et al. | 126/680 |

OTHER PUBLICATIONS

Benítez, P., Ultrahigh–Numerical–Aperture Imaging Concentrator, Journal of the Optical Society of America vol. 14, No. 8, Aug. 1997, pp. 1988–1997.

Caulfield, H.J., Optically Generated Kinoforms, *Opt. Comm.* vol. 4, No. 3., 201 (1971).

Davies P.A., Design of Single Surface Spherical Lenses as Secondary Concentrators For Photovoltaic Cells, Pure and Applied Optics, vol. 2, No. 4, Jul. 1993, pp. 315–324.

Minano, J.C, et al., New Method of Design of Nonimaging Concentrators. Applied Optics, 31, No. 16 (1992), pp. 3051–3060.

Minano, J.C. et al., A High–Gain, Compact, Nonimaging Concentrator: RXI. Applied Optics, vol. 34, No. 34 (1995), pp. 7850–7856.

Minano, J.C. et al., Ultra Compact Optics Wireless Communications. (2000).

Minano, J.C., et al., Poisson Bracket Design Method Review. Application to the Elliptic Bundles. (1993).

Minano, J.C., et al., New Method of Design of Nonimaging Concentrators. Applied Optics, vol. 31, No. 16 (1992), pp. 3051–3060.

Minano, J.C., et al., RX: a Nonimaging Concentrator. Applied Optics, vol. 34, No. 13 (1995), pp. 2226–2235.

Minano, J.C., et al., RXI: A High–Gain, Compact, Nonimaging Concentrator. Applied Optics (1995).

Minano, J.C., et al., New Non–Imaging Designs: The RX and the RXI Concentrators. Nonimaging Optics Maximum Light Efficiency Light Transfer II, (Winston et al. Eds.) (1993).

Miñano, J.C., Two–dimensional Non–imaging Concentrators With Inhomogeneous Media. A new look. Journal of the Optical Society of America, A, vol.. 2., No. 11, (1985), pp. 1826–1831.

Minano. J.C., Design of Three Dimensional Non–Imaging Concentrators with Inhomogeneous Media. Journal of the Optical Society of America, A, vol. 3, No. 9, (1986), pp. 1345–1353.

Minano. J.C., et al. Chapter 3. Design of Optical Systems for IR Wireless Links. Wireless Lan Systems, (Santa Maria et al., eds.) Artech House, Boston (2001).

Minano, J.C. et al., Flat High Concentration Devices, World Conference on Photovoltaic Energy, IEEE, (Dec. 1994), vol. 1 Conf.1, pp. 1123–1126.

Ning, X., et al., Dielectric Totally Internally Reflecting Concentrators. Applied Optics, vol. 26, No. 2, (1987), pp. 300–305.

Spigulis, J., Compact Dielectric Reflective Elements. I. Half–Sphere Concentrators of Radially Emitted Light. Applied Optics, vol. 33, No. 25 (Sep. 1994), pp. 5970–5974.

Welford, W.T., et al., High Collection Nonimaging Optics, Academic Press, New York, (1989).

PCT Search Report Dated, Dec. 5, 2001, International Application No. PCT/US/01/08685.

* cited by examiner

Positive curvature    Negative curvature

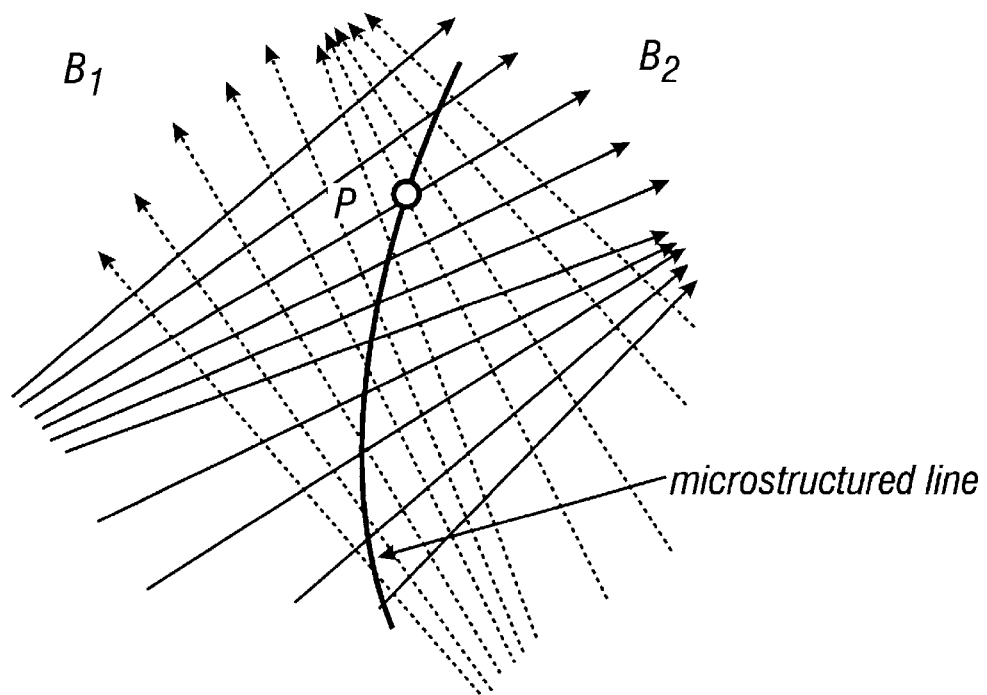
FIG. 72
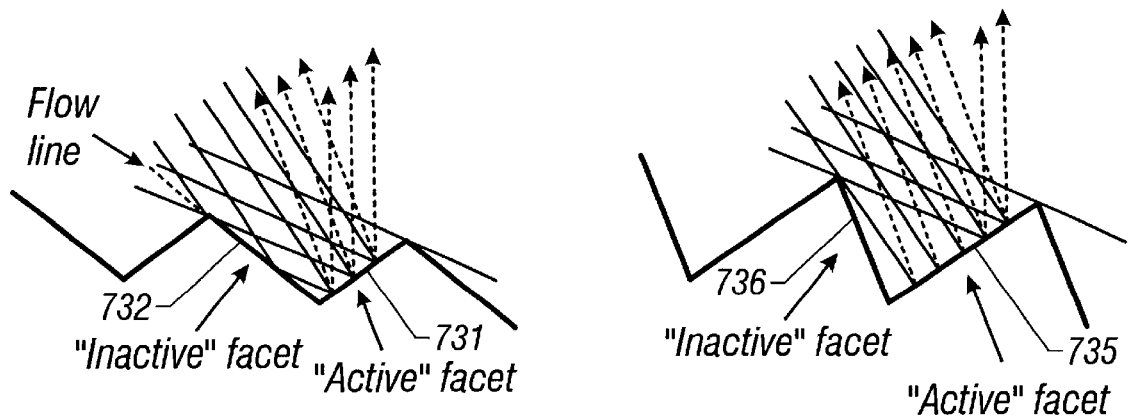
FIG. 73A          FIG. 73B

HIGH EFFICIENCY NON-IMAGING OPTICS

This application claims the benefit of U.S. Provisional Application No. 60/190,130, filed Mar. 16, 2000, entitled METHOD OF DESIGN AND APPARATUS DERIVED FROM METHOD FOR ULTRA COMPACT HIGH EFFICIENCY OPTICAL NON-IMAGING CONCENTRATORS COLLIMATORS AND COUPLERS.

BACKGROUND OF THE INVENTION

1. Field of the Invention

This invention relates generally to compact, high-efficiency optical devices that concentrate, collimate, redirect or otherwise manipulate a beam or source of electromagnetic radiant energy, such as concentrators, collimators, reflectors, and couplers.

2. Description of Related Art

The field of non-imaging optics relates to optical devices that collect and concentrate light energy from a distant source onto a receiver, or to optical devices that redirect or collimate light from a closely positioned source. In one example, a photovoltaic solar energy collector utilizes non-imaging optics to increase the power density upon a receiver. Because the purpose of a photovoltaic solar collector is to convert light energy into electrical energy, it is not necessary to precisely image the sun onto the receiver; rather it is only important that the solar energy at the entry aperture be concentrated somewhere upon the receiver. In other words, the imaging characteristics of a solar energy collector are unimportant. In addition to non-imaging collectors, the field of non-imaging optics relates to optical devices that redirect, shape, and/or collimate light from a closely positioned source without regard to accurately imaging the source at a distant location. An example of one important light source is an LED (light emitting diode), which emits light in a widely-dispersed pattern with large intensity variations. A non-imaging reflector in one such application attempts to transform the non-uniform LED source into a substantially uniform output light beam. Although non-imaging optics are often unsuitable for imaging uses, some non-imaging optical designs also exhibit good imaging characteristics.

A generic problem in the field of non-imaging geometric optics is how to design very high efficiency (high efficacy) compact concentrators, collimators, redirectors and/or couplers that are cost effective and mass-producible. A number of solutions to this problem have been disclosed but they all have inherent weaknesses.

One type of non-imaging optics uses faceted total internal reflection (TIR)/refractive elements. This type of non-imaging optic is disclosed in U.S. Pat. No. 5,676,453, by Parkyn et al. entitled Collimating TIR lens devices employing fluorescent light sources, U.S. Pat. No. 5,404,869 by Parkyn et al entitled: Faceted internally reflecting lens with individually curved faces on facets, and U.S. Pat. No. 4,337,759 by Popovich et al. entitled Radiant Energy Concentration by Optical Total Internal Reflection. However, the efficiencies of the devices manufactured to date based on this approach have not been as high as predicted by the theoretical models in these patents and related publications. One reason for this low efficiency relates to difficulties associated with accurately manufacturing the required optical shapes in plastics and other optical materials. Secondly, this approach from a theoretical standpoint is not an optimum solution. Maximum efficiencies for conventional optical designs based on this approach do not typically exceed 60% and are quite often found to be 50% or less. Further, as a consequence of the complexity of the geometry of these designs, their inherent manufacturing costs can be high.

A second approach for developing non-imaging optics is the edge-ray approach, which is disclosed in Welford and Winston, *High Collection Nonimaging Optics*, Academic Press, New York, 1989. The edge-ray approach is particularly useful for two-dimensional designs that can be rotated to provide a rotationally symmetrical device, or extended linearly to provide a linearly symmetrical device. Designs based on this second approach are disclosed in U.S. Pat. Nos. 5,289,356; 5,586,013 and 5,816,693, for example. One characteristic device of this method is the CPC (Compound Parabolic Concentrator), which is described beginning at page 55 of the Welford and Winston reference. FIG. 1 is a cross-sectional view of a conventional CPC device, including two opposing mirror-image parabolic reflector sections 1 and 2 arranged symmetrically around a central axis 3 (the z-axis). The surfaces are formed by choosing a partial segment of a first parabola with a first focus, displacing a mirror image of this curve a distance away from the first focus, and rotating the two curves with respect to a common axis. The resulting two planar curves are either swept around a central axis or extruded along a straight line.

The CPC collect all the radiation impinging upon its entry aperture within the angle $\pm\theta_s$, and concentrates it upon a receiver 4, which is situated opposite an entry aperture with its center intersecting the z-axis. The sections of the parabolic reflectors are arranged such that their respective axes of symmetry are tilted with respect to the z-axis, which widens the entry aperture. Also, each parabola's focus is at the opposite edge of the receiver, as illustrated at 5 and 6. Particularly, the focus of the first parabolic reflector section 1 is at the opposite edge 5, and the focus of the second parabolic reflector section 2 is at the opposite edge 6. For illustrative purposes, in one embodiment the reflectors comprise a mirrored surface, and the center of the CPC is air. In other embodiments, the CPC comprises a dielectric material with parabolic surfaces that provide an index of refraction greater than one, and the reflections from the parabolic surfaces are facilitated by total internal reflection.

In addition to the typical use of a CPC as a collector/concentrator, it can also be used as a emitter/collimator by positioning a source at the location of the receiver. The performance of a CPC can be very high for some embodiments; for example, a CPC can achieve a transmission efficiency of over 90% with acceptance angles 5° or less. Disadvantages of a CPC are its thickness for small angles, and its difficulty of manufacture because the CPC reflectors end at the receiver (emitter) edges. This problem is particularly significant when the receiver (emitter) has a small size. The complexity of manufacturing for these types of devices can be significantly reduced by replacing the side reflectors with a solid dielectric-filled CPC that utilizes total internal reflection on its outside surface instead of reflection on its inner surface. An example of this approach is disclosed in X. Ning, R. Winston, J. O'Gallagher. *Dielectric Totally Internally Reflecting Concentrators*, Applied Optics, Vol. 26, (1987) pp. 300. Designs based on this approach are also disclosed in U.S. Pat. Nos. 5,055,892, 5,001,609, and 5,757, 557. However, manufacturing such devices is problematic because adhesion of the receiver (emitter) to the solid device must guarantee that total internal reflection is achieved also at the reflector points close to the receiver (emitter) edges.

The CPC device is first designed as a two-dimensional (2D) cross-section, and then made into a three-dimensional (3D) design. In one embodiment, a rotationally symmetrical 3D design is obtained by rotating the cross-section shown in FIG. 1 about an axis through the centerline of symmetry. Alternatively, a linearly symmetrical 3D design is obtained by extruding the cross-section shown in FIG. 1 along a line perpendicular to the 2D cross section.

In a CPC design disclosed by A. Santamaria and F. J. Lopez-Hernandez, *Wireless LAN Systems*, Artech House, 1993, pp. 74, for an acceptance angle of ±1°, the thickness-to-aperture size ratio is greater than 40. However, for certain acceptance angles, a solid dielectric CPC (with curved top) can reduce the thickness-to-aperture ratio and improve on the thickness-to-aperture. For example, for acceptance angles of 10° or more, this ratio can be reduced to between 1.0 and 2.0, as disclosed by Ning el al. *Dielectric Totally Internally Reflecting Concentrators*, Applied Optics, Vol. 26, 1987, p. 300. When the acceptance angle is smaller, the thickness of a concentrator/collimator can also be reduced by combining an image-forming device with either a CPC or one of the associated family of devices such as a CEC (compound elliptical concentrator), such as disclosed by the Welford and Winston reference. However, the optical performance of such a hybrid device is not close to the thermodynamic limit, and furthermore, the high manufacturing cost and complexity of such devices are disadvantages.

Another approach, which is useful for three-dimensional designs, is the flow line approach described by the Welford and Winston reference (Ch. 7). One very high concentration design using the flow line approach has two stages: a non-imaging Flow Line Concentrator (FLC) combined with an optical imaging device such as a parabolic reflector. FIG. 2 shows a 2D cross-sectional example of a two-stage approach, including a first optical stage that is a parabolic mirror 10 that focuses the incoming ray bundle towards a virtual receiver, illustrated generally at 12 as the area between two edge points. The rays directed toward the virtual receiver are then further concentrated by a FLC 14, which comprises the second stage that includes a smaller size receiver 16. The trajectories of two edge rays are also shown. Unlike the rotational CPC, the FLC has the property of achieving the theoretical limit of concentration in 3D-geometry, as disclosed by Welford and Winston, pages 197–199. Although this hybrid design is at useful for some applications such as optical communication links, the displacement of the imaging component from the FLC does create difficulties for manufacturing. Another disadvantage is that the unit is not compact in depth.

In the early and middle 1990s, development began on the Simultaneous Multiple Surfaces (SMS) method for the design of non-imaging concentrators and collimators. Examples of this early SMS method are disclosed in: J. C. Miñano and J. C. González, "Design of Nonimaging Lenses and Lens-Mirror Combinations" SPIE's International Symposium on Optical Applied Science and Engineering, San Diego, Calif. Proc. SPIE 1528 (1991) pp. 104–117; J. C. Miñano and Juan C. González, "New Method of Design of Nonimaging Concentrators", *Applied Optics*, 31 (1992) pp. 3051–3060; Miñano et al., "RX: a Nonimaging Concentrator", *Applied Optics*, 34, 13 (1995) pp. 2226–2235; and J. C. Miñano et al, "RXI: A high-gain, compact, nonimaging concentrator", *Applied Optics*, 34, 34 (1995) pp. 7850–7856. Advantageously, unlike the CPC or flow line devices described earlier, whose reflectors end at the receiver (emitter) edges, in SMS devices there is no optical surface in contact with the source/receiver.

Unfortunately, the early SMS method disclosed in these papers has a number of significant limitations that greatly restrict its usefulness. The early SMS method generated a design that was described only as a series of points, and not as a polynomial or any analytical expression. This discontinuous point-by-point description made it very difficult to manufacture the device, and also made it difficult to adapt a design or add features to the device. Furthermore, the second derivative was discontinuous in the early SMS method.

The early SMS method imposed very significant restrictions on the input and output ray bundles that could be accommodated, thereby limiting the usefulness of the early SMS method to mostly theoretical sources and receivers, effectively eliminating most real-world, practical applications. Specifically, the early SMS method accommodated only two types of input bundles: 1) parallel flow lines from an infinite source (for a concentrator) or 2) a ray bundle from a flat finite, isotropic or Lambertian source (for a collimator). These are very severe restrictions, effectively eliminating LEDs, light bulbs, and most other real-world light sources from design consideration. The early SMS method also could not handle embodiments in which the emitter is surrounded on one side by a reflector such as a CPC reflector cup. Furthermore, the early SMS method would not allow for the receiver (or emitter) at the focus to be embedded in a material with a different index of refraction than the material (e.g. dielectric) of the main device.

For the relatively few applications in which the early SMS method could be used, the optical concentrators and collimators or other devices designed using the method typically exhibited one or more of the following four desirable characteristics:

1) High efficiency: For small acceptance (concentrators) and output (collimators) angles (<10°) these devices achieved more than 96% of the maximum theoretical attainable efficiency (based on etendue considerations).

2) Compactness: the aspect ratio (device thickness/ aperture diameter) can be as small as 0.27, for small angular values of acceptance (or output).

3) The receiver or source does not have to be in contact with the optical device. Unlike the CPC or flow line devices described earlier, whose reflectors end at the receiver (emitter) edges, there is no optical surface in contact with the receiver (emitter). The TIR faceted devices share this trait with the SMS-based devices.

4) Simplicity: The devices are simple, and many embodiments can be manufactured in a single solid piece.

In light of these desirable characteristics, it is clear that it would be useful if an SMS method could be developed to design optics for a wider variety of real-world sources and receivers, such as LEDs. LEDs are low cost, high efficiency light sources, and it would be an advantage if they could be utilized for a wide variety of illumination requirements. However an LED's emission pattern is far from the cosine law produced by a flat Lambertian emitter. The non-isotropic, non-Lambertian output from the LED is caused by several factors. First, the LED die geometry is very different from a flat disk and also the LED die itself (even with a secondary optic device) exhibits a non-isotropic, non-Lambertian output. Furthermore, in order to direct the output light in approximately one general direction, LED packages typically include a reflector cup that modifies the output profile from the bare LED die, adding more non-uniformities. Also, LED dies and reflector cups are typically bonded in place using epoxy, silicone, and other adhesives, which all contribute to produce a highly non-isotropic, non-Lambertian output.

SUMMARY OF THE INVENTION

In order to overcome the limitations of the prior art, the present invention provides an optical device that is highly efficient and a method of manufacturing the optical device in a variety of forms, such as optical devices that transform a first radiation distribution that is non-uniform into a second radiation distribution that is substantially uniform.

A method of manufacturing an optical device that has two opposing active optical surfaces that convert a first distribution of an input radiation to a second distribution of output radiation includes providing a two-dimensional mathematical model that describes the first distribution of radiation as an input bundle of edge rays and the second distribution of radiation as an output bundle of edge rays. The input and output edge ray bundles are each represented in a phase-space representation in terms of the position of each ray in space and its associated optical cosine of propagation, where the locus of the edge rays in the phase-space for the input bundle defines a closed boundary of a first planar shape, and the locus of the edge rays in the phase-space for the output bundle defines a closed boundary of a second planar shape, wherein these two planar shapes have a substantially equal area. The two-dimensional shape of the outer caustic is approximated for the input and output radiation distribution ray bundles, where the outer caustic is defined such that it does not touch any of the active optical surfaces. A two-dimensional representation of the active optical surfaces is defined responsive to the boundary conditions of the phase-space representations and the outer caustics, including defining a focal area spaced apart from, and noncontiguous with, the optical surfaces, the active optical surfaces each having a continuous second derivative. The optical surfaces are formed so that the theoretical transmission efficiency of the first input radiation distribution to the second input radiation distribution, neglecting attenuation losses in the processing path, is greater than about 80% of the maximum transmission efficiency. To form a three-dimensional optical device, the two-dimensional representation of the optical surfaces is symmetrically extended rotationally or linearly.

An optical device that converts a first distribution of an input radiation to a second distribution of output radiation comprises two opposing active non-spherical optical surfaces defined by a two-dimensional representation that is symmetrically extended to provide a three-dimensional device. A focal area is defined by the two opposing active optical surfaces. The active optical surfaces each have a continuous second derivative, and the optical surfaces are defined by a polynomial with an order of at least about twenty. The optical surfaces provide a theoretical transmission efficiency of the first input radiation distribution to the second input radiation distribution, neglecting attenuation losses in the processing path, of greater than about 80% of the maximum transmission efficiency.

In some embodiment the optical device is rotationally symmetric, and in other embodiments the optical device is linearly symmetric. The optical device may comprise a transparent dielectric core, and the optical surfaces may be formed on the optical core. If a receiver is situated approximately at the focal area of the device, a concentrator is provided. If an extended light source is situated approximately at the focal area, then a collimator is provided.

The optical device may be an RR device, or a folded edge ray device such as an RX device, an RXI device, an XX device, or an XR device.

The surfaces can have a variety of configurations. For example, one of the optical surfaces may be substantially flat. In a faceted embodiment at least one of the optical surfaces comprises facets including an active facet and an inactive facet.

Faceted devices can be made with a small aspect ratio: the faceted optical surfaces define an aspect ratio within a range of about 0.65 to about 0.1. Faceted surfaces provide other advantages, such as the heat transfer advantage of an embodiment wherein one of the active surfaces comprises a cuspoid shape that approaches the focal area. In other embodiment at least one of the optical surfaces comprises a diffuser formed thereon. The diffuser may transforms incident radiation into a predetermined shape, such as rectangular, elliptical, or a crossed shape.

In one embodiment, the optical device is rotationally symmetric and defines a central axis, and the device comprises a dielectric core that has a cylindrical hole formed on the central axis with a spherical void at its top. For a collimator, an extended light source such as an LED is inserted into the hole and situated approximately at the focal area. The LED can be attached to the dielectric core by an attaching material that has a substantially different index of refraction than the dielectric. For a concentrator, a receiver can be inserted into the hole and situated approximately at the focal area. In another embodiment in which the optical device is linearly symmetric, a linear light source such as an array of LEDs can be situated along the linear focal area to provide a linear emitter, or a linear receiver can be situated along the linear focal area to provide a linear concentrator.

Substantial advantages are provided because the active surfaces of the optical devices described herein have a continuous second derivative, and can be represented by a polynomial power series. This representation is very useful for interfacing, modifying, and adapting the design with CAD packages and CNC, and also for manufacturing it with diamond turning equipment. For example, the overall or macro shape of the transducer can be adapted to devices using micro-structured curved or flat facets, unlike the early SMS method. Faceted designs can provide a lower aspect ratios; i.e. more compact designs than has been achieved previously using the old SMS method or other non-imaging optic design approaches. As an added benefit, an infinite variety of transducers can be designed. Furthermore, the ability to represent the surfaces by a polynomial allows a solution to be chosen from a family of solutions where there is a geometric or other constraint, which was not possible with devices designed using the early SMS method. The method described herein ensures that the second derivative of the active optical surfaces is continuous, unlike the early SMS method in which it was discontinuous.

BRIEF DESCRIPTION OF THE DRAWINGS

For a more complete understanding of this invention, reference is now made to the following detailed description of the embodiments as illustrated in the accompanying drawing, wherein:

FIG. 73A is a magnified cross-section of a first faceted structure, including an active facet and an inactive facet;

FIG. 73B is a magnified cross-section of a second faceted structure, including an active facet and an inactive facet;

DETAILED DESCRIPTION

Figure 1:
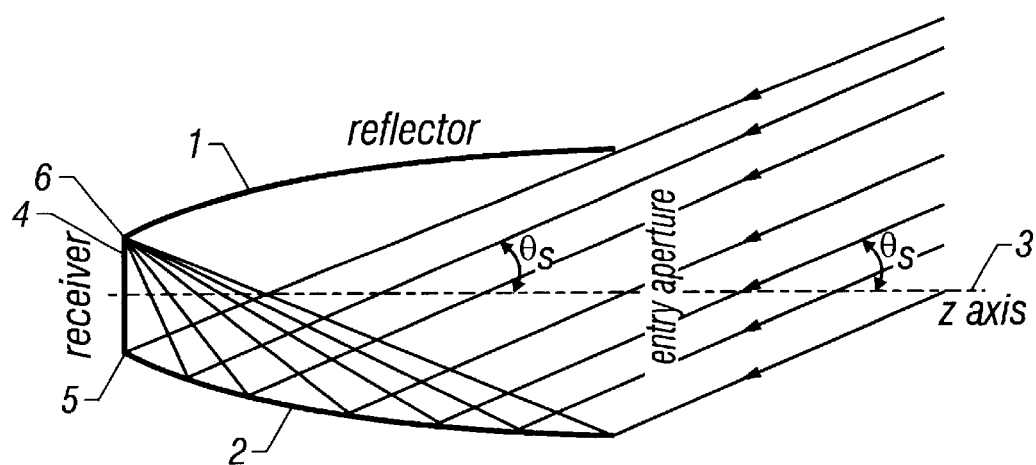
FIG. 1 is a cross-sectional diagram of a prior art compound parabolic concentrator (CPC) device.

Table of Contents
Glossary of Terms and Acronyms:
Overview
RX optical Devices
RXI optical Devices
XR optical Devices
RR optical Devices
XX optical Devices
General Description of Method of Design of Transducers for Smooth Surfaces
Method of Designing Transducers with Micro-structured/Faceted Surfaces
Method for Homogenizing and Shaping the Radiative Output or Input
Graphical/CAD Method for Taking a Non-Faceted Optical Design such as an RX or
RXI and Deriving a Family of Faceted Optical Devices Sample Embodiments This invention is described in the following description with reference to the Figures, in which like numbers represent the same or similar elements.

In order to facilitate understanding, the units of measure on certain drawings are specified as millimeters (mm). It should be apparent that other embodiments may have different specifications and may be scaled up or down as desired to meet the requirements of each particular embodiment.

| Glossary of Terms and Acronyms | |
|---|---|
| aspect ratio | the ratio of the depth of the device to its aperture diameter |
| average acceptance (or output) angle | the inverse sine of the ratio of the refractive index of the medium surrounding the receiver (or source) over the square root of the geometrical concentration |
| caustic | loci of the centers of curvature of a wavefront of a one-parametric ray bundle, which is equivalent, mathematically, to the evolute of the wavefront. For an edge ray bundle ∂B, the outer caustics are the lines in the x–z plane which delimit the region crossed by rays of ∂B. |
| collimated beam: | a beam of electromagnetic energy in which all rays propagate approximately parallel. |
| $F_d$: | structure with facets used refractively |

| -continued | |
|---|---|
| Glossary of Terms and Acronyms | |
| $F_m$: | structure with facets used reflectively |
| $F_{dm}$: | structure with facets used refractively and reflectively |
| $F_i$: | structure with facets used for TIR |
| folded edge ray device | An optical device where a predominance of the rays which traverse and are deflected through its optical boundaries, intersect more than once with at least one imaginary plane whose normal is parallel to the axis of the device; where the location of this plane can be chosen to exist anywhere along the axis of the device. |
| geometrical concentration | For a concentrator, the ratio of the entry aperture to the receiverareas |
| isotropic | a light source with flat geometry producing an intensity proportional to the cosine of the emission angle over the entire hemisphere |
| Lambertian emitter (also source) | TIR surface (will also behave as a refractive surface (R) for low incidence angles) |
| L | |
| r | the direction cosine of a ray with respect to the z-axis, multiplied by the index of refraction |
| p | The direction cosine of a ray with respect to the x-axis, multiplied by the index of refraction |
| R | Refractive surface |
| SMS: | (Simultaneous Multiple Surface) method of designing optics |
| TIR: | Total Internal Reflection |
| X | Reflective surface |

Herein, the terms "source" and "emitter" are used interchangeably to refer to a source of electromagnetic radiation.

Herein, a "transducer" is a device that transforms a first distribution of radiation to another, second radiation distribution. A transducer could be a device that concentrates a distribution of radiation, or collimates a distribution of radiation or in the most general sense, transforms one distribution to a second specified distribution. The optical devices described herein are transducers.

For illustration purposes, the ray tracings used in conjunction with the optical devices and the associated description are often described from the reference of an external source that supplies rays to the optical device, which are then focused by optical surfaces onto a receiver. It should be apparent that the optical devices can also operate in the reverse direction, as an emitter from a source that generates rays that are processed by the optical surfaces and then emitted in a predetermined shape with a predetermined divergence and intensity profile.

In some instances, the figures represent the optical devices as a 2D cross-sectional diagram that shows the optical surfaces, focal area, and other possibly other features. It should be understood that an actual optical device may comprise additional structure. For example the optical surfaces may be formed on a single dielectric piece of material. Other embodiments, such as the XX device, typically comprise two separate mirrors.

Overview

One description of the optical devices herein relates to their design and methods relating to their design. The optical devices described herein comprise ultra compact, very high efficiency (and possibly maximum theoretical efficiency), non-imaging concentrators, collimators, couplers or redirectors in which rays of electromagnetic energy encounter one or two refractions (R), in some cases one or more reflections (X) and in some cases one or more total internal reflections (I) in their trajectory through the component or a combination of components.

The optical device can be implemented in a variety of forms such as:

1) A solid transparent dielectric core that has an optical top surface having a smooth or faceted surface or surfaces that can either reflect (X), totally internally reflect (I) or refract (R) rays impinging on it and an optical lower surface, which can be either a smooth reflective (X) or refractive (R) curved surface or be multi-faceted in form; the multi-faceted top or lower surfaces having flat or curved regions which can either refract (R), reflect (X) or totally internal reflect (I) the rays;
2) A reflective curved or faceted mirrored device that can be either attached or not attached to the first component;
3) Regions on either or both of the active surfaces of these two types of optical devices can be convex, concave in shape or a combination and multiplicity of convex and concave shaped surfaces;
4) The optical components can have a multiplicity of surface regions, each having a number of relatively small size (on the order of 30 microns more or less) "random" shaped non-periodic surface relief structures that act as micro-lenses or micro-reflectors;
5) A micro-lens array sheet with lenses on both sides can be attached to the first component or to a combination of the first and second components; and
6) Combinations of one or more devices from the above categories.

The optical device can be implemented for use in a wide variety of applications, because the method described herein can handle a non-flat or arbitrarily shaped emitter or receiver, and the receiver (emitter) input/output bundle is not required to be Lambertian and isotropic.

In one embodiment, an optical device and a method are disclosed that allows for the receiver (emitter) to be embedded in a material with a different index of refraction than the material of the main device. In addition, the methods and design examples disclosed herein can be utilized in embodiments where the emitter is surrounded by an optical device such as a CPC reflector cup.

The above-mentioned enhancements are useful to design specialty optics for real-world applications such as reflector/collimator optical devices for Light Emitting Diodes (LEDs), which emit a highly non-uniform pattern. LED packages typically include a reflector cup that modifies the output profile from the bare LED die, and furthermore, these devices are typically bonded in place using epoxy, silicone, and other adhesives. Even a typical LED die (without a secondary optic device) does not exhibit an isotropic output. Therefore, the improvements to the SMS method described herein are very useful for this type of application.

The improvements to the SMS method described herein are also very useful for fiber-optic couplers. For instance, these improvements allow the theoretical input ray bundle to have a different angular spread and tilt angle (with respect to the z-axis) for different points on the input aperture. This may be very useful to design fiber optic couplers, because it allows a design to be created which relaxes the spatial positioning of the couplers with respect to the end of the fibers. Finally, the emitter can be designed to emit radiation in a restricted angle even if the angle restriction is different for different points of the emitter. This type of optical device may be of use when the emitter is segmented such as an LED array that includes a number of dies each having its own characteristics. One example of such an LED array is the so-called RGB triad LED, which has a red die, a green die, and a blue die mounted in a single package.

The above enhancements to the method allow for a variety of new highly efficient devices to be designed for a wide range of optical devices and applications that were not envisioned in the early SMS method. A number of embodiments are disclosed in the ensuing sections that will illustrate the new method and the diversity of its design potential.

Previous technical publications relating to the early SMS method typically do not disclose the geometry of the surface shapes or a solid model description of any of the devices. One reason for this is that, typically, the shapes derived using the SMS method do not lend themselves to be described with standard geometric equations of surfaces or their descriptions. This will be evident to the reader after reviewing the wide variety of novel shaped optical devices described herein; for example where the geometry of the bounding surfaces can be described by a many-term power (typically the exponents are even numbers) series. In some cases, up to a 60-term power series is required to describe the bounding space curves (typically in one plane) with sufficient accuracy to achieve high efficiency in a real world device.

From these bounding space curves, the solid 3D model is created by either sweeping the planar closed space curve rotationally around a central axis or by translating or extruding it along either a straight line or other type of space curve. In the first approach, the optical device is in the form of a lens that has rotational symmetry about a central axis. The second approach generates a trough-shaped optical device. If the extrusion follows a closed circular path, the optical device has a shape of a torus with constant aspherical sections. Clearly, extrusions along other paths will yield other optical devices.

The SMS method disclosed here improves upon the early SMS method disclosed in the following references: J. C. Miñano, Juan C. González, "New Method of Design of Nonimaging Concentrators", Applied Optics 31 (1992) pp. 3051–3060; J. C. Miñano, P. Benítez, J. C. González, "RX: a Nonimaging Concentrator", Applied Optics 34, 13 (1995) pp. 2226–2235; J. C. Miñano, J. C. González, P. Benítez, "RXI: A High-Gain, Compact, Nonimaging Concentrator", Applied Optics 34, 34 (1995) pp. 7850–7856. The early SMS method imposes significant limitations, effectively eliminating most real-world applications of the original SMS method. In comparison, the method disclosed herein significantly improves the original SMS method, and the optical devices disclosed herein are directly applicable to real world design problems.

The following example compares the early SMS method with the method disclosed herein. As applied to the RXI for example, the early SMS method required that the initial choice from a family of curves was made for one of the "defining" boundary curves on the surface. (Actually the procedure first solves the 2D case and the space curves arrived at are then symmetrically rotated about a central axis or extruded to generate the 3D shape so that a planar space curve is first chosen.) The algorithm was iterative and if the designer chose the initial curve incorrectly, the algorithm would not converge to a solution. The method disclosed herein improves the algorithm substantially, because the algorithms can be direct design methods rather than iterative methods. Further, the new method insures that the second derivative of the curve of the optical boundaries of the RXI transducer is continuous. This is not guaranteed to be the case using the old SMS method. This constraint is needed to accurately approximate the optical boundary curves in terms of a polynomial power series, an important requirement for interfacing the design with CAD packages and CNC and diamond turning equipment. Using the old method, in most instances, a smooth approximation of the curves was not possible.

Although a hand or CAD-drawn graphical approach of the methods disclosed herein is conceivably possible, it is believed that the method is best implemented in a computer program and, preferably, a computer program that has the ability to graphically display the solution in a 2D and/or a 3D format. In many cases, designing and displaying the solution can take a number of minutes using state-of-the-art PCs when the algorithms are implemented in a compiled language such as C++.

Using the methods described herein, an infinite variety of very high efficiency optical devices can be derived from the original. It will be shown that the data and flow line ray tracings from the original computer run can be used in a CAD or specialty computer program, to create faceted and other versions that are based on the original design. A few examples of this approach will be disclosed and the general methods needed to accomplish this will be also be disclosed.

Once a numerical description to the optical device is determined, the designer can use the boundary descriptions of the space curves or points on the space curves to determine other representations which, when built, have similar properties to the original design. For example, a power series can be transformed into other forms of descriptive equations that are also a close approximation to the original. Techniques such as Chebyshev and rational polynomial approximation techniques can be applied to minimize the complexity of the polynomial power series expressions used, without introducing optical errors in the geometric shapes. Use of descriptive geometric techniques employing Splines, Bezier, or NURBS, is described in: A. Bowyer, J. Woodwark, *A Programmer's Geometry*, Butterworths, (1983); P. C. Gasson, *Geometry of Spatial Forms*, Ellis Horwood Ltd. (1983); D. Rogers and J. A. Adams, *Mathematical Elements for Computer Graphics 2nd Edition*, McGraw Hill, (1990); and A. Watts, 3D *Computer Graphics* ($2^{nd}$ Ed.) Addison-Wesley, (1993). Other descriptive geometric techniques can also be used.

The optical devices described herein can substantially reduce or even eliminate non-uniformities and artifacts typical of other optical devices. For example, the output from a typical SMS-designed collimator is highly uniform, whereas other optical sources typically are non-uniform and vary from one unit to the next. However, due to manufacturing tolerances and yield problems, artifacts can appear in the output of optical devices, including SMS optical devices. Further, when dealing with the mixing of multiple sources of different wavelength light to produce colored or white light, there are issues in making these sources appear uniform when perceived by humans. One embodiment addresses these problems by the use of specially designed pattern of irregular diffusing lenses incorporated into one of the surfaces of the SMS device. It was shown many years ago that it is possible to produce "perfect diffusers" by bleaching laser speckle patterns into optically transmitting materials as disclosed for example in H. J. Caulfield "Optically Generated Kinoforms," *Opt. Comm.* Vol. 4, 201 (1971). These diffusing elements can be designed to "homogenize" the incoming radiation, substantially eliminating the problems of artifacts and local non-uniformities. Although the diffusing elements introduce a minimal increase in the angular output of the device, this minimal increase can be compensated for by designing the optical device to have a half angle output smaller than the final specifications, for example. This approach has been employed in the field of holography and has been used commercially to produce stand-alone holographic "shaping diffusers" by Physical Optics Corporation (Torrance, Calif., USA) and independently by holographers.

H. J. Caulfield, "Optically Generated Kinoforms," *Opt. Comm.* Vol. 4, 201 (1971) discloses holographic techniques. Other references for holographic techniques include U.S. Pat. No. 5,365,354, issued November 1992, entitled Grin type Diffuser Based on Volume Holographic Material, U.S. Pat. No. 5,534,386, issued July 1996 entitled Homogenizer formed using coherent light and a holographic diffuser, and U.S. Pat. No. 5,609,939 issued March 1997 entitled Viewing screen formed using coherent light.

The approach of using holographic diffusers in conjunction with the new SMS method can produce optical devices that are highly efficient, compact, and have superior uniformity without significant artifacts. In one embodiment, the approximate size of the random-shape diffusing optical elements is around 30 microns. At this size, they can be easily incorporated into injection molds (using photo resist or other techniques) and they work equally well on flat or curved surfaces in either reflective or refractive modes.

These holographic diffusers can also be used to dramatically modify the shape of the output of the SMS optical device or to transform an irregularly shaped source into a circular shaped ray bundle. For example, using such an approach, a normally circular output SMS-designed device can be changed into an illuminator which can project the shape of a rectangle, square, ellipse or cross and do so with little loss in efficiency. They can also be employed in the reverse to concentrate non-circular sources of radiation such as rectangles, ellipses or other shapes onto a receiver.

One embodiment uses a microlens to mix colors and/or to increase uniformity. In this embodiment a microlens array sheet is situated at the aperture (entry or exit), where the bundle has a small angular spread with parallel flow lines. The advantage of this solution is that it does not necessarily increase the angular spread of the bundle. This is useful when the design goal is to have the highest but uniform intensity (in the collimating mode) or when, in the concentrator mode, the design goal is to get the highest concentrator's acceptance angle while maintaining a uniform illumination on the receiver.

In the microlens embodiment, both sides of the microlens array sheet have the shape of an array of spherical portions. The sheet material is a dielectric and thus each spherical shape forms a microlens in such a way that each microlens on one side is aligned with another microlens of the other side, both having a focal length equal to the sheet thickness. Thus the focal plane of one lens is in the aperture plane of the other lens. The microlenses are arranged in a rectangular, square or hexagonal pattern, producing a uniform far field pattern (in the emission mode) with a rectangular, square or hexagonal shape, respectively. In one embodiment, the microlens diameter is in the range of about 100 microns to about 2 mm.

From the practical point of view, the diffusing surface solution is preferred for some uses because it does not require an additional component. In addition, the diffusing surface can have a higher efficiency (no Fresnel losses), and the increased angular spread of the bundles is small enough to be negligible in many applications.

An algorithmic method for designing ultra-compact high efficiency optical devices and the family of optical apparatus derived there from is described herein. The method is applicable for designing optical devices including ultra compact high efficiency non-imaging concentrators, collimators, redirectors and couplers in which each ray of a bundle of rays of electromagnetic energy encounters one or more refractions (R), in some cases one or more reflections (X) and in some cases one total internal reflection (I) in its trajectory through the device. A means and location for attaching a two or three-dimensional receiver or source is provided, either interior to the device or on one or more of its outside surfaces. The device can be designed to work with a receiver or source that is surrounded by a material having a different index of refraction from the device.

In one embodiment the optical device includes a solid transparent dielectric core that has a smooth or faceted top surface, having surface regions that can reflect (X), totally internally reflect (I) or refract (R) rays impinging on it and an optically active lower surface, which can be either a smooth reflective (X) or refractive (R) curved surface or be multi-faceted in form; the multi-faceted lower surface having flat or curved regions which can either refract (R), reflect (X) or totally internal reflect (I) the rays. The solid model description of the core may have circular symmetry about a central axis or can be defined by the extrusion of a closed planar space curve along a straight line or space curve.

In another embodiment the optical device includes two different optical components: one component that is reflective (X) and a second component that is refractive (R) such that in its concentrator mode, the rays coming from the source first intercept the reflective surface then the refractive surface and then the receiver. In one implementation, both components have rotational symmetry about a central axis, whereas in another implementation both components have linear symmetry along an axis. The refractive component can be made of a transparent solid dielectric material, which can have a flat or three dimensional source or receiver embedded into it or, alternatively, the refractive component can be located on one or more of its exterior faces. The reflective component can be a smoothly curved mirror or a faceted prismatic structure exhibiting circular rotational symmetry. The faceted means for reflecting can be by direct reflection (X) or TIR (I) or a combination thereof, and the reflection of a ray can be performed by a single surface facet or more than one surface facet in combination. The facets of this component can either be flat or curved or a combination of the two.

The surfaces of the optical components in an optical device can have a multiplicity of regions that have localized and small (on the order of 30 microns more or less) surface structures on them, which take the form of "randomized" but controlled non-periodic shaped micro-lenses or micro-reflectors. The surface structures have the advantageous effect of making the radiation that impinges on them more uniform both spatially and spectrally, while at the same time removing artifacts. Additionally, these "micro-relief" structures can form radiation into a wide diversity of shapes, such as ellipses, rectangles, crosses and other unsymmetrical shapes, or allow for the concentration of unusually shaped sources of radiation onto a receiver.

In an alternative embodiment, any of the optical devices can be attached to a microlens array sheet that is formed by lenses in both sides of the sheet whose focal length coincides with the sheet thickness and whose aperture diameter is smaller than about 1/10 of the device aperture diameter to which the microlens array is attached. The microlenses, which may be arranged in a square, rectangular or hexagonal tessellation pattern for example, have the effect of homogenizing and making more uniform the far field angular beam intensity within a prescribed angular domain.

A method for designing and determining the geometric specifications of these optical devices described herein can be obtained by using the algorithms and design goals and constraints specified in detail in other sections of this invention.

For purposes of illustration herein, the optical devices described herein fall approximately into five different groups: RX, RXI, XR, RR, and XX. Particularly, "R" designates a refractive surface, "X" designates a reflective surface, and "I" designates a surface that operates by total internal reflection. The order of the letters designates the sequence that an external ray would encounter; for example, in an RX device, an external ray first encounters a refractive surface R, next encounters a reflective surface X, and finally encounters the receiver. A single surface may be used both as an "R" surface (refractive) and an "I" surface (total internal reflection), depending upon the angle of incidence.

Alternative embodiments of each of the five different groups include replacing one or more of the smooth surfaces in any of the five different groups with faceted/micro-structured surfaces, , where the faceted/micro-structured surfaces are designated using the following nomenclature: $F_d$ for refractive surfaces, $F_m$ for reflective surfaces, $F_i$ for total internal reflection surfaces, and $F_{dm}$ for surfaces that are used both refractively and reflectively.

Generally, the non-imaging optical devices described herein can function as either a collector/concentrator of radiation received from an external source or an emitter/collimator of radiation emitted from an internal source. Particularly, each of the devices has a receiver or source (dependent upon its implementation) and an entry aperture through which the input or output radiation propagates. A collector/concentrator is implemented with a receiver such as a photodetector, and a reflector/collimator is implemented with a source such as an LED.

Because many non-imaging optical designs can be used interchangeably as either a collector or an emitter, the term "source/receiver" may used herein to refer to the focal area and the device at the focal area. It should be understood that the focal area of a non-imaging optic does not necessarily resemble the focal plane of an imaging optic. For example, the focal area of a non-imaging optic may comprise an extended 3D shape, such as a spherical or cylindrical section (e.g. the top and portions of the side of the cylinder) or an oval shape. As another example, if the source is an LED, the focal area may be designed to substantially coincide with the non-uniform emission profile of the LED, which typically is not a standard geometrical shape. In the LED example, the source may be termed an "extended source". Likewise, a receiver that has a non-uniform shape may be termed an "extended receiver".

The RX Concentrator/Collimator/Redirector

Figure 3:
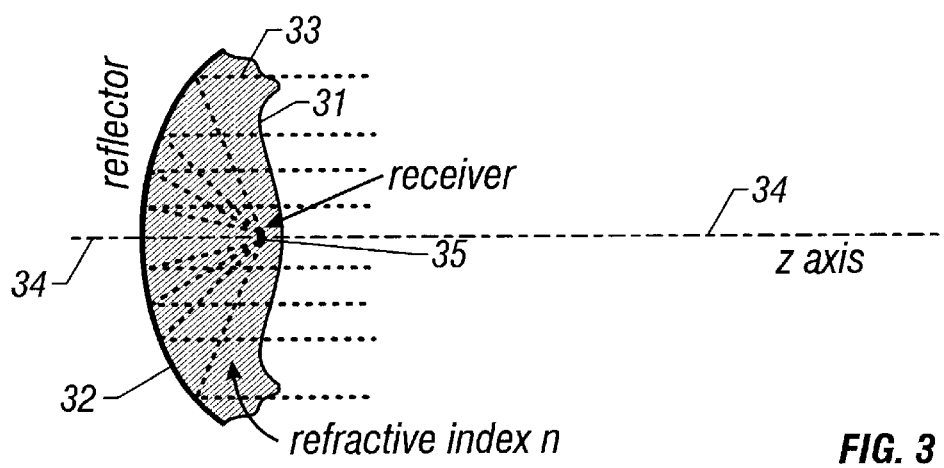
FIG. 3 is a cross-sectional view of an RX concentrator comprising a single dielectric piece with a refractive entrance and a mirrored reflective back surface.

Reference is now made to FIG. 3, which is a cross-section of an RX (refractive-reflective) optical device formed of a single dielectric piece. The RX device includes two optical surfaces: a refractive surface 31 and a reflective surface 32 formed on a main body 33, symmetrically about a central axis 34 (the z-axis). These two optical surfaces 31 and 32 cooperatively define a focal area 35 situated on the central axis between the two optical surfaces 31 and 32. A source or receiver is situated at the focal area 35. For example, if the RX device is operated as a collector of radiation, a receiver such as a photodetector with a suitable shape is situated in the focal area. Examples of suitable receiver shapes include a spherical section, a cylindrical section, or even a flat disk. Alternatively the RX device can be operated as an emitter, in which case the focal area comprises a source of optical radiation such as an LED.

The opposing outer active surfaces 31 and 32 of the RX can be convex, concave or have alternating regions of either type on the same surface, depending upon the design. Typically the reflective surface 32 is entirely convex. The theoretical profiles of the curves of each of the two surfaces are usually defined numerically, and typically have no standard analytical expression.

The performance of the RX, as with any other device using a refractive surface, can be improved by use of an anti-reflective ("AR") coating on its refractive side. An AR coating can often increase overall transmission efficiency of the device by 3% to 5% or more. In embodiments designed for hostile environments such as space, the surfaces of the device can be coated with specialty products in order to help protect it from the environment.

The reflective side of the RX device typically includes a metallic layer comprising a highly reflective metal that is covered with a suitable coating to prevent degradation of the metallic layer. This reflective layer and protective coating is accomplished by any suitable technique, such as vacuum deposition, lithography, roller coating, or other processes. The required degree of reflectivity can also be accomplished by utilizing a stack of transparent, semi-transparent or opaque depositions of plastics or other materials where each layer has a varying index of refraction and thickness.

When the RX device is used as a concentrator of radiation, the rays coming from the external source are refracted in the refractive surface 31 and then reflected by the mirror 32 to the receiver. In one embodiment the RX is rotationally symmetric about a central axis 34 (the z-axis), and the receiver comprises a flat circle whose active side is facing the reflector. The aspect ratio of the receiver (i.e. concentrator thickness to aperture diameter ratio) is typically smaller than 0.5 for designs like the one shown in FIG. 3. However, in other embodiments non-flat receivers can be used. For example, the receiver could be cylindrical in shape with a non-zero depth, in which case the radiation would be concentrated on the top and sides of the cylindrical receiver.

In its typical form, the RX device has rotational symmetry about the central axis 34 (the z-axis), which creates a circular entry/exit aperture. However, there are a number of variants such as RX devices with linear symmetry. For example, a cross-sectional area through the central axis of a normal RX can be extruded along a straight line or along a planar or three-dimensional space curve to form a variety of devices of different shapes, lengths, and radii. In one embodiment, a trough-shaped device is created by an extrusion of this planar shape along a straight line. Such a linearly symmetrical device can be used to concentrate an infinite parallel source onto a linear receiver, where the aperture is rectangular in shape. Furthermore, a linearly symmetrical device can be used to efficiently collimate a linear source or a cylindrical source that emits rays perpendicular to its longitudinal axis (such as a radial collimated linear source).

The RX device can be manufactured in a variety of ways; for example an RX device can be manufactured as a single transparent dielectric piece of material such as PMMA, polycarbonate (PC), cyclo-olefin (CO), PTFE, polypropylene (PP), PPS, or as a combination of two or more dielectric pieces bonded together using a refractive index-matched adhesive or other suitable bonding process. Attachment between the two pieces can also be achieved by employing an optical gel. High optical coupling can be achieved by the use of an interstitial optical gel or liquid having appropriate properties, such as those produced by companies such as Nye Optics of Fairhaven, Massachusetts.

In one embodiment, the body 33 of the RX optical device comprises a single dielectric piece with a refractive index of 1.5, and a thickness-to-diameter ratio less than 0.5. Such an RX device can theoretically achieve up to 98% of the maximum theoretical concentration at the receiver, when used as a collector.

Figure 4:
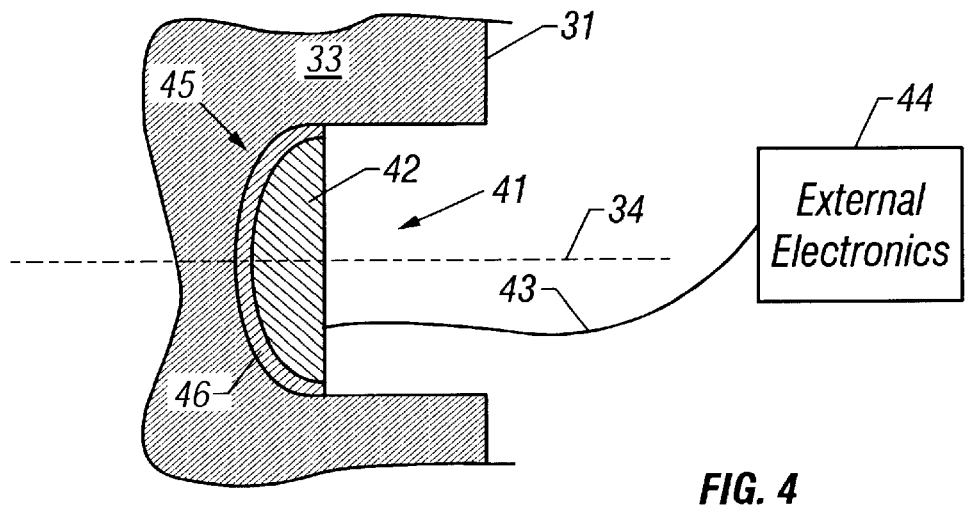
FIG. 4 is a partial cross section showing a source/receiver of one embodiment of an RX device such as shown in FIG. 3.

FIG. 4 is a partial cross section showing the source/receiver of one embodiment of an RX device such as shown in FIG. 3. In FIG. 4, a hollowed-out region 41 provides a place to insert a source/receiver 42, which is connected via a cable pair 43 to an external electronic device 44. In one rotationally symmetrical embodiment, the hollowed-out region can be created by drilling a cylindrical hole centered along the z-axis 34. A dome-shaped region 45 is provided centered on the cylindrical hole, and the source/receiver has an approximately corresponding dome shape. In alternative embodiments, the hollowed-out region can comprise shapes other than a cylindrical hole. Furthermore, if the RX is an extruded version, the shape of the hollowed-out region would be transformed into linear or curved troughs.

Attachment of the receiver/source or other non-optical devices to the RX device can be accomplished by adhesive and/or mechanical means. For example, the area between the source/receiver 42 and the body 33 could be filled with an index-matching epoxy 46 in order to minimize optical losses. Attachment can also be achieved by employing an optical gel. Particularly optical coupling can be achieved by use of an interstitial optical gel or liquid having the appropriate properties, produced by companies such as Nye Optics of Fairhaven, Massachusetts.

For some applications it may be useful to completely encase the receiver/source and its ancillary devices within the RX unit. This can be accomplished, for example, by designing the RX device in two or more parts, inserting the source/receiver and then bonding the parts together with a refractive index matching adhesive or by sonic welding or another form of welding, so as to enclose the receiver/source assemblage.

The reflective side of the RX device typically comprises a metallic layer including a highly reflective metal covered with a suitable coating to prevent degradation of the metallic layer. This reflective layer and protective coating is accomplished by any suitable technique, such as vacuum deposition, lithography, roller coating, or other processes. The required degree of reflectivity can also be accomplished by utilizing a stack of transparent, semi-transparent or opaque depositions of plastics or other materials where each layer has a varying index of refraction and thickness.

The performance of the RX, as with any other device using a refractive surface, can be improved by use of an anti-reflective ("AR") coating on its refractive side. An AR coating can often increase overall transmission efficiency of the device by 3% to 5% or more. In embodiments designed for hostile environments such as space, the surfaces of the device can be coated with specialty products in order to help protect it from the environment.

Although the RX optical concentrator can be designed using the enhanced SMS method, which is a nonimaging method, some embodiments of an RX optical concentrator device can have impressive imaging characteristics. In such embodiments the RX is a good imaging and non-imaging device at the same time. This is not contradictory since nonimaging designs do not require image formation, but, as defined herein, neither do they exclude imaging as a possible outcome of the non-imaging solution.

Figure 5:
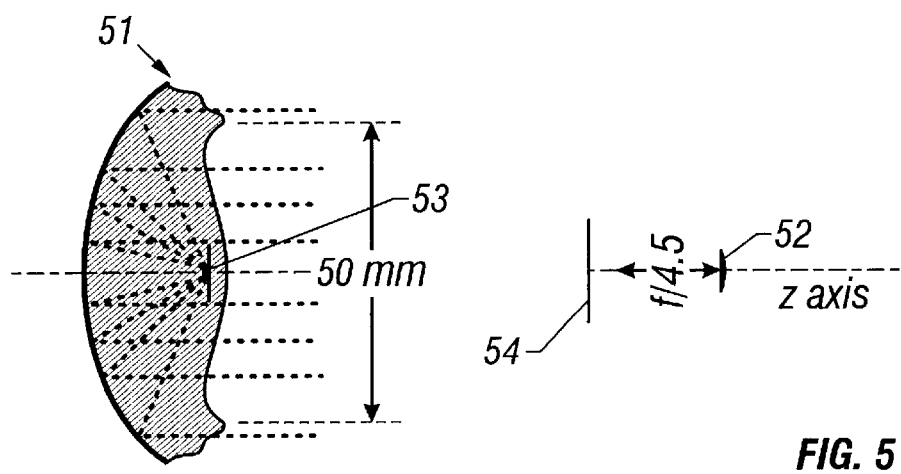
FIG. 5 is a cross-sectional diagram of an RX device on the left and a conventional piano-convex lens on the right, illustrating the imaging properties of an RX device.

FIG. 5 is a cross-sectional diagram that shows a rotationally symmetrical RX device 51 on the left and, on the right, a conventional plano-convex lens 52. The RX device 51 has a focal plane situated at 53. FIG. 5 is arranged so that the focal length of the plano-convex lens is coincident with that of the RX device 51 and has a focal plane at 54, in order to illustrate the imaging qualities. In one example, the rotationally symmetrical RX device has a 50 mm diameter, the refractive index of the device is 1.5, and the plano-convex lens is a conventional 3.8-mm diameter f/4.5 plano-convex lens. FIG. 5 illustrates the imaging properties of an RX device; in one example an RX device can form a high quality image within a field of view of ±3.2° with substantially the same quality (in terms of MTF) as a conventional plano-convex lens (i.e. low Seidel aberration) for normal incidence (this lens has poorer quality for non-normal incidence). However, the RX device can be more useful because the RX image is about 173 times more luminous than the corresponding image created by the standard plano-convex lens. The concentrating capability of the RX as an imaging device results in a numerical aperture (NA) of 1.46, which is 97.5% of the maximum theoretical NA for any imaging device. In summary, FIG. 5 illustrates that an RX device, originally designed for its non-imaging characteristics can also be used as an imaging device.

Prior art non-SMS devices have been designed that have both imaging and non-imaging characteristics; for example, the graded index of refraction lens called the Luneburg lens, disclosed in R. K. Luneburg, *Mathematical Theory of Optics*, University of California Press (1964), is a highly effective imaging and nonimaging device; in other words, it forms images with high concentration (up to 100% of the theoretical maximum, excluding optical losses by reflection and absorption).

Figure 6:
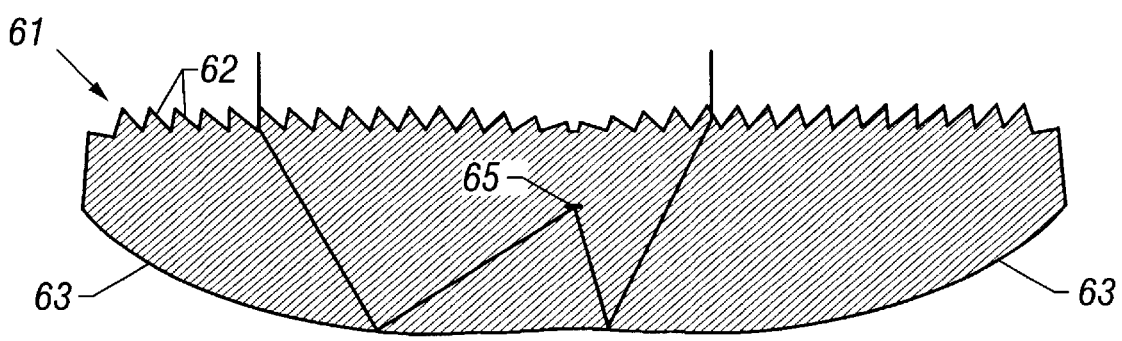
FIG. 6 is a cross-sectional diagram of an example of an RX-derived faceted device, comprising an $F_dX$ collimator device designed for a flat emitter with an emission restricted to about ±90° (downwards in the diagram), with an aspect ratio of about 0.233.
Figure 7:
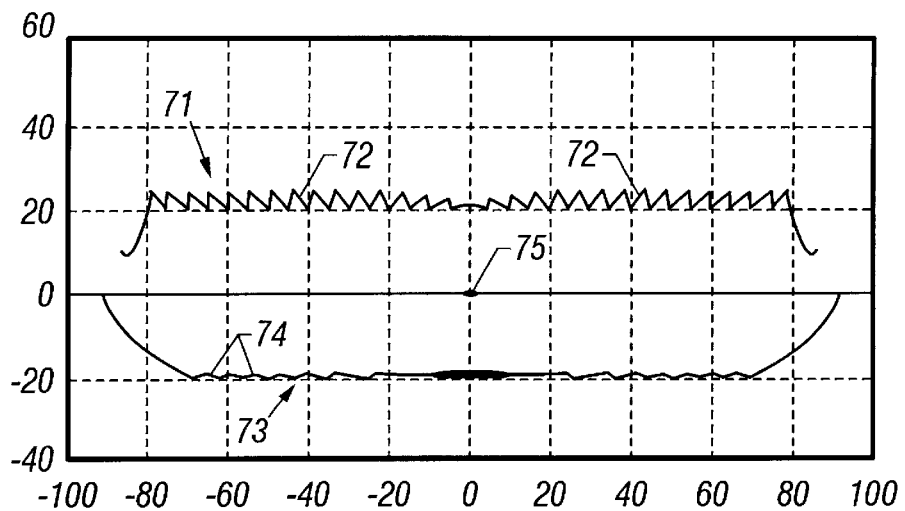
FIG. 7 is a cross-sectional diagram of another example of an RX-derived faceted device, comprising an $F_dF_m$ collimator device designed for a small flat emitter with an emission restricted to about ±90° (downwards in the diagram), with an aspect ratio of about 0.239.
Figure 8:
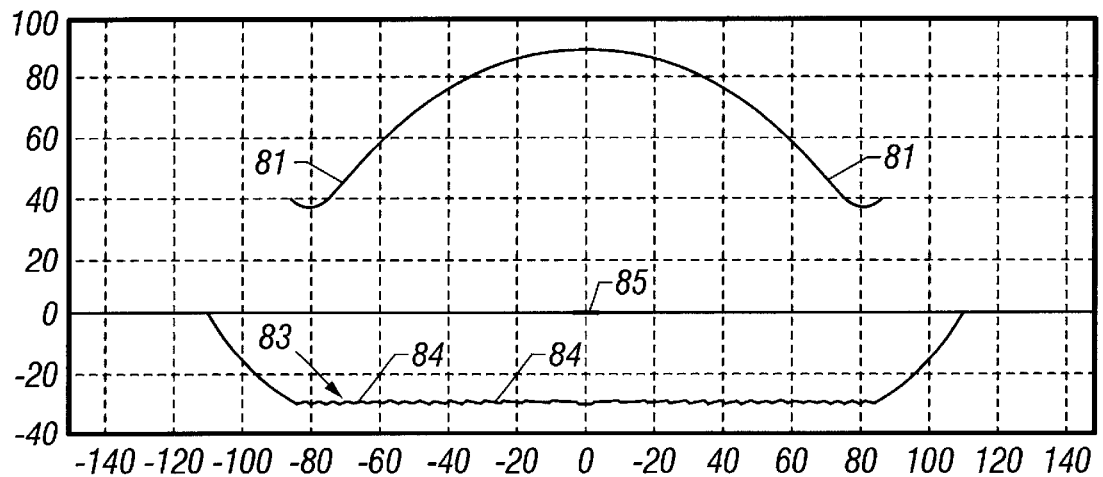
FIG. 8 is a cross-sectional diagram of an example of an RX-derived faceted device, comprising an $RF_m$ device designed for a small flat emitter with an emission restricted to about ±90° (downwards in the diagram), with an aspect ratio of about 0.70.

Faceted RX Devices: The $RF_m$, $F_dX$, and $F_dF_m$ Concentrator/Collimator/Redirector FIGS. 6, 7, and 8 are cross-sectional diagrams of $F_dX$, $F_dF_m$ $RF_m$ devices, respectively, which are derived from RX designs. In these devices, one or both smooth surfaces of an RX type of device, or a part of them, is replaced with a slowly-varying sloped array of faceted prismatic surfaces, which are reflective ($F_m$) or refractive ($F_d$).

FIG. 6 is a cross-sectional diagram of an example of an RX-derived faceted collimator device, comprising an $F_dX$ device designed for a flat emitter with an emission restricted to about ±90° (downwards in the diagram). This example has an aspect ratio of about 0.233. A refractive surface shown generally at 61 comprises a plurality of refractive facets 62. A smooth reflective surface 63 is designed to work in cooperation with the faceted surface 61 so that rays from the emitter incident upon the smooth surface are reflected toward the faceted reflective surface 61 and then collimated. The device can also be designed as a concentrator.

FIG. 7 is a cross-sectional diagram of another example of an RX-derived faceted device, comprising an $F_dF_m$ collimator device designed for a flat emitter with an emission restricted to about ±90° (downwards in the diagram). This example has an aspect ratio of about 0.239. A refractive surface shown generally at 71 comprises a plurality of refractive facets 72. A faceted reflective surface 73 comprises a plurality of facets 74 designed to work in cooperation with the faceted surface 71 so that rays incident upon the facets 74 are reflected toward the faceted reflector 73 and then refracted and collimated. The device can also be utilized as a concentrator by considering the optical functions in the reverse direction from the collimator description.

FIG. 8 is a cross-sectional diagram of another example of an RX-derived faceted device, comprising an $RF_m$ collimator device designed for a flat emitter with an emission restricted to about ±90° (downwards in the diagram). This example has an aspect ratio of about 0.70. A smooth refractive surface is shown generally at 81. A faceted reflective surface 83 comprises a plurality of facets 84 designed to work in cooperation with the refractive surface 81 so that light rays incident upon the faceted surface are reflected toward the smooth refractor 81 and then collimated.

As in other cases, the base design of the RX-derived faceted designs is 2D, but the actual 3D devices are obtained with symmetry from these cross-sections such as linear symmetry (the axis of symmetry lies normal to the cross section) or rotational symmetry (the centered vertical axis in the Figures is the axis of symmetry). The surfaces redirect the rays impinging on them via a single reflection on a facet or by double reflection from a combination of two facets, in the case of $F_m$ surfaces or via refraction or a combination of refraction and TIR in the case of $F_d$ and $F_i$ surfaces. The reflective surfaces of the $F_m$ facets are mirrored whereas those of the $F_i$ surfaces perform the redirection by TIR. The facets can either be flat or curved or a combination of the two. Further, the overall shape of the bottom of the facets can either be on a flat plane or take on an arbitrary shape. A wide variety of designs are possible. For example some designs allow for greater heat dissipation by reducing the thickness of the material below the receiver/source and increasing the area compared to a typical RX design, which increases heat conduction.

Compared to the smooth-surfaced RX and RXI devices, the faceted optical devices are usually less efficient and typically require a larger aperture to achieve the same degree of concentration or collimation. However, the faceted devices can be designed to be more compact in depth. From a manufacturing standpoint, a faceted device may be more complex but has the advantage that its profile can be designed to minimize the effects of shrinkage on the part when produced using conventional plastic molding techniques.

The RXI Concentrator/Collimator/Redirector

Figure 9:
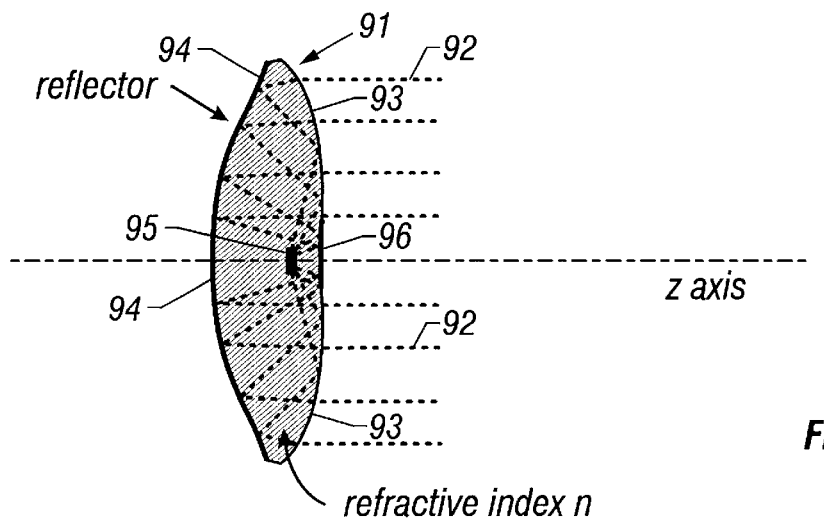
FIG. 9 is a cross-sectional diagram of an RXI concentrator device in which approximately parallel rays from a source are first refracted at the right-hand surface, then reflected by a reflector, and finally reflected by total internal reflection at the right-hand surface; at the central part of the right-hand surface over the receiver, total internal reflection cannot be achieved and therefore this central section should be mirrored; the refractive index is 1.5.

FIG. 9 is a cross-sectional diagram of an RXI receiver device shown generally at 91. In one embodiment the RXI receiver is formed of a single piece of dielectric material such as PMMA, polycarbonate (PC), cyclo-olefin (CO), PTFE, polypropylene (PP), and PPS, with optical surfaces formed on two opposing sides. In FIG. 9, rays 92 arriving from an external source are first refracted at a front optical surface 93 on the right-hand side of the diagram, then reflected from the opposing, back reflective surface 94, and finally reflected by total internal reflection from the inner side of the front surface 93, from which they are focused on the focal area that includes a receiver 95. Thus, the incoming rays encounter the front surface 93 twice: once from the outside as a refractive surface, and once from the inside as a TIR surface. However, at a central portion 96 of the optical surface directly over the receiver, the angles of incidence of the reflected rays are too small for total internal reflection and therefore this central section 96 may comprise a mirrored surface to reflect and focus these rays onto the receiver 95. Although this front mirror introduces some losses to incoming rays, with a proper design, these losses can be kept low (for example, below 1%).

The RXI device, like the RX, can be manufactured in number of ways, such as a single dielectric piece or by a combination of pieces that are bonded together with a refractive index-matching adhesive. For some applications such as a collimator or redirector for an embedded LED light source, the RXI configuration has an advantage over the RX device because the emitting portion of the LED is facing the front of the optical device. This can be an advantage with regard to electrical wiring and heat dissipation of the embedded LED in some embodiments.

Figure 10:
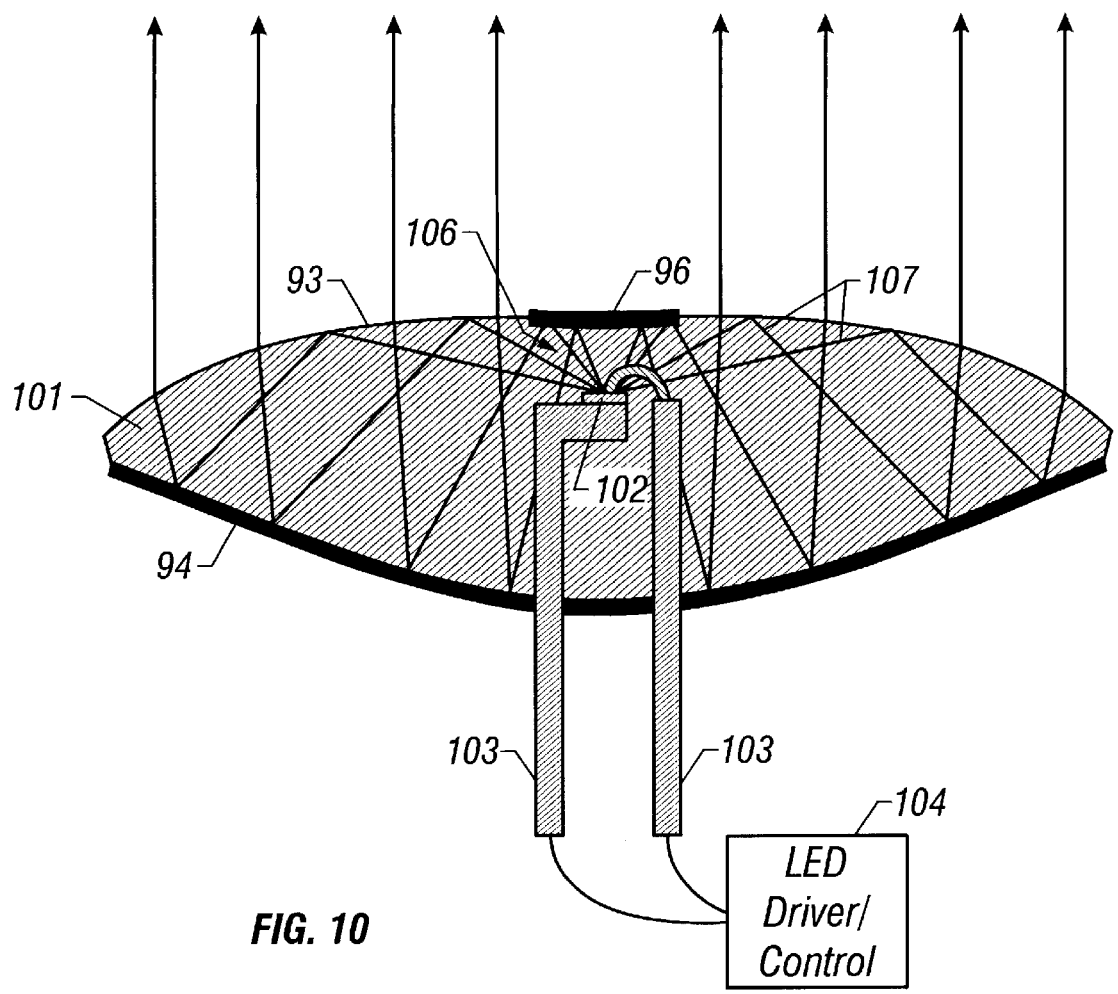
FIG. 10 is a cross-sectional diagram of an RXI type collimator with an embedded LED device.

FIG. 10 is a cross-sectional view of an RXI-type emitter/collimator comprising a solid dielectric piece 101 and an LED device 102 embedded in the solid dielectric and situated at the focal area. A pair of electrodes 103 are connected to the LED 102 to provide power to the LED through the dielectric piece 101. On the other end of the electrodes 103, an LED driver/controller 104 provides electrical power and control of the LED. A ray tracing originating at the LED 102 shows a first group of rays 106 emitted at relatively small angles from the LED reflected from the central reflector 96 toward the back reflective surface 94. A second group of rays 107 emitted from the LED are reflected via TIR from the front surface 93 and then directed toward the back reflector 94. Both the first and second groups of rays reflected from the back reflector 94 then exit through the front surface 93, where the rays are refracted to form a substantially collimated beam in this design. Other designs may provide a variety of beam shapes and divergences, and intensity profiles, depending upon the requirements.

In some embodiments, the RXI device shown in cross-section in FIG. 10 is rotationally symmetric, and in such embodiments a standard LED or an array of LEDs is situated approximately within the focal area. In other embodiments, the RXI device shown in FIG. 10 is extruded to be linearly symmetric, and in such embodiments a linear array of LEDs is situated approximately in the focal area.

In many embodiments of the RXI device, the front surface is convex and the back surface is concave; however in other embodiments the front and back surfaces of the RXI can have a variety of shapes; for example the surfaces can be convex, concave or have regions of either type on the same surface. As with the RX device, the sectional space curves defining the outer boundary of the RXI are typically described numerically, because the space curves typically do not lend themselves to description by standard analytical expressions. The numerical descriptions are given in the form of a multi-term polynomial power series expression, some of which are described subsequently. These numerical descriptions can be used to interface with CNC-driven machines for manufacture of molds or prototypes, or can be used to generate working drawings in high-end CAD programs. Because of the shape of the curves, a typical polynomial expression can have as many as sixty or more terms. This is an important fact, which differentiates the shape of these unique space curves from some of the shapes of prior art optical devices, which have less efficient designs but can be described by standard spherical or conical representations, or a low order polynomial expression with an order of less than 20.

The transmission efficiencies for RXI devices depend on a number of factors, such as its acceptance angle and the ratio of the largest dimension of the receiver with the diameter of the RXI device. For some embodiments the transmission efficiencies can reach values as high as 97%, which is significant if one compares these numbers with conventional approaches. For example a parabolic reflector typically has an actual, real-world transmission efficiency of 25% to 40% from an isotropic source to output for a narrow collimator. Real world efficiencies include optical losses due to inaccuracies in the profiles, manufacturing, non-perfect reflectors, Fresnel losses, absorption losses, and so forth, which depend to a large extent on the properties and quality of the materials used in the design. For RXI embodiments that comprise narrow beam collimators (less than 5° half angle), in experimental devices using low cost materials (acrylic injection pieces), real losses have been measured as varying between 11% to 15%, which, when taking into account a theoretical transmission efficiency of about 97%, result in a real transmission efficiency in the range of 82% to 87%.

To the extent that the RXI device is similar to the RX device, many of the same design and fabrication considerations described for the RX device are applicable to the RXI device. For example, the manufacturing techniques for producing the reflective (X) layers, which were previously described, apply to both devices. Further, the RXI device can be produced in the form of either a single dielectric piece or an assemblage of two or more pieces.

The source/receiver can be connected to the RXI device by a number of techniques including but not limited to: adhesives, sonic or laser welding or mechanical devices such as screws, rivets or other conventional methods. As with the RX device, the RXI device includes an insertion space or hole that provides for insertion of the source/receiver device into the focal area of the RXI device, and also provides for insertion of any ancillary apparatus. This insertion space can take a variety of shapes. A dome on a cylindrical hole is a common design approach that can be incorporated in some RXI embodiments; however, other design approaches can utilize other shapes. In some embodiments, this insertion space can also be designed to allow a means for adjusting the position of the source or receiver. For example, the inner face of a cylinder could be threaded to accept a screw insert by having its walls modified with a complementary screw groove threading. By placing the LED at the end of the screw or attached thereto, such a configuration would allow for accurate positioning of the source/receiver along the length of the central axis of the device by rotating the screw, which would allow for fine tuning of the far field pattern in the emission mode, for instance in flashlight applications. A radial positioning device could also be accommodated in this insertion area.

A method is disclosed that can determine a substantially optimum shape of an RXI device, from a performance standpoint, given the shape of the insertion space in the RXI device, together with the shape and index of refraction of the material which surrounds the source/receiver. This approach can also be applied to design other devices in the other groups of optical devices described herein such as the RX, XX, XR, and RR, and their derivative families of faceted devices.

Using the method, the designer could arrive at a number of solutions to the shape of the insert and the choice of the material to be used that surrounds the insert. The final choice of the shape of the insert would then be based on manufacturing or other considerations. The material surrounding the insert could be air, which would allow for adjusting the position of the insert after manufacturing for purposes such as tuning, or optimization of performance. Tunable designs could also be achieved using an interstitial gel or liquid material of a desired index of refraction.

For example, in applications such as optical wireless communications, the angular transmission characteristic of the receiver surface (photodiode) should also be considered in the design because the goal is not to maximize the light on a receiver surface, for example, but to maximize the photocurrent. This can be implemented using the methods set forth herein.

For example, to design an RXI concentrator for a semiconductor receiver, first assume a monochromatic source with an even distribution of incidence angles within the angular field of view ($\pm\theta_s$) and an even distribution of power in both polarization states. If the semiconductor-to-dielectric interface reflects the light reaching it at high incidence angles, and we are interested in reducing (or minimizing) the receiver area, then it is unnecessary to design for illuminating the semiconductor at high angles of incidence. Therefore the concentrator output bundle can be restricted to some angular span from $\approx 0°$ to $\theta_o$ degrees.

Define $T_s(\alpha)$ as the ratio of light power penetrating into the semiconductor to all the light power impinging the semiconductor surface at an incidence angle $\alpha$ with the surface's normal. In practical designs $T_s(\alpha)<1$. An antireflection coating or the texturing of the semiconductor surface increases $T_s(\alpha)$; however, optimization of the antireflection coating should be accomplished considering that there is an isotropic illumination of the semiconductor, instead of assuming there is a single angle of incidence. In the case of minimal receiver's surface (maximal concentration) the variable to be optimized in the antireflection coating design is $T_s$, which is the ratio of power entering in the semiconductor to the power impinging isotropically on its surface.

$$T_s = \int_0^{\pi/2} T_s(\alpha)\sin 2\alpha d\alpha \quad (1)$$

If the output bundle is restricted to the range from 0° to $\theta_o$, then we have to optimize $$T_s = \int_0^{\theta_0} T_s(\alpha)\sin 2\alpha d\alpha \quad (2)$$

The selection of the value of $\theta_o$ will depend on the signal to internal noise ratio. The method described herein allows one to consider the characteristics of the receiver (or the emitter) for the RXI device and to introduce the appropriate constraint(s) into the solution. This approach can also be applied to design other devices in the other groups of optical devices described in the invention such as the RX, XR, RR, and XX, and their derivative families of faceted devices.

Faceted RXI devices: The $RF_mI$, $F_dXF_i$, and $F_dF_mF_i$ Concentrator/Collimator/Redirector The $RF_mI$, $F_dXF_i$, and $F_dF_mF_i$ devices are derived from RXI designs. As with the faceted RX devices described above, one or both optical surfaces of the RXI device, or a portion of the optical surface(s), is replaced with faceted surface(s). Advantageously, the faceted RXI optical devices can be designed to be extremely compact, with a small aspect ratio. Many different faceted variations of the RXI design can be implemented. Described herein are four main design approaches to the faceted RXI device.

Figure 11:
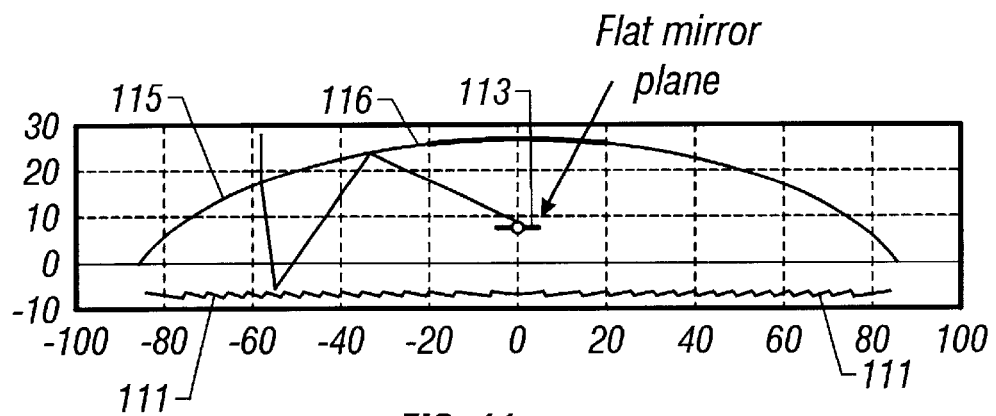
FIG. 11 is a cross-sectional diagram of another example of an RXI-derived faceted device, comprising a deep design $RF_mI$ type of device with small facets (not to scale) in which the emitter is a semi-sphere on a flat cup.

FIG. 11 is a cross-sectional diagram of an example of an RXI-derived faceted device, in which a faceted back reflector 111 comprises facets that are small compared to the size of the device. Specifically, FIG. 11 shows a deep design $RF_mI$ device with small facets (not to scale) in which a source/emitter 113 comprises a semi-spherical shape on a flat cup. The $RF_mI$ device comprises a front surface 115 that can be designed to have a similar shape as the RXI solution, including a central mirrored portion 116. In the embodiment shown in FIG. 11, a deep design $RF_mI$ device is designed so that the bottom tips of the faceted elements are on a plane parallel to the radial plane of the device, which reduces the overall amount of material compared to an equivalent RXI design. Although a faceted device typically has lower efficiency than a non-faceted device, the faceted device can be made more compact, which can be an important advantage for many applications. The mirrored facets can be designed in a variety of forms, such as those described previously with respect to faceted RX devices.

Figure 12:
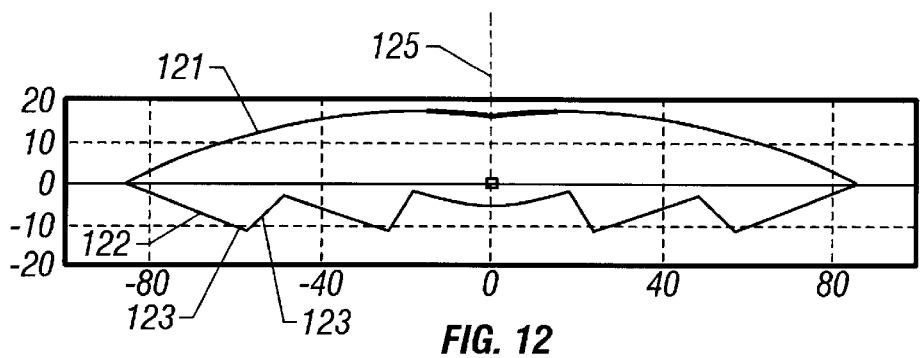
FIG. 12 is a cross-sectional diagram of an example of an RXI-derived faceted device, comprising an $RF_mI$ type of device designed with large non-flat facets to provide an emitting cube with emission restricted to about ±90° (in the upward direction in the diagram), which models an LED chip on a flat cup.

FIG. 12 is a cross-sectional diagram of an $RF_mI$ device including a curved front reflector 121 and a faceted back reflector 122 that includes large non-flat facets 123. In general, FIG. 12 illustrates an approach in which the facets of the back reflector have a curved cross-section, and these facets are large compared to the device. In FIG. 12, the facet structure on the back reflector is only a few concentric rings and the bottommost of these concentric rings lies on a plane, and the device provides an emitting cube with emission restricted to about ±90° (in the upward direction in the diagram), which models an LED on a flat cup. This approach will yield a highly compact design; however the shape of the front surface 121 is significantly altered from the RXI solution. For example, the front surface shape 121 comprises two separate convex shapes, each extending from a center axis 125 to its respective edge.

Figure 13:
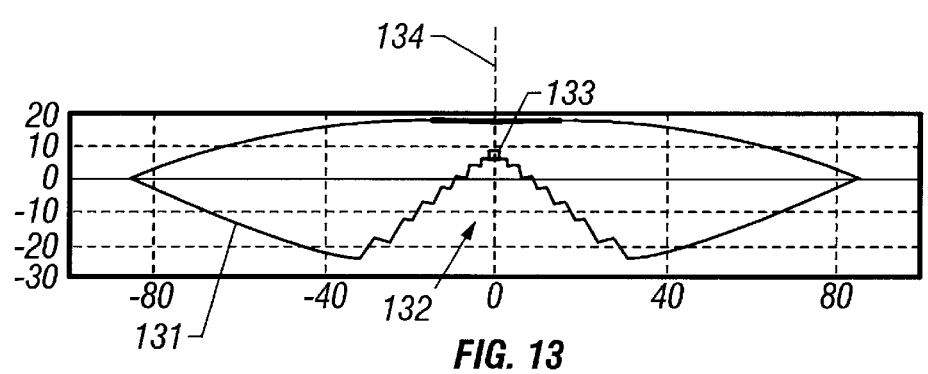
FIG. 13 is a cross-sectional diagram of another example of an RXI-derived faceted device, comprising an $RF_mI$ type of device that has a faceted reflective surface comprising a large conical hollow area centralized along the axis of symmetry, which can be used for cooling purposes, for example, and a heat sink can be placed therein.

Another design approach uses a back-faceted structure with a cuspoid void centered about the central axis, so that the source/receiver, which is also centered about the central axis, is close to the back surface. The facets may be large or small, depending upon the design; FIG. 13 illustrates an example of a large faceted design.

FIG. 13 is a cross-sectional diagram of an example of an RXI-derived faceted device in which a back reflector 131 comprises an inverted shape 132 that gradually approaches the source/receiver 133, as it gets nearer to the center axis 134. Specifically, the $RF_mI$ type of device in FIG. 13 has a faceted reflective surface comprising a large substantially conical hollow area centralized along the central axis 134 of symmetry. One advantage of the hollow area approaching the source/receiver is that the source/receiver can be designed to be close to the boundary of the optic; and even exposed, because the start of the cusp can be designed to lie just outside and below the boundary of the source/receiver. This arrangement has a number of advantages, including improved heat dissipation from the source/receiver, because convective and radiative cooling is enhanced. Furthermore, the open air within the hollow area allows installation of heat sinks or other cooling devices directly below the source/receiver. Another advantage is a reduction in the amount of material needed to make the device. Still another advantage, in some embodiments, is that typical molding problems such as post-molding part shrinkage may be improved by the hollow area. These advantages must be weighed up against a potential loss in efficiency and the increased complexity of the $RF_mI$ type of device with the hollow area.

In a faceted device based upon an RXI design, the bottom shaped reflector may employ mirrored facets or achieve reflection via TIR. Also, a ray can be reflected by either one or multiple facets before heading towards the top face of the device. The facets can be planar, curved, or a combination of the two.

Figure 14:
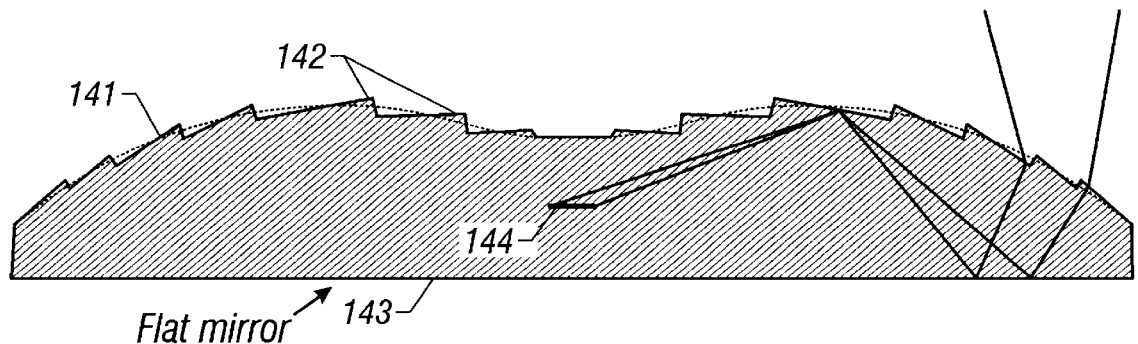
FIG. 14 is a cross-sectional diagram of an example of an RXI-derived faceted device, comprising an $F_dXF_i$ collimator/concentrator with a flat bottom mirrored reflector.
Figure 15:
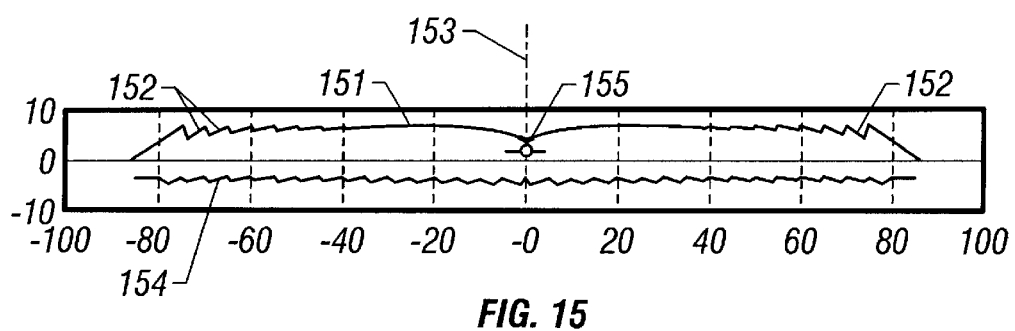
FIG. 15 is a cross-sectional diagram of an example of an RXI-derived faceted device, comprising an $F_dF_mF_i$ type of device designed for a semi-spherical emitter on a flat cup, in an example that has an aspect ratio of only about 0.062.

FIGS. 14 and 15 are examples of RXI-derived devices in which the front surface is faceted and the back surface has a smooth surface ($F_dXF_i$) or a faceted surface ($F_dF_mF_i$). Specifically, FIG. 14 is a cross-sectional diagram of an $F_dXF_i$ collimator/concentrator having a front surface 141 that has a plurality of facets 142, and a flat, smooth bottom mirrored back reflector 143. A receiver/source 144 is situated at the focal area defined by the two surfaces.

FIG. 15 is a cross-sectional diagram of an $F_dF_mF_i$ collimator/concentrator having a front surface 151 that has a plurality of facets 152 that increase in size with increasing distance from a center axis 153, and a faceted, mirrored back reflector 154. A receiver/source 155 is situated at the focal area defined by the front and back surfaces. One embodiment of the $F_{dFm}F_i$ device shown in FIG. 15 comprises a source including a semi-spherical emitter on a flat cup, with an aspect ratio of only about 0.062.

When used as a concentrator, the incoming rays first strike one of the facets of the front face $F_d$ from which they are refracted toward the back surface, where it is reflected, via metallic reflection or, in some embodiments, TIR off of one or more facets, where it is then redirected to a facet on the front face where it is reflected via TIR onto the receiver. In one embodiment the optical devices comprise a solid transparent dielectric, which can be made of a single piece or multiple pieces bonded together. The front and back surfaces are coated appropriately to achieve the desired effect.

The XR Concentrator/Collimator/Redirector

Figure 16:
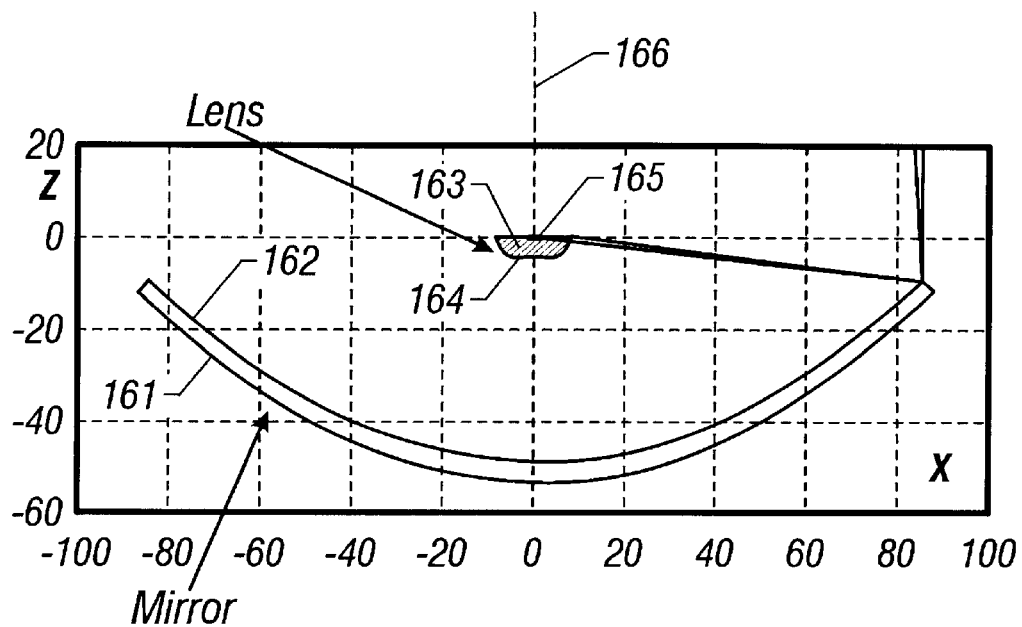
FIG. 16 is a cross-sectional diagram of an XR device designed for a source at infinity subtending an angle of about 1° with the z-axis, which is designed for maximal concentration.

FIG. 16 is a cross-section of an XR device comprising two separate and different optical components: a reflective component 161 that includes a reflective (X) surface 162 and a refractive component 163 that has a refractive (R) surface 164, such as a lens. The XR is an optical device such that, in its concentrator mode, the rays coming from an external source first intercept the reflective surface 162, then the refractive surface 164, and then the receiver 165. Particularly, the shape of the reflective surface 162 is designed to receive rays within a predetermined angular range from the central axis 166, and then reflect them to the refractive component 163. The refractive surface 164 is designed to refract the reflected rays onto a receiver 165 situated at a focal area. In one embodiment of the XR device shown in FIG. 16, the reflective surface is designed to receive light rays from a source at infinity subtending an angle of about 1° with the central axis, and is designed for maximal concentration. In some embodiment the refractive component is fairly complex in shape and the refractive surface may comprise one or more convex and concave surface regions on the side facing the mirror.

In one embodiment the refractive component 164 is made of a transparent solid dielectric material, which can have a flat, or a non-flat (three dimensional) source/receiver embedded into it or located on one or more of its exterior faces. In many embodiments, the reflective surface 164 comprises a smoothly curved mirror. The solid transparent dielectric lens 164 can be made from a single component or multiple pieces bonded together.

Faceted XR Devices: The $F_mR$, $XF_d$ and $F_mF_d$ Concentrator/Collimator/Redirector Like the XR devices from which they are derived, faceted XR devices comprise two separate and different optical components: a reflective component that includes a reflective (X) surface and a refractive component that has a refractive (R) surface, such as a lens. When used as a concentrator, the rays coming from an external source first intercept the reflective surface, then the refractive surface, and then the receiver. In a faceted design, either of the two components, or both, comprise a faceted structure exhibiting circular rotational or linear symmetry.

The faceted reflector component can either be overall flat or be curved with rotational or linear symmetry. A faceted reflective surface can be designed to operate by direct reflection from a metallic coating, or TIR, or a combination thereof. Furthermore, the reflection of a ray from the reflective surface can be performed by a single surface facet or multiple surface facets that operate cooperatively to reflect the ray to the refractive component.

A faceted refractive surface can be designed to operate by refraction or a combination of refraction and TIR in the case of $F_{di}$ surfaces. The facets of a refractive component can either be flat or curved, or a mixed combination of the two.

The RR Concentrator/Collimator/Redirector

Figure 17:
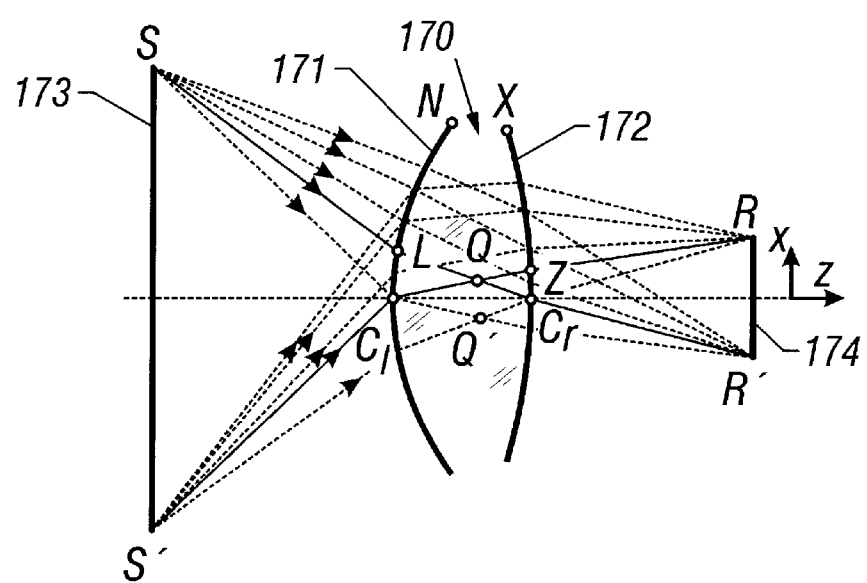
FIG. 17 is a partial cross-sectional view of an RR device with two refractive active surfaces, with a relatively wide acceptance angle and a low concentration ratio, and a source SS' and a receiver RR' located outside the RR device.

FIG. 17 is a cross-sectional view of an RR device shown generally at 170, defined by two refractive active surfaces including a first refractive surface 171 and a second refractive surface 172. A source 173 is defined between points labeled S and S' on one side of the RR device, and a receiver 174 is defined between points labeled R and R' on the opposite side of the RR device. Both the source 173 and receiver 174 are located outside the RR device 170. The RR device 170 can be designed to have a relatively wide acceptance angle and a low concentration ratio; FIG. 17 shows an example of a typical cross sectional shape of an RR device that takes a high acceptance angle source and concentrates it onto a relatively large receiver.

In one embodiment the first and second refractive surfaces 171 and 172 are formed on opposing faces of a solid optical device that can be manufactured as a single transparent dielectric piece or in alternative embodiments it can be made up of a combination of two or more dielectric pieces bonded together (using a refractive index-matched adhesive or other manufacturing process). When used as a concentrator, the rays coming from a source outside the boundary of the RR device, first intercept the nearest refractive surface, then the other refractive surface and finally the receiver.

Figure 2:
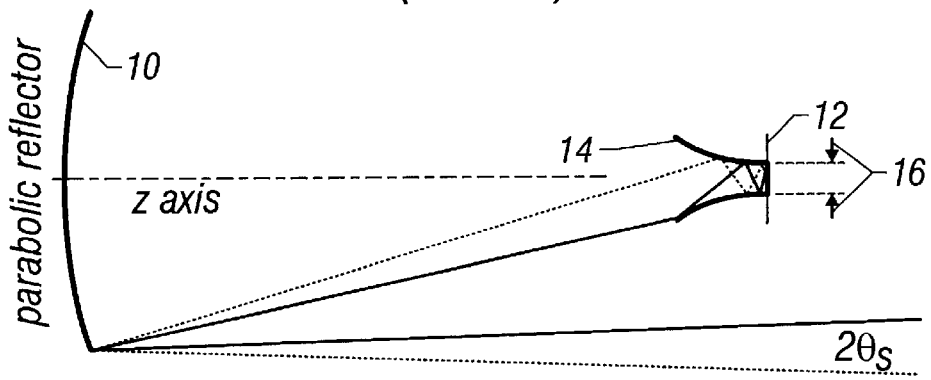
FIG. 2 is a cross-sectional diagram of a prior art hybrid approach to non-imaging optics that combines a parabolic reflector with a flow line concentrator (FLC), also showing also the trajectories of two edge rays.
Figure 18:
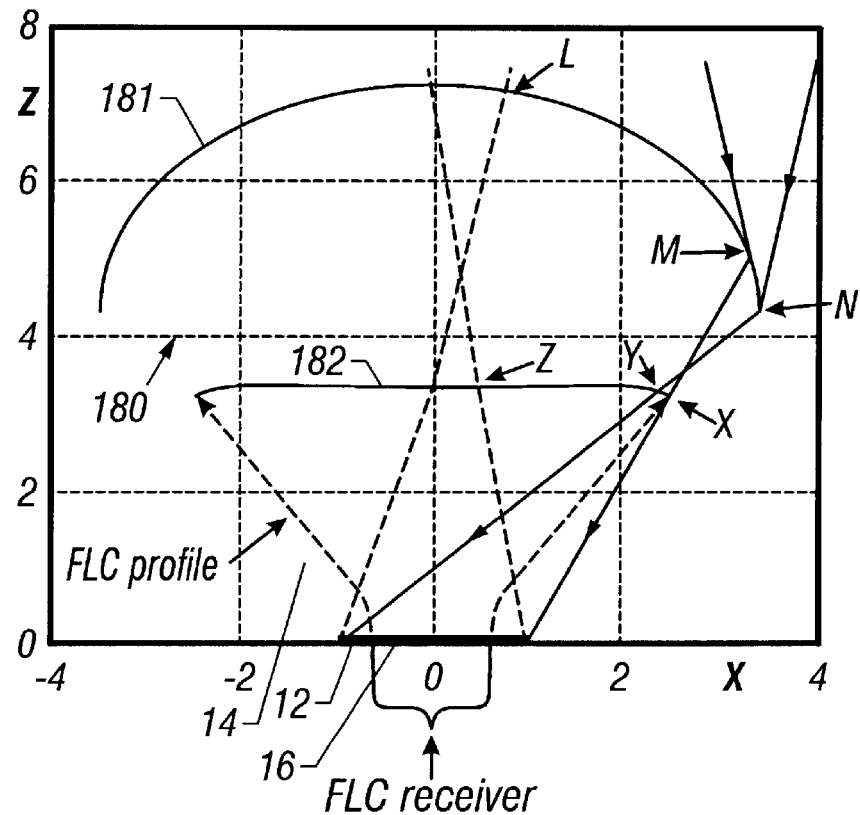
FIG. 18 is a partial cross-sectional view of a combination of an RR device with a FLC, in an embodiment with an acceptance angle of about 10° and a geometrical concentration of about 33.2.

FIG. 18 illustrates an embodiment in which an RR device 180 is combined with a conventional FLC device to further increase the concentration of the rays emanating from the RR device. Specifically, FIG. 18 is a partial cross-sectional view of an RR device including a first refractive surface 181 and a second refractive surface 182, which is designed to be used in combination with an FLC, which is described with reference to FIG. 2. In one embodiment the RR device has an acceptance angle of about 10° and a geometrical concentration of about 33.2. Also shown in FIG. 18 is the portion of Cartesian ovals (shown as MN and XY) and the points L and Z representing intersection points on the outer (L) and inner (Z) optical refractive surfaces for two edge rays from the source.

Unlike a conventional imaging lens, the RR is typically not an imaging device but instead is optimized for maximum radiative transfer. The differences between an RR device and an imaging lens become greater when the ray bundles are from a distributed source that provides a large angular spread, and thus the paraxial approximation becomes increasingly inaccurate.

Faceted RR Devices: The $RF_d$, $F_dR$, and $F_dF_d$ Concentrator/Collimator/Redirector Faceted RR optical devices use one or two faceted refractive surfaces and are derived from the RR concentrator by replacing one or both of the smooth reflective surfaces of the RR device with a corresponding faceted surface. Because of the faceted structures, faceted RR devices can be made more compact than the RR device from which they were designed, but the faceted designs are typically less efficient. Facets for faceted RR devices can employ all the design approaches described for other faceted devices, such as the approaches described with reference to the RX family of faceted optical devices.

The XX Concentrator/Collimator/Redirector

Figure 19:
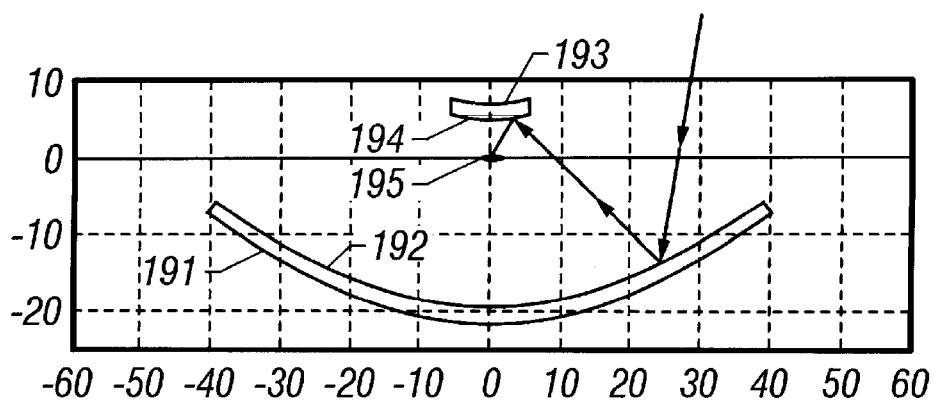
FIG. 19 is cross-sectional diagram of an XX device design that concentrates radiation with an acceptance angle of about ±1° on a receiver with an illumination angle restricted to about ±45°.

FIG. 19 is cross-sectional diagram of an XX optical device, which comprises two separate and different optical components: a first component 191 that includes a first reflective surface 192 and a smaller second component 193 that includes a second reflective surface 194. In its concentrator mode, the rays coming from an external source first intercept the larger first reflective surface 192, then the smaller second reflective surface 194, and then a receiver 195. The embodiment shown in FIG. 19 concentrates radiation with an acceptance angle of about ±1° on a receiver with an illumination angle restricted to about ±45°.

A variety of alternative embodiments are possible; for example either the first or second reflector, or both, can have regions of convex or concave shapes. In some embodiments one or both of the reflectors may be formed on a dielectric material, in other embodiments, neither of the reflectors uses dielectric material.

The XX device is particularly useful when the overall size of the device is so large that the use of dielectric pieces becomes unpractical. For example, some solar energy applications could utilize a large XX device.

In typical XX designs, the smaller of the reflectors casts a shadow on the other one. This shadowing becomes of reduced importance or even negligible from the efficiency point of view, when either the input or output design bundles have small angular spread while the other one (output or input) has a large angular spread.

The XX device is typically not an imaging device, unlike the conventional Cassegrain telescope. The XX device is superior for radiation transfer, especially when the paraxial approximation is not valid for the input or output bundles. For maximum concentration purposes or for collimation of isotropic sources, it is required that at least one of the design bundles does not fulfill the paraxial approximation.

Faceted XX Devices: The $XF_m$, $F_mX$, and $F_mF_m$ Concentrator/Collimator/Redirector Faceted XX optical devices use one or two faceted refractive surfaces and are derived from the XX concentrator by replacing one or both of the smooth reflective surfaces of the XX device with a corresponding faceted surface. Because of the faceted structures, faceted XX devices can be made more compact than the XX devices from which they were designed, but the faceted designs are typically less efficient.

General Description of Method of Design of Transducers with Smooth Surfaces

1. Introduction

The design method described herein is done in 2-dimensional (2D) geometry, i.e., the ray trajectories are contained in a plane and the refractive and reflective surfaces are lines in this plane. Thus, the term optical line will be used instead of optical surface, with the understanding that the 2D design will be extended to make a three-dimensional (3D) device by using rotational or linear symmetry.

Figure 20:
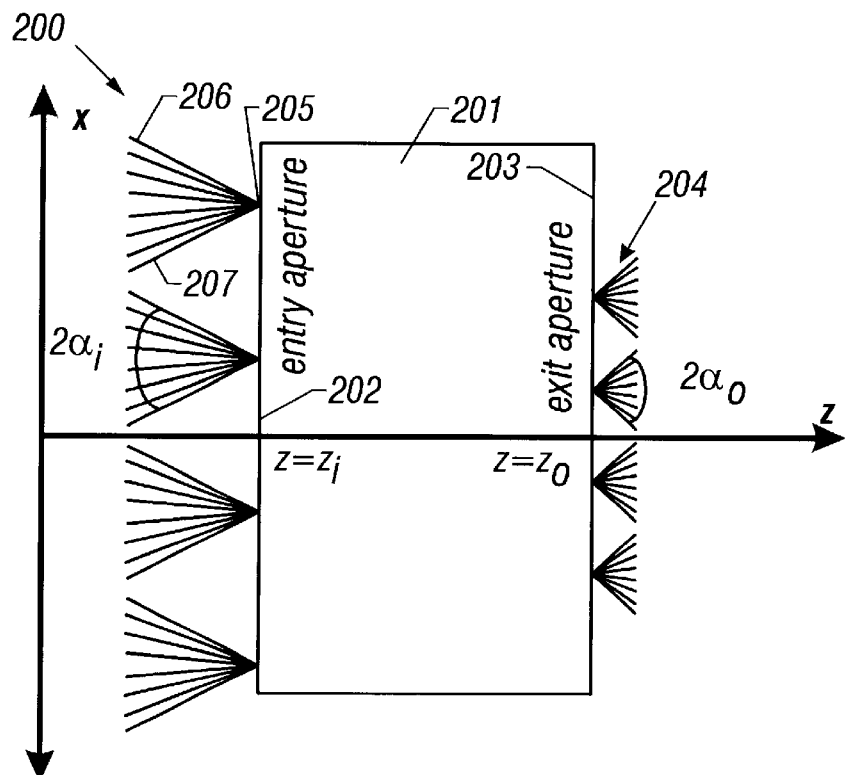
FIG. 20 is a 2D diagram of an optical transducer shown in block form, including an entry aperture and an exit aperture.

FIG. 20 is a 2D diagram of a transducer 201 shown in block form, including an entry aperture 202 and an exit aperture 203. The transducer shown in block form can have any of a variety of forms such as RX, RXI XR, XX, and RR. The entry aperture 202 receives a bundle of input rays $B_i$ shown at 200, and a bundle of output rays $B_o$ shown at 204 is emitted from the exit aperture 203. In general, the transducer 201 optically transforms the input rays 200 into the output rays 204. FIG. 20 illustrates an approach to 2D design used herein; generally, the design problem in 2D geometry can be stated as follows: an optical system including two optically active lines (refractive or reflective) and two apertures is designed such that if a given 2-parameter input bundle $B_i$ impinges in one of the apertures, then it exits the optical system as another prescribed 2-parameter output bundle $B^o$.

In the example shown in FIG. 20, the input and output bundles have a uniform distribution for purposes of illustration. The input ray bundle $B_i$ is formed from all the rays which impinge on the entry aperture (a given segment at $z=z_i$) with an angle with the z-axis between $-\alpha_i$ and $\alpha_i$, and $B_o$ is formed by all the rays exiting the other aperture (another given segment at $z=z_o$) with an angle with the z-axis between $-\alpha_o$ and $\alpha_o$. The two outermost rays at each point of the optical line are termed the edge rays. Particularly, the rays impinging upon a point 205 include a first edge ray 206 and a second edge ray 207. FIG. 21 shows the representation in the x-p space of the input and output bundles shown in FIG. 20.

Figure 21A:
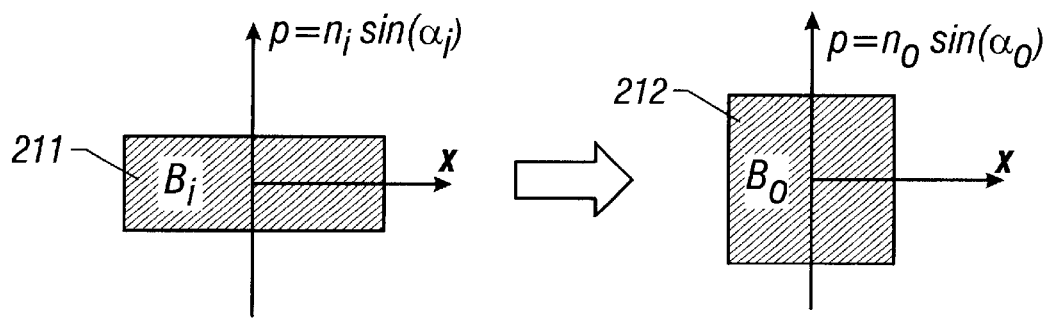
FIG. 21A is a phase-space representation of the rays in one example of the input and output bundles $B_i$ and $B_o$ at $z=z_i$ and at $z=z_o$ respectively.

FIG. 21A is a phase-space representation of the rays in one example of the input and output bundles $B_i$ and $B_o$ at $z=z_i$ and at $z=z_o$ respectively; particularly the input bundle $B_i$ is represented by an rectangular area 211 and the output bundle $B_o$ is represented by a second rectangular area 212 that has a different shape. In general, each ray of the input and output bundles is represented as a point in the phase-space x-p, where p is the index of refraction (n) multiplied by the optical direction cosine of the ray with respect to the x-axis, which is the same as the optical direction sine of the ray with respect to the z-axis: $p=n \sin(\alpha)$. The index of refraction is defined for each of the input and output lines: $n_i$ is the index of refraction of the medium in which the input bundle resides (typically 1.0, air), $n_m$ is the refractive index of the medium that lies in between the two optical lines, and $n_o$ is the index of refraction of the medium in which the output bundle resides (typically 1.5). The ray (x, p) is then the ray passing through the point $(x, z_r)$ having an angle with the x-axis equal to $a\cos(p/n)$, where n is the refractive index at the point $(x, z_r)$. Different values of the coordinate z give different representations.

Figure 21B:
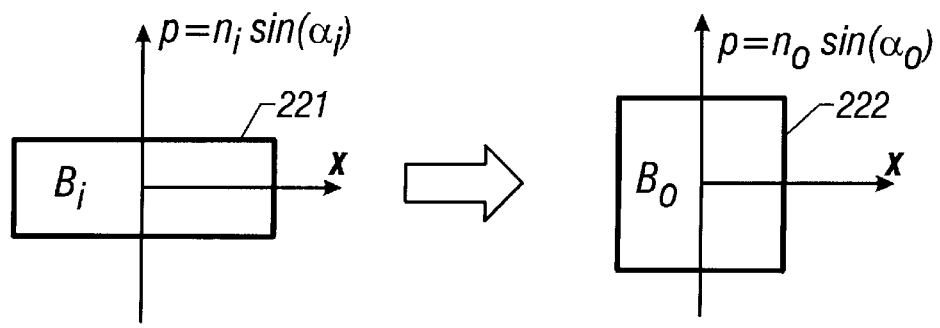
FIG. 21B is a phase space representation of the edge ray bundles $\partial B_i$ and $\partial B_o$ at $z=z$ and at $z=z_o$ respectively.

FIG. 21B is a phase space representation of the edge ray bundles $\partial B_i$ and $\partial B_o$ at $z=z_i$ and at $z=z_o$ respectively; particularly the input edge rays $\partial B_i$ are represented by the boundary 221 of the rectangular area 211, and the output edge rays $\partial B_o$ are represented by the boundary 222 of the rectangular area 212. The edge ray theorem is disclosed in W. T. Welford and R. Winston, *High Collection Nonimaging Optics*, Academic, San Diego (1989); J. C. Miñano, "Two-dimensional Non-imaging Concentrators with Inhomogeneous Media: A New Look," *Journal of the Optical Society of America A*, 2 (1985) pp. 1826–1831; and J. C. Miñano, "Design of Three Dimensional Non-imaging Concentrators with Inhomogeneous Media" *Journal of the Optical Society of America A*, 3 (1986), pp. 1345–1353. The edge ray principle establishes that a sufficient condition for obtaining an output bundle $B_o$ when the optical system is illuminated by a bundle $B_i$ is that the edge rays bundles $\partial B_i$ and $\partial B_o$ are coupled through the optical device. The bundles $\partial B_i$ and $\partial B_o$ include all of the edge rays of $B_i$ and $B_o$, respectively and are represented in FIG. 21B by the rays whose representation in the phase space are in the boundary of the regions representing $B_i$ and $B_o$.

By defining the bundle of input rays incident at each point on the line by only the two edge rays, the edge ray principle greatly simplifies the process of mapping input rays to output rays. The following explanation is a description of an optical system method of design that transforms a given bundle $\partial B_i$ into another bundle $\partial B_o$ (and vice versa).

2. Design Procedure

In this design procedure, we will construct an optical device consisting of two optical lines such as shown in FIG. 20, each line representing an optical surface. The two optical lines can represent two refractive surfaces (RR), two mirrors (XX) or one mirror and one refractive surface (XR and RX). The input edge rays $\partial B_i$ will impinge first on one of them, which is called the input optical line. Then the rays will intercept the output optical line and then they will exit the device as rays of the output edge rays $\partial B_o$. In the following description, the rays of $\partial B_i$ proceed toward increasing values of z, so their optical direction cosines, r (the direction cosine multiplied by the index of refraction) with respect to the z-axis, are positive. In the case of the rays of $\partial B_o$ for the RR and the XX type devices, r>0 while for the XR and the RX devices, r<0.

2.1 Selection of the Input and Output Edge ray Bundles $\partial B_i$ and $\partial B_o$ The edge ray bundles $\partial B_i$ and $\partial B_o$ must fulfill the following conditions:

Condition 1. The bundles $\partial B_i$ and $\partial B_o$ at $z=z_i$ and $z=z_o$, respectively, are closed curves in the x-p plane which enclose the same area. Thus, the area of the regions $B_i$ and $B_o$ in the phase space is the same (this is a general necessary condition called the conservation of etendue or phase space volume).

Condition 2. There are no more than two edge rays of $\partial B_i$ (or $\partial B_o$) passing through each point of the optical lines. This condition can only be checked at the end of the design; Nevertheless, some bad selections not fulfilling this condition can be detected early on.

Condition 3. The input bundle $\partial B_i$ is contained in the region $-n_i<p<n_i$. The output bundle $\partial B_o$ is contained in the region $-n_o<p<n_o$; and Condition 4. There is a cyclic parameterization of the edge ray bundles $x=x(\omega)$, $p=p(\omega)$, such that the derivatives $dx/d\omega$, and $dp/d\omega$ are continuous.

2.2 Design steps

Step 1. Select the indices of refraction $n_i$, $n_o$ and the relative position of the entry aperture with respect to the exit aperture. In the case of an RR device, select also the refractive index media $n_m$ of the medium in between both optical lines.

Figure 22:
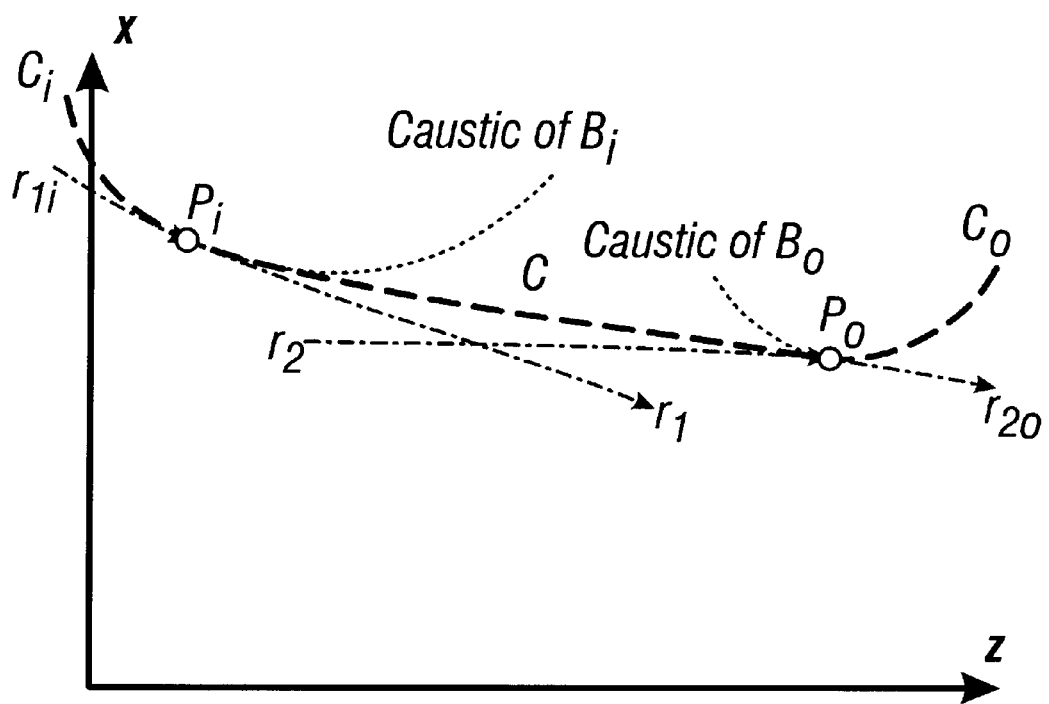
FIG. 22 is a graphical depiction in the x-z plane illustrating construction of the caustic C for input edge ray bundles and the output edge ray bundles.

Step 2. FIG. 22 is a graphical depiction in the x-z plane illustrating construction of the caustic C for input edge ray bundles and the output edge ray bundles. First, calculate the outer caustics ($C_i$ and $C_o$) of $\partial B_i$ and $\partial B_o$. The outer caustic of $\partial B_i$ is defined as the line that delimits in the x-z plane the region crossed by rays of $\partial B_i$. The outer caustic of $\partial B_o$ is defined similarly. To calculate these caustics consider the ray trajectories of $\partial B_i$ (or $\partial B_o$) in the extended phase-space x-p-z. These trajectories in the x-p-z space form a surface S, whose intersection with the plane $z=z_i$ (or $z=z_o$) is the closed line mentioned in section 2.1. The outer caustics can be calculated as the contour of the region resulting from projecting S in the x-z plane. The caustics are the loci of the centers of curvature and thus the equation of the caustics of the input bundle ($C_i$) in the X-Z plane in parametric form (parameter $\omega$) is given by:

$$X = x(\omega) - \rho(\omega)\frac{p(\omega)}{n_i} \quad \text{Eq. G1}$$

$$Z = z_i - \rho(\omega)\sqrt{1 - \frac{p^2(\omega)}{n_i^2}} \quad \text{Eq. G2}$$

where $\omega$ is the parameter, and $\rho(\omega)$ is the curvature radius of the bundle (see section 6) which can be calculated as $$\rho(\omega) = -\frac{n_i^2 - p^2(\omega)}{n_i} \frac{\left(\frac{dx}{d\omega}\right)}{\left(\frac{dp}{d\omega}\right)} \quad \text{Eq. G31}$$

The caustics of the output bundle can be calculated in a similar way (the same equations are valid, just substituting the subscript i by o). These equations are valid for any caustic not only the outer caustics. When the rays proceed towards negative values of z, the minus sign in equations G1 and G2 would be a plus sign.

Step 3. Choose an x-positive point on $C_i$. This point $P_i$ will be the edge of the input optical line. Since this point is on $C_i$ there is a single ray of $\partial B_i$ passing through it. Let us call it $r_{1i}$. The point $P_i$ divides $C_i$ in two parts. Choose one of them. This part will be called $C_i$.

Step 4. Choose an x-positive point on $C_o$. This point $P_o$ will be the edge of the input optical line. Since this point is also on $C_i$ there is a single ray of $\partial B_o$ passing through it. Let us call it $r_{2o}$. The point $P_o$ divides $C_o$ in two parts. Choose one of them. This part will be called $C_o$.

Step 5. Choose a curve C connecting $P_i$ and $P_o$ such that its tangents intersect C at a single point (see FIG. 22). The curvature of C must be such that its tangents do not intersect $C_i$ in the neighborhood of $P_i$ and do not intersect $C_o$ in a neighborhood of $P_o$ (except at the points $P_i$ and $P_o$, of course).

Step 6. Trace the tangent to C at $P_i$. This tangent will be called $r_1$. Check if there is a derivative of the input optical line at $P_i$ such that the ray $r_{1i}$ is deflected towards the ay $r_1$. "Deflection" means refraction or reflection depending on the type of device we are designing. Since we are dealing with the input bundle, deflection means here refraction for the RR and the RX and reflection for the other cases.

Trace now the tangent to C at $P_o$. This tangent will be called $r_2$. Check if there is a derivative of the output optical line at $P_o$ such that the ray $r_{2o}$ comes from a deflection of the ray $r_2$. If one of those checks fails go to step 3 and change the part of the caustics $\partial B_i$,$\partial B_o$ chosen, i.e., change the location of points $P_i$ and $P_o$ or change the curve C.

Figure 23:
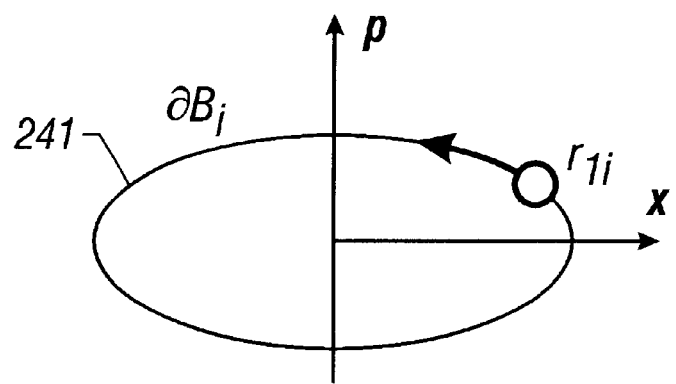
FIG. 23 is a phase-space representation of the input edge rays in one example.

Step 7. FIG. 23 is a phase-space representation used in this example, including an oval shape 241. Trace the rays of $\partial B_i$ whose representation in the x-p plane is in the neighborhood of $r_{1I}$ moving anticlockwise from $r_{1i}$, in such a way that the first rays traced are those that are not tangent to $C_i$. The representation in the phase-space x-p is moving towards higher values of p in the example shown in FIG. 23. Calculate their optical path length taking the wavefront passing through $P_i$ as the reference wavefront. In the neighborhood $P_i$ there is a region whose points are crossed by a single ray of $\partial B_i$ that is not tangent to $C_i$. Thus we can construct in this region a function $L_{i1}(x, z)$ that gives uniquely defined optical path lengths.

Step 8. Trace the tangents to C from the point of tangency towards the direction of $P_i$, Note this direction is completely defined because at any point of C we have the direction along the curve towards $P_i$ and the direction towards $P_o$. These tangents will be optical paths. Calculate the optical path length $L_1(x, z)$ taking the wavefront passing through $P_i$ as the reference wavefront and considering that these rays proceed towards the point of tangency with C. Note that the optical path length from the wavefront passing by $P_i$ to the point x, z can be calculated by the taking the integration along the curve C (which is a caustic) until the point of tangency and adding it to the optical path length along the ray from the point of tangency to the point x, z.

Figure 24:
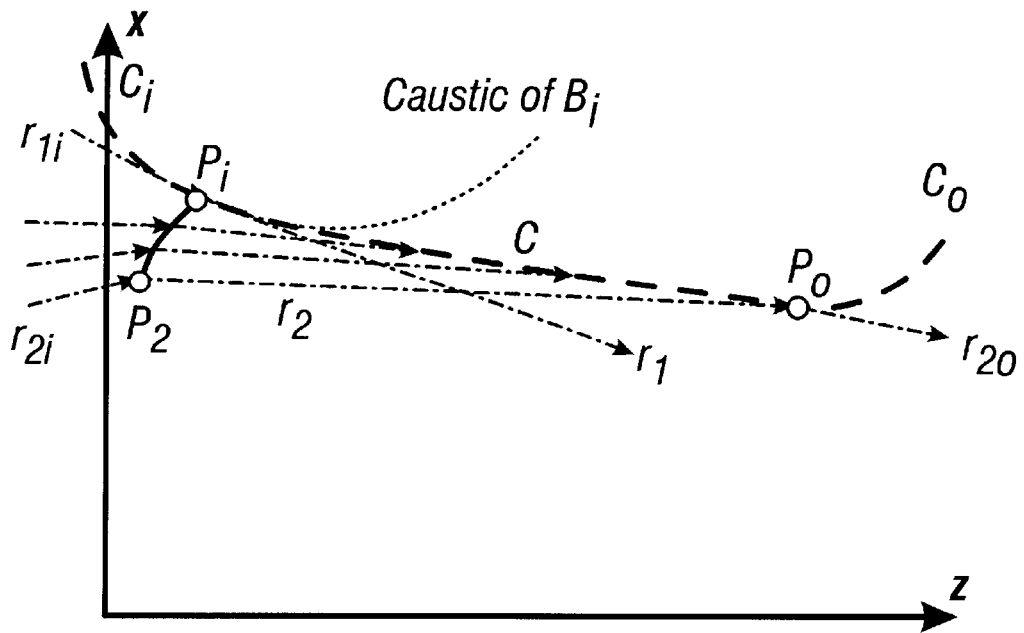
FIG. 24 is a graphical diagram in the x-z plane, illustrating construction of the first part of the input optical line.

Step 9. FIG. 24 is a graphical diagram used to describe construction of the first part of the input optical line. Calculate the first part of the input optical line with the equation $L_{i1}(x, z)=L_1(x, z)$. Take the portion of the curve given by this equation from $P_i$ to $P_2$ (see FIG. 24). $P_2$ is the point crossed by the ray $r_{2i}$, which is the ray of $\partial B_i$ directed to $P_o$. This calculation is described in section 5. Check if this curve does connect the points $P_i$ and $P_2$. In the case of an RR and RX device design, check also that the curve from $P_2$ to $P_i$ is a valid refractive surface, since the Cartesian oval procedure does not guarantee this. In all the cases check also that there are no caustics crossing the new curve. This can be done by simple inspection because if they appear, the curve from $P_2$ to $P_i$ has kinks or loops. If one of these checks fails, go to step 1, 3, 4 or 5 and change at least one parameter.

Figure 25:
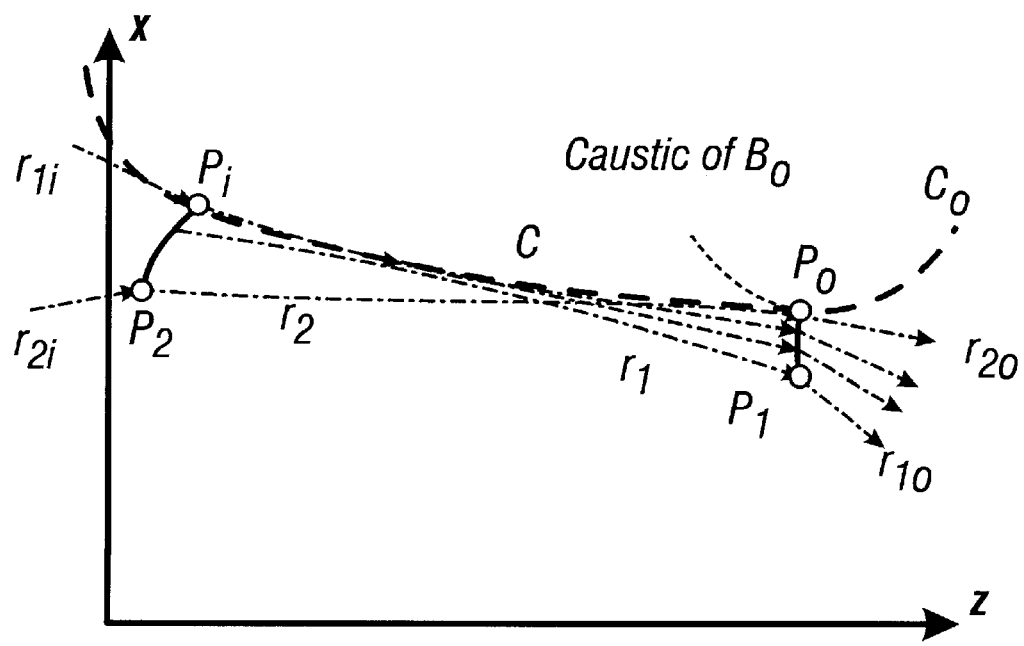
FIG. 25 is a graphical diagram in the x-z plane, illustrating construction of the first part of the output optical line.

Step 10. FIG. 25 is a graphical diagram in the x-z plane used to describe construction of the first part of the output optical line. In a similar way as step 7, 8, 9 the first portion of the output optical line is constructed. Trace the rays of $\partial B_o$ whose representation in the x-p plane is in the neighborhood of $r_{2o}$ moving clockwise from $r_{2o}$, in such a way that the first rays traced are those that are not tangent to $C_o$ (moving towards lower values of p in the example shown in FIG. 24). Calculate their optical path length taking the wavefront passing through $P_o$ as the reference wavefront. In the neighborhood $P_o$ there is also a region whose points are crossed by a single ray of $\partial B_o$ that is not tangent to $C_o$. Thus we can construct in this region a single-valued function $L_{o2}(x, z)$ which defines optical path lengths. By a single-valued function we mean that if two rays passed through each point of a certain region, the function $L_{o2}(x, z)$ would be bi-valued, i.e. the function would have to provide two values of the optical path length for the two rays passing through (x, z).

Step 11. Trace the tangents to C from the point of tangency towards the direction of $P_o$. Calculate the optical path length $L_2(x, z)$ taking the wavefront passing through $P_o$ as the reference wavefront and considering that these rays proceed from the point of tangency with C. Note again, that the optical path length from the wavefront passing by Po to the point x, z can be calculated by the taking the integration along the curve C (which is a caustic) until the point of tangency and adding it to the optical path length along the ray from the point of tangency to the point x, z.

Step 12. Calculate the first part of the output optical line with the equation $L_{o2}(x, z)=L_2(x, z)$. Take the portion of the curve given by this equation from $P_o$ to $P_1$ (see FIG. 25). $P_1$ is the point crossed by the ray $r_{1o}$, which is the ray of $\partial B_o$ that comes from $P_i$. Check if this curve does connect the points $P_o$ and $P_1$. In the case of the RR and XR check also that the curve from $P_o$ to $P_1$ is a valid refractive surface. In all the cases check also that there are no caustics crossing the new curve. If one of these checks fails, go to step 1, 3, 4 or 5 and change at least one parameter.

Figure 26:
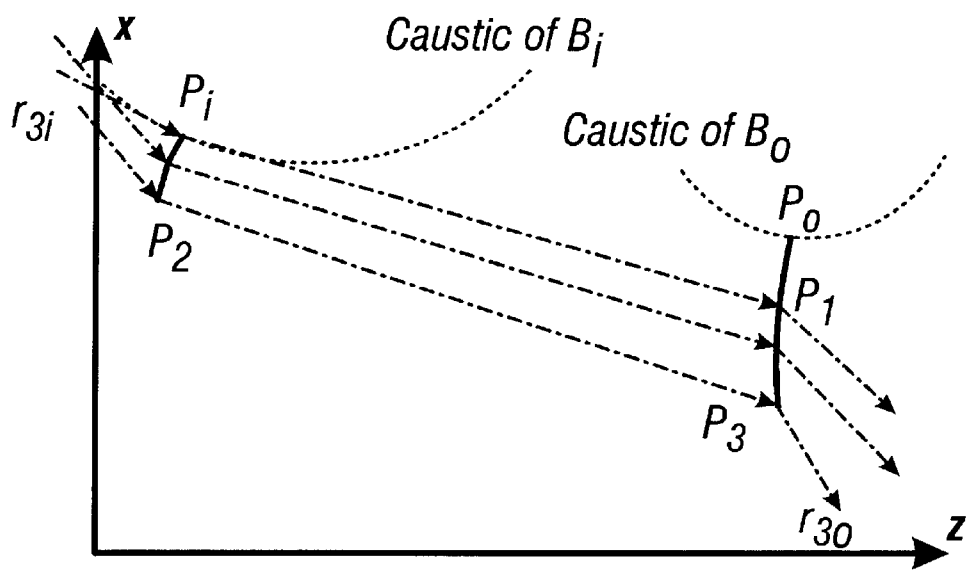
FIG. 26 is a graphical diagram in the x-z plane that illustrates calculation of the second part of the output optical line.

Step 13. FIG. 26 is a graphical diagram in the x-z plane that illustrates calculation of the second part of the output optical line. At this point the portion $P_2-P_i$ of the input optical line and $P_1-P_o$ of the output optical line are known. Trace, through the portion $P_2-P_i$ of the input optical line, the rays of $\partial B_i$ not traced before, i.e., trace the rays of $\partial B_i$ whose representation in the x-p plane is in the neighborhood of $r_{1i}$ moving clockwise from $r_{1i}$, in such a way that the first rays traced are those that are tangent to $C_i$ (the edge rays crossing the portion $P_2-P_i$ with the smaller values of p in the example). Calculate, after the deflection at this curve, the optical path length function taking the wavefront at $P_i$ as the reference wavefront, in a similar way as done in step 7 (see FIG. 26). Calculate also the optical path length of the edge rays $\partial B_o$ in a neighborhood of $r_{1o}$, moving clockwise in the phase-space representation. Use also the wavefront passing through $P_i$ as the reference wavefront. Note that this optical path length, for a given point x, z can be calculated by integration from $P_i$ to $P_o$ along the caustic C and from $P_o$ to the point x, $z_o$. Obtain a new portion $P_3-P_1$ of the output optical line with the procedure described in Section 5 ($P_3$ is the point of the output optical line crossed by the ray coming from $P_2$, i.e., the ray $r_{3i}$, which leaves $P_3$ as $r_{3o}$). The same checks as done in step 9 should be done here. In case of failure, go to step 1, 3, 4 or 5 and change at least one parameter.

Figure 27:
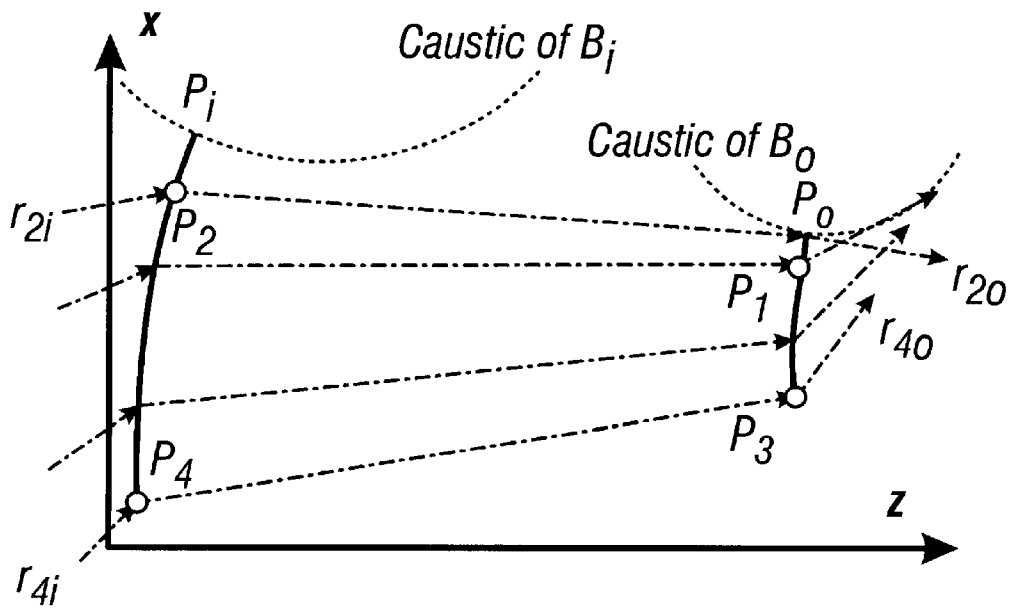
FIG. 27 is a graphical diagram in the x-z plane that illustrates calculation of the second part of the input optical line of an RR device.

Step 14. FIG. 27 is a graphical diagram in the x-z plane that illustrates calculation of the second part of the input optical line of an RR device. At this point the portion $P_2-P_i$ of the input optical line and $P_3-P_o$ of the output optical line are known. Trace back trough the portion $P_3-P_o$ of the output optical line, the rays of $\partial B_o$ not traced before, i.e., the rays crossing this portion with the high values of p (see FIG. 27). Calculate, the optical path length function at this curve before the deflection (which is a reflection for the XX and the RX and it is a refraction for the RR and the XR), taking the wavefront at $P_i$ as the reference wavefront. Calculate also the optical path length of the rays in a neighborhood of $r_{2i}$, moving anticlockwise in the phase-space representation. Obtain a new portion $P_2-P_4$ of the input optical line with the procedure described in Section 5 ($P_4$ is the point of the input optical line crossed by the ray traced back from $P_3$, i.e., $r_{4i}$ impinges at $P_4$ and leaves through $P_3$ as $r_{4o}$). The same checks as done in point 14 should be done here. In case of failure, go to step 1, 3, 4 or 5 and change at least one parameter.

Figure 28:
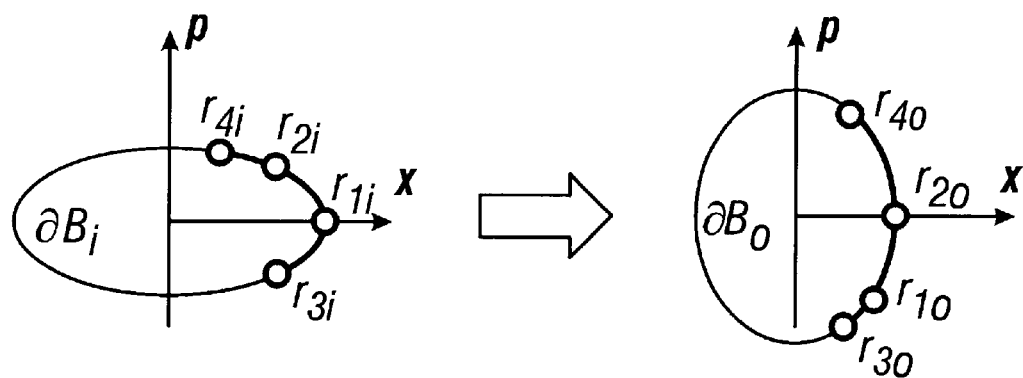
FIG. 28 is a phase-space representation of certain rays of the input edge ray bundle $\partial B_i$, and the certain rays of the output edge ray bundle $\partial B_o$.
Figure 29:
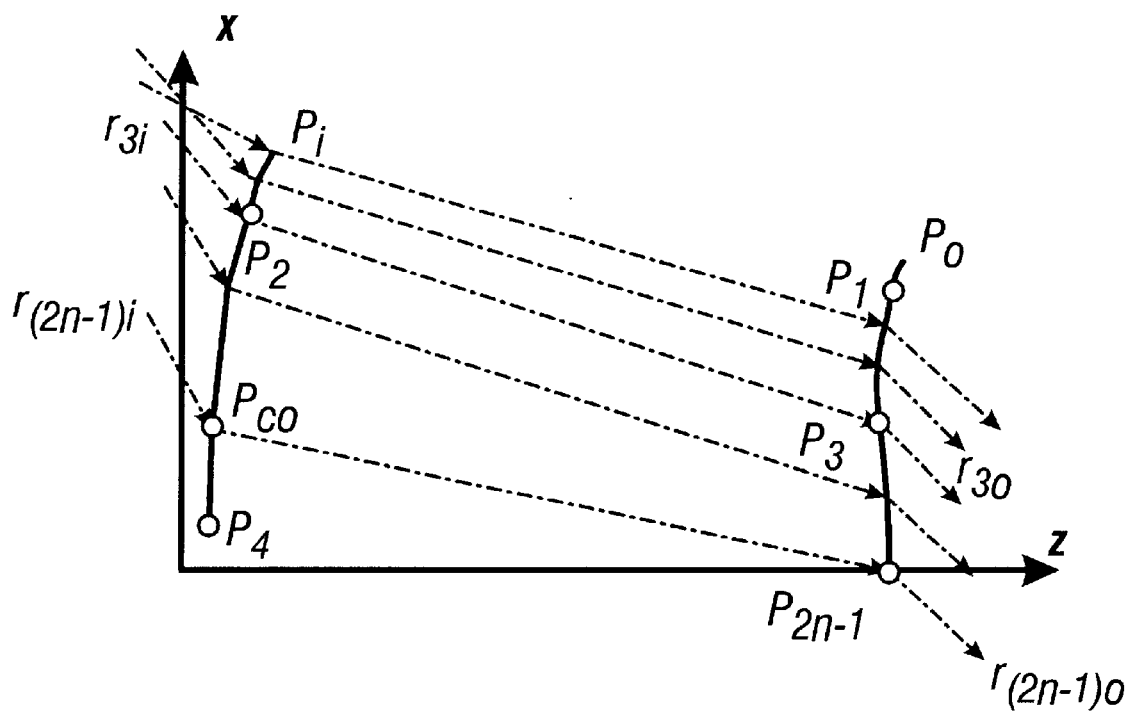
FIG. 29 is a graphical depiction in the x-z plane that illustrates creation of new portions of the input optical lines.

FIG. 28 is a phase-space representation of the rays $r_{1i}$, $r_{2i}$, $r_{3i}$, $r_{4i}$ of the input edge ray bundle $\partial B_i$ for a $z=z_{pi}$, and representation of $r_{1o}$, $r_{2o}$, $r_{3o}$, $r_{4o}$ of the output edge ray bundle $\partial B_o$ for a $z=z_{po}$, FIG. 29 shows the location in the phase-space x-p of the significant rays involved in the process. Unlike the representations done before, in this case the representation of $\partial B_i$ is done at a z coordinate equal to the z coordinate of the point $P_i$ ($\partial B_o$ is represented at $z=z_{po}$). For this reason the rays $r_{1i}$ and $r_{2o}$ (which are, respectively, in the caustics $C_i$ and $C_o$) have in this representation a dx/dp=0.

Figure 30:
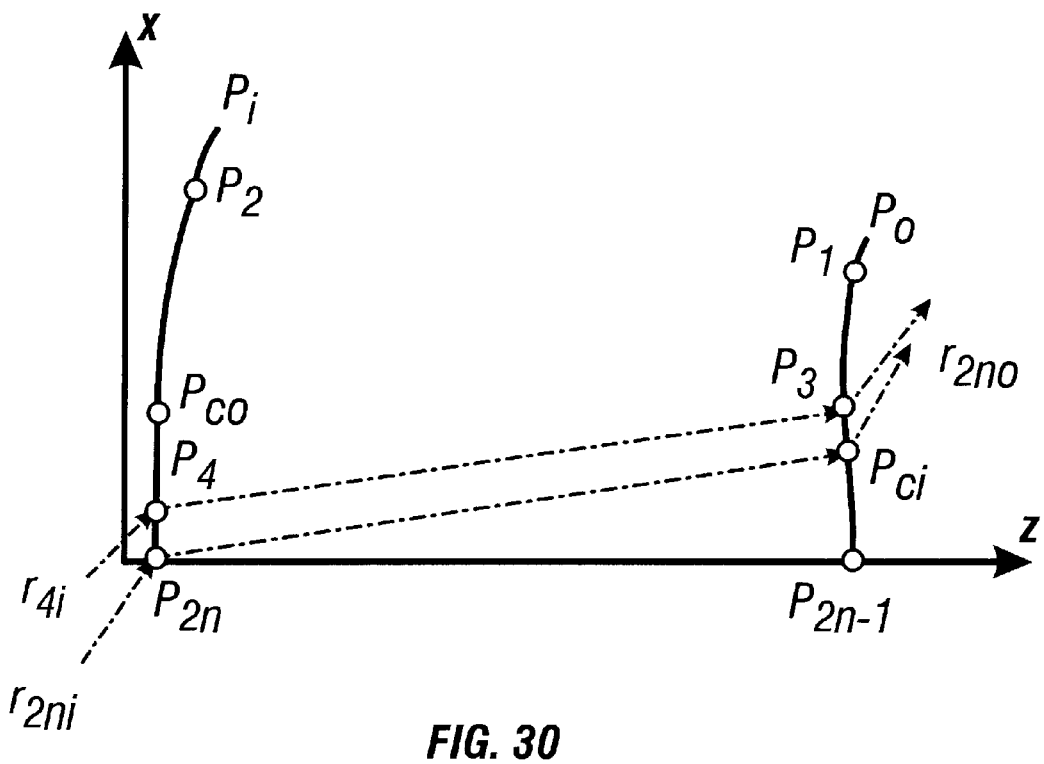
FIG. 30 is a graphical depiction in the x-z plane that illustrates creation of new portions of the output optical lines.

Step 15. FIG. 29 is a graphical depiction in the x-z plane that illustrates creation of new portions of the input optical lines, and FIG. 30 is a graphical depiction in the x-z plane that illustrates creation of new portions of the output optical lines. In a similar way as the one described in steps 13 and 14, new portions of the input and output optical lines can be obtained from the previous ones. The process is continued until the two lines reach the z-axis. In the example shown in FIGS. 29 and 30, the process is completed, respectively, in the second round of steps 13 and 14. This process is repeated, and typically, about 30–100 rounds (repetitions) of these steps are useful.

Figure 31:
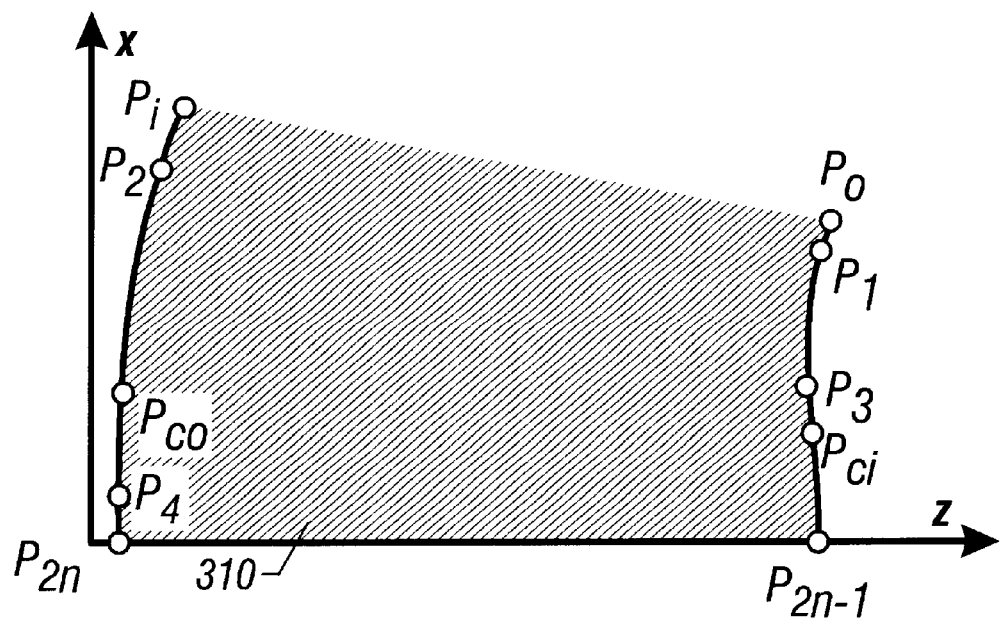
FIG. 31 is x-positive cross-section of an RR device.

The design process may finish at this point. FIG. 31 shows a RR x-positive cross-section 310 created in this example. It may be noted that not all the edge rays of $\partial B_i$ can be perfectly coupled to the rays of $\partial B_o$. In particular, not all the edge rays passing through the last portions of the optical lines can be coupled because there are not enough degrees of freedom. The importance of this effect is small if these last portions are small. The size of these portions is related with the positions of $P_i$ and $P_o$, and the relative position of the input and output bundles. Thus a proper selection of the input parameters will reduce this effect. Note also that a 3D device is obtained by rotational symmetry around the z-axis and thus, the central part of the optical lines generate a surface of relatively small area when compared with the area generated by the initial parts of the optical lines.

Since the actual 3D optical devices are obtained by rotational symmetry around the z-axis, it is advisable to iterate the design procedure in order to obtain a normal to the optical lines at x=0 that is parallel to the z-axis. This can be done by varying some of the input parameters. For the usual input and output bundles, when this condition on each normal is fulfilled, the effect on design performance as a result of imperfect coupling between $\partial B_i$ and $\partial B_o$ is negligible.

3. RXI design procedure

FIGS. 32, 33, 33A, 34, 35, and 36, are graphical diagrams in the x-z plane that are used to illustrate the process of constructing an RXI device. In this example, we will construct an optical device beginning with two optical lines as shown in FIG. 20. One optical line is a line where the refractive index of the surrounding media changes abruptly. This line, referenced as curve D, will behave as a refractive surface or as a reflector (by total internal reflection) depending on the incidence angle on this line. The other optical line is a reflector and it will be referenced as curve X. The input edge rays $\partial B_i$ will impinge first on the first line. Then the rays will intercept the other optical line and will be reflected towards the curve D where they are reflected again. Then they will exit the device as rays of $\partial B_o$. As stated earlier in this description, the rays of $\partial B_i$ will proceed toward increasing values of z, so their optical direction cosines, r (the direction cosine multiplied by the index of refraction), with respect to the z-axis, are positive. Therefore, when the edge rays are between the reflection at X and the reflection at the curve D, their optical direction cosines with respect to the z-axis are negative, i.e., $r \leq 0$.

In the design procedure, the curve D is considered a refractive surface for the rays of $\partial B_i$, and it is considered a mirror for the rays after the reflection at the curve X, whether or not the total internal reflection (TIR) condition is fulfilled. When the design is finished, a mirror should be placed at the points of D whenever the TIR condition is not fulfilled. Although this mirror creates an obstacle for the input bundle, in a good design this obstacle is very small and therefore would have a negligible effect on performance of the device.

3.1 Selection of the Input and Output Edge ray Bundles $\partial B_i$ and $\partial B_o$ The edge ray bundles $\partial B_i$ and $\partial B_o$ must fulfill the following conditions:

Condition 1. The bundles $\partial B_i$ and $\partial B_o$ at $z=z_i$ and $z=z_o$, respectively, are closed curves in the x-p plane which enclose the same area. Thus, the area of the regions $B_i$ and $B_o$ in the phase space is the same (this is again the conservation of etendue).

Condition 2. There are no more than two edge rays of $\partial B_i$ (or $\partial B_o$) intercepting each point of the optical lines. This condition can only be checked at the end of the design process. Nevertheless, some bad selections not fulfilling this condition can be detected early on in the method.

Condition 3. $\partial B_i$ is contained in the region $-n_i<p<n_i$. $\partial B_o$ is contained in the region $-n_o<p<n_o$.

Condition 4. There is a cyclic parameterization of the edge ray bundles $x=x(\omega)$, $p=p(\omega)$, such that the derivatives $dx/d\omega$, and $dp/d\omega$ are continuous.

Figure 32:
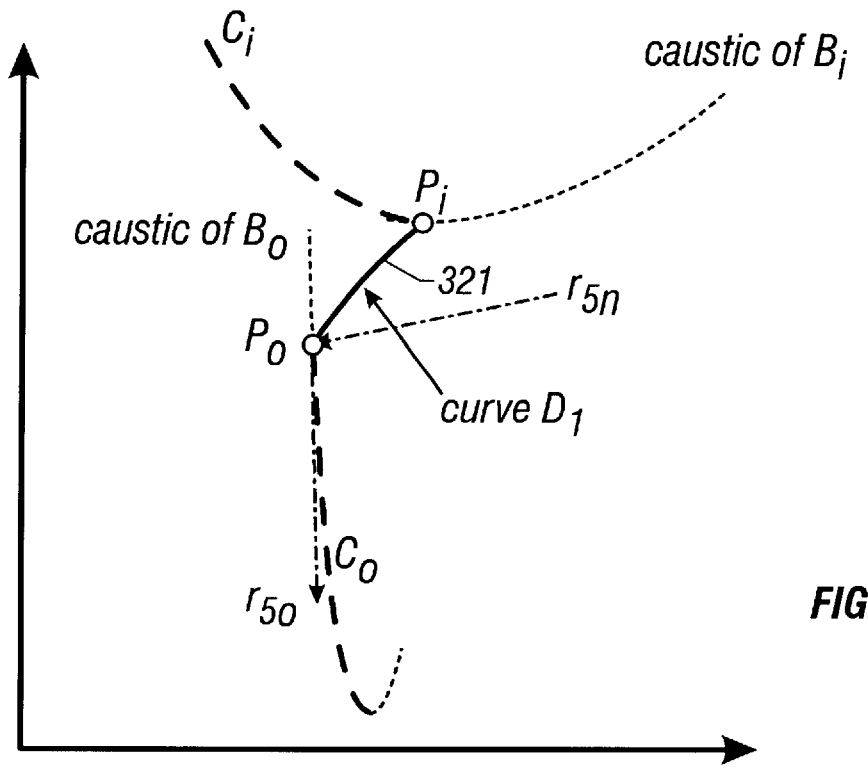
FIG. 32 is a graphical depiction in the x-z plane illustrating a process for selecting the entry and exit apertures of the RXI, and the initial curve D.

3.2 Design Steps:

Step 1. FIG. 32 is a graphical depiction in the x-z plane illustrating a process for selecting the entry and exit apertures of the RXI, and the initial curve D. The first step is to select $n_i$, $n_o$ and the relative position of the entry aperture with respect to the exit aperture, where $n_i$ is the index of refraction of the medium in which the input bundle resides (typically 1.0, air) and $n_o$ is the refractive index of the medium that lies in between the two optical lines.

Step 2. Calculate the outer caustics ($C_i$ and $C_o$) of $\partial B_i$ and $\partial B_o$. The outer caustics of $\partial B_i$ and $\partial B_o$ are defined as before (see FIG. 32).

Step 3. Select a point $P_i$ of $C_i$ and a point $P_o$ of $C_o$ such that $P_i$ is in a region of the x-y plane not crossed by any ray of $\partial B_o$. In the case that there will be an obstacle for the bundles of $\partial B_o$ in the final design, then it suffices to check that the rays $\partial B_o$ do not cross $P_i$ before they meet the obstacle. For instance, if design is required to illuminate with $B_o$ a certain opaque receiver, then all we need to do is ensure that the rays $\partial B$. don't cross $P_i$ in their trajectories before reaching the receiver.

Step 4. Choose a smooth curve D, (see 321 in FIG. 32) joining the points $P_i$ and $P_o$. This curve will be part of the optical line D. A smooth curve means here a low order polynomial. A high order polynomial may generate new caustics of the edge rays bundles, which cause the design method to fail (as explained previously in section 2.2). At polynomial with a low order (a straight line, for instance) doesn't usually give enough degrees of freedom to get surfaces D and X that are normal to the z axis at x=0. The refractive index of the right side of D is the highest. The curve D, is chosen so as to be constrained by the condition that the ray $r_{5o}$, which is tangent to $C_o$ at $P_o$, suffers a total internal reflection at $P_o$ when traced backwards, i.e., when it is traced towards the ray $r_{5n}$.

Figure 33A:
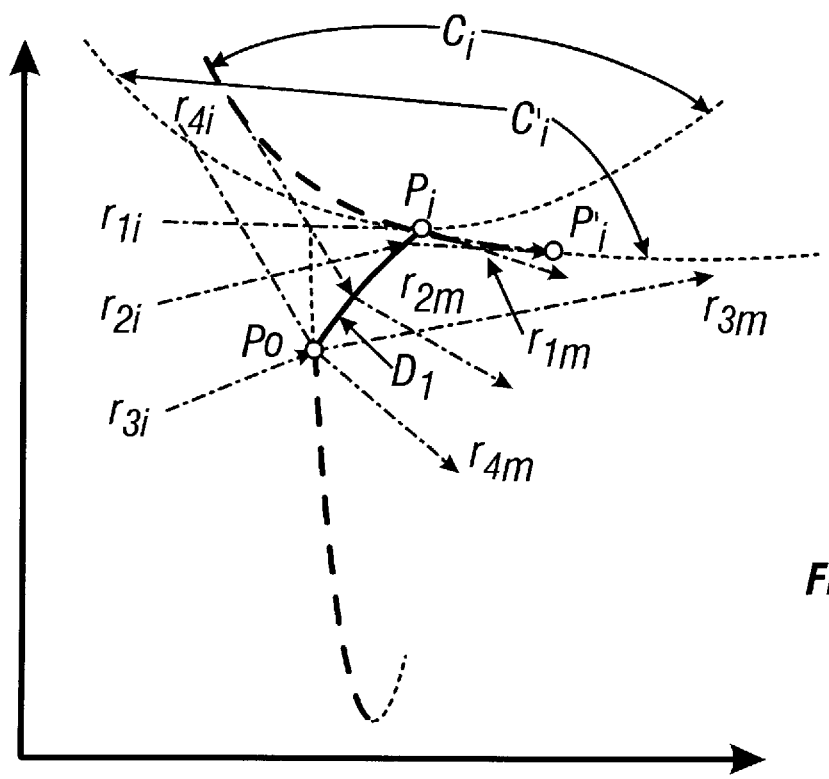
FIG. 33A is a graphical depiction in the x-z plane illustrating calculation of part of the bundle $\partial B_i'$ obtained by refraction of $\partial B_i$ at the curve $D_i$.

Step 5. FIG. 33A is a graphical depiction in the x-z plane illustrating calculation of part of the bundle $\partial B_i'$ obtained by refraction of $\partial B_i$ at the curve $D_1$. Trace the rays of the bundle $\partial B_i$ that impinge on the curve $D_1$. Trace them after the refraction at this curve. The impinging rays are labeled $r_{1i}$ through $r_4$ and the corresponding refracted rays are labeled $r_{1m}$ through $r_{4m}$. With this, we have calculated part of the bundle $\partial B_i$ after its refraction at D. This bundle after refraction is called $\partial B_i'$ (see FIG. 33A). Since the part of the bundle $\partial B_i$ traced is in the neighborhood of the caustic $C_i$, we will be able to calculate part of the outer caustic of $\partial B_i'$ which is called $C_i'$. If the curve D, is not smooth enough, then it may form additional caustics that would be able to intercept the parts of the optical lines that haven't yet been calculated.

Step 6. Check that the calculated part of $\partial B_i'$ fulfills conditions 2 and 3 of the preceding Section 3.1. If not, go to step 4 and choose another curve $D_1$.

Step 7. Choose a smooth remaining part of curve D (from $P_o$ to the z-axis) such that it is normal to the z axis at x=0 and such that, together with $D_1$, it has, at least, first and second continuous derivatives. Trace back the edge rays of $\partial B_o$ in the neighborhood of $r_{5o}$ moving clockwise in the x-p phase space representation, in such a way that the first rays traced are those tangent to the outer caustic of $\partial B_o$ which are not tangent to $C_o$. Consider that D is a reflector and calculate the trajectories of these rays before reflection at D. These rays will generate a caustic C that passes by $P_o$. The point of intersection of C and $C_i'$ is called $P_i'$. If there is no intersection between C and $C_i'$ (or if the intersection point is just the edge of the $C_i'$), go to step 4 and choose another curve $D_1$ or start again this step with a new D–$D_1$ portion. Once C and $P_i'$ have been calculated, reject the part of curve D that is not $D_1$. This method for calculating C ensures in an easy way that the final curves defining the RXI device (curves D and X obtained form the full method of design) have continuous second derivatives.

Now the next part of the RXI device is designed by treating it as an XX device. Start the design of an XX with $\partial B_i'$ and $\partial B_o$ as input and output edge ray bundles, $\partial B_i'$ is only partially known but it suffices to start the design and to get new portions of the D and X curves. Once we get a new portion of the curve D we will calculate a new portion of $\partial B_i'$ just refracting the rays of $\partial B_i$ at the new portion of the curve D. With the new portion of $\partial B_i'$ we will be able to follow the procedure described with reference to the XX design.

The relative position of $\partial B_i'$ and $\partial B_o$ is already known. $P_i'$ will be the edge of the input optical line of the XX and the edge of the X line in the RXI complete design. $P_1'$ can be any point of $C_i'$ after the refraction at $D_1$, excepting the edge of $C_i'$. $P_o$ is the edge of the output optical line in the XX design and it coincides with the point with the same name chosen in step 3.

Figure 33B:
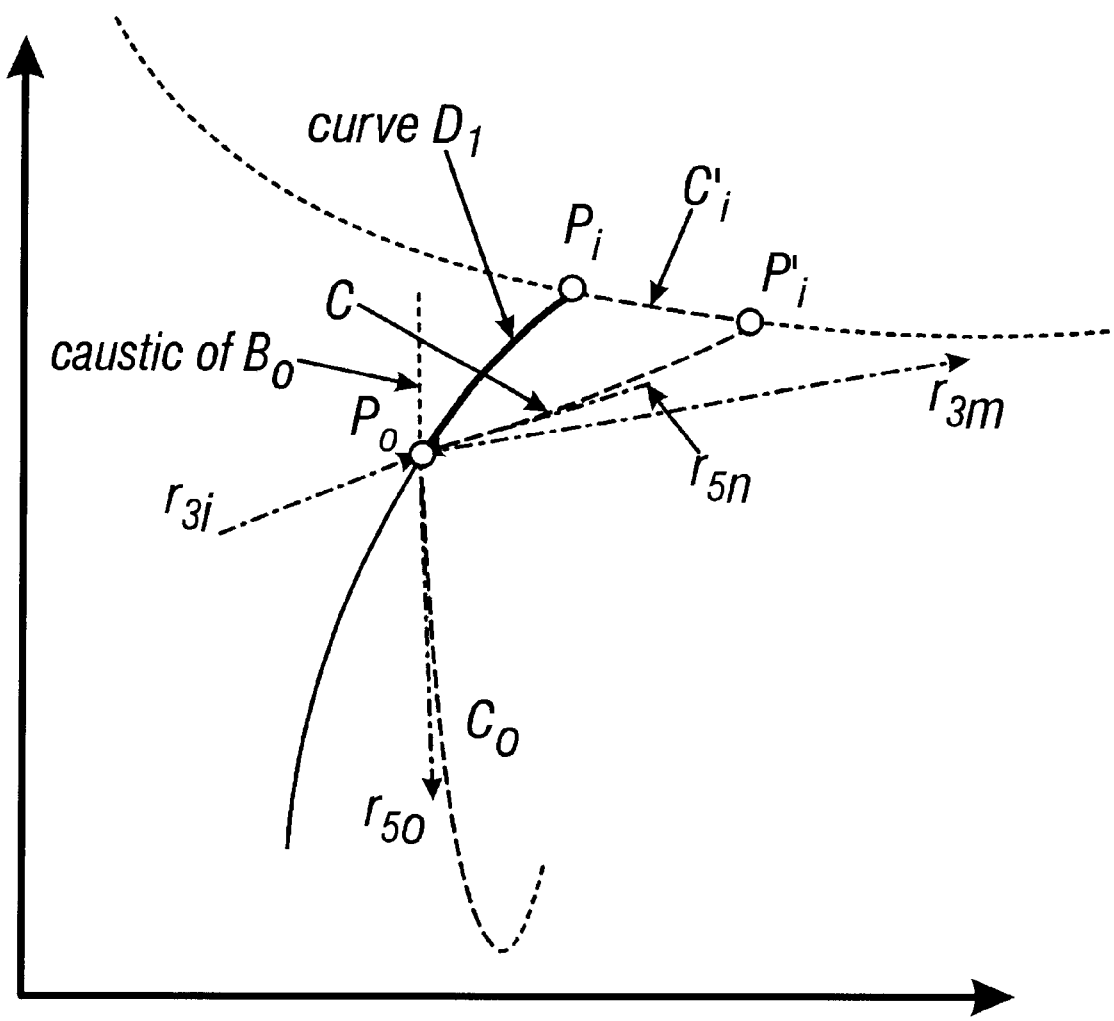
FIG. 33B is a graphical depiction in the x-z plane illustrating calculation of the caustic C.

FIG. 33B is a graphical depiction in the x-z plane illustrating calculation of the caustic C. In the XX design, a caustic C joining $P_i'$ and $P_o$ should be chosen (step 5 of the XX design procedure). We have already calculated this caustic C. C must fulfill the conditions of point 5, in section 2.2. If it doesn't, start this step again to find a new caustic C (see FIG. 33B). Remember that within the XX design procedure, the mirrors are considered to have one reflective side and they are considered to be transparent when impinged on from the non-reflective side of the mirror.

Figure 34:
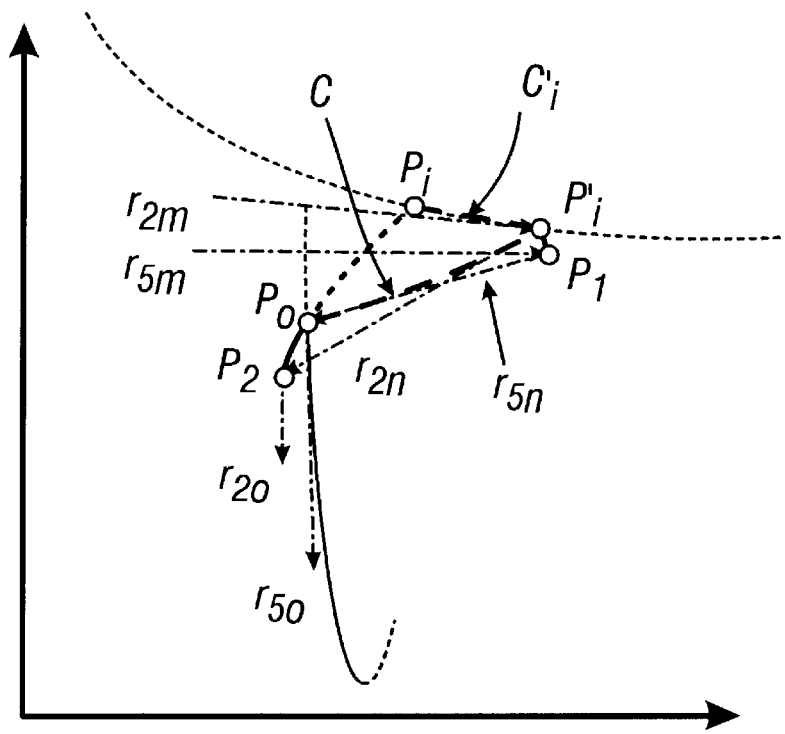
FIG. 34 is a graphical depiction in the x-z plane illustrating calculations that include the first part of the output line.

Step 8. FIG. 34 is a graphical depiction in the x-z plane illustrating calculations or the XX device. From steps 5, 6, 7, 8, 9, 10, 11 and 12 of the XX design (section 2.2) we calculate the first part of curve X ($P_i'$–$P_1$) and the second part of curve D ($P_o$–$P_2$). This second part of curve D is the first part of the output line in the XX design, as in FIG. 34.

Figure 35:
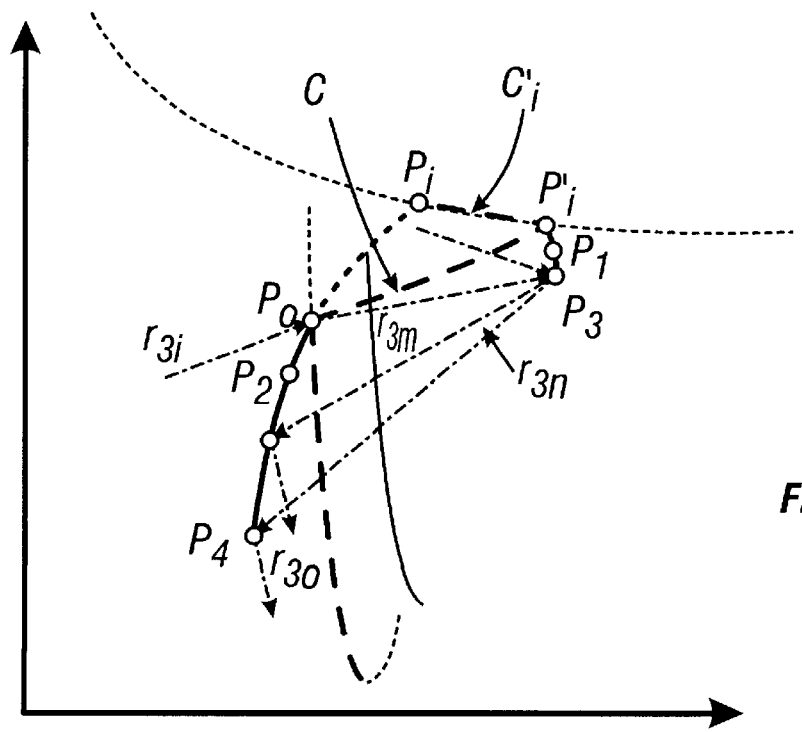
FIG. 35 is a graphical depiction in the x-z plane illustrating the step of calculating until the rays passing through $P_o$ are involved in the calculations.

FIG. 35 is a graphical depiction in the x-z plane illustrating the step of calculating the XX device until the rays passing through $P_o$ are involved in the calculations. The XX design procedure can be continued until the two rays of $\partial B_i'$ passing through $P_o$ are used for the calculation of points of the XX input and output optical lines (see FIG. 35).

Step 9. Trace the rays of $\partial B_i$ after refraction at the new portion of curve D calculated and calculate the new part of $\partial B_i'$.

Step 10. With the new part of $\partial B_1'$ the XX design can follow and new portions of the curve D are obtained. With the new portions of D, repeat steps 9 and 10, until the XX design is finished.

Figure 36:
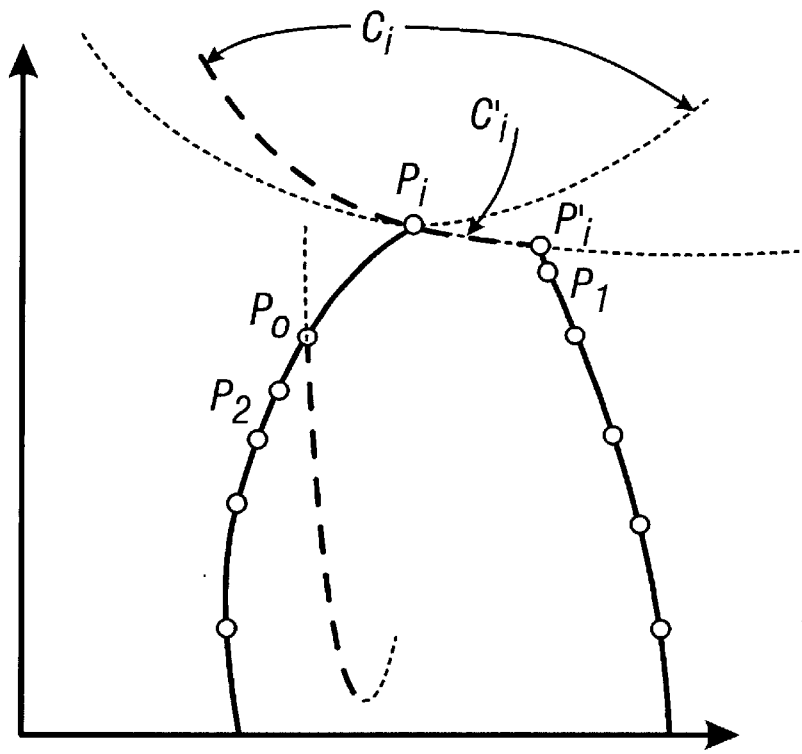
FIG. 36 is a graphical depiction in the x-z plane illustrating a finished design.

FIG. 36 is a graphical depiction in the x-z plane illustrating a finished design. The different portions of curves D and X have continuity in the slopes and curvature radius ($1^{st}$ and $2^{nd}$ derivatives).

The same considerations given in step 15 of section 2.2 apply here. Thus, it may be useful or required to repeat the design procedure to obtain curves D and X that are normal to the z axis at x=0. Also, as in the preceding (XX) case, there is a fraction of rays of $\partial B_i$ and $\partial B_o$ that do not get necessarily coupled. This fraction is negligible in the good designs and in some cases (particularly when the surfaces D and X are normal to the z-axis at x=0) the resulting device do couple all the rays of $\partial B_i$ and $\partial B_o$, at least up to the accuracy of conventional ray-tracing programs.

Step 11. Calculate the part of D where there are edge rays that cannot be reflected by TIR. Place a mirror on this region and keep clear the remaining part.

4. Other Considerations for the design Procedure

1) If the x-p representation of the edge ray bundles have discontinuities of dp/dx or segments x=constant, as in the case shown in FIG. 21B, an approximate curve without these characteristics should be chosen. For instance, assume that in the case of the rectangular representation shown in FIG. 21B, $\partial B_i$ is defined by the segments $x=x_e$, $x=-x_e$, for $-n_i \sin(\alpha_i) \leq p \leq n_i \sin(\alpha_i)$ and the segments $p=n_i \sin(\alpha_i)$, $p=n_i \sin(\alpha_i)$, for $-x_e \leq x \leq x_e$. This rectangle can be approximated by the equation:

$$\cos\left(\frac{\pi}{2}A\frac{x}{x_e}\right)\cos\left(\frac{\pi}{2}B\frac{p}{n_i \sin(\alpha_i)}\right) = C$$

where A and B are numbers close to 1 (above or below 1, provided the curve is contained in $|p|<n_i$) and C is a positive number close to zero. A good approximation is found with A=B=1.001, C=$\pi^2/4*10^{-6}$.

Assume that the derivatives dx/dω and dp/dω are continuous, but there are segments x=constant in the description of the edge ray bundles for the coordinates z corresponding to the points of the optical lines. In this case it is usually enough to change slightly the coordinates z of the points $P_i$ and $P_1$ to solve the problem.

2) Let us assume that we want to design a system that, for instance, must extract light from an emitter, which is a known optical system, and we must send it in a prescribed output bundle. In this case, we have to calculate the output bundle of the known optical system (this can be done by ray tracing or any other mean) and introduce this bundle as the input bundle in the preceding procedure. This is true for the case of an LED that is encapsulated in an epoxy dome. This epoxy shape would be the known optical system. A similar reasoning can be done with receivers of radiation. For instance, if we want to illuminate a photodiode which is encapsulated in a refractive dome, the output bundle for the concentrator design will be the one that illuminates the photodiode once it has been refracted by the dome.

3) In some cases (especially in the RXI, XX and XR designs), the resulting device is such that some rays of the input bundle rays intercept the output optical surface before than the input optical surface. Thus, the output optical line produces some shadowing on the input bundle. The design can be carried out without taking into consideration this shadowing and a final ray tracing will evaluate the effect of this shadowing.

4) The RR, RX, XR, XX design method disclosed herein is a generalization of the early SMS method in the references such as J. C. Miñano and Juan C. González, "New Method of Design of Nonimaging Concentrators" *Applied Optics*, 31 (1992) pp. 3051–3060; and J. C. Miñano, P. Benítez, J. C. González, "RX: a Nonimaging Concentrator", *Applied Optics*, 34:13 (1995) pp. 2226–2235. The method disclosed herein includes also the XX device, whose description was not done before. The method of design of RXI devices is completely new and simplifies and improves on the design method disclosed in the following reference: J. C. Miñano, J. C. González and P. Benítez, "RXI: A High-gain, Compact, Nonimaging Concentrator", *Applied Optics*, 34, 34 (1995) pp. 7850–7856. Unlike the previous algorithms, the design method disclosed herein typically doesn't require an iterative procedure.

Further, the design method in early SMS references is restricted to input and output bundles of the type called infinite source and finite source. Finite sources are the ones formed by all the rays that connect two given segments of the plane x-y. When one of the segments is a straight line infinitely far away from the other segment, then we have an infinite source. Infinite sources can be described in the phase space x-p (for some value of z) as a rectangle with sides parallel to the axes x and p. Finite sources, on the other hand, appear like a deformed rectangle. Because the x-p-description of these types of bundles has discontinuities on the dx/dp, they should be treated as a limit case in the new procedure (as explained before). Thus this new procedure is more general. Moreover, because the early SMS procedure does not take care of the discontinuities of the x-p representation of the bundles, the optical lines obtained have discontinuities in the second derivatives. The number of these discontinuities in one of the optical lines is equal to the number of portions needed to generate the curve times half of the discontinuities of the x-p representation of the bundle. This number can be large. The problem with these discontinuities shows up when a polynomial interpolation of the curves is required, for instance, when CNC equipment is being driven to create a mold or part.

5.0 Cartesian Oval Procedure

Let us assume that we have a certain region of the x-y plane where there are trajectories of two 1-parameter bundles of rays (let us call them a first bundle $B_1$ and a second bundle $B_2$) such that at any point of this region there is one and only one ray per bundle. We can construct the wavefronts of each bundle (this are just the lines normal to the rays) and thus we can calculate the functions $O_1(x, y)$ and $O_2(x, y)$ which give, respectively, the optical path length from the point x, y to a given reference wavefront for the bundle $B_1$ and $B_2$. There is a lack of definition in the sign of $O_1(x, y)$ and $O_2(x, y)$ which is solved if we define, with continuity, the direction in which the rays of both bundles proceed.

Figure 37:
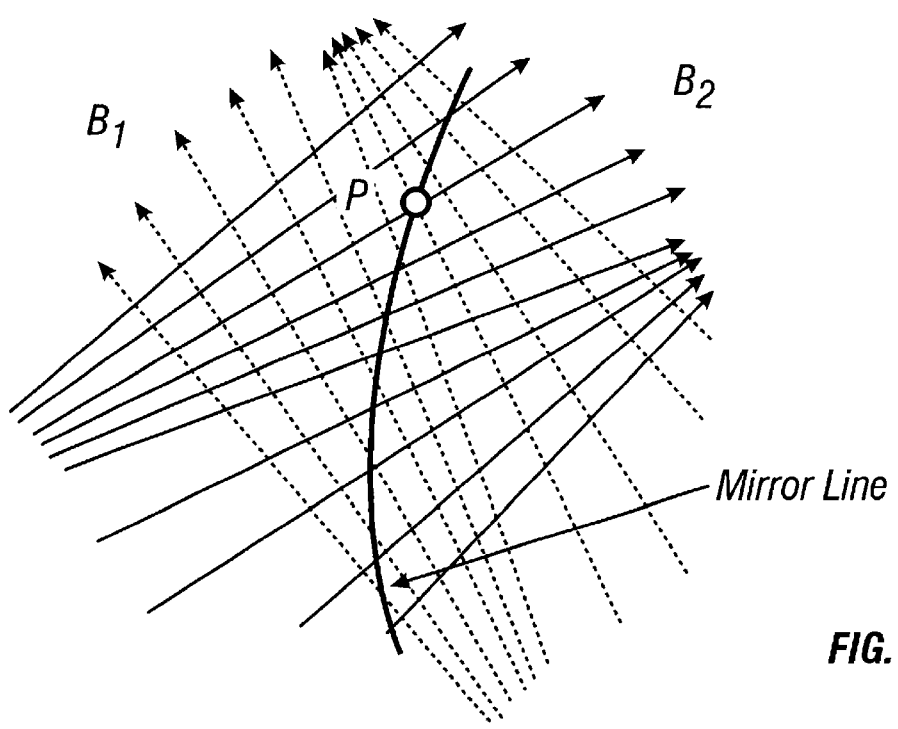
FIG. 37 is a graphical depiction in the x-z plane that illustrates construction of a mirror reflecting the first bundle $B_1$ into the second bundle $B_2$.

FIG. 37 is a graphical depiction in the x-z plane that illustrates construction of a mirror reflecting the first bundle B, into the second bundle $B_2$. We want to calculate the mirror profile such that the rays of one bundle are reflected and become rays of the other bundle. Assume also that we know the trajectory of a single ray of $B_1$ that is reflected at the point P and, after the reflection, becomes a ray of $B_2$. Then we can choose the wavefront passing through P as the reference wavefront for the calculation of $O_1(x, y)$ and $O_2(x, y)$. Then the equation of the mirror that we are looking for is simply given by the equation $O_1(x, y)=O_2(x, y)$, provided the solution is in the region of the x-y plane aforementioned, such as shown in FIG. 37.

Figure 38:
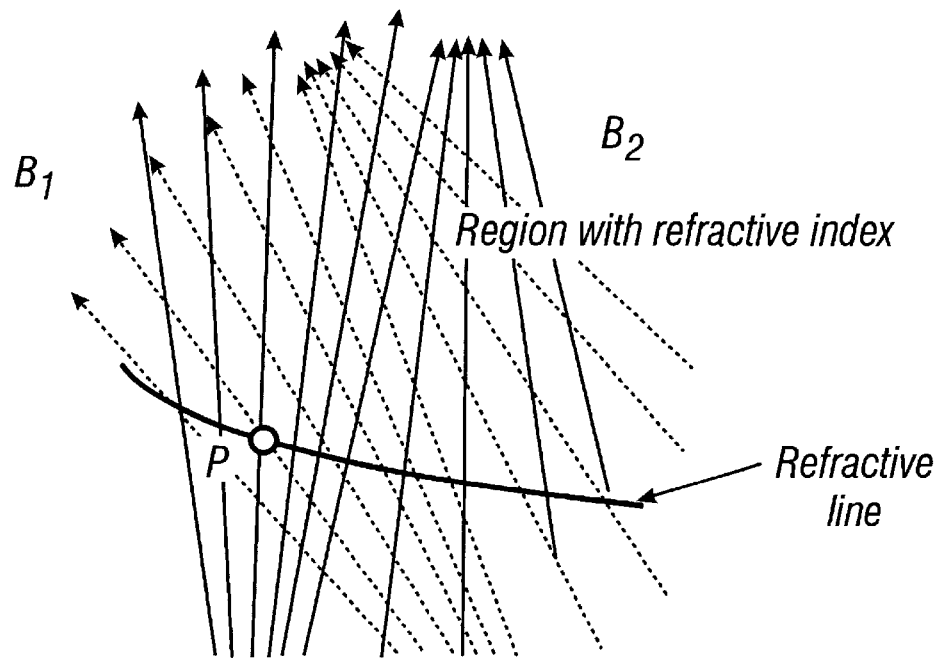
FIG. 38 is a graphical diagram in the x-z plane that illustrates construction of a refractive surface refracting the bundle $B_1$ into the bundle $B_2$.

FIG. 38 is a graphical diagram in the x-z plane that illustrates construction of a refractive surface refracting the bundle B, into the bundle $B_2$. We can also calculate the refractive line such that the rays of $B_1$ (coming from a media of refractive index $n_1$) when refracted at this line, become rays of $B_2$ in a medium of refractive index $n_2$ such as shown in FIG. 38. The equation of the line is the same as before, $O_1(x, y)=O_2(x, y)$, but now the functions $O_1(x, y)$ and $O_2(x, y)$ should include the refractive index factors since these functions are optical path lengths and not path lengths simply. We also need to know a point P of a single ray where the refractive line must pass through in order to have a common point for wavefront reference calculations. The equation $O_1(x, y)=O_2(x, y)$ is necessary but not sufficient for refractive lines. Thus, we should check that the rays of $B_1$ proceed through the region of refractive index $n_1$ before the refraction and that the rays of $B_2$ proceed through the region of $n_2$ after refraction.

This procedure is a generalization of the construction of Cartesian ovals and because of this it is called Cartesian ovals procedure.

6.0 Normal Vectors and Curvature Radius Definitions

Figure 39:
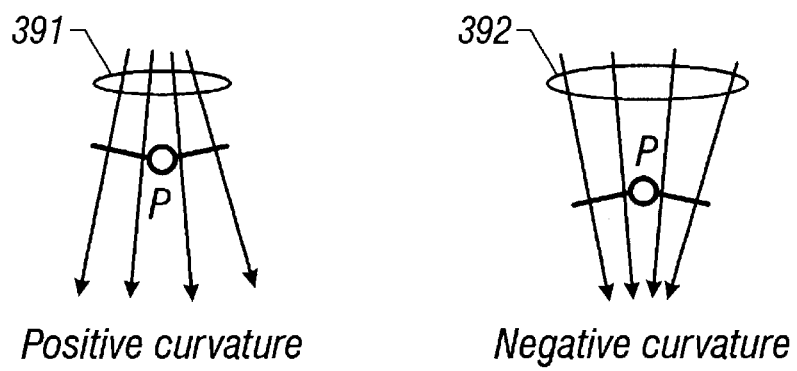
FIG. 39 is a diagram that illustrates diverging rays that have a positive curvature radius and converging rays that have a negative curvature radius.

FIG. 39 is a diagram that illustrates diverging rays 391 that have a positive curvature radius and converging rays 392 that have a negative curvature radius. We shall use the following definitions: the wavefront of a bundle of rays have a positive curvature radius at a point P, if the rays of the bundle are divergent at P and negative if they are convergent.

Figure 40:
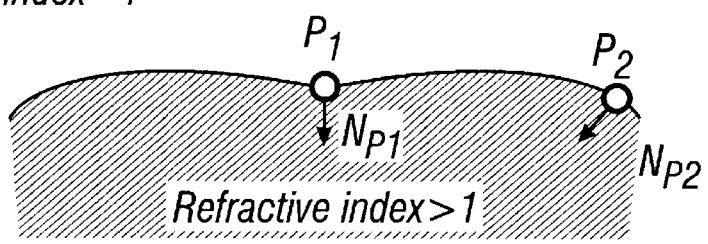
FIG. 40 is a cross-section of a portion of a refractive surface that exemplifies positive and negative curvatures.

FIG. 40 is a cross-section of a portion of a refractive surface that exemplifies positive and negative curvatures; in particular there is a negative curvature radius at point P, and a positive curvature radius at point $P_2$. FIG. 40 illustrates definitions of the sign of the curvature radius of the refractive surfaces and mirrors. For the optical lines (refractive surface and mirrors) of the RFI we shall define the normal vector to the line at a point P ($N_p$) to the one that points towards the medium with the highest refractive index. The definition is also valid for the mirrors because the mirrors also divide two regions of different refractive indices. The curvature radius is positive when the center of curvature is in the direction of the normal vector.

With the above definition of signs, the relationship between the curvature radius of the wavefronts before ($\rho_i$) and after ($\rho_r$) a refraction and the curvature radius of the line of refraction ($\rho_s$) is:

$$\frac{n_i \cos^2(\alpha_i)}{\rho_i} - \frac{n_r \cos^2(\alpha_r)}{\rho_r} = \frac{n_r \cos(\alpha_r) - n_i \cos(\alpha_i)}{\rho_s}$$

where $n_i$ is the refractive index of the medium before the refraction, $n_r$ is the refractive index of the medium after the refraction, $\alpha_i$ is the angle of between the incident ray and the normal to the refractive line and $\alpha_r$ is the angle of between the refracted ray and the normal to the refractive line, i.e., $\cos(\alpha_i)=P_i \cdot N$ and $\cos(\alpha_r)=P_r \cdot N$, where $P_i$ and $P_r$ are respectively the unitary ray-vectors of the incident and refracted rays and N is the unitary normal to the surface.

The relationship between the curvature radius of the wavefronts before ($\rho_i$) and after ($\rho_r$) a reflection and the curvature radius of the mirror line ($\rho_s$) is $$\cos(\alpha_r)\left(\frac{1}{\rho_i} - \frac{1}{\rho_r}\right) = \frac{2}{\rho_s}$$

where $\alpha_r$ is the angle of between the reflected ray and the normal to the mirror line, i.e., $\cos(\alpha_r)=P_r \cdot Nr$, where $P_r$ is the unitary ray-vector of the reflected ray and N is the unitary normal to the surface. Note that with the definition of normal that we use, $\cos(\alpha_r)>0$ for all the reflections within the RXI and the RX.

6.1 Reflection of a Caustic

When a caustic is reflected at a point P of a reflector, $\rho_s$ is not determined by the preceding equation, because $\rho_i$ and $\rho_r$ are both equal to zero.

At the point $P_o$ of the continuous line D of an RXI design, the continuity of the curvature radius is not ensured unless we fix a condition on the caustic C at the point $P_o$. This is because we have chosen freely the curvature radius of $D_1$ at $P_o$ and this should not be necessarily equal to the one we obtain for the remaining part of curve D at the same point.

The procedure for calculating C described above in Section 3.2, step 7 ensures the continuity of the curvature radius at $P_o$.

Method of Designing Transducers with Micro-Structured Surfaces

M1.0 Introduction

Figure 41:
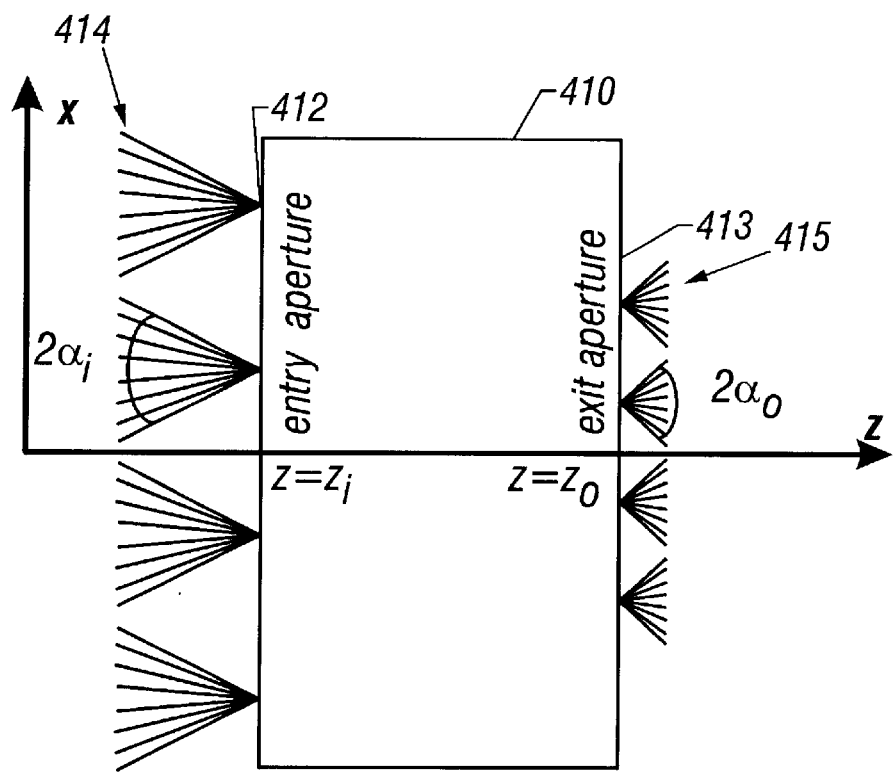
FIG. 41 is a 2D diagram of a transducer shown in block form, including an entry aperture and an exit aperture.

FIG. 41 is a 2D diagram of a transducer 410 shown in block form, including an entry aperture 412 and an exit aperture 413. The transducer shown in block 410 can have any of a variety of forms such as RX, RXI XR, XX, and RR, and it may be implemented in a variety of embodiments, such as a single dielectric or multiple components.

The entry aperture 412 receives a bundle of input rays $B_i$ shown at 414, and the exit aperture 413 emits a bundle of output rays $B_o$ shown at 415. In general, the transducer 410 optically transforms the input rays 414 into the output rays 415. The input bundle $B_i$ is formed by all the rays impinging upon the entry aperture (a given segment at $z=z_i$) with angles with respect to the z-axis between $-\alpha_i$ and $\alpha_i$, and the output bundle $B_o$ is formed of all the rays exiting the exit aperture (another given segment at $z=z_o$) with angles with respect to the z-axis between $-\alpha_o$ and $\alpha_o$. In the example shown in FIG. 41, the input and output bundles have a uniform distribution.

FIG. 41 illustrates an approach to 2D design used herein; generally, the design problem in 2D geometry can be stated as follows: an optical system including two optically active lines (refractive or reflective) and two apertures is designed such that if a given 2-parameter input bundle $B_i$ impinges in one of the apertures, then it exits the optical system as another prescribed 2-parameter output bundle $B_o$. The design is done in 2-dimensional (2D) geometry, i.e., the ray trajectories are contained in a plane and the optically active surfaces are lines in this plane. Thus, we will use the term optical line instead of optical surface.

For purposes of discussion, if no micro-structured surfaces are on a device, the design method provides an optical system in which any ray of $B_i$ exits the optical system as a ray of $B_o$, and any ray of $B_o$ comes from a ray of $B_i$ (this can be expressed as $B_i=B_o$). To be precise, the method doesn't fully guarantee $B_i=B_o$, but the optical designs obtained with this method can achieve this condition from a practical point of view, i.e., the etendue of the rays $B_i$ not exiting as rays of $B_o$ (and vice versa) can be made smaller than any positive value. However, when micro-structured surfaces are used on a device, not necessarily all the rays of $B_i$ exit the optical system as rays of $B_o$ or not all the rays of $B_o$ come from rays of $B_i$. Thus the etendue of both bundles is in general not the same. The aim for the usual design cases is to get as close as possible to the condition $B_i=B_o$, provided that any ray of one bundle (for instance $B_i$) is transformed by the optical system into a ray of the other bundle (this last condition is expressed as $B_i \subset B_o$).

Figure 42:
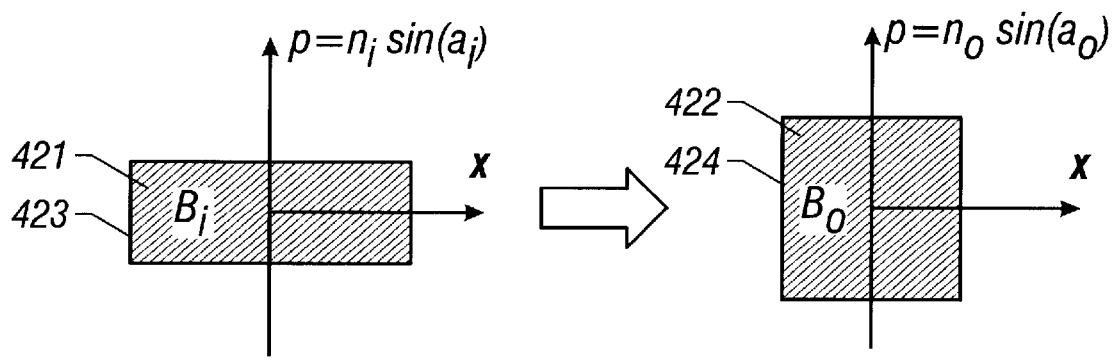
FIG. 42 is a phase-space representation of one example of all rays in input and output bundles $B_i$ and $B_o$ at $z=z_i$ and at $z=z_o$.

FIG. 42 is a phase-space representation of one example of all rays in input and output bundles $B_i$ and $B_o$ at $z=z_i$ and at $z=z_o$ respectively; particularly, the input bundle $B_i$ is represented by a rectangular area 421, and the output bundle $B_o$ is represented by a second rectangular area 422 that has a different rectangular shape. The edge rays of the input and output bundles are respectively shown at the rectangular boundaries 423 and 424. In general, each ray in these bundles is represented as a point in the phase-space x-p, where p is the optical direction cosine of the ray with respect to the x-axis, multiplied by the index of refraction (n). Herein, $n_i$ and $n_o$ are the refractive indices of the media at the entry and exit apertures respectively. The optical direction cosine with respect the z-axis is noted by r. The ray (x, r) is then the ray which passes through the point (x, $z_r$) having an angle with the x-axis equal to arcos(p/n), where n is the refractive index at the point (x, $Z_r$r). Different values of the co-ordinate z give different representations. FIG. 42 shows the representation in the x-p space of the bundles for the example shown in FIG. 41.

M2.0 Concept of Micro-structured Optical Line

A micro-structured optical line is defined as a line where the rays suffer a deflection, where deflection here means a change of the ray vector direction. A class of micro-structured lines can be characterized by its "law of deflection", which gives the direction of the ray after its deflection as a function of the direction of the incident ray and the unit normal to the line. For instance, if $P_i$ is the unitary incident ray vector, $P_d$ is the unitary deflected ray vector and N is the unitary normal to the line, then a law of deflection is a function $P_d=F(P_i, N, \phi)$, where $\phi$ is a parameter that is defined by the specific micro-structure. Because the function may not be defined for all possible values of $P_i$, N, $\phi$, the set of permitted values is called the domain of definition of the deflection law.

A micro-structured line can be characterized by its law of deflection, the equations of the line in parametric form x=x(s), z=z(s), (s is a parameter along the line) plus a function $\phi=\phi$s). The difference between a micro-structured and a non-micro-structured line is that the law of deflection in the latter case $P_d=F(P_i, N)$ does not depend on a parameter $\phi$. Thus the micro-structured lines give another degree of freedom. The equations x=x(s), z=z(s) will be called the micro-structured line equation.

Such micro-structured line will have losses, in general, i.e., not all the rays are deflected according to the law. Nevertheless, these losses will not be considered in the design procedure; the design procedure will consider that the law is fulfilled by all of the rays. Only after the design process is completed will the losses then be evaluated.

Figure 43:
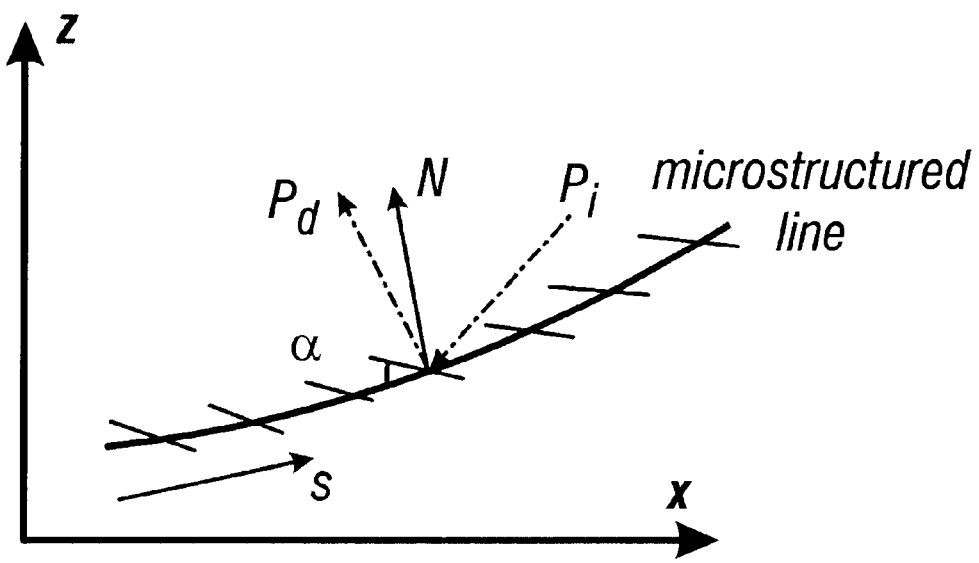
FIG. 43 is a graph of the x-z plane that shows an example of a micro-structured line.

FIG. 43 is a graph of the x-z plane that shows an example of a micro-structured line, which in this example is a Fresnel-like mirror line formed by small mirrors whose normal is not the same as the micro-structured line normal N.

The law of deflection here is just the law of reflection in the small mirrors. The slope of these mirrors relative to the tangent line is given by the angle $\alpha$, which in general is a function of the parameter s along the line ($\alpha=\alpha(s)$). This is the function $\phi(s)$ for this class of micro-structured lines. Thus the law of deflection is $P_d=P-2(N_m(\alpha) \cdot P_i) N_m(\alpha)$, where $N_m(\phi)$ is the normal to the small mirror, which is a function of N and $\alpha$.

Figure 44:
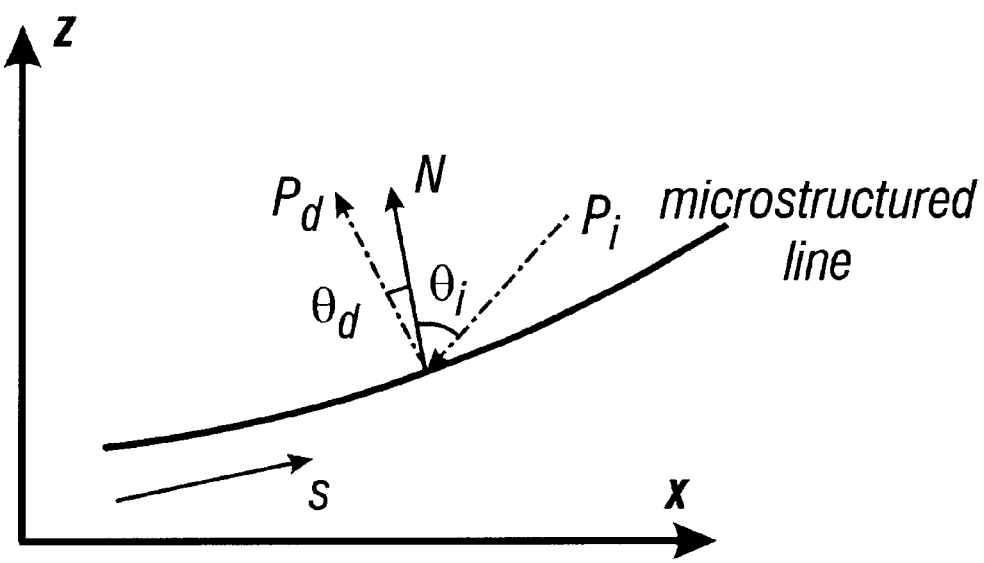
FIG. 44 is a graph of a micro-structured line, illustrating the law of deflection using an alternative definition from FIG. 43.

FIG. 44 is a graph of a micro-structured line, illustrating the law of deflection using the definition $\theta_d=\theta_i-2\alpha$. The etendue of a beam impinging on a portion of line ds forming angles within $\theta_i$ and $\theta_i$' can be written as $dE_i=ds(\sin\theta_i-\sin\theta'_i)$. This etendue does not coincide in general with the etendue of the deflected beam $dE_d=ds(\sin\theta_d-\sin\theta'_d)$. This means that either there are some rays of the impinging beam that are not deflected according to the law ($dE_i>dE_d$) or that not all of the deflected rays come from incident rays according to the law ($dE_i<dE_d$).

Although the edge ray principle can't be applied to micro-structured lines, the method will also look for an optical system that couples the edge ray bundles $\partial B_i$ and $\partial B_o$. The edge ray principle can't be rigorously applied here because the definition that we use of micro-structured line does not conserve the etendue of a bundle before and after deflection at the micro-structured line. Nevertheless, it has been found that if the optical system guarantees that $\partial B_i$ and $\partial B_o$ are coupled and that the etendue differential $dE_d \leq dE_i$ ($dE_d \geq dE_i$) for any point of the micro-structured line, then it is possible to find a real microstructure such that $B_i \supset B_o$ ($B_i \subset B_o$).

The following explanation is a description of a method of design of an optical system that transforms a given input bundle $\partial B_i$ in another output bundle $\partial B_o$ (and vice versa) using two optical lines, one of which or both is micro-structured.

M3.0 Design Procedure of the RF, FR, XF, FX and FF devices

We will construct an optical device consisting of paired optical lines, which have either one refractive surface and one micro-structured line (RF, FR), one mirror and one micro-structured line (XF, FX) or two micro-structured lines (FF). Three different cases of micro-structured lines will be considered: $F_d$, $F_m$ and $F_{dm}$ (see section M9.1 for a complete description). The input bundle $\partial B_i$ will impinge first on one of them, which is called the input optical line. Then the rays will intercept the output optical line and then they will exit the device as rays of $\partial B_o$. In this description, the rays of $\partial B_i$ proceed toward increasing values of z, so their optical direction cosines, r (the direction cosine multiplied by the index of refraction), with respect to the z-axis, are positive. The sign of r will change after a deflection at a mirror (X) or at a micro-structured line $F_m$ or $F_{dm}$.

M3.1 Selection of the Input and Output Edge Ray Bundles $\partial B_i$ and $\partial B_o$ The initial selection of the edge ray bundles $\partial B_i$ and $\partial B_o$ must substantially fulfill the following conditions:

Condition 1. The bundles $\partial B_i$ and $\partial B_o$ at $z=z_i$ and $z=z_o$, respectively, are closed curves in the x-p plane. (There is no restriction on the particular values of $z_i$ and $z_o$. It is advisable that $z_i$ and $z_o$ correspond to the z coordinate of a point of the entry and exit apertures respectively.) Now, these curves do not enclose the same area necessarily. If $B_o \supset B_i$, then the bundle $\partial B_i$ should enclose an area smaller or equal to the area enclosed by $\partial B_o$. However, if $B_i \supset B_o$, then the area enclosed by $\partial B_o$ should be smaller or equal to the one enclosed by $\partial B_i$.

Condition 2. There are no more than two edge rays of the input and output bundles $\partial B_i$ (or $\partial B_o$) for a single value of x at the points of the optical lines. However, this condition can only be checked completely at the end of the design procedure. Nevertheless, some bad selections that do not fulfill this condition can be detected early on in the process.

Condition 3. The input bundle $\partial B_i$ is contained in the region $-n_i < p < n_i$. The output bundle $\partial B_o$ is contained in the region $-n_o < p < n_o$.

Condition 4. There is a cyclic parameterization of the edge ray bundles $x=x(\phi)$, $p=p(\omega)$, such that the derivatives $dx/d\omega$, and $dp/d\omega$ are continuous.

M3.2 Selection of the Functions to Design

As seen before, a micro-structured line gives an additional degree of freedom compared to the non-micro-structured case because the function $\phi(s)$ cannot be derived from the equation of the line. The design procedure that will be shown needs only two functions to arrive at a design. In the non-micro-structured case, these two functions are the ones describing the two optical lines. Now we are going to consider three cases: 1) The micro-structured line equation is given and the function $\phi(s)$ as well as the equation of the non-micro-structured surface have to be calculated; 2) The equation of the nonmicro-structured line is given and we have to calculate the equation of the micro-structured line and its $\phi(s)$ function; and 3) When the optical system uses two micro-structured surfaces, their equations will be given and their $\phi(s)$ functions have to be calculated.

M3.3 Design Steps:

The method of designing a micro-structured RF, FR, XF, FX and FF device is described with reference to FIGS. 45 through 54.

Step 1. First, select $n_i$, $n_o$ and the relative position of the entry aperture with respect to the exit aperture. In the case of a $RF_d$ device, select also the refractive index media $n_m$ of the medium in between both optical lines.

Step 2. Select the class of micro-structured lines to be used, i.e., select its law of deflection $P_d = F(P_i, N, \phi)$.

Figure 45:
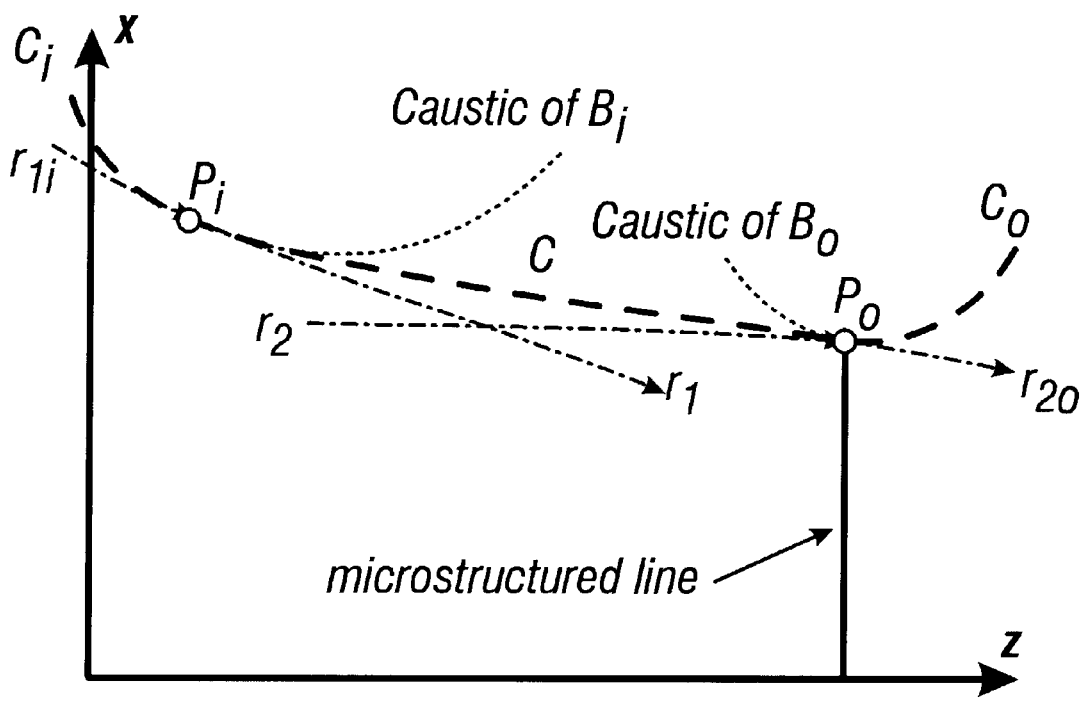
FIG. 45 is a graph illustrating construction of the caustic C.

Step 3. FIG. 45 is a graph illustrating construction of the caustic C, which is a combination of portions of the caustic $C_i$, $C_o$ and the curve between points $P_i$ and $P_o$. Calculate the outer caustics ($C_i$ and $C_o$) of $\partial B_i$ and $\partial B_o$. The outer caustics of $\partial B_i$ and $\partial B_o$ are defined as in the non-micro-structured case, i.e., as the lines that delimits in the x-z plane the region crossed by rays of $\partial B_i$ and $\partial B_i$ respectively.

Step 4. Select the micro-structured line(s) equation(s) (a z=constant line in the example of the Figures).

Step 5. Choose an x-positive point on $C_i$. This point $P_i$ will be the edge of the input optical line. If the input optical line is a micro-structured line, $P_i$ should also be on this line. Since $P_i$ is on $C_i$ there is a single ray of $\partial B_i$ passing through it. Let us call it $r_{1i}$. The point $P_i$ divides $C_i$ in two parts. Choose one of them. This part will be called $C_i$.

Step 6. Choose an x-positive point on $C_o$. This point $P_o$ will be the edge of the input optical line. If the output optical line is a micro-structured line, $P_o$ should also be on this line. Since $P_o$ is on $C_o$ there is a single ray of $\partial B_o$ passing through it. Let us call it $r_{2o}$. The point $P_o$ divides $C_o$ in two parts. Choose one of them. This part will be called $C_o$.

Step 7. Choose a curve C connecting $P_i$ and $P_o$ such that its tangents touch C at a single point. The curvature of C must be such that its tangents do not intersect $C_i$ in the neighborhood of $P_i$ neither intersects $C_O$ in the neighborhood of $P_o$ (except at the points $P_i$ and $P_o$, of course).

Step 8. Trace the tangent to C at $P_i$. This tangent will be called $r_1$. Check if there is a derivative of the input optical line at $P_i$ such that the ray $r_{1i}$ is deflected towards the ray $r_1$. If the input optical line is micro-structured, check if there is a value of $\phi$, such that the ray $r_{1i}$ is deflected towards the ray $r_1$, i.e., check if there is a value of $\phi$ such that $P_d = F(P_i, N, \phi)$ is satisfied for the ray vectors of $r_1$ and $r_{i1}$. Observe that N (normal vector to the micro-structured line) is known because the micro-structured line equation is known, as can be seen from FIG. 45.

Trace now the tangent to C at $P_o$. This tangent will be called $r_2$. Check if there is a derivative of the output optical line at $P_o$ such that the ray $r_{2o}$ comes from a deflection of the ray $r_2$. If the output optical line is micro-structured, check if there is a value of $\phi$ such that the ray $r_{2o}$ comes from a deflection of the ray $r_2$. If one of those checks fails, then return to step 3 and change the part of the caustics $\partial B_i$, $\partial B_o$ chosen, change the location of points $P_i$ and $P_o$ or change the curve C.

Figure 46:
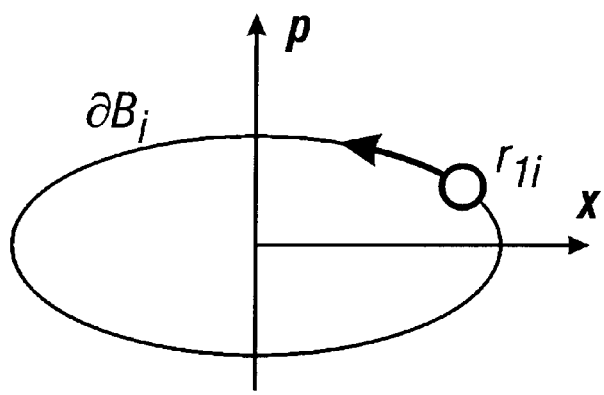
FIG. 46 is a phase-space diagram that illustrates the edge rays of the input bundle moving towards higher values of p.

Step 9. Trace the rays of $\partial B_i$ whose representation in the x-p plane is in the neighborhood of $r_{1i}$, by moving anti-clockwise from $r_{1i}$, in such a way that the first rays traced are those that are not tangent to $C_i$. FIG. 46 is a representation in a phase-space diagram, that illustrates the rays of $\partial B_i$ moving towards higher values of p. Calculate their optical path length taking the wavefront passing through $P_i$ as the reference wavefront. In the neighborhood of point $P_i$ there is a region whose points are crossed by a single ray of the input bundle $\partial B_i$ not tangent to $C_i$. Thus we can construct in this region a single-valued function $L_{i1}(x, z)$ which gives the optical path length. If the input optical line is a micro-structured line, then calculate the optical path length according to section M9.2.

Step 10. Trace the tangents to C from the point of tangency towards the direction of $P_i$. Note this direction is completely defined because at any point of C we have the direction along the curve towards $P_i$ and the direction towards $P_o$. These tangents will be optical paths. Calculate the optical path length $L_1(x, z)$ taking the wavefront passing through $P_i$ as the reference wavefront and considering that these rays proceed towards the point of tangency with C. Note that the optical path length from the wavefront passing by $P_i$ to the point x, z can be calculated by the taking the integration along the curve C (which is a caustic) until the point of tangency and adding it to the optical path length along the ray from the point of tangency to the point x, z.

Figure 47:
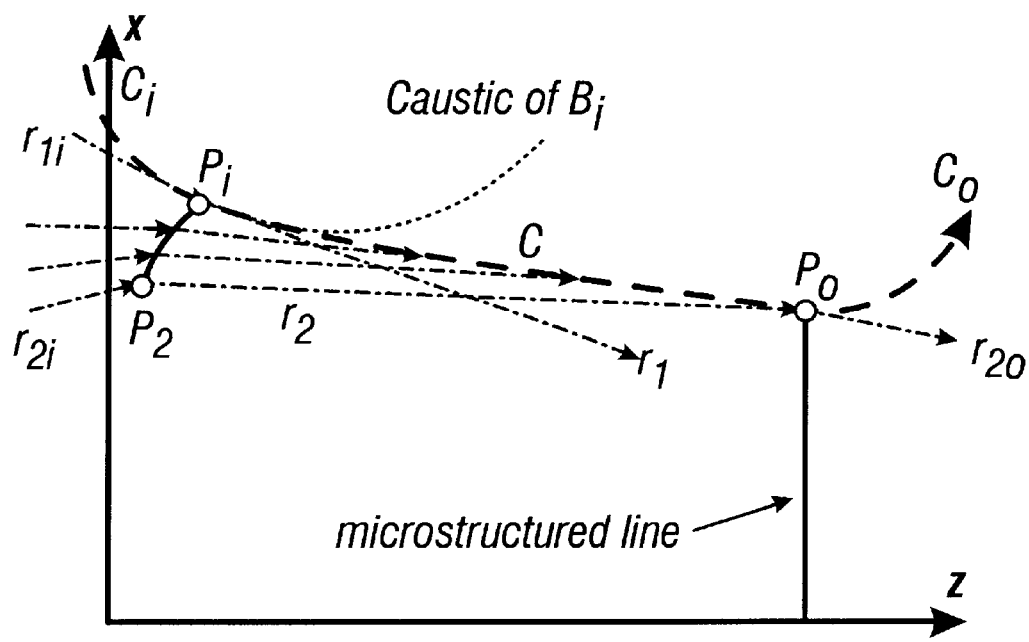
FIG. 47 is a graph in the x-z plane that illustrates construction of the first part of the input optical line.

Step 11. FIG. 47 is a graph in the x-z plane that illustrates construction of the first part of the input optical line. Calculate the first part of the input optical line with the equation $L_{i1}(x, z) = L_1(x, z)$. Take the portion of the curve given by this equation from $P_i$ to $P_2$ (see FIG. 47). $P_2$ is the point crossed by the ray $r_{2i}$, which is the ray of $\partial B_i$ (not tangent to $C_i$) that passes through $P_o$. This calculation is described in section M7.0. Check if this curve does connect the points $P_i$ and $P_2$. In the case if it is a RF type design, check also that the curve from $P_2$ to $P_i$ is a valid refractive surface, since the Cartesian oval procedure does not guarantee this. In all the cases check also that there are no caustics crossing the new curve. This can be done by simple inspection because if they appear, the curve from $P_2$ to $P_i$ has kinks or loops.

If the input optical line is micro-structured, then calculate the value of $\phi$ along the micro-structured curve from $P_i$ to $P_2$. Check whether the values of $\phi$ and of the incident and deflected ray vectors are in the valid domain of definition of the deflection law.

If one of these checks fails, then go to steps 1, 4, 5, 6, or 7 and change at least one parameter.

Figure 48:
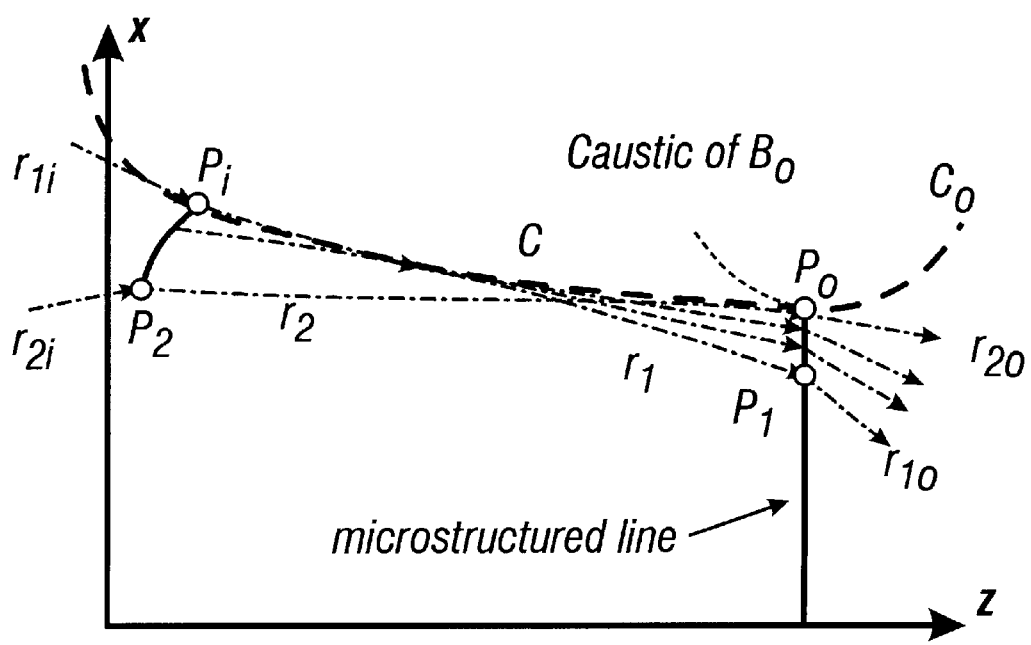
FIG. 48 is a graph in the x-z plane that illustrates construction of the first part of the output optical line.

Step 12. FIG. 48 is a graph in the x-z plane that illustrates construction of the first part of the output optical line. In a similar way as in steps 9 to 11, the first portion of the output optical line is next calculated. Trace the rays of $\partial B_o$ whose representation in the x-p plane is in the neighborhood of $r_{2o}$ moving clockwise from $r_{2o}$, in such a way that the first rays traced are those that are not tangent to $C_o$ (moving towards lower values of p in the example shown FIG. 48.) Calculate their optical path length taking the wavefront passing through $P_o$ as the reference wavefront. In the neighborhood $P_o$ there is also a region whose points are crossed by a single ray of $\partial B_o$ that is not tangent to $C_o$. Thus we can construct in this region a single-valued function $L_{o2}(x, z)$ giving the optical path length.

Step 13. Trace the tangents to C from the point of tangency towards the direction of $P_o$. Calculate the optical path length $L_2(x, z)$ taking the wavefront passing through $P_o$ as the reference wavefront and considering that these rays proceed from the point of tangency with C. Note again that the optical path length from the wavefront passing by Po to the point x, z can be calculated by the taking the integration along the curve C (which is a caustic) until the point of tangency and adding it to the optical path length along the ray from the point of tangency to the point x, z.

Figure 49:
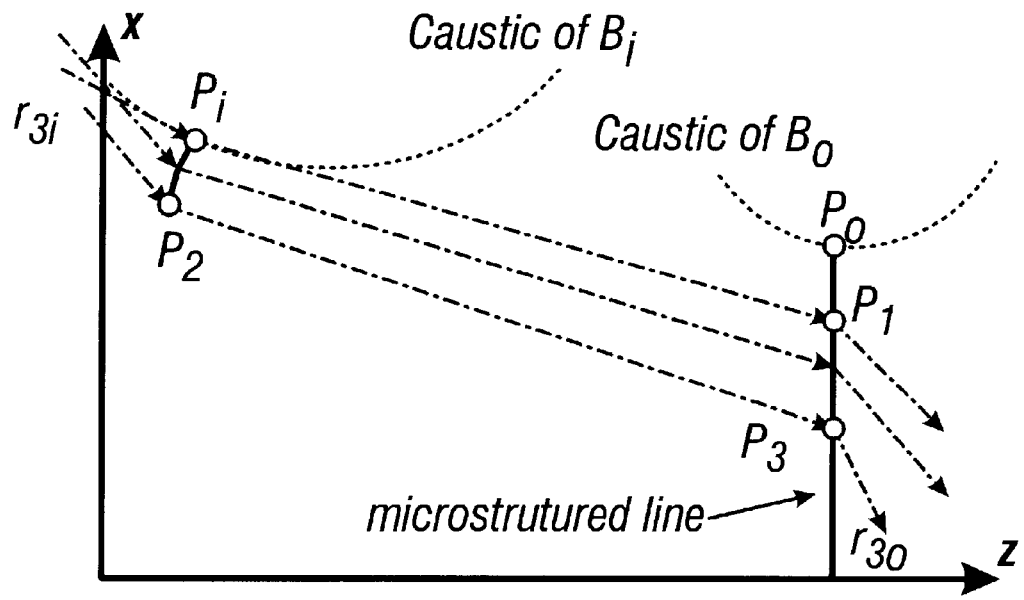
FIG. 49 is a graph in the x-z plane that illustrates calculation of the second part of the output optical line.

Step 14. FIG. 49 is a graph in the x-z plane that illustrates calculation of the second part of the output optical line. Calculate the first part of the output optical line with the equation $L_{o2}(x, z) = L_2(x, z)$. Take the portion of the curve given by this equation from $P_o$ to $P_1$ as shown in FIG. 49. $P_1$ is the point crossed by the ray $r_{1o}$, which is the ray of $\partial B_i$ (not tangent to $C_i$) that passes through $P_i$. Check if this curve does connect the points $P_o$ and $P_1$. In the case of the design for a RR and XR, check also that the curve from $P_o$ to $P_1$ is a valid refractive surface. In all the cases check also that there are no caustics crossing the new curve.

If the output optical line is micro-structured, then calculate the value of $\phi$ along the micro-structured curve from $P_o$ to $P_1$, Check if the values of $\phi$ and of the incident and deflected ray vectors are in the valid domain of definition of the deflection law.

If one of these checks fails, go to Section M3.3, steps 1, 4, 5, 6, or 7 and change at least one parameter.

Step 15. At this point the portion $P_2-P_i$ of the input optical line and $P_1-P_o$ of the output optical line are known. If the input (output) optical lines are micro-structured, what we have calculated are the values of $\phi$ from $P_2$ to $P_i$ (or from $P_1$ to $P_o$) Thus these portions are completely known. Trace, through the portion $P_2-P_i$ of the input optical line, the rays of $\partial B_i$ not traced before, i.e., trace the rays of $\partial B_i$ whose representation in the x-p plane is in the neighborhood of $r_{1i}$ moving clockwise from $r_{1i}$, in such a way that the first rays traced are those that are tangent to $C_1$ (the edge rays crossing the portion $P_2-P_i$ with the smaller values of p in the example). In the case of micro-structured lines the deflection should be done according to their deflection law. Calculate, after the deflection at this curve, the optical path length function taking the wavefront at $P_i$ as the reference wavefront, in a similar way as done in step M9 i.e., using the procedure described in section M9.2 for the case of micro-structured lines. Calculate also the optical path length of the edge rays $\partial B_o$ in a neighborhood of $r_{1o}$, moving clockwise in the phase-space representation. Use also the wavefront passing through $P_i$ as the reference wavefront. Note that this optical path length at a point x, z can be calculated by integration from $P_i$ to $P_o$ along the caustic C and from $P_o$ to the point x, z. Obtain a new portion $P_3-P_1$ of the output optical line with the Cartesian oval procedure ($P_3$ is the point of the output optical line crossed by the ray coming from $P_2$, i.e., the ray $r_{3i}$, which leaves $P_3$ as $r_{3o}$). For a micro-structured output optical line obtain the values of $\phi$ for the points from $P_3$ to $P_1$. The same checks as done in step 11 should be done here. In case of failure, go to Section M3.3, steps 1, 4, 5, 6, or 7 and change at least one parameter.

Figure 50:
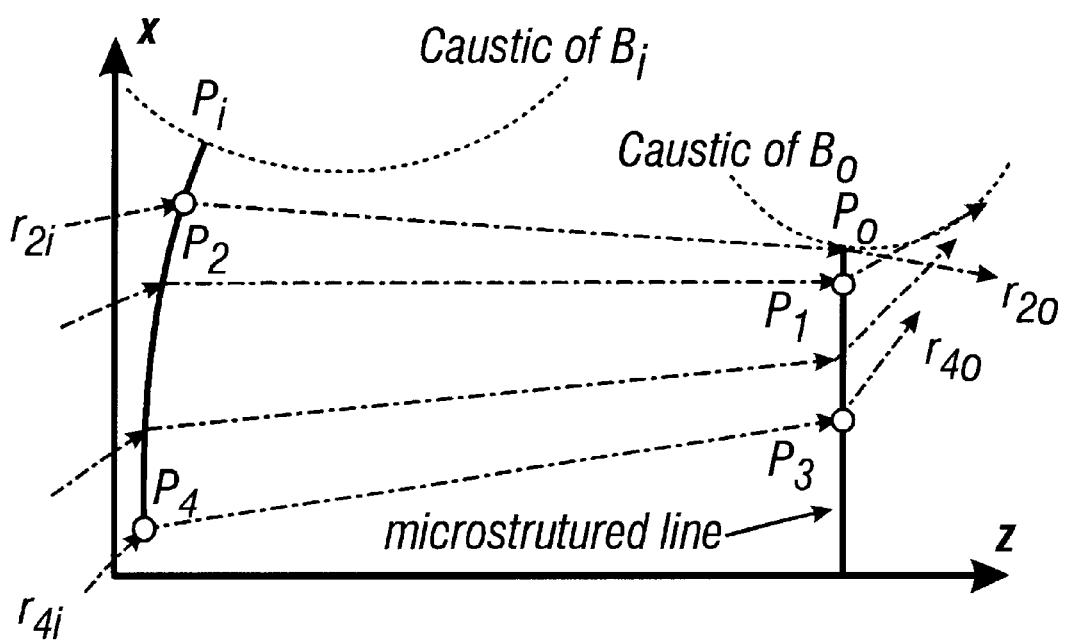
FIG. 50 is a graph in the x-z plane that illustrates calculation of the second part of the input optical line of an RR device.

Step 16. FIG. 50 is a graph in the x-z plane that illustrates calculation of the second part of the input optical line of an RR device. At this point the portion $P_2-P_i$ of the input optical line and $P_3-P_o$ of the output optical line are known. Trace back through the portion $P_3-P_o$ of the output optical line, the rays of $\partial B_o$ not traced before, i.e., the rays crossing this portion with the higher values of p (see FIG. 50). Calculate, before the deflection at this curve, the optical path length function taking the wavefront at $P_i$ as the reference wavefront. Calculate also the optical path length of the rays in a neighborhood of $r_{2i}$, moving anticlockwise in the phase-space representation. Obtain a new portion $P_2-P_4$ of the input optical line with the procedure described in section M7.0 ($P_4$ is the point of the input optical line crossed by the ray traced back from $P_3$, i.e., $r_{4i}$ impinges at $P_4$ and leaves through $P_3$ as $r_{4o}$). In the case of micro-structured input optical line use the procedure described in section M9.2. The same checks as done in step 11 should be done here. In case of failure, go to Section M3.3, steps 1, 4, 5, 6, or 7 and change at least one parameter.

Figure 51:
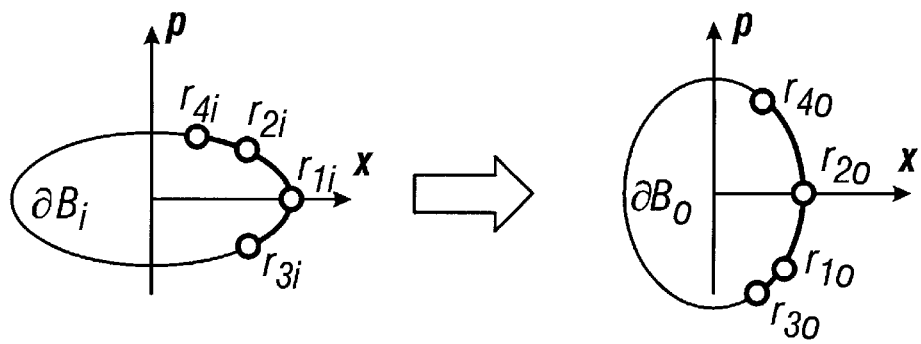
FIG. 51 is a phase-space representation of the certain rays of the input edge ray bundle, and certain rays of the output edge ray bundle.

FIG. 51 is a phase-space representation of the rays $r_{1i}$, $r_{2i}$, $r_{3i}$, $r_{4i}$ of the input edge ray bundle $\partial B_i$ for a $z=z_{pi}$, and representation of $r_{1o}$, $r_{2o}$, $r_{3o}$, $r_{4o}$ of the output edge ray bundle $\partial B_o$ for $z=z_{po}$. FIG. 51 shows the location in the phase-space x-p of the significant rays involved in the process. Unlike the representations presented before, in this case the representation of $\partial B_i$ is done at a z coordinate equal to the z coordinate of the point $P_i$ ($\partial B_o$ is represented at $z=z_{po}$). For this reason the rays $r_{1i}$ and $r_{2o}$ (which are, respectively, in the caustics $C_i$ and $C_O$) have, in this representation, a dx/dp=0.

Figure 52:
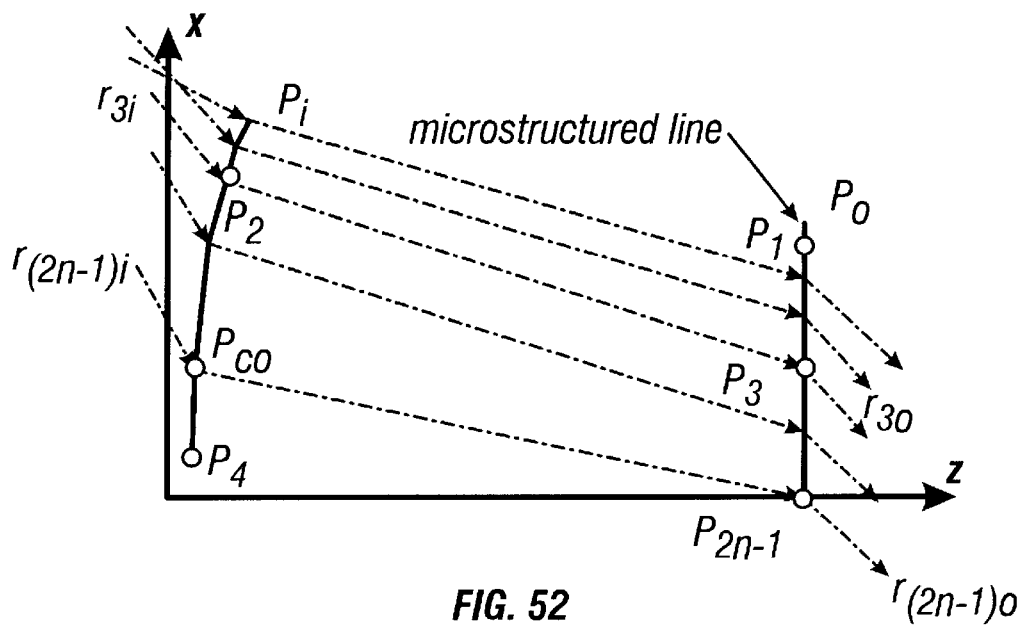
FIG. 52 is a graph in the x-z plane that illustrates calculation of the last part of the output optical line of an RF device.
Figure 53:
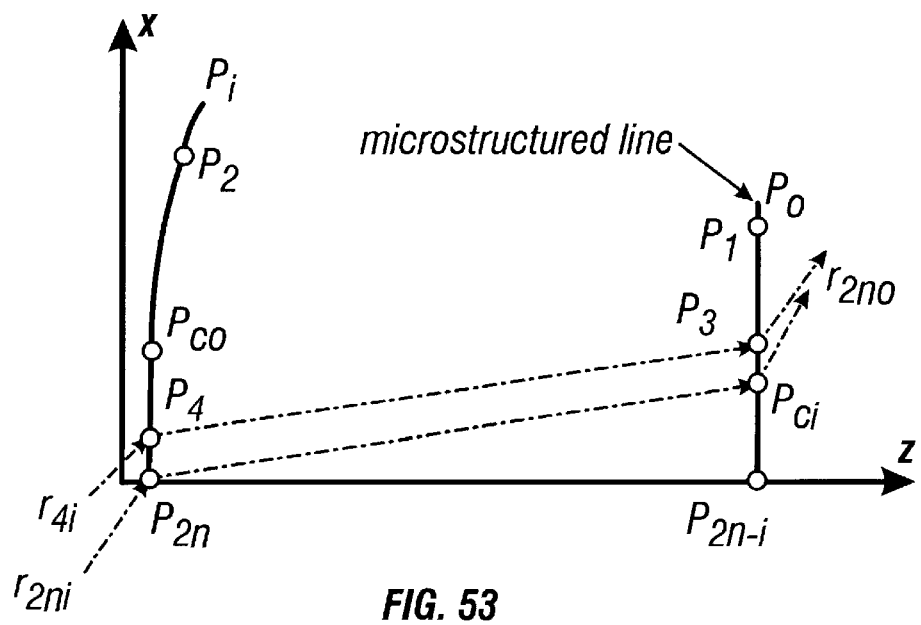
FIG. 53 is a graph in the x-z plane that illustrates calculation of the last part of the input optical line of an RF device.

Step 17. FIG. 52 is a graph in the x-z plane that illustrates calculation of the last part of the output optical line of an RF device. FIG. 53 is a graph in the x-z plane that illustrates calculation of the last part of the input optical line of an RF device. In a similar way as the one described in steps 15 and 16, new portions of the input and output optical lines can be obtained from the previous ones. The process is continued until the two lines reach the z-axis. In the case shown in FIGS. 52 and 53, the process finishes in the second round of steps 15 and 16. However, it has been found that in the usual case is it is useful to about 30–100 rounds (repetitions) of these steps.

Figure 54:
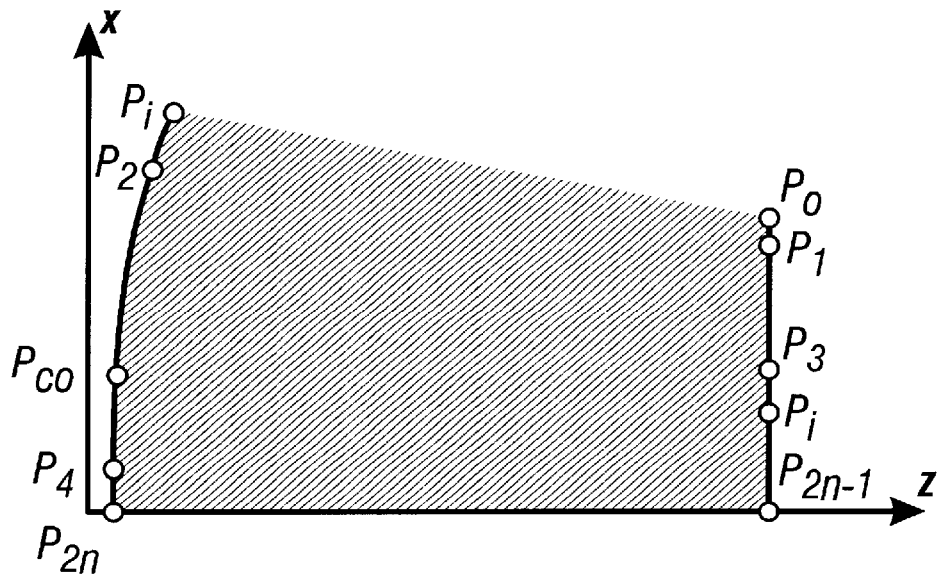
FIG. 54 is a diagram of a cross-section of a completed RF x-positive device.

FIG. 54 is a diagram of a cross-section of a completed RF x-positive in this example. Not all the edge rays of $\partial B_i$ can be perfectly coupled to the rays of $\partial B_o$. In particular, not all the edge rays passing through the last portions of the optical lines can be coupled because there are not enough degrees of freedom. The significance of this effect is small if the last segments of the optical lines are small. The size of these segments is related to the positions of $P_i$, $P_o$, and the relative position of the input and output bundles. Thus a proper selection of the input parameters will reduce this effect. Note also that the 3D device is obtained by rotational symmetry around the z axis and thus, the central part of the optical lines generate a surface of relatively small area if it is compared with the area generated by the initial parts of the optical lines.

Since the actual 3D optical devices are obtained by rotational symmetry around the z-axis (or in some cases by extrusion along a space curve), it is advisable to iterate the design procedure to obtain a normal to the optical lines at x=0 that is parallel to the z-axis. This can be done varying the input parameters. For the usual input and output bundles, when this condition on the normal vectors is fulfilled, the effect of imperfect coupling between $\partial B_i$ and $\partial B_o$ is negligible.

Step 18. Once the function $\phi(s)$ of each one of the micro-structured lines has been calculated it is possible to design the shape of the micro-structures of the line. $\phi$ determines the slope of the micro-mirrors in the $F_m$ lines, and the slope of the grooves of the $F_d$ lines and the $F_{dm}$ lines. The procedure to get these slopes is described in section M9.3.

M4.0 $RF_m I$ Device Design Procedure

The design procedure for creating a micro-structured $RF_m I$ device is described with reference to FIGS. 55 through 60. An optical transducer device is defined by two optical lines, one of the lines being a line where the refractive index changes abruptly. This line, called curve D, will behave as a refractive surface or as a reflector (by total internal reflection) depending on the incidence angle on this line. The other line is a micro-structured reflector. It will be called curve $F_m$. The input bundle $\partial B_i$ will impinge first on the curve D. Then the rays will intercept the other optical line and will be reflected towards the curve D where they are reflected again. Then they will exit the device as rays of $\partial B_o$. The rays of the input and output bundles $\partial B_i$ and $\partial B_o$ are assumed to proceed towards increasing values of z, i.e., all of their optical direction cosines with respect the z-axis (p) are positive. When the rays are between the reflection at $F_m$ and the reflection at the curve D, their optical direction cosines with respect to the z-axis are negative $r \leq 0$.

In the design procedure, the curve D is considered a refractive surface for the rays of $\partial B_i$, and it is considered a mirror for any rays after the reflection point starts on the curve $F_m$, whether or not the total internal reflection (TIR) condition is fulfilled. When the design is finished, a mirror should be placed at the points on D where the TIR condition is not fulfilled. Although this mirror creates an obstacle for the input bundle $B_i$, in the good designs this mirror obstacle has a negligible effect on such a parameter as the transmission efficiency.

M4.1 Selection of the Input and Output Edge ray Bundles $\partial B_i$ and $\partial B_o$ In this design, the edge ray bundles $\partial B_i$ and $\partial B_o$ must fulfill the following conditions:

Condition 1. The bundles $\partial B_i$ and $\partial B_o$ at $z=z_i$ and $z=z_o$, respectively, are closed curves in the x-p plane. Now, these curves do not necessarily enclose the same area. If $B_o \supset B_i$, is desired, then the bundle $\partial B_i$ should enclose an area smaller than or equal to the area enclosed by $\partial B_o$. If $B_i \supset B_o$ then the area enclosed by $\partial B_o$ should be smaller than or equal to the one enclosed by $\partial B_i$.

Condition 2. There are no more than two edge rays of $\partial B_i$ (or $\partial B_o$) for a single value of x at the points of the optical lines. This condition can only be checked at the end of the design procedure. Nevertheless, some bad selections that do not fulfill this condition can be detected from the beginning.

Condition 3. The input bundle $\partial B_i$ is contained in the region $-n_i < p < n_i$. The output bundle $\partial B_o$ is contained in the region $-n_o < p < n_o$.

Condition 4. There is a cyclic parameterization of the edge ray bundles $x=x(\omega)$, $p=p(\omega)$, such that the derivatives $dx/d\omega$, and $dp/d\omega$ are continuous.

M4.2 Design Steps:

FIGS. 55 through 60 illustrate steps for designing a micro-structured $RF_m I$ device.

Figure 55:
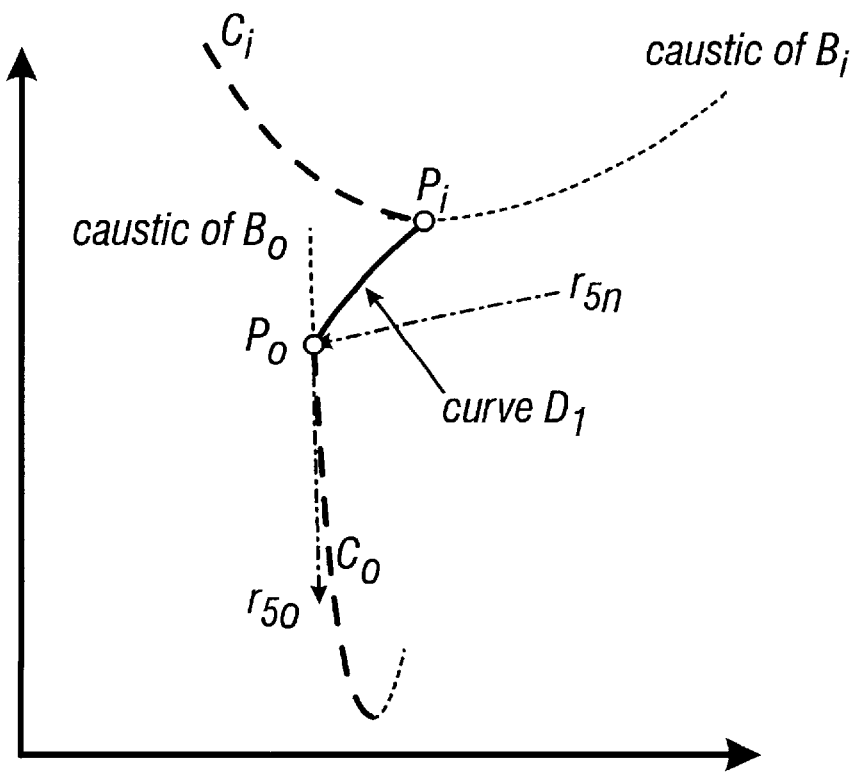
FIG. 55 is a diagram that illustrates the process for selecting the entry and exit apertures of the $RF_mI$ and the initial curve $D_1$.

Step 1. FIG. 55 illustrates the process for selecting the entry and exit apertures of the $RF_m I$ and the initial curve $D_1$. First, select $n_i$, $n_o$ and the relative position of the entry aperture with respect to the exit aperture.

Step 2. Calculate the outer caustics ($C_i$ and $C_o$) of $\partial B_i$ and $\partial B_o$. The outer caustics of $\partial B_i$ and $\partial B_o$ are defined as in the non-micro-structured case, i.e., as the lines that delimit in the x-z plane the region crossed, respectively, by the rays of $\partial B_i$ and $\partial B_o$.

Step 3. Select the micro-structured line equation (a z=constant line in the example of the Figures). It must be symmetric with respect the z-axis.

Figure 56:
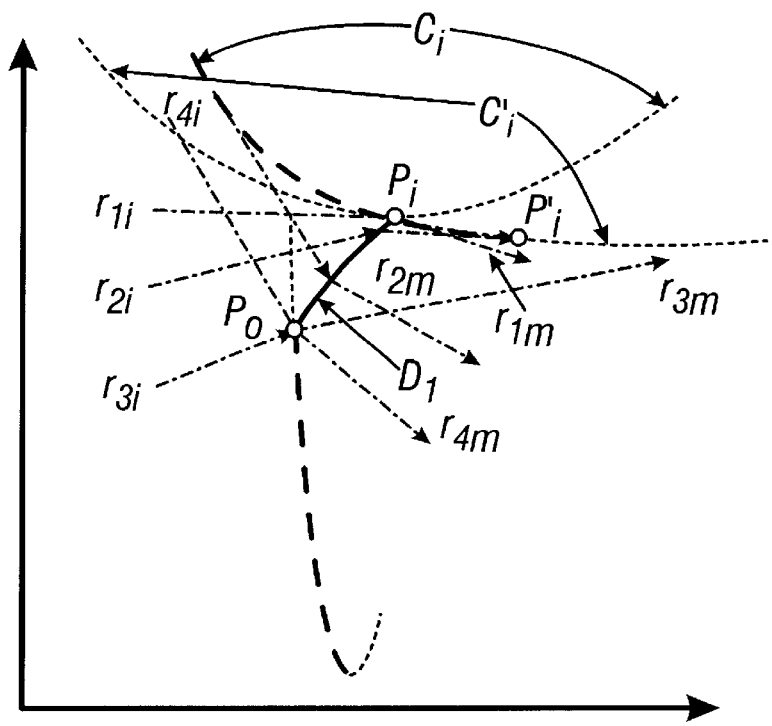
FIG. 56 illustrates calculation of the edge rays of the input bundle $\partial B_i'$ obtained by refraction of the input bundle $\partial B_i$ at the curve $D_1$.

Step 4. FIG. 56 illustrates calculation of the edge rays of the input bundle $\partial B_i'$ obtained by refraction of $\partial B_i$ at the curve $D_1$. Calculate the outer caustics ($C_i$ and $C_o$) of $\partial B_i$ and $\partial B_o$. The outer caustics of $\partial B_i$ and $\partial B_o$ are defined as shown in FIG. 56.

Step. 5. Select a point $P_i$ of $C_i$ and a point $P_o$ of $C_o$ such that $P_i$ is in a region of the x-y plane not crossed by any ray of $\partial B_o$. In the case that there is an obstacle for the bundles of $\partial B_o$ in the final design, then it suffices to check that the rays $\partial B_o$ do not cross $P_i$ before they meet the obstacle. For instance, if design is done to illuminate with $B_o$ a certain opaque receiver, then all we need is that the rays $\partial B_o$ don't cross $P_i$ in their trajectories before reaching the receiver.

Step 6. Choose a smooth curve $D_1$ joining the points $P_i$ and $P_o$. This curve will be part of the optical line D. The refractive index of the right side of D is the highest. The curve $D_1$ has to be chosen constrained to the condition that the ray $r_{5o}$, which is tangent to $C_o$ at $P_o$, suffers a total internal reflection at $P_o$ when traced backwards, i.e., when traced towards the ray $r_{5n}$.

Step 7. Trace the rays of the bundle $\partial B_i$ that impinges on the curve $D_1$. Trace them after the refraction at this curve. The impinging rays are illustrated at $r_{1i}$ through $r_{4i}$ and the corresponding refracted rays are illustrated at $r_{1M}$ through $r_{4M}$. With this, we have calculated part the bundle $\partial B_i$ after refraction at D. This bundle after refraction is called $\partial B_i'$ (see FIG. 56). Since, the part of the bundle $\partial B_i$ traced is in the neighborhood of the caustic $C_i$, we will be able to calculate part of the outer caustic of $\partial B_i'$ which is called $C_i'$. If $P_i$ is close to $P_o$, then the calculable part of $C_i'$ will be short. If the curve $D_1$ is not smooth enough, then it may form additional caustics that would be able to intercept the parts of the optical lines that haven't yet been calculated.

Step 8. Check that the calculated part of $\partial B_i'$ fulfills conditions 2 and 3 of the preceding Section M4.1 If not, go to step 6 and choose another curve $D_1$.

Step 9. Choose a smooth remaining part of curve D (from $P_o$ to the z-axis) such that it is normal to the z axis at $x=0$ and such that, together with $D_1$, it has, at least, first and second continuous derivatives. Trace back the edge rays of $\partial B_o$ in the neighborhood of $r_{5o}$ moving clockwise in the x-p phase space representation, in such a way that the first rays traced are those tangent to the outer caustic of $fB_o$ that are not tangent to $C_o$. Consider that D is a reflector and calculate the trajectories of these rays before reflection at D. These rays will generate a caustic C that passes by $P_o$. The point of intersection of C and $C_i'$ is called $P_i'$. If there is no intersection between C and $C_i'$ (or if the intersection point is just the edge of the $C_i'$), go to step 6 and choose another curve $D_1$ or start again this step with a new $D-D_1$ portion. Once C and $P_i'$ have been calculated, reject the part of curve D that is not $D_1$. This method for calculating C ensures in easy way that the final curves defining the RXI (curves D and X obtained form the full method of design) have continuous second derivatives.

Start the design of an $F_mX$ device with $\partial B_i'$ and $\partial B_o$ as input and output edge ray bundles. $\partial B_i'$ is only partially known but it suffices to start the design. The relative position of $\partial B_i'$ and $\partial B_o$ is already known. $P_i'$ will be the edge of the input optical line of the $F_mX$ and the edge of the $F_m$ line in the RFI complete design. $P_i'$ can be any point of $C_i'$ after the refraction at $D_1$, excepting the edge of $C_i$. $P_o$ is the edge of the output optical line in the $F_mX$ design and it coincides with the point with the same name chosen in step 5.

Figure 57:
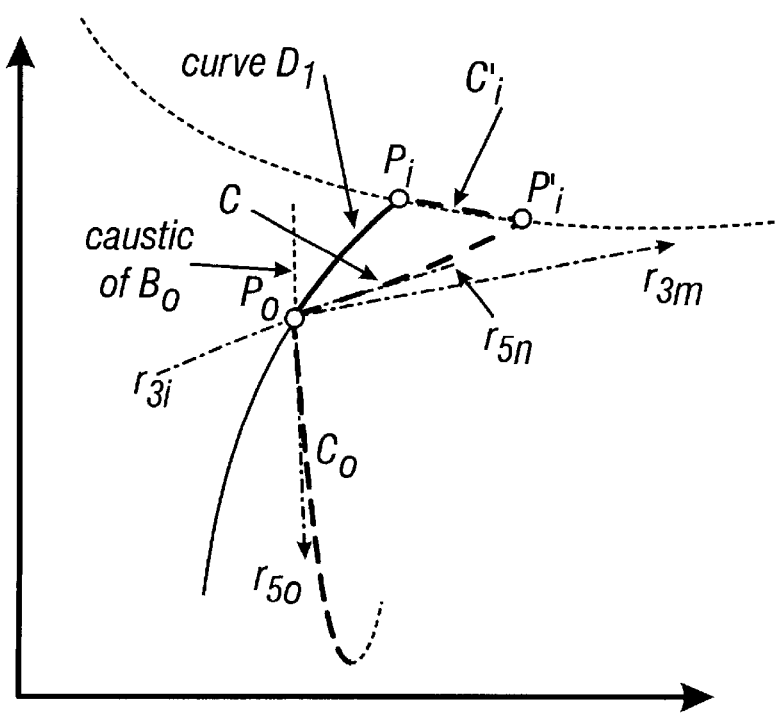
FIG. 57 is a graph illustrating calculation of the caustic C.

In the $F_mX$ design, a caustic C joining $P_i'$ and $P_o$ should be chosen (step 7 of the $F_mX$ design procedure). FIG. 57 is a graph illustrating calculation of the caustic C, which has already been calculated. The caustic C must fulfill the conditions of step 7 in section M3.3. If it doesn't, start again this step to find a new caustic C as shown in FIG. 57.

Remember that within the $F_mX$ design procedure, the mirrors are considered to have one reflective side and they are considered to be transparent when impinged from the non-reflective side of the mirror.

Figure 58:
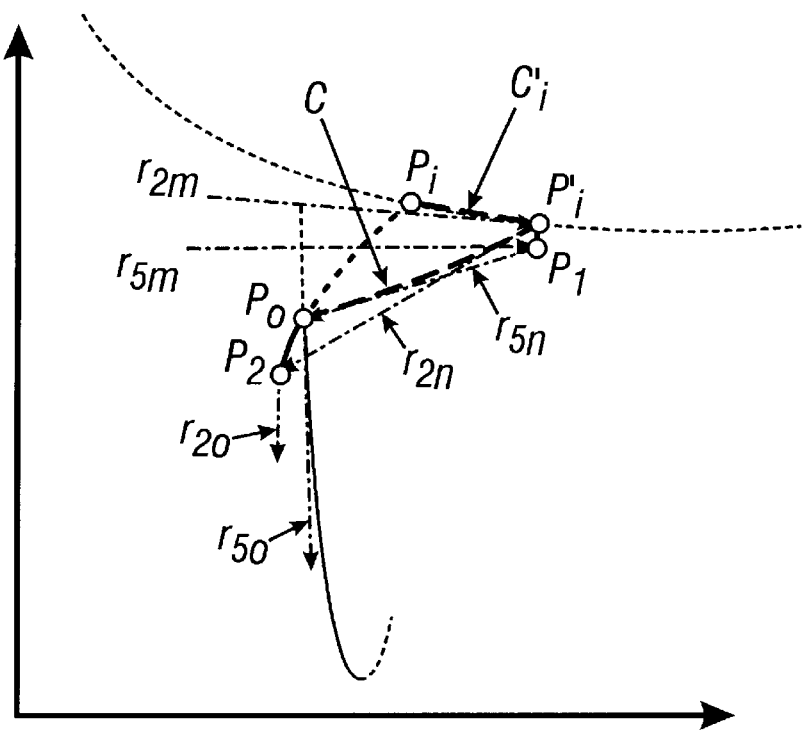
FIG. 58 is a graph illustrating calculations to design an $F_mX$ device.
Figure 59:
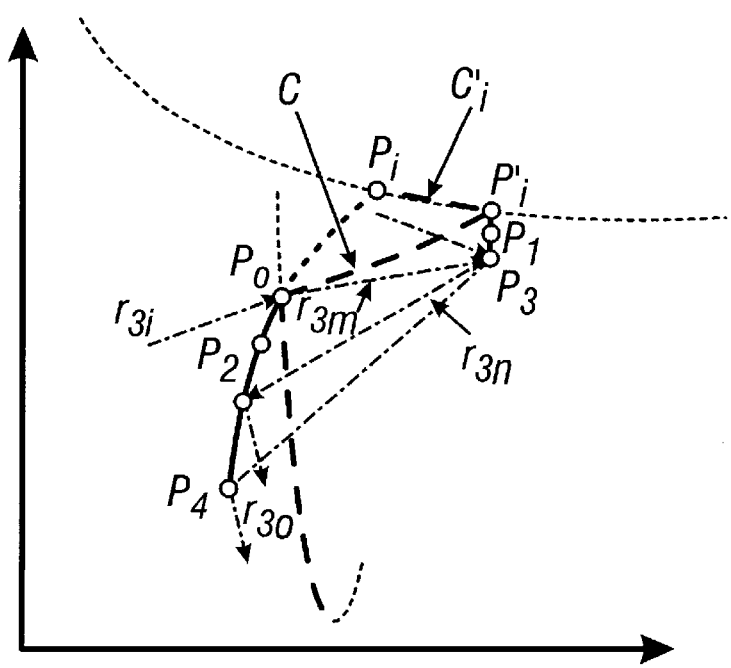
FIG. 59 is a graph that illustrates repeatedly calculating the surfaces of the $F_mX$ device until rays passing through $P_o$ enter into the calculations.

Step 10. FIG. 58 is a graph illustrating calculations to design an $F_mX$ device. From steps 7, 8, 9, 10,11, 12, 13 and 14 of the $F_mX$ design (section M3.3) we calculate the first part of the $\phi$ function of the curve $F_m$ ($P_i'-P_1$) and the second part of curve D ($P_o-P_2$). This second part of curve D is the first part of the output line in the $F_mX$ design such as shown in FIG. 58. FIG. 59 illustrates calculating the surfaces of the $F_mX$ device until the rays passing through $P_o$ enter into the calculations. The $F_mX$ design procedure can be continued until the two rays of $\partial B_i'$ passing through $P_o$ are used for the calculation of points of the $F_mX$ input and output optical lines as shown in FIG. 59.

Step 11. Trace the rays of $\partial B_i$ after refraction at the new portion of curve D calculated and calculate the new part of $\partial B_i'$.

Step 12. With the new part of $\partial B_i'$ determined, the $F_mX$ design process continues as a new segment of the curve D is obtained and steps 11 and 12 are repeated until the $F_mX$ design is finished such as shown in FIG. 60.

Figure 60:
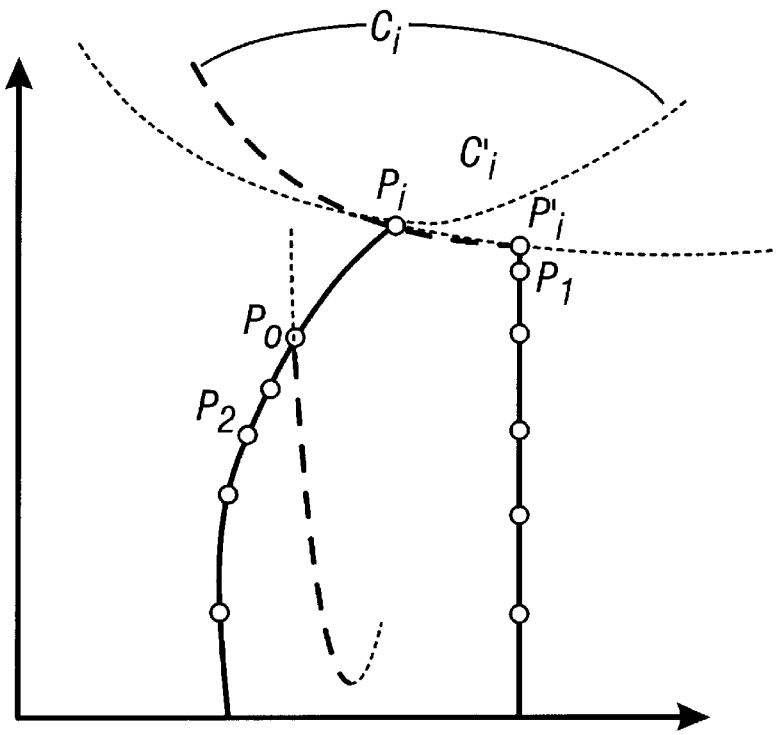
FIG. 60 is a graph that illustrates a completed $RF_mI$ design.

FIG. 60 illustrates a completed $RF_mI$ design. The different portions of curve D have continuity in the slopes and curvature radius ($1^{st}$ and $2^{nd}$ derivatives).

The same considerations done in step 17 of section M3.3 apply here. Thus, it may be required to repeat the design procedure to get a curve D normal to the z axis at $x=0$.

Step 13. Calculate the part of D where there are edge rays that cannot be reflected by TIR. Place a mirror on this region and keep clear the remaining part of D.

Step 14. From the function $\phi(s)$ calculate the slope of the micro-mirrors in the $F_m$ line. The procedure to get these slopes is described in section M9.3.

M5.0 $F_dXF_i$, $F_dF_mF_i$ Design Procedure

The design procedure for creating a micro-structured $F_dXF_i$, or $F_dF_mF_i$ device is described with reference to FIGS. 61 through 66. We will construct an optical device also derived from the RXI device, defined by two optical lines. Either one of the lines, or both lines, can be micro-structured. The first line, called curve D, is micro-structured totally or partially and it will behave as a refractive surface or as a reflector (by total internal reflection) depending on the incidence angle on this line. The other line is a continuous mirror (X) or a micro-structured reflector ($F_m$). The input bundle $\partial B_i$ will impinge first on the curve D. Then the rays will intercept the other optical line and will be reflected towards the curve D where they are reflected again. Then they will exit the device as rays of the output bundle $\partial B_o$. The rays of $\partial B_i$ and $\partial B_o$ are assumed to proceed towards increasing values of z, i.e., all of their optical direction cosines with respect the z-axis (r) are positive. When the rays are between the reflection at X (or $F_m$) and the reflection at the curve D, their optical direction cosines with respect to the z-axis are negative, so $r \leq 0$.

In the design procedure, the curve D is considered a refractive surface for the rays of $\partial B_i'$, and it is considered a mirror for the rays after the reflection at the curve X (or $F_m$), whether or not the total internal reflection (TIR) condition is fulfilled. When the design is finished, a mirror should be placed at the points on D where the TIR condition is not fulfilled. This mirror creates an obstacle for the input bundle. However, in the good designs, this obstacle has a negligible on the performance of the device.

M5.1 Selection of the Input and Output Edge Ray Bundles $\partial B_i$ and $\partial B_o$ In this design, the edge ray bundles $\partial B_i$ and $\partial B_o$ must fulfill the following conditions:

Condition 1. The bundles $\partial B_i$ and $\partial B_o$ at $z=z_i$ and $z=z_o$, respectively, are closed curves in the x-p plane. Now, these curves do not necessarily enclose the same size areas. If $B_o \supset B_i'$, is desired, then the bundle $\partial B_i$ should enclose an area smaller than or equal to the area enclosed by $\partial B_o$. However if $B_i \supset B_o$ is desired, then the area enclosed by $\partial B_o$ should be smaller than or equal to the one enclosed by $\partial B_i$.

Condition 2. There are no more than two edge rays of $\partial B_i$ (or $\partial B_o$ for a single value of x at the points of the optical lines. This condition can only be checked at the end of the design process. Nevertheless, some bad selections not fulfilling this condition can be detected from the beginning.

Condition 3. The input bundle $\partial B_i$ is contained in the region $-n_i<p<n_i$. The input edge ray bundle $\partial B_o$ is contained in the region $-n_o<p<n_o$.

Condition 4. There is a cyclic parameterization of the edge ray bundles $x=x(\omega)$, $p=p(\omega)$, such that the derivatives $dx/d\omega$, and $dp/d\omega$ are continuous.

MS.2 Design Steps

FIGS. 61 through 66 are graphs in the x-z plane that illustrate the design procedure for creating a micro-structured $F_dXF_i$, or $F_dF_mF_i$ device.

Figure 61:
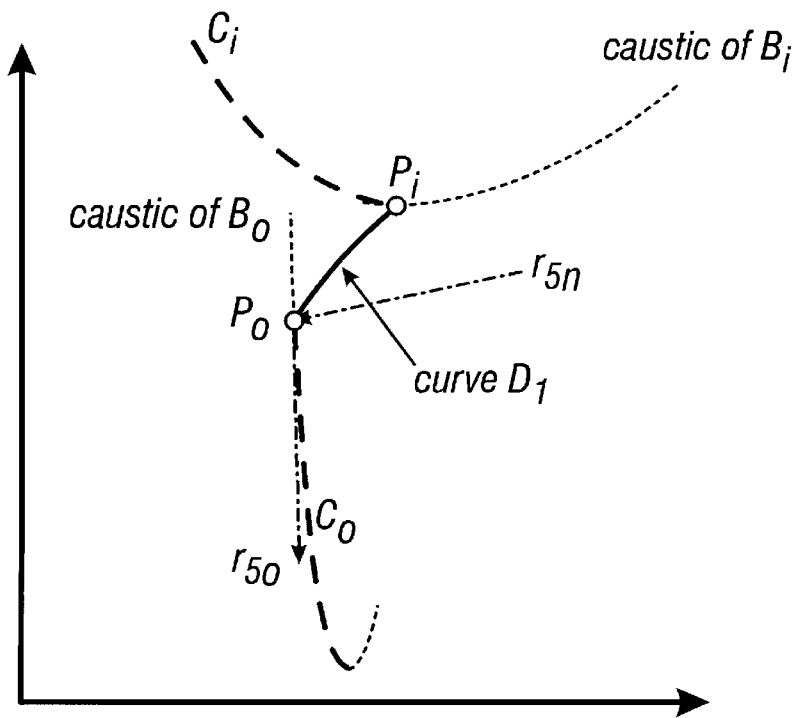
FIG. 61 is a graph that illustrates steps for selecting the entry and exit apertures of the $F_dXF_i$ (or $F_dF_mF_i$) and the initial curve $D_1$.

Step 1. FIG. 61 illustrates steps for selecting the entry and exit apertures of the $F_dXF_i$ (or $F_dF_mF_i$) and the initial curve $D_1$. Select $n_i$, $n_o$ and the relative position of the entry aperture with respect to the exit aperture.

Step 2. Calculate the outer caustics ($C_i$ and $C_o$) of $\partial B_i$ and $\partial B_o$. The outer caustics of $\partial B_i$ and $\partial B_o$ are defined as in the non-micro-structured case, i.e., as the lines that delimits in the x-z plane the region crossed by rays of $\partial B_i$ and $\partial B_o$, respectively.

Step 3. Select the $F_m$ micro-structured line equation (a z=constant line for the example of the Figures). The equation must be symmetric with respect the z-axis.

Step 4. Calculate the outer caustics ($C_i$ and $C_o$) of $\partial B_i$ and $\partial B_o$. The outer caustics of $\partial B_i$ and $\partial B_o$ are defined as before (see FIG. 61).

Step 5. Select a point $P_i$ of $C_i$ and a point $P_o$ of $C_o$ such that $P_i$ is in a region of the x-y plane not crossed by any ray of $\partial B_o$. In the case that there is an obstacle for the bundles of $\partial B_o$ in the final design, then it suffices to check that the rays $\partial B_o$ do not cross $P_i$ before they meet the obstacle.

Step 6. Choose a smooth curve $D_1$ joining the points $P_i$ and $P_o$. This curve will be part of the optical line D. The refractive index of the right side of D is the highest. The curve $D_1$ has to be chosen constrained to the condition that the ray $r_{5o}$, which is tangent to $C_o$ at $P_o$, suffers a total internal reflection at $P_o$ when traced backwards, i.e., when traced towards the ray $r_{5n}$.

The curve $D_1$ can also be micro-structured. In this case, we have to choose its line equation and its function $\phi(s)$. Choose also the remaining part of the micro-structured line equation D (a z=constant line in the example) so the full D curve is symmetric with respect to the z-axis. The remaining micro-structured line D must be such that there exists a value of $\phi$ for which the deflection of $r_{5n}$ n is coincident with $r_{5o}$, i.e., the deflection law at both sides of the point $P_o$ is continuous for the edge rays.

Figure 62:
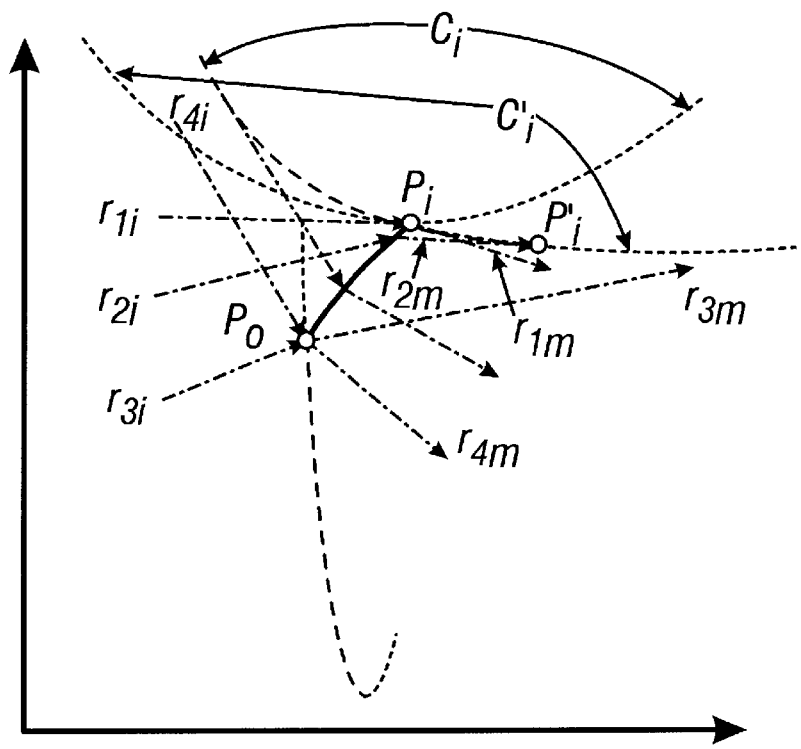
FIG. 62 is a graph that illustrates calculation of the edge ray bundle $\partial B_i'$ obtained by refraction of $\partial B_i$ at the curve $D_1$.

Step 7. FIG. 62 illustrates calculation of the bundle $\partial B_i'$ obtained by refraction of $\partial B_i$ at the curve $D_1$. Trace the rays of the bundle $\partial B_i$ that impinges on the curve $D_1$. Trace them after the deflection at this curve. With this, we have calculated part the bundle $\partial B_i$ after deflection at D. This bundle after deflection is called $\partial B_i'$ as shown in FIG. 62. Because the part of the bundle $\partial B_i$ traced is in the neighborhood of the caustic $C_i$, we will be able to calculate part of the outer caustic of $\partial B_i'$ which is called $C_i'$. If $P_i$ is close to $P_o$, then the calculable part of $C_i'$ will be short. If the curve $D_1$ is not smooth enough (in the micro-structured case, the line equation and $\phi(s)$ must both be smooth), then it may form additional caustics that would be able to intercept the parts of the optical lines that haven't yet been calculated.

Step 8. Check that the calculated part of $\partial B_i'$ fulfills conditions 2 and 3 of the preceding section M5.1. If not, go to step 5.1 and choose another curve $D_1$.

Figure 63:
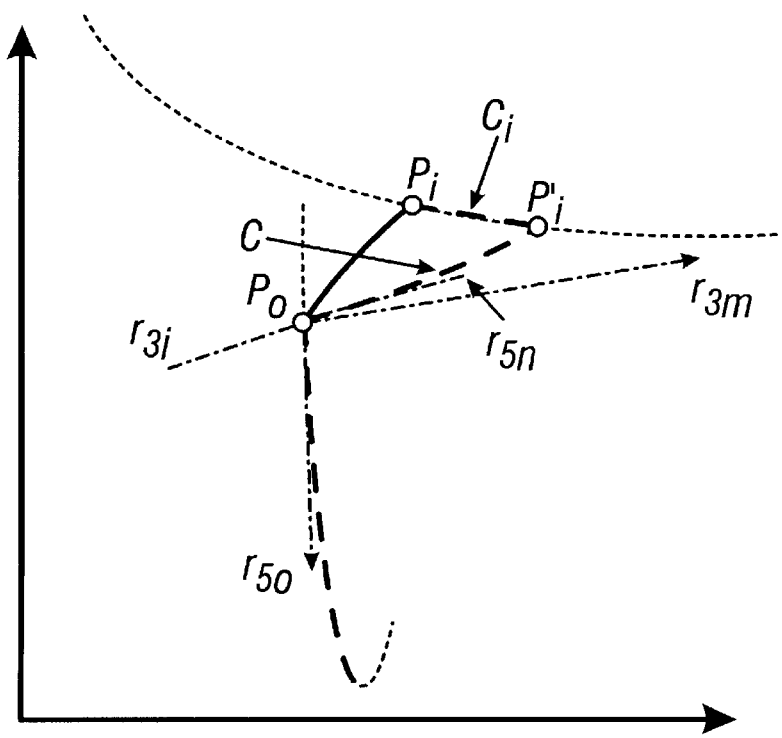
FIG. 63 is a graph that illustrates calculation of the caustic C.

Step 9. FIG. 63 illustrates calculation of the caustic C. Start the design of a $XF_m$ (in the case of the $F_dXF_i$) or a $F_mF_m$ (in the case of the $F_dF_mF_i$) device with $\partial B_i'$ and $\partial B_o$ as input and output edge ray bundles. The input edge ray bundle $\partial B_i'$ is only partially known but it suffices to start the design. The relative position of $\partial B_i'$ and $\partial B_o$ is already known. The point $P_i'$, which is the edge of the input optical line of the $XF_m$ (or the edge of the $F_mF_m$) and also the edge of the $F_m$ line in the $F_dXF_i$ (or $F_dF_mFi$) complete design, has to be chosen on the part of the line $C_i'$ already calculated in step 7. The point $P_i'$ can be any point of $C_i'$ after the refraction at $D_1$, excepting the edge of $C_i$. $P_o$ is the edge of the output optical line in the $XF_m$ (or $F_mF_m$) design and it coincides with the point with the same name chosen in step 5. (In all cases the idea is that you refract the input bundle on $D_1$ and you have to start the design of a XX or more accurately, an XI to couple the refracted bundle with the output bundle. As the I and D lines are the same, when a segment of the I line is calculated, it can be considered as a refractive surface. Then calculate the refraction of new rays of the input bundle, and proceed with the calculation of new segments of the XI device and so on (until reaching the optical axis). In the case of this section, the micro-structured surfaces do not introduce any significant problem, because the design of the micro-structured XX versions involved in this case (XF and FF) have been already described in section 3. Also, there is no special difficulty with the ray-tracing through the micro-structured refractive surface as explained in section M9.2. Observe that the description of the RFI device has been done separately because it has (as the RXI device) the problem of the continuity of the second derivative, whereas the FXF and FFF have discontinuities in the first derivative, so no matter the second one. In the $XF_m$ (or $F_mF_m$) design, a caustic C joining $P_i'$ and $P_o$ should be chosen (step 7 of its design procedure). This caustic C must fulfill the conditions of step 7, in section M3.3. Besides this, and within the $F_dXF_i$ (or $F_dF_mF_i$) design, C must also fulfill that its tangent at $P_o$ (called ray $r_{5n}$) is reflected as the ray $r_{5o}$. In step 6 we have already ensured that this reflection is obtained by TIR. Thus the derivative of C at $P_o$ is not free. It is advisable, although not completely necessary that the ray $r_{3m}$ does not intercept the caustic C. The ray $r_{3m}$ is one of the rays of $\partial B_i$ after refraction at $P_o$ as shown in FIG. 63.

Remember that within the $XF_m$ (or $F_mF_m$) design procedure, the mirrors are considered to have one reflective side and they are considered to be transparent when impinged from the non-reflective side of the mirror.

Figure 64:
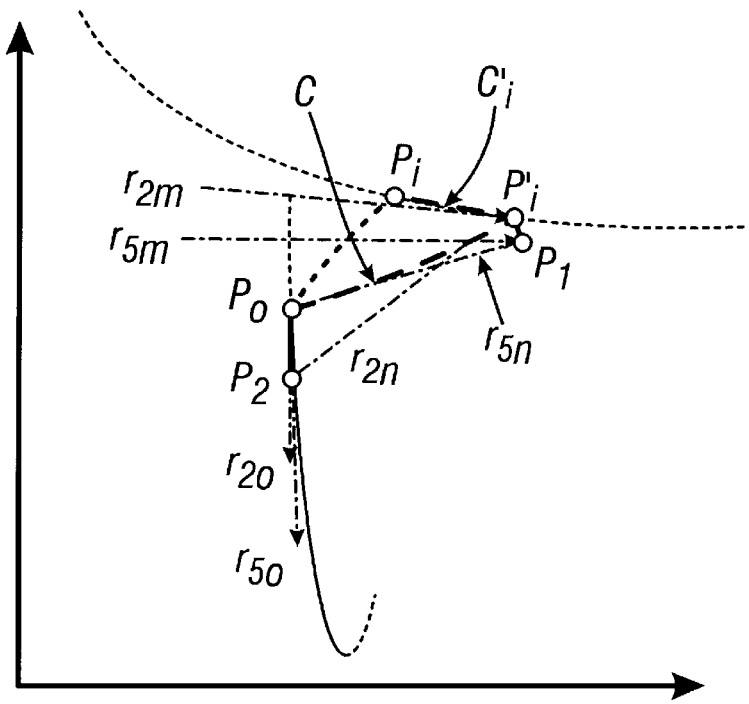
FIG. 64 is a graph that illustrates design calculations for the $F_mF_m$ device.

Step 10. FIG. 64 illustrates design calculations for the $F_mF_m$ device. From steps 7, 8, 9, 10, 11, 12, 13 and 14 of the $XF_m$ (or $F_mF_m$) design (section M3.3) we calculate the first part of the curve X (or the first part of the $\phi$ function of the curve $F_m$) i.e., from $P_i'$ to $P_1$ and the second part of the $\phi$ function of the curve D ($PO$-$P_2$). This second part of curve D is the first part of the output line in the $XF_m$ (or $F_mF_m$) design as shown in FIG. 64.

Figure 65:
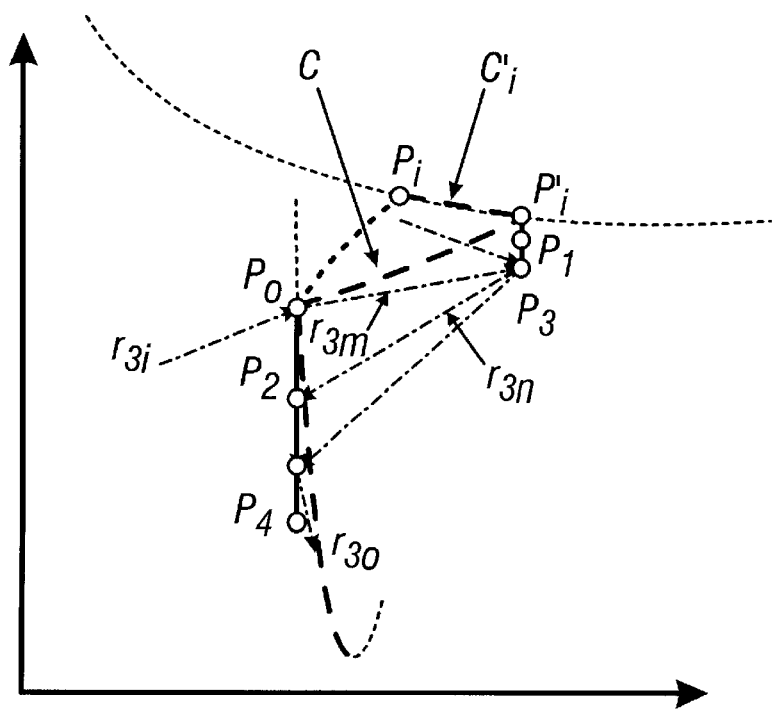
FIG. 65 is a graph that illustrates repeatedly calculating the design for the $F_mF_m$ device until the rays passing through $P_o$ enter into the calculations.

FIG. 65 illustrates repeatedly calculating the design for the $F_mF_m$ device until the rays passing through $P_o$ enter into the calculations. Particularly, the $F_mX$ design procedure can be continued until the two rays of $\partial B_i'$ passing through $P_o$ are used for the calculation of points of the $F_mX$ input and output optical lines as shown in FIG. 65.

Step 11. Trace the rays of $\partial B_i$ after refraction at the new previously calculated portion of curve D and calculate the new part of $\partial B_i'$.

Step 12. With the new part of $\partial B_i'$, the $XF_m$ (or $F_mF_m$) design can follow and new portions of the function $\phi(s)$ of the curve D are obtained. With the new portions of D, repeat steps 11 and 12, until the $XF_m$ (or $F_mF_m$) design is finished as shown in FIG. 66.

Figure 66:
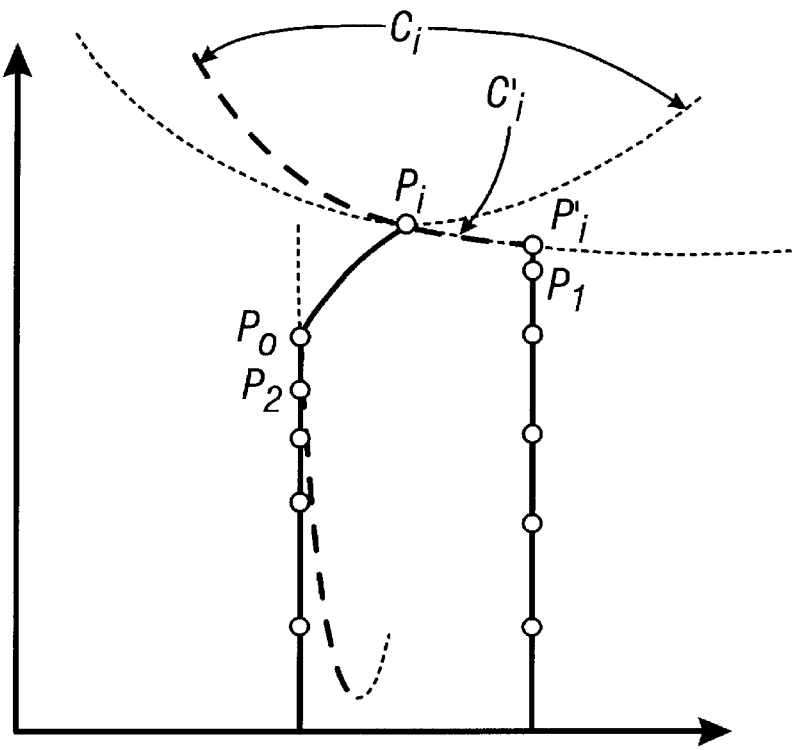
FIG. 66 is a graph that illustrates a completed $F_mF_dF_m$ design

FIG. 66 illustrates a completed $F_mF_dF_m$ design. The deflection law for edge rays along curve D has continuity.

The same considerations done in step 17 of section M3.3 apply here. Thus, it may be required to repeat the design procedure to get a curve D normal to the z axis at Step 13.

Calculate the part of D where there are edge rays that cannot be reflected by TIR. Place a mirror on this region and keep clear the remaining part of D.

Step 14. From the function φ(s) of the micro-structured lines calculate the profile of the micro-structures. The procedure to determine these slopes is described in section M9.3.

M6.0 Other Considerations for the Design Procedure

1) If the x-p representation of the edge ray bundles has discontinuities of dp/dx or segments x=constant, such as in the case shown in FIG. 42, an approximate curve without these characteristics should be chosen. For instance, assume that in the case of 42, the input edge ray bundle $\partial B_i$ is defined by the segments $x=x_e$, $x=-x_e$, for $-n_i \sin(\alpha_i) \leq p \leq n_i \sin(\alpha_i)$ and the segments $p=n_i \sin(\alpha_i)$, $p=-n_i \sin(\alpha_i)$, for $-x_e \leq x \leq x_e$. This rectangle can be approximated by the following equation:

$$\cos\left(\frac{\pi}{2} A \frac{x}{x_e}\right) \cos\left(\frac{\pi}{2} B \frac{p}{n_i \sin(\alpha_i)}\right) = C$$

where A and B are numbers close to 1 (above or below 1, provided the curve is contained in $|p|<n_i$) and C is a positive number close to zero. A good approximation is found with $A=B=1.001$, $C=\pi^2/4*10^{-6}$.

Assume that the derivatives dx/dω and dp/dω are continuous, but there are segments x=constant in the description of the edge ray bundles for the coordinates z corresponding to the points of the optical lines. In this case, it is usually enough to change slightly the coordinates of z for the points $P_i$ and $P_1$ to solve the problem.

2) Assume we want to design a system that, for instance, must extract light from an emitter, which is within a known optical system, and must sent it in a prescribed output bundle. We have to calculate the output bundle of the known optical system (this can be done by ray tracing or any other mean) and introduce this bundle as the input bundle in the preceding procedure. This is the case of LEDs that are encapsulated in an epoxy dome. This epoxy shape would be the known optical system. A similar reasoning can be done with receivers of radiation.

3) In some cases (for instance, in the $RF_mI$, $F_mX$, $XF_m$, and $F_mR$ designs), the resulting device is such, that some rays of the input bundle rays intercept the output optical surface, before they strike an input optical surface. Thus, the output optical line is producing some shadow on the input bundle. The design process can be carried out without consideration of this shadowing and a final ray tracing can then be carried out to evaluate the effect of this shadowing.

M7.0 Cartesian Oval Procedure

Assume that we have a certain region of the x-y plane where there are trajectories of two 1-parameter bundle of rays (let us call them $B_1$ and $B_2$) such that at any point of this region there is one and only one ray per bundle. We can construct the wavefronts of each bundle (the wavefronts are defined by the lines normal to the rays) and thus we can calculate the functions $O_1(x, y)$ and $O_2(x, y)$ which give, respectively, the optical path length from the point x, y to a given reference wavefront for the bundle $B_1$ and $B_2$. There is a lack of definition in the sign of $O_1(x, y)$ and $O_2(x, y)$ which is solved if we define, with continuity, the direction in which the rays of both bundles proceed.

Figure 67:
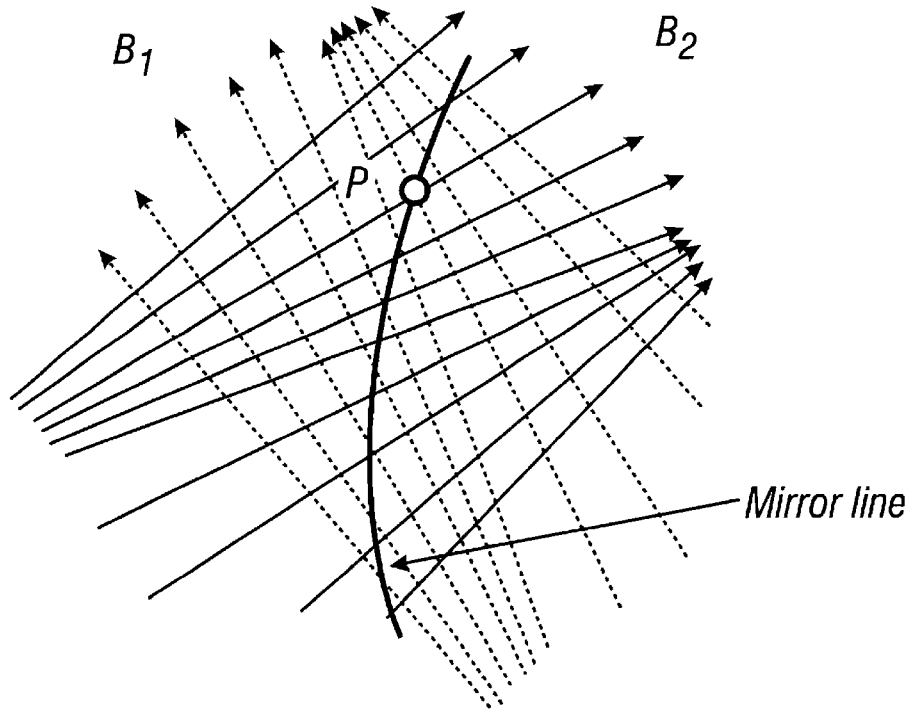
FIG. 67 is a graph that illustrates construction of a mirror reflecting the bundle $B_1$ into the bundle $B_2$.

FIG. 67 illustrates construction of a mirror reflecting the bundle $B_1$ into the bundle $B_2$. We want to calculate the mirror profile such that the rays of one bundle are reflected and become rays of the other bundle. Assume also that we know the trajectory of a single ray of $B_1$ that is reflected at the point P and, after the reflection, becomes a ray of $B_2$. Then we can choose the wavefront passing through P as the reference wavefront for the calculation of $O_1(x, y)$ and $O_2(x, y)$. Then the equation of the mirror that we are looking for is simply given by the equation $O_1(x, y)=O_2(x, y)$, provided the solution is in the region of the x-y plane aforementioned.

Figure 68:
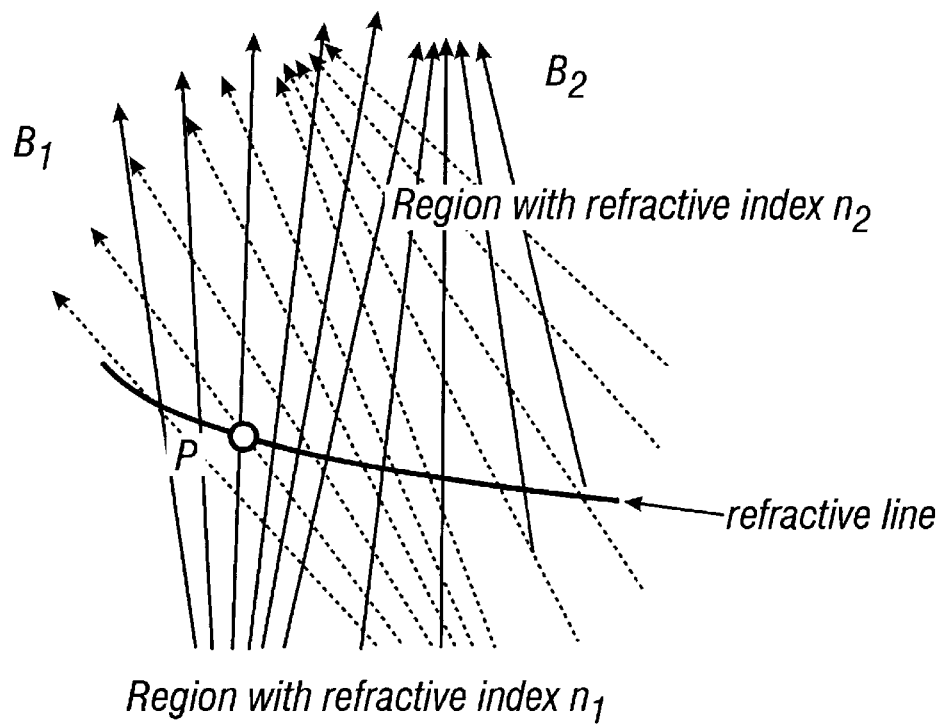
FIG. 68 is a graph that illustrates construction of a refractive surface refracting the bundle $B_1$ into the bundle $B_2$.

FIG. 68 illustrates construction of a refractive surface refracting the bundle $B_1$ into the bundle $B_2$. We can also calculate the refractive line such that the rays of $B_1$ (coming from a media of refractive index $n_1$) when refracted at this line, become rays of $B_2$ in a medium of refractive index $n_2$ (see FIG. M52). The equation of the line is the same as before, $O_1(x, y)=O_2(x, y)$, but now the functions $O_1(x, y)$ and $O_2(x, y)$ should include the refractive index factors since these functions are optical path lengths and not path lengths simply. We also need to know a point P of a single ray where the refractive line must pass through in order to have a common point for the wavefront reference calculations. The equation $O_1(x, y)=O_2(x, y)$ is necessary but not sufficient for refractive lines. Thus, we should check that the rays of $B_1$ proceed through the region of refractive index $n_1$ before the refraction and that the rays of $B_2$ proceed through the region of $n_2$ after refraction.

This procedure is a generalization of the construction of Cartesian ovals and because of this it is called Cartesian ovals procedure.

M8.0 Normal Vectors and Curvature radius Definitions

Figure 69:
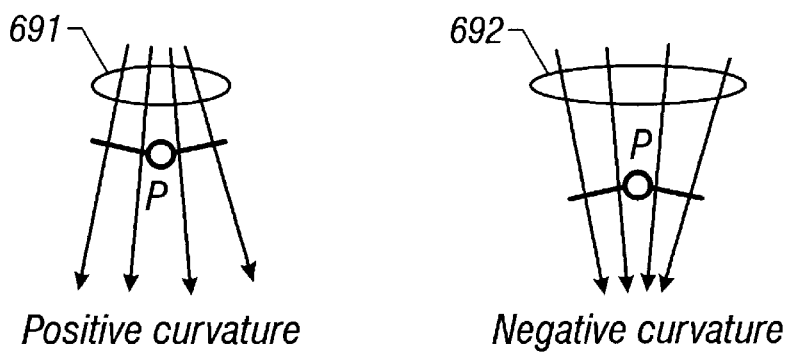
FIG. 69 is a diagram that illustrates diverging rays 691 that have a positive curvature radius and converging rays 692 that have a negative curvature radius

FIG. 69 is a diagram that illustrates diverging rays 691 that have a positive curvature radius and converging rays 692 that have a negative curvature radius. We shall use the following definitions: the wavefront of a bundle of rays have a positive curvature radius at a point P, if the rays of the bundle are divergent at P and negative if they are convergent.

Figure 70:
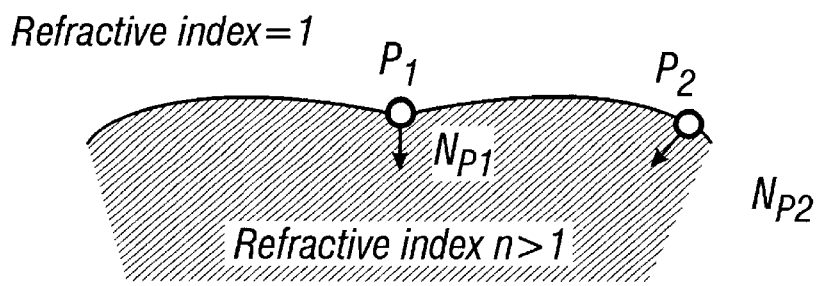
FIG. 70 is a cross-section of a portion of a refractive surface that exemplifies positive and negative curvatures.

FIG. 70 is a cross-section of a portion of a refractive surface that exemplifies positive and negative curvatures; particularly there is a negative curvature radius at point $P_1$ and a positive curvature radius at point $P_2$. For the optical lines (refractive surface and mirrors) of the RFI we shall define the normal vector to the line at a point P ($N_p$) to the one that points towards the medium with the highest refractive index. The definition is also valid for the mirrors because the mirrors also divide two regions of different refractive indices. The curvature radius is positive when the center of curvature is in the direction of the normal vector as shown in FIG. 70.

With the above definition of signs, the relationship between the curvature radius of the wavefronts before ($\rho_i$) and after ($\rho_r$) a refraction and the curvature radius of the line of refraction ($\rho_s$) is:

$$\frac{n_i \cos^2(\alpha_i)}{\rho_i} - \frac{n_r \cos^2(\alpha_r)}{\rho_r} = \frac{n_r \cos(\alpha_r) - n_i \cos(\alpha_i)}{\rho_s}$$

where $n_i$ is the refractive index of the medium before the refraction, $n_r$ is the refractive index of the medium after the refraction, $\alpha_i$ is the angle of between the incident ray and the normal to the refractive line and $\alpha_r$ is the angle of between the refracted ray and the normal to the refractive line, i.e., $\cos(\alpha_i)=P_i \cdot N$ and $\cos(\alpha_r)=P_r \cdot N$, where $P_i$ and $P_r$ are respectively the unitary ray-vectors of the incident and refracted rays and N is the unitary normal to the surface.

The relationship between the curvature radius of the wavefronts before ($\rho_i$) and after ($\rho_r$) a reflection and curvature radius of the mirror line ($\rho_s$) is $$\cos(\alpha_r)\left(\frac{1}{\rho_i} - \frac{1}{\rho_r}\right) = \frac{2}{\rho_s}$$

where $\alpha_r$ is the angle of between the reflected ray and the normal to the mirror line, i.e., $\cos(\alpha_r) = P_r \cdot N$, where $P_r$ is the unitary ray-vector of the reflected ray and N is the unitary normal to the surface. Note that with the definition of normal that we use, $\cos(\alpha_r) > 0$ for all the reflections within the RXI and the RX.

M8.1 Reflection of a Caustic

When a caustic is reflected at a point P of a reflector, $\rho_s$ is not determined by the preceding equation, because $\rho_i$ and $\rho_r$ are both equal to zero.

At the point $P_o$ of a continuous line D of an $RF_m I$ design (or any other design where the curve D is continuous at $P_o$) the continuity of the curvature radius is not ensured unless we fix a condition on the caustic C at the point $P_o$. This is because we have chosen freely the curvature radius of $D_1$ at $P_o$ and this should not be necessarily equal to the one we obtain for the remaining part of curve D at the same point. The procedure for calculating C described in Section M4.2, step 9 ensures the continuity of the curvature radius at $P_o$.

M9. Characterization of Different Micro-structured Optical Lines

M9.1 Classes of Micro-structured Lines

Figure 71A:
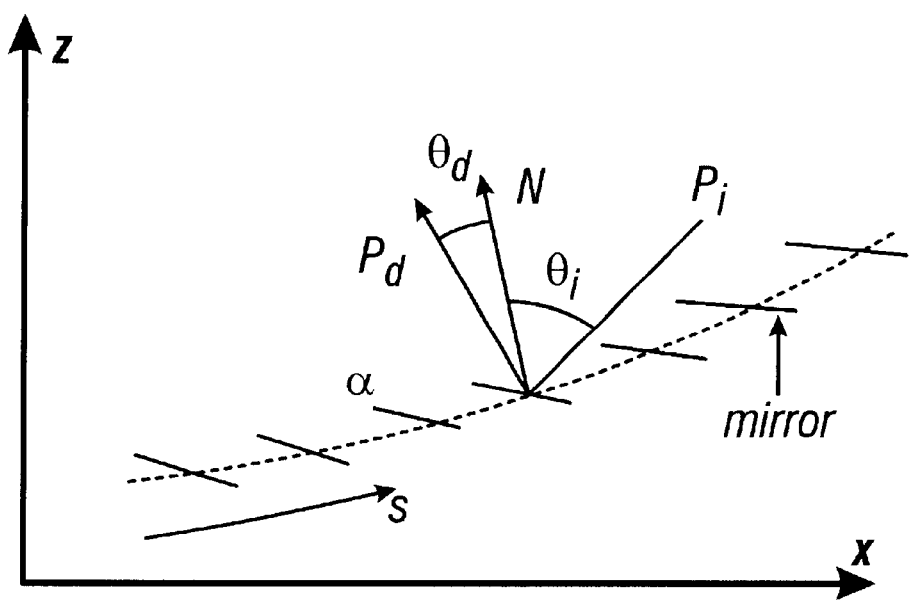
FIG. 71A is a graph that shows a Fresnel-like mirror line $(F_m)$.
Figure 71B:
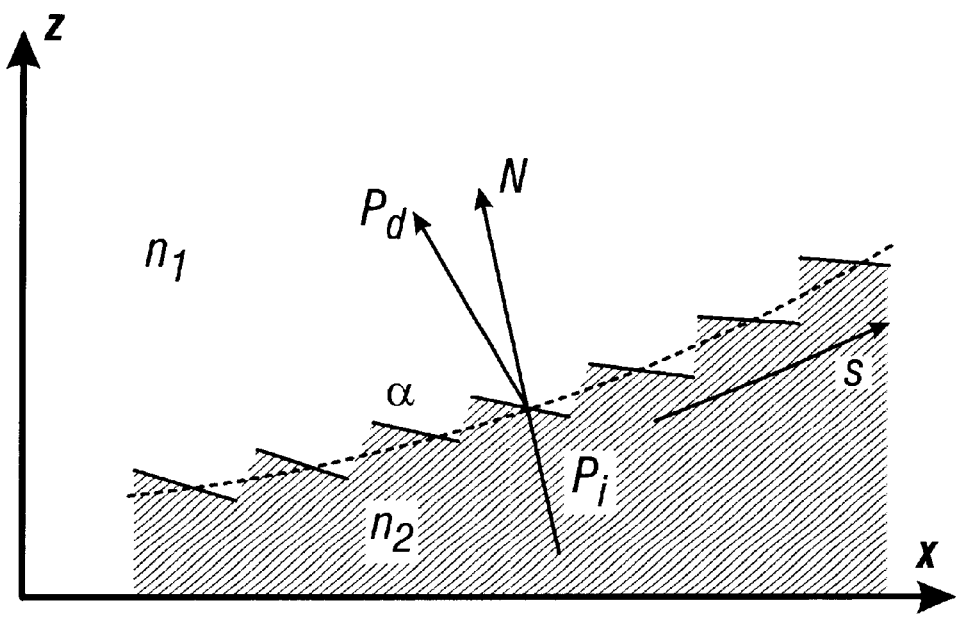
FIG. 71B is a graph that shows a Fresnel-like refractive surface $(F_m)$.
Figure 71C:
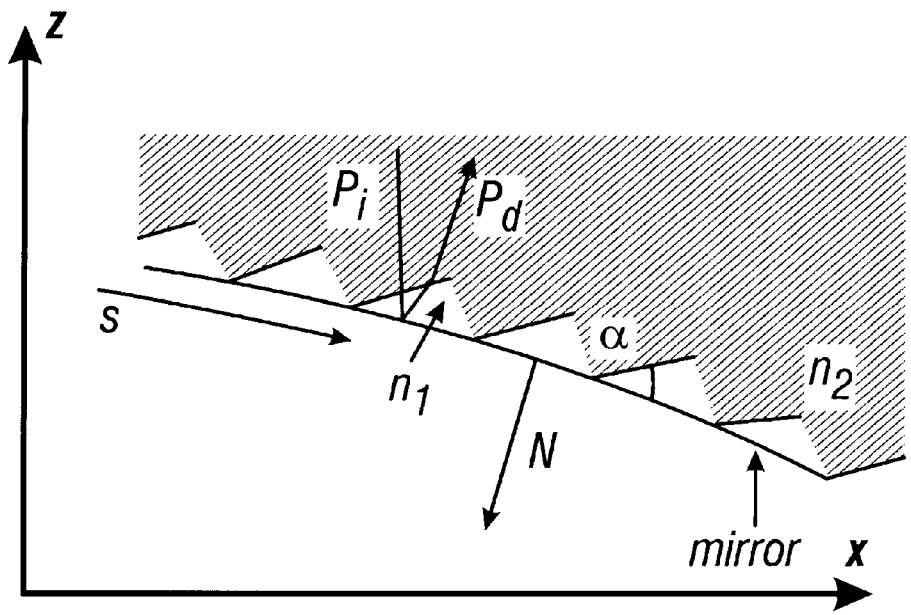
FIG. 71C is a graph that shows a first refractive-reflective combination line $(F_{dm})$.
Figure 71D:
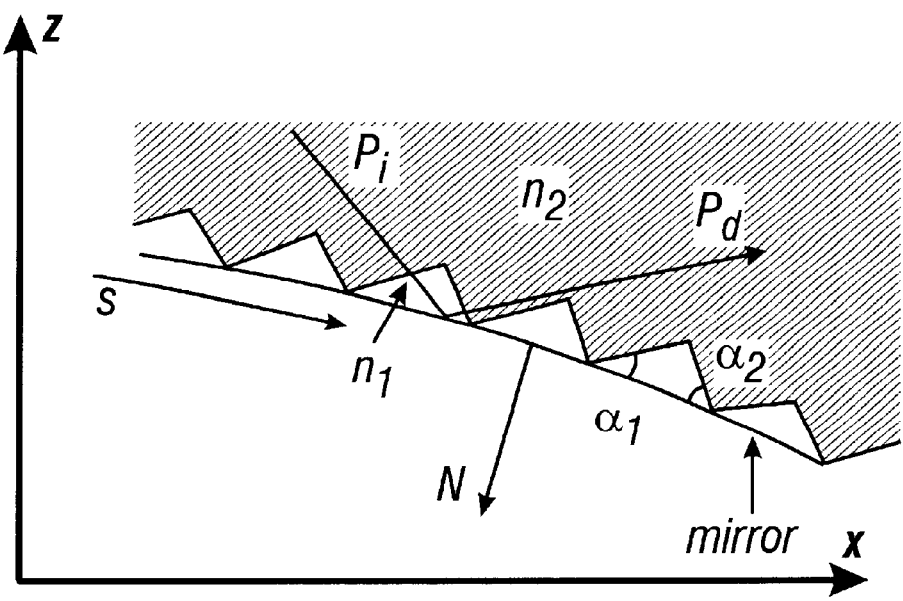
FIG. 71D is a graph that shows a second refractive-reflective combination line $(F_{dm}$ FIG. 72 is an graph of an example in the region of the x-y plane, in which there are known trajectories of two 1-parameter bundle of rays, one of them $(B_1)$ impinging on, and the other one $(B_2)$ exiting, a given micro-structured optical line.

Consider that we have in a certain region of the x-y plane a micro-structured optical line whose line equation given in parametric form is $x=x(s)$, $z=z(s)$ (s is a length parameter along the line), and which has at each point a deflection law $P_d(s)=F(P_i(s), N(s), \phi(s))$. $P_i$ is the unitary incident ray vector, $P_d$ is the unitary deflected ray vector, N is the unitary normal to the line, and $\phi$ is a parameter. The deflection law depends on the micro-structure design, and each micro-structure has its corresponding deflection law. FIGS. 71A, 71B, 71C, and 71D are graphs in the x-z plane that show different cases of micro-structures, named $F_d$, $F_m$ and $F_{dm}$ ("d" stands for refraction on a refractive surface and "m" for reflection on a mirror). Particularly, FIG. 71A shows a Fresnel-like mirror line ($F_m$) FIG. 71B shows a Fresnel-like refractive surface ($F_m$), FIG. 71C shows a first refractive-reflective combination line ($F_{dm}$), and FIG. 71D shows a second refractive-reflective combination line ($F_{dm}$).

We will consider that the size of the facets is infinitesimal and that the facet profiles are flat. In practice, finite-size facets perform as infinitesimal ones if their size is small, compared with the curvature radius of the wavefronts at their incidence on the facet.

The deflection law of the micro-structures can be calculated in each case by application of the laws of reflection and refraction on the facets. The parameter (of the deflection law can be identified, in the cases of micro-structures shown in FIGS. 71A, 71B, and 71C, as the angle cc indicated in the figures. For example, in the case of an $F_m$ structure, the deflection law is $P_d = P_i + 2(P_i \cdot N')N'$, where N' is the normal to the facet pointing towards the hemisphere corresponding to the reflective side of the mirror. N' is the vector N clockwise rotated an angle $\alpha$. It is clear that N' is a function of N and $\alpha$ and thus $P_d$ is a function of $P_i$, N and $\alpha$.

In case of micro-structure shown in FIG. 71D, two parameters $\alpha_1$ and $\alpha_2$ will appear in the deflection law, so an additional condition can be chosen to leave a single parameter $\phi$ as degree of freedom (for instance, $\alpha_1 = \alpha_2$, or the condition such that the losses are minimum).

M9.2 Cartesian Oval Procedure With Micro-structured Lines

FIG. 72 is an graph of an example, in the aforementioned region of the x-y plane, in which there are known trajectories of two 1-parameter bundle of rays, one of them ($B_1$) impinging on, and the other one ($B_2$) exiting, a given micro-structured optical line (i.e., the deflection law). Assume also that at any point of this region there is one and only one ray per bundle crossing the optical line. Consider the following problems:

Problem 1. The two bundles $B_1$ and $B_2$, and the functions x x(s), z=z(s) of the micro-structured line are given, and the problem is to find the function $\phi(s)$ that makes $B_1 = B_2$ according to the deflection law.

Problem 2. The bundle $B_1$, and the functions $x=x(s)$, $z=z(s)$ and $\phi(s)$ of the micro-structured line are given, and the problem is to find the deflected bundle $B_2$.

The first problem is analogous to the one described in the section 7 for the non-micro-structured optical lines (mirrors and refractive surfaces). However, as the micro-structure has an additional degree of freedom (the function $\phi(s)$, which is the unknown) and the curve is given, the solution to this problem is trivial: it is found by inverting the deflection law, that is, $\phi(s) = F^{-1}(P_i(s), N(s), P_d(S))$. For example, in the case of micro-structure FIG. 71A, the reflection law leads to $\alpha = (\theta_i - \theta_d)/2$, being $\theta_i = -\cos^{-1}(P_i N)$ and $\theta_d = \cos^{-1}(P_d N)$, which are shown in FIG. 71A.

The second design problem is equivalent to ray-tracing on the micro-structured optical line. Such ray-tracing can be done as in the case of the non-micro-structured optical lines, but applying the corresponding deflection law.

We can construct the wavefronts of each bundle (this are just the lines normal to the rays) and thus we can calculate the functions $O_1(x, y)$ and $O_2(x, y)$ which give, respectively, the optical path length from the point x, y to a given reference wavefront for the bundle $B_1$ and $B_2$. Assume also that we know the trajectory of a single ray of $B_1$ that is deflected at the point P and, after the reflection, becomes a ray of $B_2$. Then we can choose the wavefront passing through P as the reference wavefront for the calculation of $O_1(x, y)$ and $O_2(x, y)$. In the case of non-micro-structured optical lines, the equation of the line is simply given by $O_1(x, y) = O_2(x, y)$ (see section M7). However, in the micro-structured case, the additional degree of freedom in the deflection law leads to a more general result. To obtain it, define the following function:

$$C(s) = O_1(x(s), y(s)) - O_2(x(s), y(s))$$

which is null at P. Without loss of generality we can consider P also as origin of the arc length s, so $C(O) = 0$. If we derive the expression above with respect to s:

$$\frac{dC(s)}{ds} = \nabla O_1(x(s), y(s)) \cdot (x'(s), y'(s)) - \nabla O_2(x(s), y(s)) \cdot$$
$$(x'(s), y'(s))$$
$$= n_i(s)\sin\theta_i(s) - n_d(s)\sin\theta_d(s)$$

where the $\nabla$ symbol denotes gradient operator and the dot denotes the scalar product. Again, $\theta_i = -\cos^{-1}(P_i \ N)$ and $o\theta_d = \cos^{-1}(P_d \ N)$, and $n_i$ and $n_d$ are the refractive indices of the medium where $B_1$ and $B_2$ proceed, respectively.

Therefore, combining the two expressions we get:

$$O_1(x(s), y(s)) = O_2(x(s), y(s)) + \int_0^s (n_i(t)\sin\theta_i(t) - n_d(t)\sin\theta_d(t))\,dt$$

which is the general expression (and also valid for non-micro-structured optical lines).

M9.3 Complete Definition of the Micro-structure

The function $\phi(s)$, calculated during the design process, only partially defines the "real" micro-structure. For instance, for micro-structures shown in FIGS. 71A, 71B, and 71C, $\phi=\alpha$ and thus only the active facet (from the design point of view) is defined. To be complete, the definition of these micro-structures also needs to describe the tilting angle of the inactive facet, which physically joins adjacent active facets. In FIG. 71D, both facets are active, but there is also one degree of freedom to define the micro-structure completely.

Typically, the facets are chosen in order to make the micro-structure as efficient as possible, and thus to avoid losing transmitted rays due to an undesired incidence (i.e., deflected not according to the micro-structure deflection law). As the concentrators/collimators disclosed herein transmit a 2-parameter bundle of rays (let us call it $B_t$), such transmission efficiency must be evaluated for the whole bundle $B_t$.

FIGS. 73A and 73B are magnified cross-sections of the micro-structured surface of the faceted structure shown in FIG. 71A; particularly FIG. 73A is a magnified cross-section of a first faceted structure, including an active facet 731 and an inactive facet 732, and FIG. 73B is a magnified cross-section of a second faceted structure, including an active facet 735 and an inactive facet 736. FIGS. 73A and 73B differ to one another in the inactive facet selection. Some edge rays have also been drawn. In FIG. 73A, the inactive facet is parallel to the flow line, and the inactive facet does not intercept rays of $B_t$. This condition is just an inequality, so the tilting angle of the inactive facet can be chosen within a certain range. In FIG. 73B, the transmitted bundle do not intercept the inactive facet, and the inactive facet is parallel to the flow line of $B_t$, to work as a mirror by metallic or TIR reflection (the name "inactive" is not exact in this case). If the bundle is symmetrical with respect to its flow line, a mirror parallel to the flow line has the property of performing as a guide for the bundle $B_t$, not disturbing its geometry (then, this inactive facet is indeed inactive from this point of view).

Figure 74:
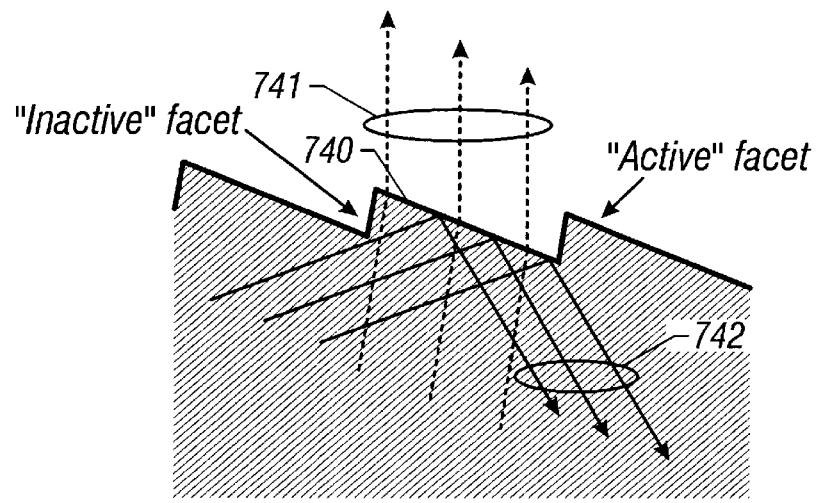
FIG. 74 is a magnified cross-section of the micro-structured upper optical line of the $F_dF_mF_i$ collimator.

FIG. 74 is a magnified cross-section of the micro-structure upper optical line of the $F_d F_m F_i$ collimator, showing that the bundle impinges twice upon an active facet 740. Two groups of flow lines are shown: a first group 241 that is refracted through the active surface 240, and a second group of flow lines 242 that are reflected via TIR. The inactive facet is parallel to the flow lines of the first group 241 for the refraction, and it is not intercepted by the second bundle 242 for the total internal reflection. FIG. 74 is an interesting example of a complete definition of a micro-structure is that of the upper optical line of the $F_d F_m F_i$ collimator design. The transmitted bundle $B_t$ impinges twice on this line during its propagation from a source (not shown): first when the bundle 242 suffers a total internal reflection on it ($F_i$), and next when the bundle 741 is refracted ($F_d$) to become $B_o$. The inactive face has been designed as parallel to a flow line of the bundle 741 for the $F_d$ incidence, a selection that is compatible with the inequality that results from the non-interception condition for the $F_i$ incidence.

In the case of the micro-structure shown in FIGS. 71C and 71D, the selection of the inactive face cannot be done without losses as can be achieved for micro-structures shown in FIGS. 71A and 71B. In both cases the selection must be done to minimize the losses, evaluated by conventional ray tracing on one unit cell of the micro-structure.

Summary of aspect Ratio and Acceptance/output Angles

The following table summarizes the range of aspect ratios, f, that are believed to be associated with the devices described herein. As can be seen, smaller aspect ratios are characteristic of the micro-structured devices.

| Device | For small acceptance/output angle (e.g. < ±15°) | For large acceptance/output angles (e.g. < ±25°) |
|---|---|---|
| RX | 0.65 > f > 0.2 | 1.2 > f |
| RXI | 0.4 > f > 0.2 | 0.8 > f |
| XX | 0.65 > f > 0.2 | 1.2 > f |
| RR | 0.65 > f > 0.2 | 1.2 > f |
| XR | 0.65 > f > 0.2 | 1.2 > f |
| $F_d X$ | 0.45 > f | 1.2 > f |
| $F_d F_m$ | 0.45 > f | 1.2 > f |

Method for Homogenizing and Shaping the Radiative Output and Input

1. Introduction

In the early 1970s "perfect diffusers" were produced by bleaching laser speckle patterns. Such diffusers were later commercialized as light shaping diffusers by Physical Optics Corporation (POC) of Torrance, Calif. and others such as National Technical Systems, Research Division, of Culver City and Canyon Country, Calif., performed research and development of such devices under US government and private contracts in the early 1980s. Features of the bleached laser speckle pattern approach include: 1) about 100% diffusion (i.e. substantially no specular component); 2) about 100% efficiency (one low-cost light shaping diffuser versions claims 92% efficiency); 3) the diffusion pattern can have a wide variety of shapes (the shape of the diffusion around the specular beam must be an autocorrelation of a nonnegative pattern); 4) the diffuser is substantially non-depolarizing (i.e. the polarization remains substantially unchanged); 5) it can generate any width angular diffusion pattern (e.g. a 1° cone or a 90° cone are both possible); and 6) it can be easily implemented in either reflection mode or transmission mode.

For many implementations of interest, a non-uniform source will likely be utilized in the design. Therefore, without a diffuser, the beam produced would be non-uniform even with perfect conventional optics, because the source will be non-uniform. Everyone who has ever shined a flashlight beam on a wall has observed the dark splotches, bright patches, and other artifacts typical of a non-uniform beam phenomenon. Placing a perfect diffuser in a non-uniform beam will cause the projected pattern to be significantly smoothed out; and if the artifacts are not too severe, the diffuser may even make the beam approximately uniform.

The introduction of a conventional diffuser in a beam as an additional component costs additional money and extracts a penalty in the form of a light loss. It would be an advantage if the diffuser could be built into the optical device in the manufacturing process, thus eliminating the negative consequences of employing a separate device.

2. Homogenizing Features

As described herein, the diffuser can be built into any optical surface, (even including relatively small regions such as the facets in faceted designs). For example, in one embodiment the active facet 740 (FIG. 74) comprises a diffuser. The diffuser could be formed on refractive surfaces such as the facet 740, or on reflective surfaces. For example in one embodiment the back reflective surface 752 (FIG. 75) of an RXI device comprises a diffuser.

One approach to including a diffuser into an optical design is to first define the desired characteristics of the optical design and then make systematic, "random" errors that make the output pattern more uniform, spatially and spectrally, even when an unpredictable, non-uniform source is used with the optical device.

The built-in diffuser could be used in a wide variety of applications, from slightly non-uniform sources to highly non-uniform sources such as a cluster of red, green, and blue LEDs. In any particular embodiment, if the non-uniform source has a total angular divergence defined by δθ, then a diffuser of angular spread several times greater than δθ would have the effect of homogenizing the resulting beam spatially and spectrally. The pattern would closely resemble the pattern of a slightly larger single source, but now the color would be fully controllable.

3. Method of Designing Homogenizing Features

Diffusion occurs as a result of patches of phase shifts differing by about half a wavelength. For visible light, for instance, the diffuser could be designed to be theoretically perfect for a central wavelength of, say, 0.5 μm. The angular divergence in any direction is the diffraction-limited angle of the patch dimension in the orthogonal direction. For example, for circular speckles of diameter d, then the diffraction angle is given by the following well-known equation:

$$\theta = 2.44 \lambda / d$$

where λ is the wavelength of the radiation source.

For a typical application involving a visible light source, the design will require speckles as large as 30 μm for small angle diffusion. For large angle diffusion smaller speckles would be utilized.

In designing the diffusers in one embodiment, for the central wavelength, the phase retardation between adjacent patches should be precisely half a wavelength. A complete description of the method of accomplishing this calculation is described in H. J. Caulfield, "Optically Generated Kinoforms," Opt. Comm. Vol. 4, p. 201 (1971).

4. Manufacturing Considerations

One way to manufacture a diffuser onto a flat or non-flat surface is to use a laser to project a speckle pattern onto the surface to be patterned and use photolithographic patterning techniques (as routinely used in electronics manufacturing) to form the pattern. Another way to manufacture a diffuser is to use numerically-controlled machining processes to build the diffusion pattern into the mold used for manufacturing the optics.

5. Re-shaping and Homogenization

In addition to diffusing and/or selecting the wavelength, it is also possible to reshape a beam at the same time as it is being homogenized. For example, shaping diffusers are commercially available from Physical Optics Corporation of Torrance, Calif. that convert circular collimated or diverging light sources into a variety of shapes such as ellipses or circular outputs with a wide range of angular profiles. For example, these shaping diffusers can convert a 1° half-angle non-uniform diverging beam into a 5° uniform diverging beam. It is also known how to produce a variety of other shapes such as crosses and rectangles from circular beams and how to split a single beam into a variable number of beams with a variety of angular spreads between each beam. The techniques employed in these and other holographic technologies can be used directly on any of the optical faces of any family of optical devices described herein to form diffusers, and thereby to further increase their usefulness.

Method for Taking a Non-faceted Optical Design Such as an RX or RXI Device and Deriving a Family of New Optical Devices 1. Introduction Once a design has been completed for an optical device using the methods described up to this point, it will now be shown how this design can be used to create families of stepped or smooth optical devices using techniques such as simple graphical techniques or a Computer Aided Design (CAD) system.

2. General Procedure (for the Reflective Case)

Figure 75:
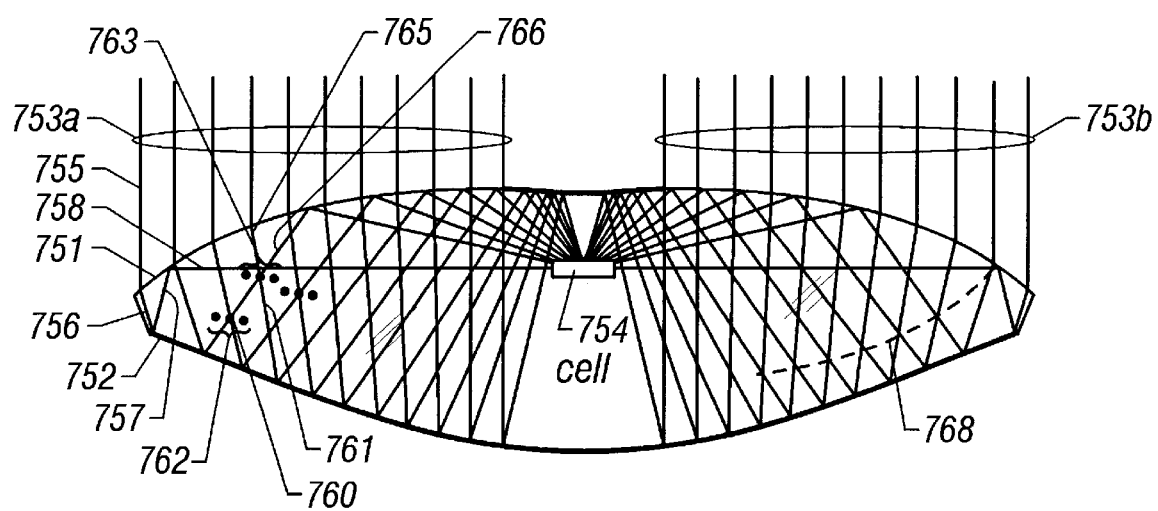
FIG. 75 is an example of a 2D ray tracing showing imaginary reflectors at point intersections and smooth curved lines connecting a sequence of ray intersections.
Figure 76:
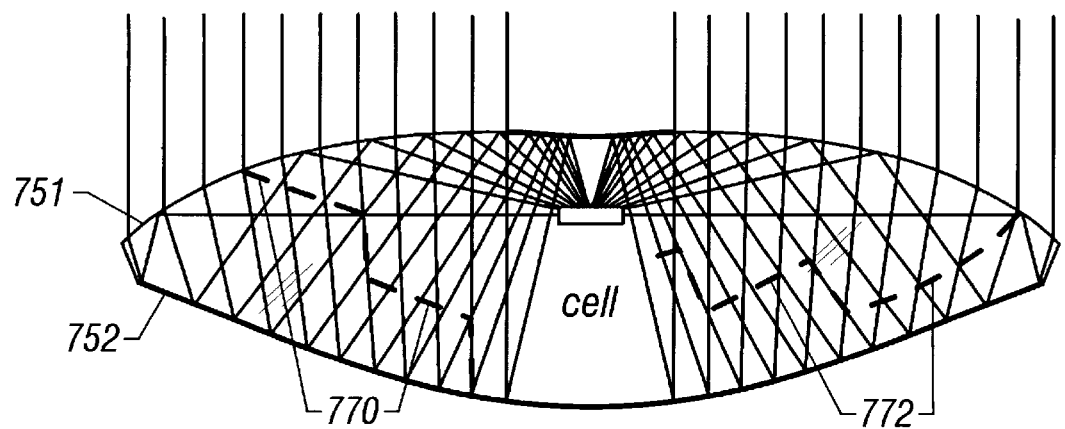
FIG. 76 shows examples of two designs derived from the flow line information.

FIGS. 75 and 76 are cross-sectional views of an RXI device, illustrating the steps used to derive a faceted optical device from a non-faceted design. FIG. 75 is an example of a 2D ray tracing showing imaginary reflectors at point intersections and smooth curved lines connecting a sequence of ray intersections. FIG. 76 shows examples of two new designs derived from the flow line information of ray tracing. The process can be enumerated as follows:

Step 1. First a numerical description of the surfaces (a 2D sectional numerical description will suffice) of an optical device (e.g. RX, RXI or other type device) must be supplied. For example, the numerical descriptions disclosed herein in table form can be used.

Step 2. The numerical description is applied to generate an accurate sectional representation in suitable program such as a CAD program or an optical ray trace program. FIGS. 75 and 76 show the outline of an RXI design including a front refractive surface 751 and a back, reflective surface 752.

Step 3. Using established techniques and equations, a ray tracing is performed on the 2D section using the source/receiver data that is associated with the design in order to calculate the flow lines of the transmitted bundle. FIG. 75 shows a plurality of substantially parallel external rays 753a and 753b that then enter the RXI device and follow respective optical paths through the RXI device, and all rays eventually impinging upon a receiver 754.

The flow lines are defined as the lines tangent to the geometrical vector flux field at all their points. In the case of bundles which have only two edge rays crossing each point, the geometrical vector flux is parallel to the bisector of the edge rays, and its modulus is equal to 2sinα, where a is the half the angle formed by the edge rays. The fineness of the ray tracing determines the range of designs that can be generated or determined by this approach. This will be clear when an example of the approach is given. It should be obvious that a ray-tracing program will speed up the process significantly compared to the CAD method of ray tracing. However, a parametrically driven CAD program will be highly accurate for this purpose, and can work well. Also, it is also now possible to perform this ray tracing in commercial programs such as MathCAD 2000™, which combines a mathematical engine with a 2D CAD package.

Step 4. For a concentrator design, with the ray tracing completed either number or label each of the input flow lines in the design. For example, in the example of the concentrator ray tracing shown in FIG. 75 we see that there are twenty-two input-flow lines, including eleven on each side of the device; particularly the flow lines comprise a first group 753a that includes all flow lines on the left side of the receiver 754, and a second group 753b that includes all flow lines on the opposite (right) side of the receiver. Because of symmetry between the two sides of the device on either side of the receiver, it is necessary only to consider the use of the rays on one side (e.g. the rays 753a) of the device to perform the analysis. In other words, once the rays are calculated for one side, they are identical at the other side. However, it is possible to design a non-symmetrical solution if desired, and in such an embodiment either or both sides would be used, and the analysis performed twice within the given constraints.

Step 5. For a concentrator design, the next step is to look at the internal flow lines in the device and to label each of the internal ray deflections through the device in a systematic manner. In the example of FIGS. 75 and 76, an external flow line 755 is first refracted at the front surface 751 to provide a first internal flow line 756 (an Lr type), which is then is reflected from the back, reflective surface 752 to provide a second flow line 757 (an Lx type), which is then reflected from the back of the front surface by TIR to provide a twice-reflected flow line 758, which then propagates onto the receiver 754.

Step 6. Next, at every point P where an Lr (refracted at the front surface) type of flow line crosses an Lx (reflected from the back surface) type of flow line, as exemplified by the points at 760 and also at 761, the normal vector to a mirror theoretically placed at that point is calculated such that the mirror is at the required angle to transform, by reflection, the flow line direction of the Lr flow line into the flow line direction of the Lx flow line. That normal vector can be easily calculated by applying the reflection law to the vector tangent to the flow lines at that point. A few examples of these "imaginary" reflectors are shown in the FIG. 75 by the three dots arranged in a line; for example the three dots shown at 762 define a line of a reflector through the point 760, and the three dots shown at 763 define a line of a second reflector through the point 761. In one of the examples shown, a flow line 765 of the Lr type is redirected (reflected) by the second reflector to provide the flow line 766 of the Lx type.

Step 7. Next by inspection and/or defined requirements it is determined how far from out from the central axis on the sectional view to start construction of the new optical device.

Step 8. Next, select a set of points at the intersections of Lr and Lx lines, so that the points, when connected, create a continuous smooth curve starting from the outside of the device drawing and continuing on towards the central axis of the device. This smooth curve that connects this set of points is such that it is perpendicular to the normal vector fields found in step 6. These continuous intersections linked by segments perpendicular to the normal vector field can be determined by visual inspection. One of these continuous curves is shown in the FIG. 75 by the continuous dashed line 768 on the right side of the ray traced drawing, that represents an example curve created by connecting a sequence of imaginary reflectors. The design process starts with determining the size and length of these continuous curves and their smoothness.

Step 9. It is also possible, if desired, to create a mirror that is parallel to a flow line (so it does not disturb the bundle whose flow line it is parallel to), using the flow lines that have already been calculated. FIG. 76 shows two different faceted designs for illustration purposes: a faceted concentrator design 770 on the left side and a faceted collimator design 772 on the right hand side. In a typical device a single faceted design is used throughout the device. Note that in the concentrator mode, shown on the left of FIG. 76, the inactive portion of the faceted mirror is chosen to lie parallel to a flow line of the first (Lr) type in order to avoid disturbing the flow lines of the Lr type, which would otherwise reduce efficiency. However, in the concentrator mode shown on the right of FIG. 76, the inactive facet of the mirror is chosen parallel to a flow line of the Lx type in order to avoid disturbing the flow lines of the Lx type, which would otherwise reduce efficiency.

Step 10. By using either straight or curved "replacement" reflectors that approximately connect the intersection points, it is possible to derive an optical device that is substantially different from the original design in its aperture size and shape. One advantage of the faceted design is that it can be made much thinner (i.e. it can be made with a higher aspect ratio) than the original design, and accordingly such a device could be lighter and fit into a smaller space. Select a starting point away from the axis of the original ray tracing and move inwards, choosing the slope of the replacement reflectors at the points of intersection on one or more of the "continuous intersection curves" that appears in the ray tracing. Whenever an abrupt change in the slope of the curve or straight-line is encountered and/or the segment needs to be ended, then the next curve can be selected by following one of the flow lines in the ray tracing upward or downward as desired. FIG. 76 gives one illustration of how this is carried out, by showing the faceted surfaces of this particular design at 770 and 772.

It is also possible to adjust the vertical height of the line or curve of the reflector such that it aligns more accurately with the next continuous sequence curve. This adjustment can be accomplished by maintaining the slope of the line segment while it is being drawn and moving it up or down or slightly away from the ray intersection point. Using this approach, a continuously-curved reflector can be created that links many of the intersection points. An example of such a solution is shown on the right hand side of FIG. 76 by the dashed lines. Another technique is to use the various constraint features of the CAD program to create a continuous B-spline, Bezier or other curve or curves linking all the imaginary reflector lines.

3. Extending the Procedure to the Refractive Case

Using a similar approach to that described above with respect to reflective surface, this method can be extended to adjust the shape of refractive surfaces. For example, in the collimator mode, at any point inside a device (other than an RXI device), a surface slope can be calculated given the angle of the refractive flow line at the point and the desired output angle, through the use of Snell's law. There are many CAD packages that allow calculations to be automatically be handled by an imbedded parametric equation. Alternatively, the surface can be generated, by simply translating or moving small segments of the original refractive surface associated with the refractive flow lines. By repeated application of this calculation for many points, in combination with the smoothing functions of the CAD package, the desired shape can be determined.

Further, it is possible (although more difficult) to apply the method to surfaces that are used for both refraction and TIR. It should be obvious that the method can be easily applied to all type of ray tracings whether they are for concentrators, collimators, redirectors or other devices.

4. Accuracy Considerations

The accuracy of the above methods is typically dependent on the fineness of the ray tracing used to derive the optical design. For example, if a ray tracing technique utilizes a large number of rays, a highly efficient optically design can be produced that is more compact than the original.

5. Performance Considerations

Comparing the performance of the new devices with the corresponding original ones from which they were designed, typically the performance is somewhat less than in the original device. For instance, in the collimator mode, the degree of collimation is lower in the stepped ones than in the original devices. It is believed that this is due to the fact that the bundle, after reflecting on a point of a mirror that is inside the volume of the original device, will have an angular span that is greater than that of the reflected bundle of the original device at the same point. Furthermore, the coupling of the direction of the flow lines by the mirror in step 6 did not guarantee that the bundles would also be coupled by the mirror: the modulus of the Lx-type geometrical vector flux will be greater than that of the Lr-type one, and thus they all cannot be coupled). This widening of the bundles with respect to the original ones also modifies the actual Lr-type flow lines of the stepped design, and also affects the refraction (so the Lr-type flow lines are also modified). However, these two last effects are negligible for high collimating designs, for which the angular spans are small and the modification of the flow lines is very slight.

Sample Embodiments

The transducers described herein can be implemented in a wide variety of forms, some of which are shown in FIGS. 77 through 88 and FIGS. 89 through 96. In those figures, the optical surfaces are shown approximately to scale on a graph, and characteristics and a numerical description are included. It should be understood that the optical surfaces can be implemented in a number of different ways; for example as a single-piece dielectric with the appropriate coatings formed thereon.

The following numerical examples disclose a number of different configurations of the devices described herein. Each example is defined with reference to its associated figure, by specifications that include device dimensions, characteristics of the input and output beams, and optical surface specifications. Particularly, each optical surface in a non-faceted design is defined by a high-degree polynomial having substantially the following form:

$$Z = \sum_{j=0}^{N} A_j \rho^j$$

where z is the axial coordinate, $\rho$ is the radial coordinate, and N is the order of the polynomial. In these example, the coefficients $A_j$ are zero for all odd values of the index j and therefore the designations for the odd-numbered coefficients are omitted from the tables.

For a faceted design, two polynomials are used to describe a single faceted surface, as will be explained, for example with reference to FIGS. 83 and 84.

Figure 77:
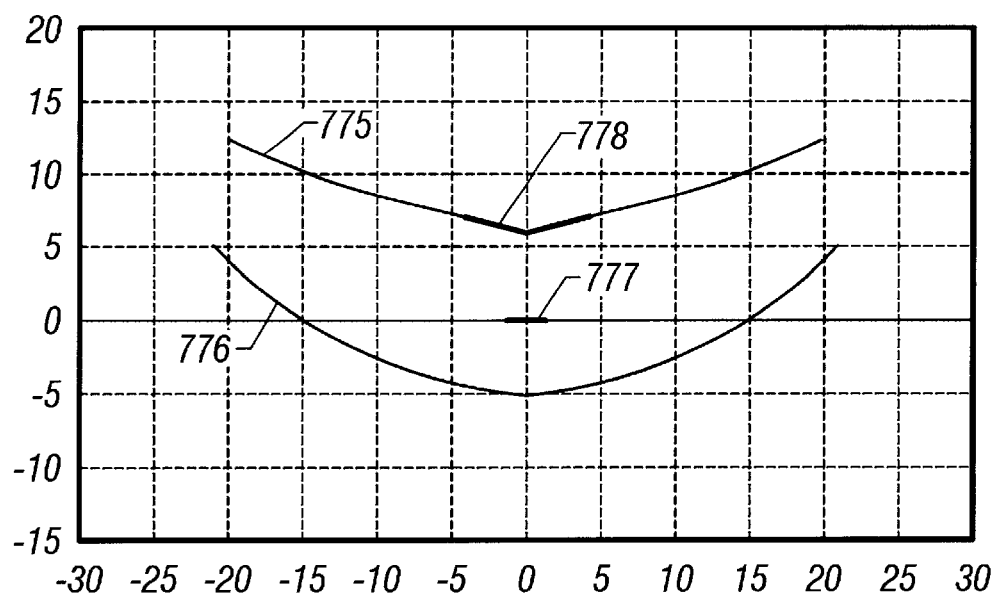
FIG. 77 is a diagram of an RXI device designed for an emitter with emission restricted to ±45°.

FIG. 77 is a diagram of an RXI device designed for an emitter with emission restricted to ±45 degrees, which may be useful for fiber-optic applications. The RXI device shown in FIG. 77 includes an upper refractive surface 775 that also functions as 25 a TIR surface, a lower reflective surface 776, a focal area 777, and a centrally located reflective area 778. Its specifications are shown in Tables I-A and I-B.

TABLE I-A

RXI Emitter with emission restricted to ±45 degrees

| | |
|---|---|
| Aperture radius | 19.85 |
| Front mirror radius | 4.0 |
| Emitting disk radius | 1 |
| Half angle of emission outside the RXI | ±3 degrees |

TABLE I-A-continued

RXI Emitter with emission restricted to ±45 degrees

| | |
|---|---|
| Half angle of emission of the emitting disk | ±45 degrees |
| z coordinate of the emitting disk | 0 |
| Refractive index | 1.5 |

TABLE I-B

Optical Surface Specification
RXI Emitter with ±45° emission

| j | Aj Upper surface | Aj Back surface (mirror) |
|---|---|---|
| 0 | 5.69655534767240 E+00 | −5.15549748603940 E+00 |
| 2 | 6.61055782577406 E−02 | 2.75103456054755 E−02 |
| 4 | −1.58236471076641 E−03 | −1.05286005001394 E−04 |
| 6 | 4.07114978129583 E−05 | 2.34898442229606 E−06 |
| 8 | −7.04485057895482 E−07 | −4.25361101119710 E−08 |
| 10 | 7.12547943756960 E−09 | 4.73550463566485 E−10 |
| 12 | −3.85433448647325 E−11 | −3.17870008245136 E−12 |
| 14 | 7.84978039261424 E−14 | 1.24044031495004 E−14 |
| 16 | 1.65677721413578 E−16 | −2.10114546328632 F−17 |
| 18 | −7.60958615913921 E−19 | −3.62970125509428 E−20 |
| 20 | −8.75161765875855 E−22 | 2.64968032854517 E−22 |
| 22 | 2.59867995816026 E−24 | −4.48010062940569 E−25 |
| 24 | 1.23884976040948 E−26 | −3.83944226393646 E−28 |
| 26 | 1.08717470412208 E−29 | 2.75278312586766 E−30 |
| 28 | −1.19665131093278 E−31 | −4.08770728586701 E−33 |
| 30 | −4.61084966238219 E−35 | −1.62516628960130 E−38 |
| 32 | −3.65998827962527 E−37 | 1.72362332943903 E−38 |
| 34 | 1.82302546273376 E−39 | −5.76629459436808 E−41 |
| 36 | 2.99257946427511 E−42 | 4.12914906906716 E−44 |
| 38 | −1.75915535466800 E−45 | 1.57287419213749 E−46 |
| 40 | −2.00688943964622 E−47 | −2.90232090595038 E−49 |
| 42 | 1.95103031050895 E−50 | 4.25744284947710 E−52 |
| 44 | −8.72096084661392 E−53 | −9.38731765492506 E−55 |
| 46 | 2.03581014419278 E−55 | 3.00788050439050 E−58 |
| 48 | −5.38364782902487 E−58 | 8.79628305666878 E−61 |
| 50 | 6.82679329131717 E−61 | −5.64296996386966 E−63 |
| 52 | 5.40800637224286 E−64 | 1.42113472409901 E−65 |
| 54 | −1.15270320956275 E−66 | −1.09576067342529 E−68 |
| 56 | 1.17256037678939 E−68 | 1.33563767267799 E−72 |
| 58 | 1.53489328851691 E−71 | 1.29480983518115 E−73 |
| 60 | −4.91200323747113 E−74 | −3.79020382808124 E−76 |
| 62 | 1.09170994902764 E−76 | 5.92519772737475 E−79 |
| 64 | −3.35259909355997 E−79 | −2.21790672944663 E−82 |
| 66 | −8.43212511956741 E−82 | −2.53465480566833 E−84 |
| 68 | −9.06305434597297 E−86 | 5.85891938743259 E−87 |
| 70 | −6.03663173379396 E−88 | −9.11894489883524 E−90 |
| 72 | −3.14277077277289 E−90 | 8.23193224539698 E−93 |
| 74 | 3.48096365080244 E−92 | 4.82488455495135 E−96 |
| 76 | 1.02032046612011 E−95 | −1.34904782631551 E−98 |
| 78 | 3.33207640588846 E−98 | 35.1768056110088 E−101 |
| 80 | 5.1162462363589 E−101 | −1.1141495172132 E−103 |
| 82 | −1.5995631532390 E−103 | −6.5057781162467 E−107 |
| 84 | −7.8010120577380 E−106 | −2.0712448379676 E−109 |
| 86 | −1.7107130037535 E−108 | 2.6013569526294 E−111 |
| 88 | 3.4135463177774 E−111 | −3.9102415503984 E−114 |
| 90 | 1.1110285651862 E−113 | 1.0497000343156 E−116 |
| 92 | −6.0111268537161 E−116 | −1.0269951211265 E−119 |
| 94 | 1.7694282997711 E−118 | −1.0101084693885 E−122 |
| 96 | −3.6717356995016 E−121 | 4.5690883925490 E−125 |
| 98 | 1.9913853461744 E−124 | −3.0109396145904 E−127 |
| 100 | 3.2738723727414 E−127 | 4.0169635916442 E−130 |

Figure 78:
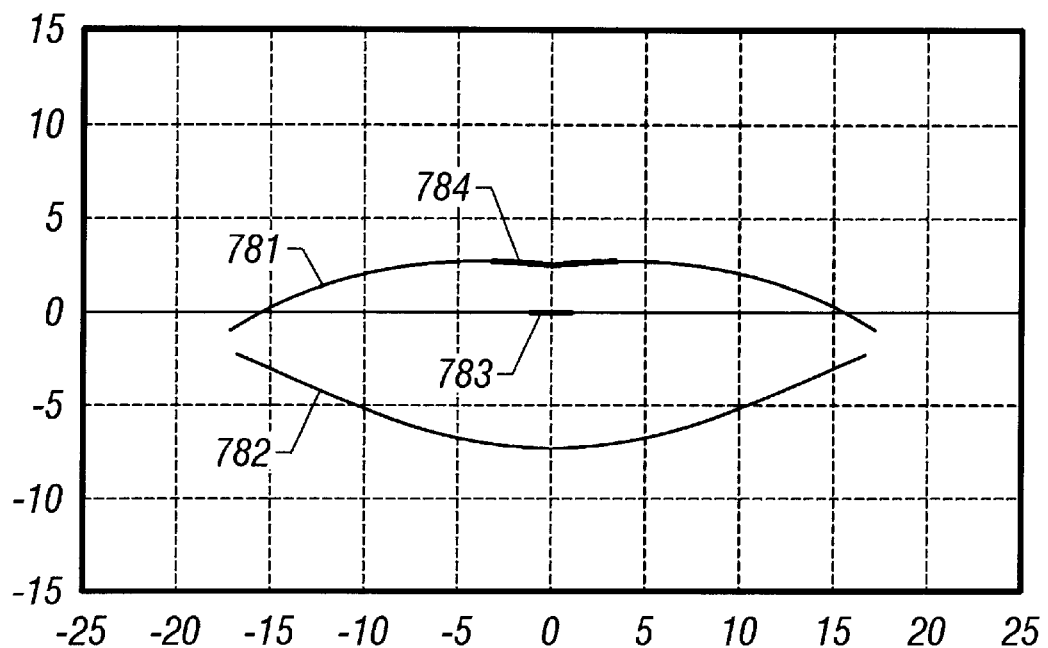
FIG. 78 is a cross-sectional diagram of an RXI device designed for an emitter with emission ±90°.

FIG. 78 is a cross-sectional diagram of an RXI device designed for an emitter with emission ±90 degrees. The RXI device shown in FIG. 78 includes an upper refractive surface 781 that also functions as a TIR surface, a lower reflective surface 782, a focal area 783, and a centrally located reflective area 784. Its specifications are shown in Tables II-A and II-B.

TABLE II-A

RXI Emitter with emission ±90°

| | |
|---|---|
| Aperture radius | 17.2 |
| Front mirror radius | 3.1 |
| Emitting disk radius | 1 |
| Half angle of emission outside the RXI | ±5 degrees |
| Half angle of emission of the emitting disk | ±90 degrees |
| z coordinate of the emitting disk | 0 |
| Refractive index | 1.5 |

TABLE II-B

Optical Surface Specification
RXI Emitter with emission ±90°

| j | Aj Upper surface | Aj Back surface (mirror) |
|---|---|---|
| 0 | 2.31725076041696 E+00 | −7.37133680053414 E+00 |
| 2 | 3.80800642466363 E−02 | 4.51182767827229 E−03 |
| 4 | −2.76492653744668 E−03 | 2.09897464938505 E−03 |
| 6 | 1.00720583657875 E−04 | −1.17426723210673 E−04 |
| 8 | −2.22764511001305 E−06 | 3.61644886538969 E−06 |
| 10 | 3.00639176508791 E−08 | −6.81664809935019 E−08 |
| 12 | −2.42715124409016 E−10 | 8.22521286330256 E−10 |
| 14 | 1.05412787039012 E−12 | −6.40278405629897 E−12 |
| 16 | −1.46677962493605 E−15 | 3.09885486124727 E−14 |
| 18 | −2.81660557006154 E−18 | −8.08775966678685 E−17 |
| 20 | −2.27883928835253 E−20 | 4.55698884514791 E−20 |
| 22 | 2.43905755087987 E−22 | 2.29110857307006 E−22 |
| 24 | −6.26209707954455 E−25 | 2.17215889263538 E−26 |
| 26 | 7.93969685508114 E−28 | −1.11911292509071 E−27 |
| 28 | −1.92392548118733 E−30 | −4.47571626988645 E−30 |
| 30 | −3.72711710275552 E−33 | 9.14592321401351 E−34 |
| 32 | 4.02398502758011 E−36 | 1.12448272353735 E−34 |
| 34 | 2.16806615276962 E−37 | −2.71902738954674 E−37 |
| 36 | −3.63900213678340 E−40 | 2.29551240878854 E−39 |
| 38 | −2.46442594995153 E−42 | −1.66737555131766 E−41 |
| 40 | 1.16925349224248 E−44 | 2.56267685109055 E−44 |
| 42 | −1.49886404887712 E−47 | −1.93572746792114 E−48 |
| 44 | −5.16910926997372 E−50 | 4.13454549367165 E−49 |
| 46 | 8.37139004899778 E−53 | −5.92096336391841 E−52 |
| 48 | 3.90712117000022 E−55 | −2.63961017580788 E−54 |
| 50 | −9.59781627746757 E−58 | −6.54468954088447 E−57 |
| 52 | 8.31955684194812 E−60 | 1.31436514612311 E−59 |
| 54 | −2.95422399426398 E−62 | 6.00926721644585 E−62 |
| 56 | −4.41093231908447 E−65 | 6.10508653681224 E−64 |
| 58 | 3.10203737663007 E−67 | −3.08852435057763 E−66 |
| 60 | −3.39142657689632 E−70 | 3.51975182436756 E−69 |

Figure 79:
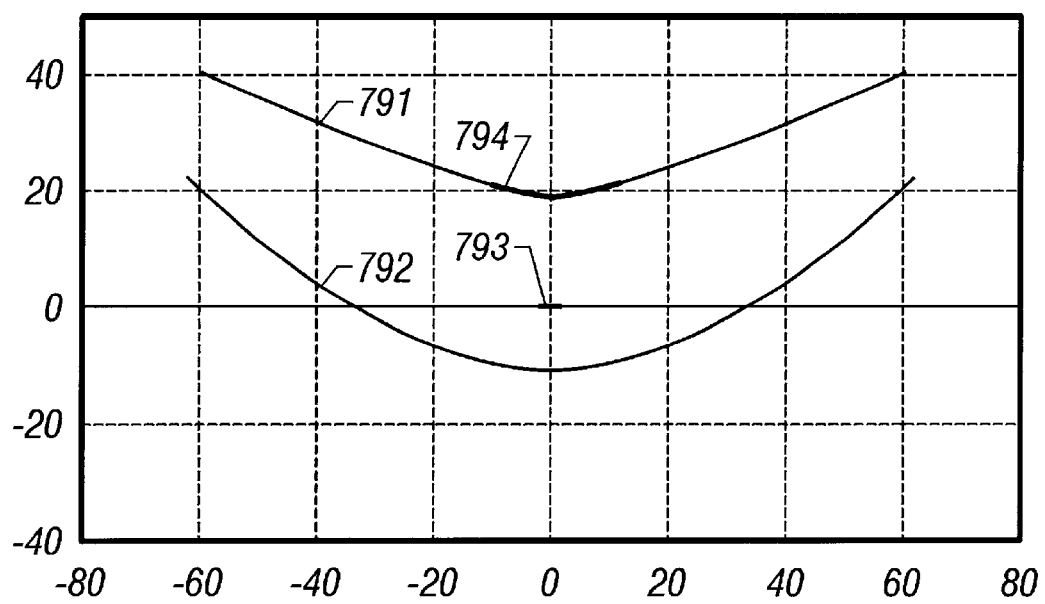
FIG. 79 is a 2D design of the optical surfaces on an RXI device designed for an emitter with emission restricted to ±45°.

FIG. 79 is a 2D design of the optical surfaces on an RXI device designed for an emitter with mission restricted to ±45 degrees. The RXI device shown in FIG. 79 includes an upper refractive surface 791 that also functions as a TIR surface, a lower reflective surface 792, a focal area 793, and a centrally located reflective area 794. Its specification shown in Tables III-A and III-B.

TABLE III-A

RXI Emitter with emission restricted to ±45°

| | |
|---|---|
| Aperture radius | 60.1 |
| Front mirror radius | 10.4 |
| Emitting disk radius | 1 |
| Half angle of emission outside the RXI | ±1 degrees |
| Half angle of emission of the emitting disk | ±45 degrees |
| z coordinate of the emitting disk | 0 |
| Refractive index | 1.5 |

TABLE III-B

Optical Surface Specification:
RXI Emitter with emission restricted to ±45°

| j | Aj Upper surface | Aj Back surface (mirror) |
|---|---|---|
| 0 | 1.87038343446460 E+01 | −1.08139760013729 E+01 |
| 2 | 2.48159765403940 E−02 | 1.03906390385324 E−02 |
| 4 | −6.63244753928673 E−05 | −6.50812368859122 E−06 |
| 6 | 1.78099649797466 E−07 | 1.62886492245884 E−08 |
| 8 | −3.01061354280309 E−10 | −2.62902475481419 E−11 |
| 10 | 2.87315376400604 E−13 | 2.53970909508862 E−14 |
| 12 | −1.26781937626174 E−16 | −1.42986282428941 E−17 |
| 14 | −1.01447322415612 E−20 | 4.17150894877093 E−21 |
| 16 | 3.37939916868252 E−23 | −3.21165909328678 E−25 |
| 18 | −9.40093896430816 E−27 | −5.95482968404293 E−29 |
| 20 | −1.85964182626024 E−30 | −3.62175580072140 E−32 |
| 22 | 9.98073341313179 E−34 | 1.47426149895204 E−35 |
| 24 | 4.93426845550725 E−38 | 1.62341596144663 E−39 |
| 26 | −2.36690922905270 E−41 | −4.97056917125490 E−43 |
| 28 | −8.65683010871282 E−45 | −1.56059557798366 E−46 |
| 30 | −2.11366828361002 E−48 | 8.06923861183867 E−51 |
| 32 | 3.57729648762149 E−52 | 2.13041692900316 E−54 |
| 34 | 3.58807819968306 E−55 | −6.59390570644649 E−58 |
| 36 | 3.03647288167373 E−59 | 1.07161602918813 E−60 |
| 38 | −1.40573961548584 E−62 | −4.45395411048999 E−65 |
| 40 | −4.16052262688510 E−66 | −7.77090294467569 E−70 |
| 42 | −9.35397776445461 E−70 | −1.41435872402350 E−71 |
| 44 | −5.79381482204753 E−74 | −5.37967825734599 E−76 |
| 46 | 9.70947743569938 E−77 | −2.11517603988801 E−79 |
| 48 | 5.07435019037875 E−80 | 1.75620846347837 E−83 |
| 50 | −4.28228402518112 E−84 | 6.22672596630123 E−86 |
| 52 | −2.57265637246942 E−87 | 9.31782918114615 E−90 |
| 54 | −3.17219308023028 E−91 | −1.00900822913759 E−93 |
| 56 | 3.47056942639049 E−95 | −4.44858290988327 E−97 |
| 58 | 1.76303306074547 E−98 | −1.81377740896933 E−100 |
| 60 | 7.47431158910394 E−102 | −1.41208660562912 E−105 |
| 62 | −9.82118938912149 E−106 | 3.29732503039617 E−108 |
| 64 | −4.05135230074180 E−109 | 1.81476691894671 E−111 |
| 66 | 6.42791959373409 E−113 | −9.98277873126518 E−116 |
| 68 | 3.98928344707620 E−117 | 3.55474197575300 E−120 |
| 70 | −2.84953006653620 E−122 | −3.98983740484427 E−123 |
| 72 | −3.53839407012955 E−124 | 2.08968356310426 E−126 |
| 74 | −1.96204541766184 E−127 | −4.90278900791867 E−130 |
| 76 | 5.18992582218819 E−131 | 2.04594938729300 E−134 |
| 78 | 5.97088130393884 E−135 | −3.00022832649257 E−137 |
| 80 | −1.50289228990213 E−138 | 5.55676320814944 E−141 |

Figure 80:
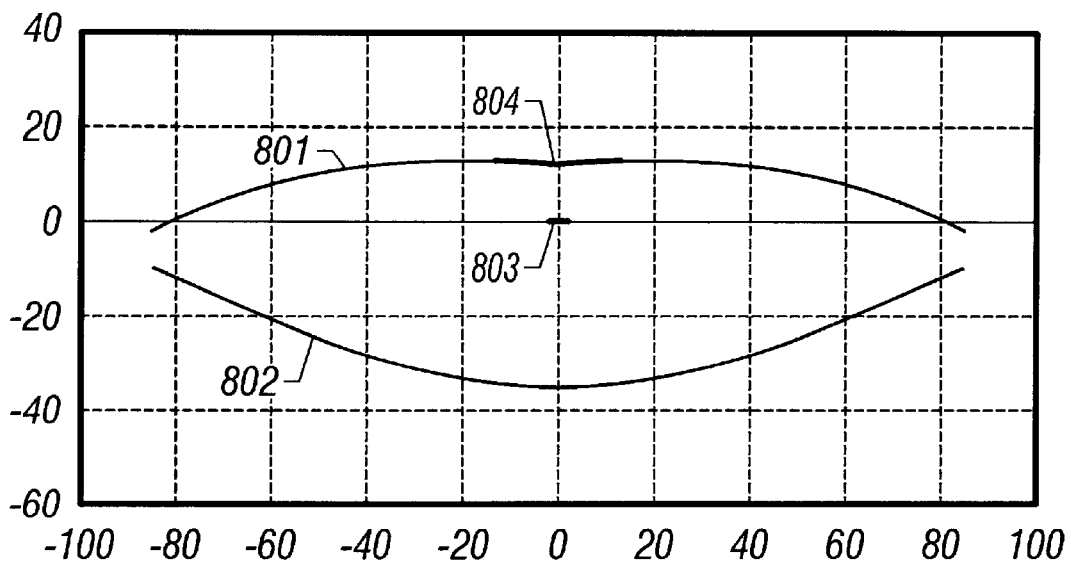
FIG. 80 is a 2D diagram of the optical surfaces of an RXI device designed for an emitter with emission ±90°.

FIG. 80 is a 2D diagram of the optical surfaces of an RXI device designed for an emitter mission ±90 degrees. The RXI device shown in FIG. 80 includes an upper refractive surface 801 that also functions as a TIR surface, a lower reflective surface 802, a focal area 803, and a centrally located reflective area 804. Its specifications are shown in IV-A and IV-B.

TABLE IV-A

RXI Emitter with emission ±90°

| | |
|---|---|
| Aperture radius | 85.94 |
| Front mirror radius | 10.56 |
| Emitting disk radius | 1 |
| Half angle of emission outside the RXI | ±1 degrees |
| Half angle of emission of the emitting disk | ±90 degrees |
| z coordinate of the emitting disk | 0 |
| Refractive index | 1.5 |

TABLE IV-B

Optical Surface Specification:
RXI device with emission of ±90°

| j | Aj Upper surface | Aj Back surface (mirror) |
|---|---|---|
| 0 | 1.19277003523066 E+01 | -3.60207592259810 E+01 |
| 2 | 7.18873041204095 E-03 | 5.86049710666623 E-03 |
| 4 | -1.72268614322975 E-05 | -3.26586005702166 E-06 |
| 6 | 2.09183957660909 E-08 | 4.14381638301234 E-09 |
| 8 | -1.52253583934274 E-11 | -3.34221304550535 E-12 |
| 10 | 6.44820015632653 E-15 | 1.62989576296892 E-15 |
| 12 | -1.43178465549737 E-18 | -4.40868825978548 E-19 |
| 14 | 8.65655079588911 E-23 | 4.27076612973388E-23 |
| 16 | 2.24970876501474 E-26 | 7.69570639162921E-27 |
| 18 | -1.33610485422277 E-30 | -1.86622297432025 E-30 |
| 20 | -1.00916182822429 E-33 | -9.56657301726154 E-35 |
| 22 | 1.45367060894359E-37 | 4.26492288810021 E-38 |
| 24 | 7.75181913629954 E-43 | 2.08327603034004 E-43 |
| 26 | -3.30578954891309 E-46 | -2.15576644602213 E-46 |
| 28 | -9.21381009661569 E-50 | -3.76939320036412 E-50 |
| 30 | -2.62957041534019 E-54 | -1.83581232179476 E-54 |
| 32 | 1.54642106480524 E-57 | -1.29458590513944 E-59 |
| 34 | 2.86081678670589 E-62 | 8.3898079106464 E-62 |
| 36 | -2.77760405754985 E-65 | 5.64101274444637 E-66 |
| 38 | -3.02196204801441 E-69 | 1.86714009659915 E-69 |
| 40 | 4.64864824729595 E-73 | 8.71424938563799 E-74 |
| 42 | 1.98720188932951 E-76 | -4.06402735651498 E-77 |
| 44 | -5.06299722006984 E-81 | -1.27374877908410 E-80 |
| 46 | -3.86946699760636 E-84 | 1.43393613822086 E-85 |
| 48 | -7.09662802554844 E-90 | 8.19551264321073 E-89 |
| 50 | 1.78339005752745 E-92 | 3.14174049305514 E-92 |
| 52 | 6.11913723698387 E-97 | -1.15992231753905 E-96 |
| 54 | 1.64156465799852 E-100 | -8.50201469326449 E-101 |
| 56 | -1.19465755143729 E-107 | -9.98497922864930 E-105 |
| 58 | 1.28227471409673 E-108 | -8.08703870030805 E-109 |
| 60 | -1.41289032518127E-112 | -8.01411913442296 E-113 |
| 62 | 4.30376141285134 E-117 | -3.82073940123143 E-117 |
| 64 | -3.20377142485365 E-120 | 1.56408505487436 E-121 |
| 66 | -2.00548065878650 E-124 | 8.40528285146552 E-125 |
| 68 | -2.51758522518254 E-128 | 9.12769444871743 E-129 |
| 70 | 2.92572832399851 E-132 | 2.01141882825470 E-132 |
| 72 | -2.22715628168088 E-136 | 2.41403911314749 E-136 |
| 74 | 4.36330937142906 E-140 | -3.85107127168386 E-141 |
| 76 | 6.79386722113096 E-144 | 7.71271371396328 E-145 |
| 78 | 1.03143640582994 E-147 | -1.93685955151078 E-148 |
| 80 | -1.71835516508070 E-151 | -4.48963824612132 E-152 |

TABLE V-B

Optical Surface Specification:
RXI device with emission of ±90°

| j | Aj Upper surface | Aj Back surface (mirror) |
|---|---|---|
| 0 | 3.37583340514870 E+00 | -1.25771608292148 E+01 |
| 2 | 2.42939740564647 E-02 | 1.72565253252715 E-02 |
| 4 | -5.43964230739872 E-04 | -6.53887386858251 E-05 |
| 6 | 6.08505181102516 E-06 | 6.12700787694378 E-07 |
| 8 | -4.00448286661641 E-08 | -3.72415195494574 E-09 |
| 10 | 1.51518688119987 E-10 | 1.40803529806523 E-11 |
| 12 | -2.88643712640033 E-13 | -3.11146199423986 E-14 |
| 14 | 5.81614323783104 E-17 | 3.24176843179942 E-17 |
| 16 | 7.88137667433260 E-19 | 1.50653288983741 E-21 |
| 18 | -1.05171262580092 E-21 | -2.05515456623814 E-23 |
| 20 | -4.56038321476427 E-25 | -3.06082826588376 E-26 |
| 22 | 1.11253833932670 E-27 | 1.25540960465543 E-28 |
| 24 | 1.40236805691673 E-30 | -2.84208497409821 E-31 |
| 26 | -2.27505622006248 E-33 | 3.48453725899825 E-34 |
| 28 | -1.29141017446254 E-36 | -1.67957046797561 E-37 |
| 30 | 2.56704190364476 E-39 | 4.73638859392333 E-40 |
| 32 | 9.56444978173120 E-43 | -7.49795260783409 E-43 |
| 34 | -1.47559343063191 E-45 | -3.07789557438784 E-46 |
| 36 | -1.67518885846359 E-48 | -1.19738658841970 E-49 |
| 38 | -1.92971240180430 E-51 | 1.96159256203379 E-51 |
| 40 | 2.80281622056694 E-54 | -1.14643083301749 E-54 |
| 42 | 8.30018262044470 E-57 | 8.04974747732334 E-58 |
| 44 | -2.70118364278414 E-60 | -6.12723365381011 E-61 |
| 46 | -8.64711147081732 E-63 | -2.37153886160312 E-64 |
| 48 | 7.69703848211822 E-69 | -2.87232482376741 E-66 |
| 50 | -2.12834773407776 E-69 | 1.85573154649671 E-69 |
| 52 | 1.33584598818759 E-72 | 1.24054134434185 E-72 |
| 54 | 6.18090505126000 E-75 | 8.66925163215803 E-76 |
| 56 | 4.20122476352671 E-78 | 1.97109110286095 E-79 |
| 58 | -1.51153529071448 E-81 | -4.28866904317218 E-83 |
| 60 | -4.77093332953191 E-84 | -1.08334998623165 E-84 |
| 62 | 2.24528144348043 E-87 | -1.48395670534704 E-88 |
| 64 | 4.97517296950694 E-90 | -6.77104571345835 E-91 |
| 66 | -2.05384888426494 E-93 | 5.82284978190613 E-94 |
| 68 | -1.39354144031884 E-95 | -1.47179133675021 E-96 |
| 70 | -4.86634744024061 E-99 | -6.78287560502071 E-100 |
| 72 | 4.11281157055166 E-103 | 6.10868698551380 E-103 |
| 74 | 1.87766095404342 E-104 | 3.27036431270864 E-105 |
| 76 | 1.32756404735013 E-107 | 1.01163465837685 E-108 |
| 78 | -1.93401157655785 E-110 | -2.62870513690920 E-111 |
| 80 | 7.90777432292814 E-115 | -1.19314936856756 E-115 |

Figure 81:
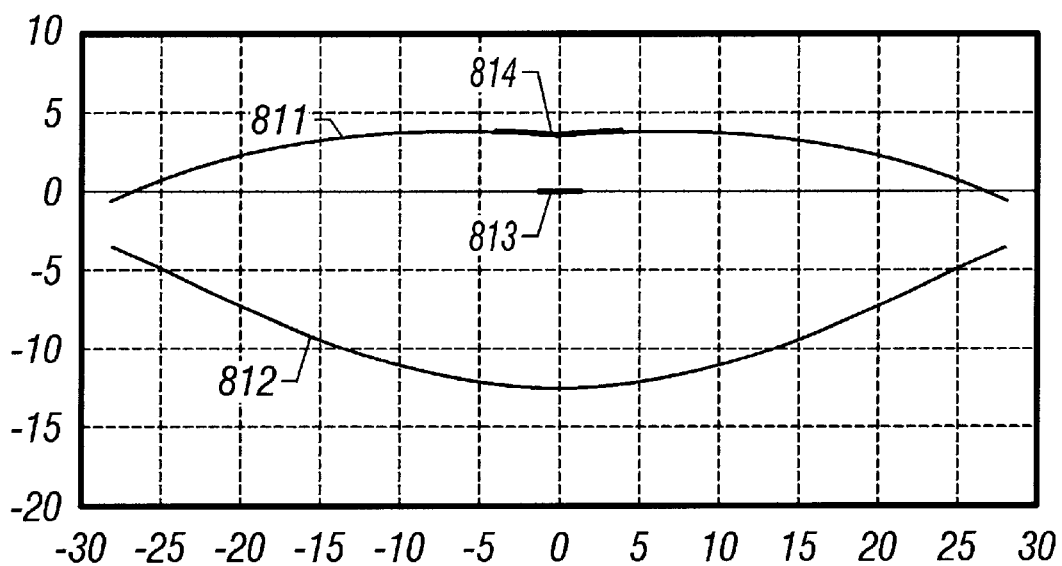
FIG. 81 is a 2D diagram of the optical surface of an RXI device designed for an emitter with emission ±90°.

FIG 81 is a 2D diagram of the optical surface of an RXI device designed for an emitter mission ±90 degrees. The RXI device shown in FIG. 81 includes an upper refractive 811 that also functions as a TIR surface, a lower reflective surface 812, a focal area 813, and a centrally located reflective area 814. Its specifications are shown in Tables V-A and V-B.

TABLE V-A

| RXI Emitter with emission ±90° | |
|---|---|
| Aperture radius | 28.66 |
| Front mirror radius | 3.79 |
| Emitting disk radius | 1 |
| Half angle of emission outside the RXI | ±3 degrees |
| Half angle of emission of the emitting disk | ±90 degrees |
| z coordinate of the emitting disk | 0 |
| Refractive index | 1.5 |

Figure 82:
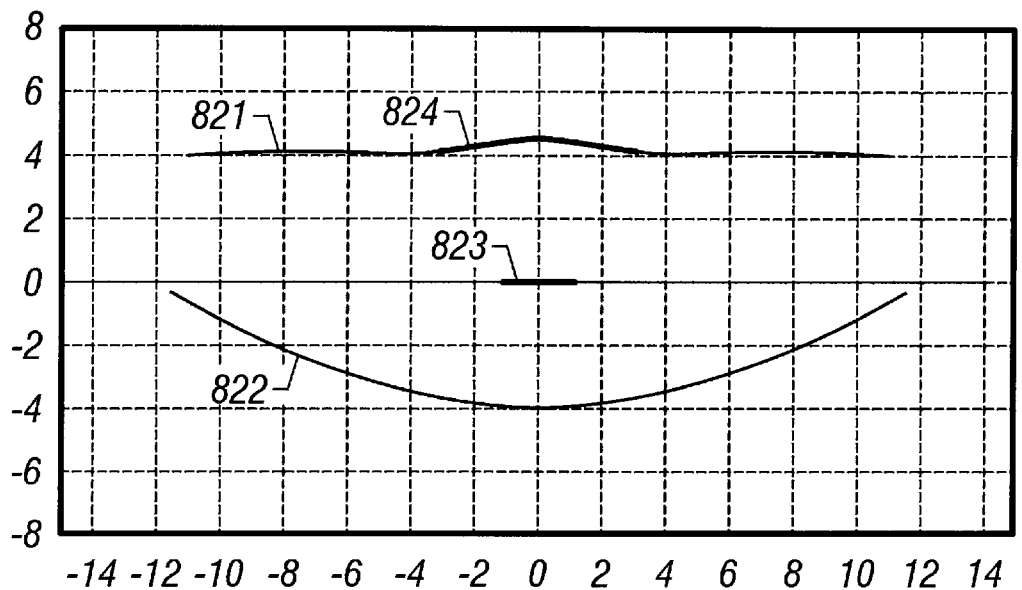
FIG. 82 is a 2D diagram of the optical surfaces of an RXI device designed for an emitter with emission restricted to ±45°.

FIG. 82 is a 2D diagram of the optical surfaces of an RXI device designed for an emitter mission restricted to ±45 degrees. The RXI device shown in FIG. 82 includes an upper refractive surface 821 that also functions as a TIR surface, a lower reflective surface 822, a focal area 823, and a centrally located reflective area 824. Its re shown in Tables VI-A and VI-B.

TABLE VI-A

| RXI emitter with emission restricted to ±45° | |
|---|---|
| Aperture radius | 11.1 |
| Front mirror radius | 3.0 |
| Emitting disk radius | 1 |
| Half angle of emission outside the RXI | ±5 degrees |
| Half angle of emission of the emitting disk | ±45 degrees |
| z coordinate of the emitting disk | 0 |
| Refractive index | 1.5 |

TABLE VI-B

Optical Surface Specification:
RXI emitter with emission restricted to ±45°

| j | Aj Upper surface | Aj Back surface (mirror) |
|---|---|---|
| 0 | 3.40364100701752 E+00 | −3.95816408960174 E+00 |
| 2 | 6.84325427925355 E−02 | 3.16630429729332 E−02 |
| 4 | −4.87370803476195 E−03 | 1.12472481789460 E−03 |
| 6 | 1.76456321759523 E−04 | −1.96562769042094 E−04 |
| 8 | 1.15355755209194E−06 | 1.31053701355031 E−05 |
| 10 | −4.34017971089124 E−07 | −4.29494138738734 E−07 |
| 12 | 1.98084160389355 E−08 | 6.05520668071725 E−09 |
| 14 | −4.47752029909820 E−10 | 1.96626797635458 E−11 |
| 16 | 5.25976413713140 E−12 | −1.66208012320082 E−12 |
| 18 | −2.11141448289883 E−14 | 1.41454372871864 E−14 |
| 20 | −1.48369906769272 E−16 | 7.94126664234480 E−17 |
| 22 | 4.04389970298270 E−19 | −1.57149339583613 E−18 |
| 24 | 2.94000092128693 E−20 | 5.38486570112128 E−21 |
| 26 | −2.83322286049076 E−22 | −4.03137399741546 E−23 |
| 28 | 3.28058816317742 E−25 | 4.43166694313880 E−25 |
| 30 | 6.10835219571155 E−27 | 2.18503077060443 E−27 |
| 32 | −2.67896010811457 E−29 | −1.73249591022746 E−30 |
| 34 | 1.06882101791021 E−31 | −3.27966353648784 E−31 |
| 36 | 4.35444803186724 E−34 | −6.86068860087472 E−34 |
| 38 | −9.42680229666738 E−36 | 6.13466176804463 E−36 |
| 40 | −1.30506085159744 E−37 | 1.32540474235864 E−37 |
| 42 | 1.78425017462647 E−39 | 2.44731594014295 E−40 |
| 44 | −3.53327383495358 E−42 | −2.04902617449638 E−42 |
| 46 | 1.94793730291085 E−44 | −5.31205320098839 E−44 |
| 48 | −4.92740012237521 E−46 | −1.96337241710686 E−46 |
| 50 | 3.77525616920490 E−48 | 3.64370880095319 E−48 |
| 52 | −4.70411551480629 E−50 | −6.14858167211940 E−51 |
| 54 | 3.44513851269546 E−52 | 1.57454604515399 E−53 |
| 56 | 5.77781154469333 E−55 | 4.16876362502979 E−55 |
| 58 | −1.52651992586919 E−56 | −6.54208422013151 E−57 |
| 60 | 4.30821570411618 E−59 | 1.96001710175289 E−59 |

Reference is now made to FIGS. 83 through 96, which describe faceted designs. For faceted designs, the faceted optical surfaces are described by two separate high-order polynomials: one polynomial defines the active facets and a second polynomial defines the inactive facets. The smooth optical surfaces are defined by a single polynomial, as above.

Figure 83:
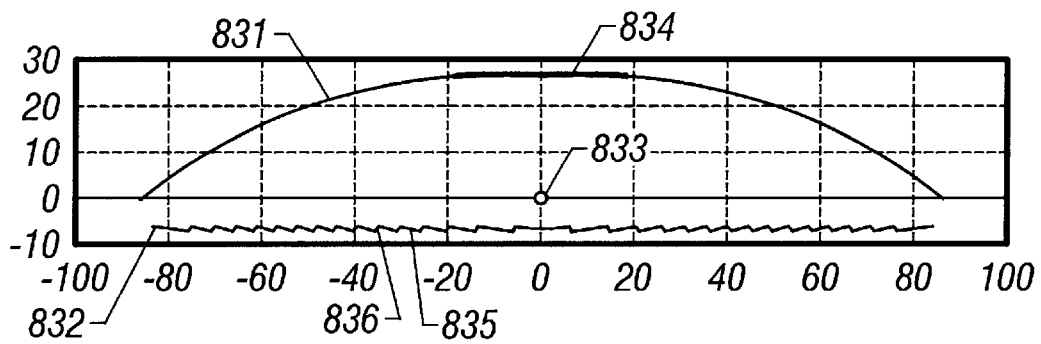
FIG. 83 is a 2D cross-sectional diagram of the optical surfaces of an $RF_mI$ device designed for a hemispherical emitter with emission restricted to ±90°.

FIG. 83 is a 2D cross-sectional diagram of the optical surfaces of an $RF_mI$ device designed for a hemispherical emitter with emission restricted to ±90 degrees. The $RF_mI$ device of FIG. 83 includes an upper refractive surface 831 that also functions as a TIR surface, a faceted lower reflective surface 832, a focal area 833, and a centrally located reflective area 834. The faceted lower surface 832 includes active facets 835 and inactive non-facets 836 that lie parallel to the flow line of the transmitted bundle. The hemisphere is placed on a flat mirror and therefore it is like a spherical emitter as seen from the upper hemisphere. This is a simplification of the behavior of an LED die on a flat mirror cup.

For the design, the size of the facets is considered infinitesimal with flat profiles; that is the facets are very small, and not to scale in the FIG. 83. Finite-size facets perform as infinitesimal ones if the size is small compared with the curvature radius of the edge-ray wavefronts at their incidence on the facet.

TABLE VII-A $RF_mI$ device designed for a hemispherical emitter with emission restricted to ±90°

| | |
|---|---|
| Aperture radius | 85.95 |
| Front mirror radius | 19.30 |
| Emitting sphere radius | 1 |
| Half angle of emission outside the RXI | ±1.50 degrees |
| Half angle of emission of the emitting sphere | ±90 degrees |
| z coordinate of the of emitting sphere center | 7.9459 |
| Refractive index | 1.5 |

Since the upper surface is a smooth surface, the upper surface 831 is defined in the single polynomial form:

$$Z = \sum_{j=0} A_j \rho^j$$

where z is the axial coordinate and ρ is the radial coordinate.

On the faceted lower surface, the active facets 835 of the multi-faceted lower surface are defined by the tilting angle θ(ρ) (with respect to horizontal) given in the form (θ in degrees):

$$\theta = \sum_{j=0} B_j \rho^j$$

where z is the axial coordinate and ρ is the radial coordinate.

The inactive non-facets 836, which lie parallel to the flow line of the transmitted bundle, of the multi-faceted lower surface are defined by their tilting angle φ(ρ) (with respect to horizontal) given in the form:

$$\phi = \sum_{j=0} C_j \rho^j$$

where z is the axial coordinate and ρ is the radial coordinate.

The coefficients $A_j$, $B_j$, and $C_j$, are set forth in Table VII-B.

TABLE VII-B

Optical Surfaces Specification:
$RF_mI$ hemispherical emitter, emission ±90°

| j | $A_j$ | $B_j$ | $C_j$ |
|---|---|---|---|
| 0 | 2.65199822352472 E+01 | 1.53325372881899 E−03 | 8.99992791075794 E+01 |
| 1 | 8.37177849148884 E−04 | 6.75607333353772 E−01 | −1.21488095354911 E+00 |
| 2 | 3.32525654605193 E−03 | −1.90286564316323 E−02 | 9.43774613408482 E−03 |
| 3 | −4.75315511295133 E−04 | 1.10617304290679 E−03 | −3.81711066391930 E−04 |
| 4 | 2.34998907171397 E−05 | −6.60619057022028 E−05 | 3.48487878934448 E−05 |

TABLE VII-B-continued

Optical Surfaces Specification:
$RF_mI$ hemispherical emitter, emission ±90°

| j | $A_j$ | $B_j$ | $C_j$ |
|---|---|---|---|
| 5 | −1.03204588510330 E−06 | 2.67389150603869 E−06 | −1.58844844369557 E−06 |
| 6 | 3.56216878786360 E−08 | −6.66479798901066 E−08 | 4.28448069067517 E−08 |
| 7 | −8.08777385778421 E−10 | 1.01818574316350 E−09 | −7.37564106747706 E−10 |
| 8 | 1.03849976120094 E−11 | −1.06764758386852 E−11 | 8.65854487173004 E−12 |
| 9 | −6.65954788644194 E−14 | 4.69448836754842 E−14 | −3.07834013955006 E−14 |
| 10 | 6.07600430523045 E−16 | 2.08403434967880 E−15 | −1.74529389518897 E−15 |
| 11 | −1.23923349673554 E−17 | −3.42117877421508 E−17 | 2.46852412054176 E−17 |
| 12 | 4.66632641845190 E−20 | −4.76413056702028 E−19 | 3.68725140614227 E−19 |
| 13 | 8.19824433143154 E−22 | 1.16772422567313 E−20 | −8.39560519909635 E−21 |
| 14 | 1.55254252060516 E−24 | 1.40356377471015 E−23 | −1.07045907742759 E−23 |
| 15 | −3.79551044686563 E−26 | −1.01352390865730 E−24 | 7.19604081265298 E−25 |
| 16 | −2.28326857380221 E−28 | −4.27753661581256 E−27 | 3.20607757302258 E−27 |
| 17 | −1.49295038361159 E−30 | 7.17143062642865 E−29 | −5.29152398913716 E−29 |
| 18 | −4.95505079583024 E−32 | 4.15858082959972 E−31 | −3.86362305821132 E−31 |
| 19 | −1.13995793173530 E−33 | −3.07819448290867 E−33 | 3.94288946796111 E−33 |
| 20 | 5.69095559829525 E−36 | −8.13699381076553 E−36 | −2.36802941445230 E−36 |
| 21 | 1.24442423732836 E−37 | | |
| 22 | 8.01338442485034 E−40 | | |
| 23 | 2.44968061572986 E−41 | | |
| 24 | 1.03518879461943 E−43 | | |
| 25 | −1.35570350308250 E−45 | | |
| 26 | −3.99876240611913 E−47 | | |
| 27 | −4.27640287005144 E−49 | | |
| 28 | 1.46230581602939 E−51 | | |
| 29 | −5.58394781163844 E−53 | | |
| 30 | 7.45890246179422 E−55 | | |
| 31 | −4.39507040683248 E−57 | | |
| 32 | 1.27273948098194 E−58 | | |
| 33 | 5.97911641994840 E−61 | | |
| 34 | 6.42698404778282 E−63 | | |
| 35 | −1.87881333355056 E−64 | | |
| 36 | −6.90863742757640 E−67 | | |
| 37 | 3.85483745079201 E−69 | | |
| 38 | 1.62996483951709 E−71 | | |
| 39 | −9.60268781157029 E−73 | | |
| 40 | 1.12025897662817 E−74 | | |

Figure 85:
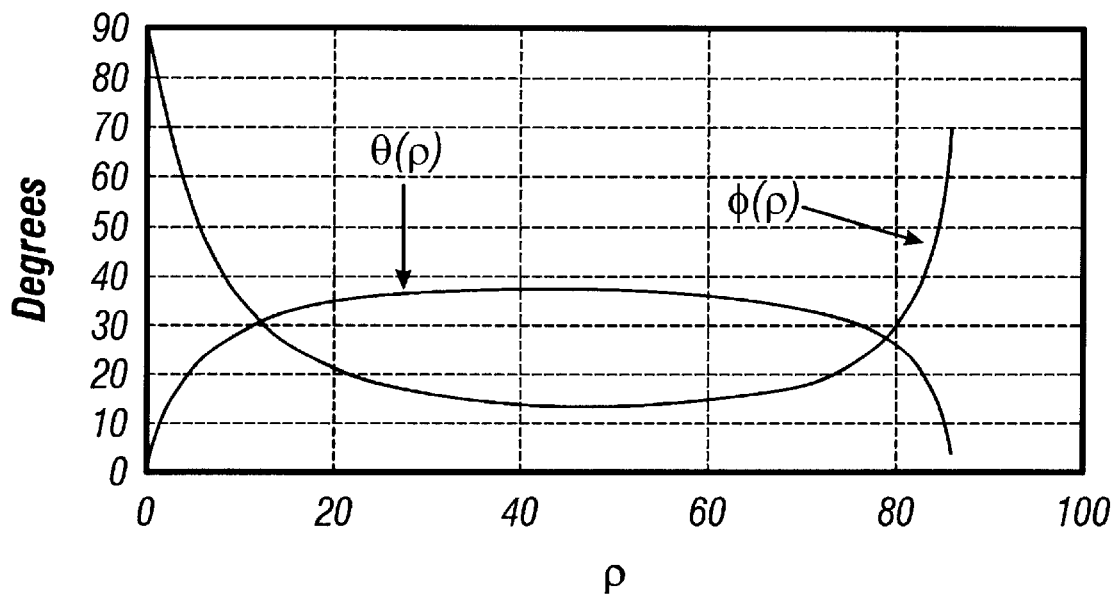
FIG. 85 is a graphical depiction showing both functions $\theta(\rho)$ and $\phi(\rho)$ as calculated for the $RF_mI$ device of FIG. 83.

FIG. 85 is a graphical depiction showing both functions $\theta(\rho)$ and $\phi(\rho)$ as calculated for the $RF_mI$ device of FIG. 83.

Figure 86:
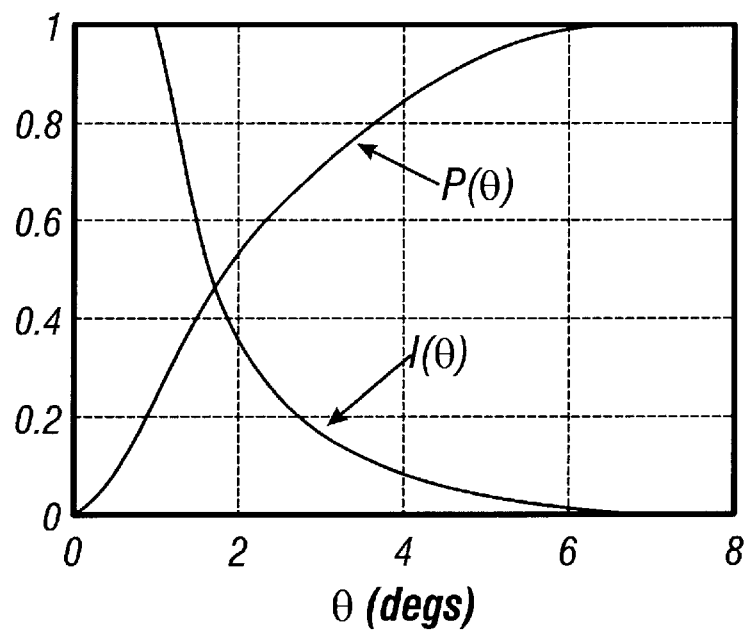
FIG. 86 is a graphical depiction of the angle emission curve $I(\theta)$ and the integrated power for the $RF_mI$ device of FIG. 83

FIG. 86 is a graphical depiction of the angle emission curve $I(\theta)$ and the integrated power for the $RF_mI$ device of FIG. 83. The integrated power is $$P(\theta) = \int_{\delta=0}^{\delta=\theta} I(\delta) 2\pi \sin\delta \, d\delta.$$

Figure 84:
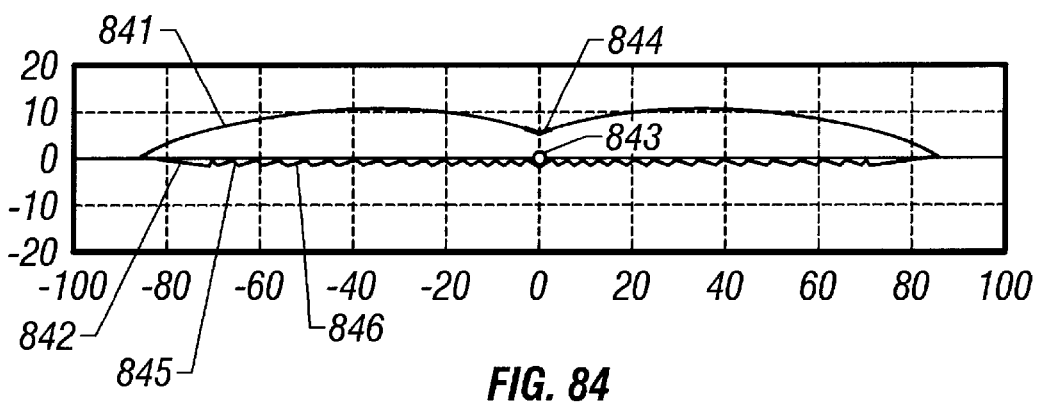
FIG. 84 is a 2D cross-section of the optical surfaces of an $RF_mI$ device designed to provide a hemispherical emitter with emission restricted to ±90°.

FIG. 84 is a 2D cross-section of the optical surfaces of an $RF_mI$ device designed to provide a hemispherical emitter with emission restricted to ±90 degrees. The $RF_mI$ device of FIG. 84 includes an upper refractive surface 841 that also functions as a TIR surface, a faceted lower reflective surface 842, a focal area 843, and a centrally located reflective area 844. The faceted lower surface 842 includes active facets 845 and inactive non-facets 846 that lie parallel to the flow line of the transmitted bundle. The hemisphere is placed on a flat mirror and so it is like a spherical emitter as seen from the upper hemisphere. This is a simplification of the behavior of a LED die on a flat mirror cup.

For this design, the size of the facets is considered infinitesimal with flat profiles; that is, the facets are very small and are not shown to scale. Finite-size facets perform as infinitesimal ones if their size is small compared with the curvature radius of the edge-ray wavefronts at their incidence on the facet.

TABLE VIII-A $RF_mI$ hemispherical emitter with emission ±90°

| | |
|---|---|
| Aperture radius | 85.95 |
| Front mirror radius | 1.63 |
| Emitting sphere radius | 1 |
| Half angle of emission outside the RXI | ±1.60 degrees |
| Half angle of emission of the emitting sphere | ±90 degrees |
| z coordinate of the of emitting sphere center | 0.50675 |
| Refractive index | 1.5 |

At with the $RF_mI$ device shown in FIG. 83, the optical surfaces 841 and 842 are defined by three polynomials. A first polynomial with coefficients $A_j$ describes the smooth upper surface 841, a second polynomial with coefficients $B_j$ describes the active facets 845 of the multi-faceted lower surface by their tilting angles $\theta(\rho)$ (with respect to horizontal), and a third polynomial with coefficients $C_j$ describes the active non-facets 846, (parallel to the flow line of the transmitted bundle) of the multi-faceted lower surface by their tilting angles $\phi(\rho)$ (with respect to horizontal).

TABLE VIII-B

Optical Surfaces Specification:
$RF_mI$ hemispherical emitter with emission ±90°

| j | Ai | Bj | Cj |
|---|---|---|---|
| 0 | 5.23667552015562 E+00 | 6.55489434552105 E−01 | 9.05440890141957 E+01 |
| 1 | 3.43562878839034 E−01 | 7.50251857375459 E+00 | −1.02007353132776 E+01 |
| 2 | 3.73824601619008 E−02 | −9.17457265219434 E−01 | 6.57736326536749 E−01 |
| 3 | −7.84893693352474 E−03 | 7.31322638360656 E−02 | −2.27830938500542 E−02 |
| 4 | 6.34013012301826 E−04 | −3.73498757084559 E−03 | 2.08997557247374 E−04 |
| 5 | −2.86225106777155 E−05 | 1.24328232707361 E−04 | 2.20073589826065 E−05 |
| 6 | 7.62151057937280 E−07 | −2.79599160694399 E−06 | −1.32673849423888 E−06 |
| 7 | −1.13473683832103 E−08 | 4.36820499242222 E−08 | 3.48546213546670 E−08 |
| 8 | 6.14238761220319 E−11 | −4.56244987785256 E−10 | −3.83780530207412 E−10 |
| 9 | 8.74067694338597 E−13 | 3.01224889424105 E−12 | −3.58785516605123 E−13 |
| 10 | −2.16480485290932 E−14 | −4.02482896009282 E−14 | −3.08278955167680 E−16 |
| 11 | 2.09853000255442 E−16 | 1.06922140281279 E−15 | 1.23604279428397 E−15 |
| 12 | −3.59472769286498 E−19 | −9.80975588379069 E−18 | −1.07903808486466 E−17 |
| 13 | −1.63388321285361 E−20 | −3.64349056365712 E−20 | −1.41398386055209 E−19 |
| 14 | 1.48141226798295 E−22 | −2.92242310548115 E−22 | 8.30971207823153 E−22 |
| 15 | −6.64561053914485 E−25 | 2.75878043276243 E−23 | 2.80733930978391 E−23 |
| 16 | 1.92059022703100 E−26 | −1.86939259726139 E−25 | −2.01741351744027 E−25 |
| 17 | −2.42733580870510 E−28 | 8.32146359365264 E−29 | −1.06633557211856 E−27 |
| 18 | −1.18522885999708 E−31 | −2.18757045876568 E−29 | 1.60065626678311 E−30 |
| 19 | 4.20509075396579 E−32 | 3.40577824417196 E−31 | 1.34836150488679 E−31 |
| 20 | −8.18043584864804 E−34 | −1.31688825016267 E−33 | −6.20786017572056 E−34 |
| 21 | 6.12176800940097 E−36 | | |
| 22 | 3.03381217351892 E−38 | | |
| 23 | −6.73965453109022 E−40 | | |
| 24 | 3.63755982286662 E−42 | | |
| 25 | −3.03460092457332 E−44 | | |
| 26 | 2.50537230158944 E−46 | | |
| 27 | 3.60070275844834 E−49 | | |
| 28 | −5.32396371159950 E−50 | | |
| 29 | −7.15157083743229 E−53 | | |
| 30 | 1.28944131166866 E−53 | | |
| 31 | 2.39780521754873 E−56 | | |
| 32 | −1.56248861249958 E−57 | | |
| 33 | 2.75161195032406 E−61 | | |
| 34 | 1.56149138774063 E−61 | | |
| 35 | −1.61971834220454 E−63 | | |
| 36 | 7.43336743111749 E−66 | | |
| 37 | −3.28175967176119 E−67 | | |
| 38 | 5.81892580115176 E−69 | | |
| 39 | −2.73518498170671 E−71 | | |
| 40 | 2.71027679549101 E−75 | | |

Figure 87:
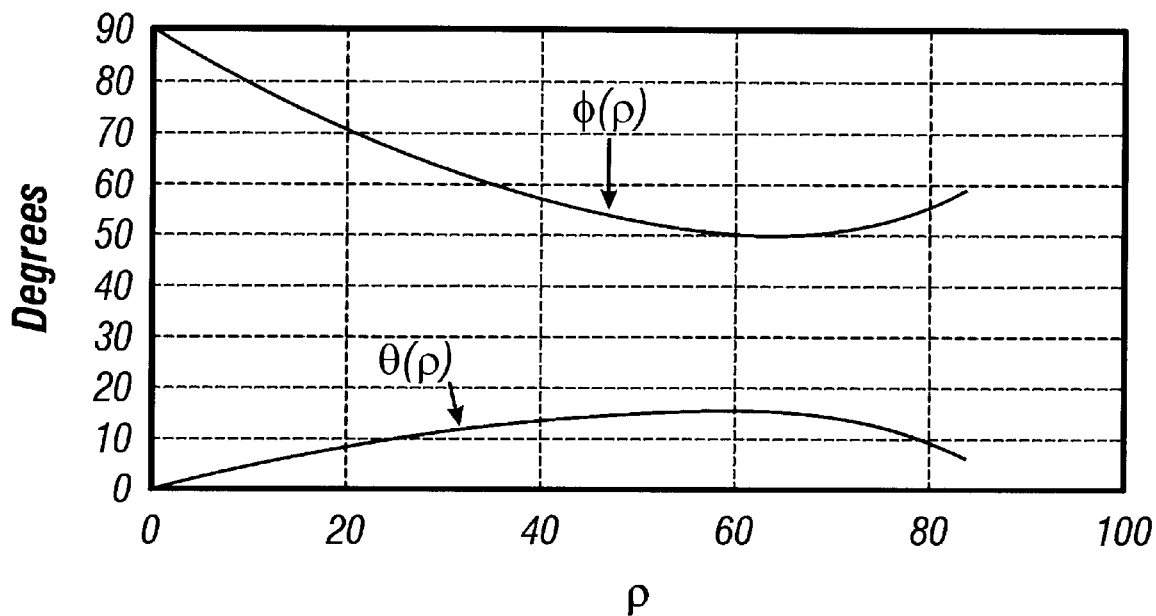
FIG. 87 is a graphical depiction showing both functions $\theta(\rho)$ and $\phi(\rho)$ as calculated for the $RF_mI$ device of FIG. 84.

FIG. 87 is a graphical depiction showing both functions $\theta(\rho)$ and $\phi(\rho)$ as calculated for the $RF_mI$ device of FIG. 84.

Figure 88:
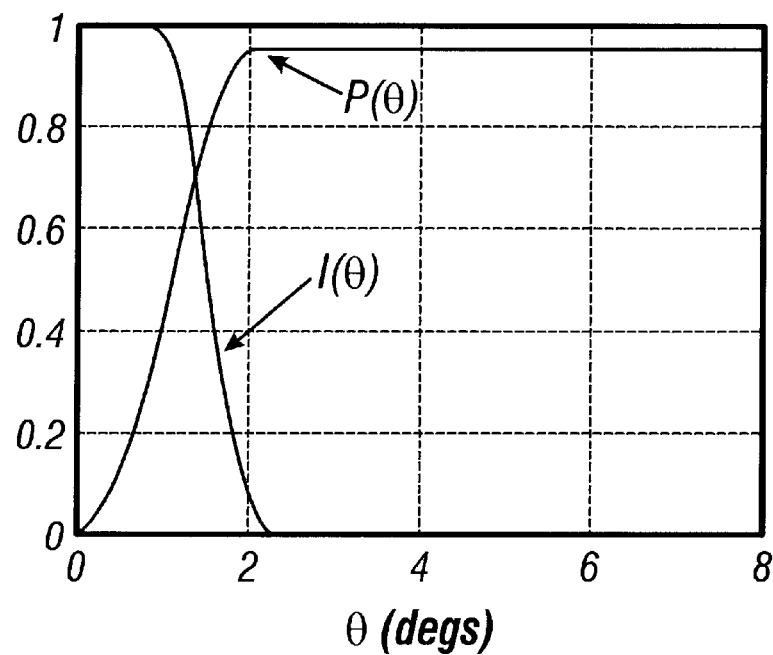
FIG. 88 is a graphical depiction of the angle emission curve $I(\theta)$ and the integrated power for the $RF_mI$ device of FIG. 84.

FIG. 88 is a graphical depiction of the angle emission curve $I(\theta)$ and the integrated power for the $RF_mI$ device of FIG. 84. The integrated power is $$P(\theta) = \int_{\delta=0}^{\delta=\theta} I(\delta) 2\pi \sin\delta \, d\delta.$$

Figure 89:
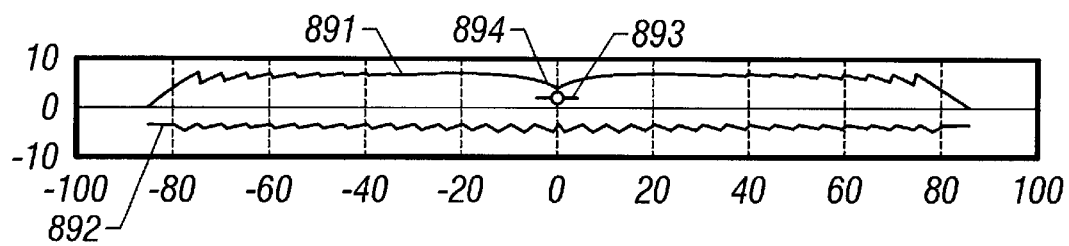
FIG. 89 is a 2D diagram of the optical surfaces of an $RF_mF_i$ device designed to provide a spherical emitter with emission restricted to ±90°.

FIG. 89 is a 2D diagram of the optical surfaces of an $RF_mF_I$ device designed to provide a spherical emitter with emission restricted to ±90 degrees. The $RF_mF_1$ device of FIG. 89 includes a faceted upper refractive surface 891 that also functions as a TIR surface, a faceted lower reflective surface 892, a focal area 893, and a centrally located reflective area 894. The faceted lower surface 892 includes active facets 895 and inactive non-facets 896 that lie parallel to the flow line of the transmitted bundle. Its characteristics are shown in Table IX.

For the design, the facet size is considered infinitesimal with flat profiles; that is, the facets are very small and not shown to scale in the figure. Finite-size facets perform as infinitesimal ones if the size is small compared with the curvature radius of the edge-ray wavefronts at their incidence on the facets.

TABLE IX

| $RF_mF_1$ spherical emitter with emission restricted to ±90 degrees | |
|---|---|
| Aperture radius | 85.95 |
| Front mirror radius | 0.694 |
| Emitting sphere radius | 1 |
| Half angle of emission outside the RXI | ±1.50 degrees |
| Half angle of emission of the emitting sphere | ±90 degrees |
| z coordinate of the of emitting sphere center | 2.027 |
| Aspect ratio (depth/aperture diameter) | 0.062 |
| Refractive index | 1.5 |

Figure 90:
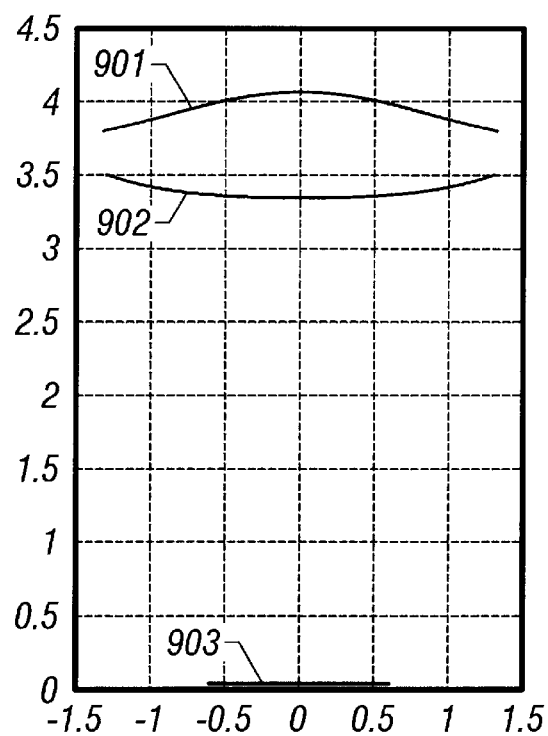
FIG. 90 is a 2D diagram of the optical surfaces of an RR device designed to provide a flat receiver with reception restricted to ±20°.

FIG. 90 is a 2D diagram of the optical surfaces of an RR device designed to provide a flat receiver with reception restricted to ±20 degrees. The RR device of FIG. 90 includes an upper refractive surface 901, a lower refractive surface 902, and a focal area 903. Its characteristics are shown in Table X.

TABLE X

| RR flat receiver with reception restricted to ±20 degrees | |
|---|---|
| Aperture radius | 1.321 |
| Lens thickness | 0.727 |
| Lens height | 4.068 |
| Receiver radius | 1 |
| Half acceptance angle of the RR | ±15 degrees |
| Half angle of reception of the flat receiver | ±20 degrees |
| Refractive index | 1.5 |

Figure 91:
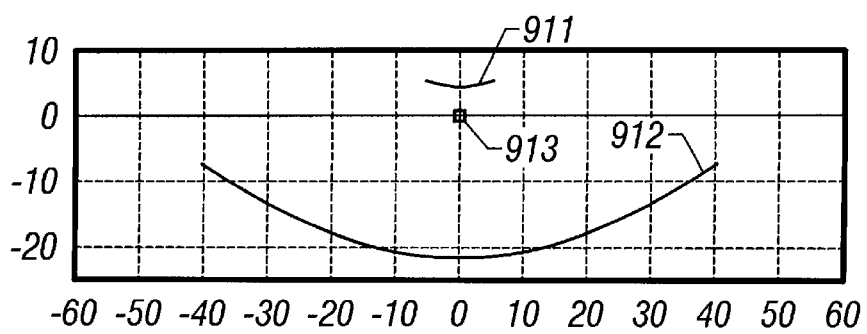
FIG. 91 is a 2D diagram of the optical surfaces of an XX device designed to provide a flat receiver with reception restricted to ±45°.

FIG. 91 is a 2D diagram of the optical surfaces of an XX device designed to provide a flat receiver with reception restricted to ±45 degrees. The XX device of FIG. 91 includes an upper reflective surface 911, a lower reflective surface 912, and a focal area 913. Its characteristics are shown in Table X.

TABLE X

| XX flat receiver with reception restricted to ±45 degrees | |
|---|---|
| Aperture radius | 40.52 |
| Secondary radius | 5.73 |
| Aspect ratio | 0.334 |
| Receiver radius | 1 |
| Half acceptance angle of the RR | ±1 degree |
| Half angle of reception of the flat receiver | ±45 degrees |
| Refractive index | |

Figure 92:
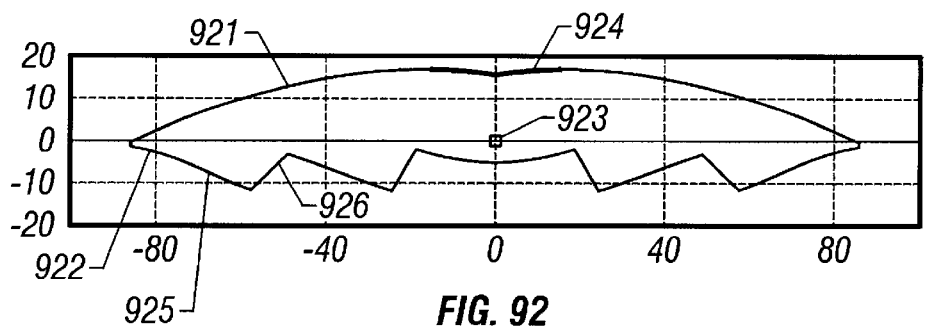
FIG. 92 is a 2D diagram of the optical surfaces of an $RF_mI$ device designed to provide an emitting cube with emission restricted to ±90°.

FIG. 92 is a 2D diagram of the optical surfaces of an $RF_mI$ device designed to provide an emitting cube with emission restricted to ±90 degrees. The $RF_mI$ device of FIG. 92 includes a smooth upper refractive surface 921 that also functions as a TIR surface, a faceted lower reflective surface 922, a focal area 923, and a centrally located reflective area 924. The faceted lower surface 922 includes active facets 925 and inactive non-facets 926. Its characteristics are shown in Table XI.

TABLE XI

| $RF_mI$ emitting cube with emission restricted to ±90 degrees | |
|---|---|
| Aperture radius | 85.95 |
| Front mirror radius | 14.84 |
| Emitting cube side | 2 |
| Half angle of emission outside the RXI | ±1.75 degrees |
| Half angle of emission of the emitting sphere | ±90 degrees |
| z coordinate of the of emitting sphere center | 0.507 |
| Aspect ratio (depth/aperture diameter) | 0.163 |
| Refractive index | 1.5 |

Figure 93:
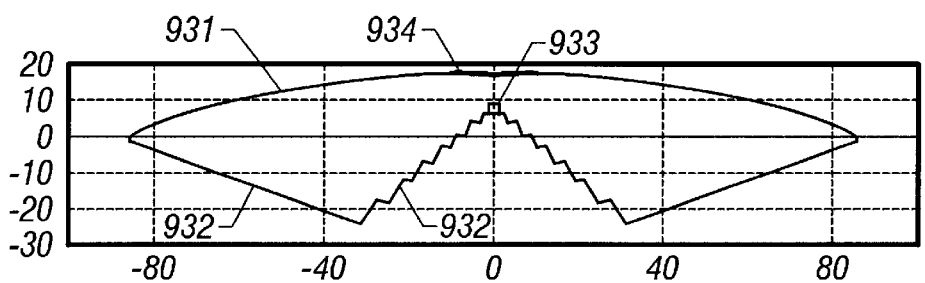
FIG. 93 is a 2D diagram of the optical surfaces of a stepped-2 $RF_mI$ designed to provide an emitting cube with emission restricted to ±90°.

FIG. 93 is a 2D diagram of the optical surfaces of a stepped-2 $RF_mI$ designed to provide an emitting cube with emission restricted to ±90 degrees. The $RF_mI$ device of FIG. 93 includes a smooth upper refractive surface 931 that also functions as a TIR surface, a faceted lower reflective surface 932, a focal area 933, and a centrally located reflective area 934. The faceted lower surface 932 includes active facets and inactive non-facets. Its characteristics are shown in Table XII.

TABLE XII

| $RF_mI$ emitting cube with emission restricted to ±90 degrees | |
|---|---|
| Aperture radius | 85.95 |
| Front mirror radius | 9.686 |
| Emitting cube side | 2 |

TABLE XII-continued

| $RF_mI$ emitting cube with emission restricted to ±90 degrees | |
|---|---|
| Half angle of emission outside the RXI | ±1.75 degrees |
| Half angle of emission of the emitting sphere | ±90 degrees |
| z coordinate of the of emitting sphere center | 7.339 |
| Aspect ratio (depth/aperture diameter) | 0.242 |
| Refractive index | 1.5 |

Figure 94:
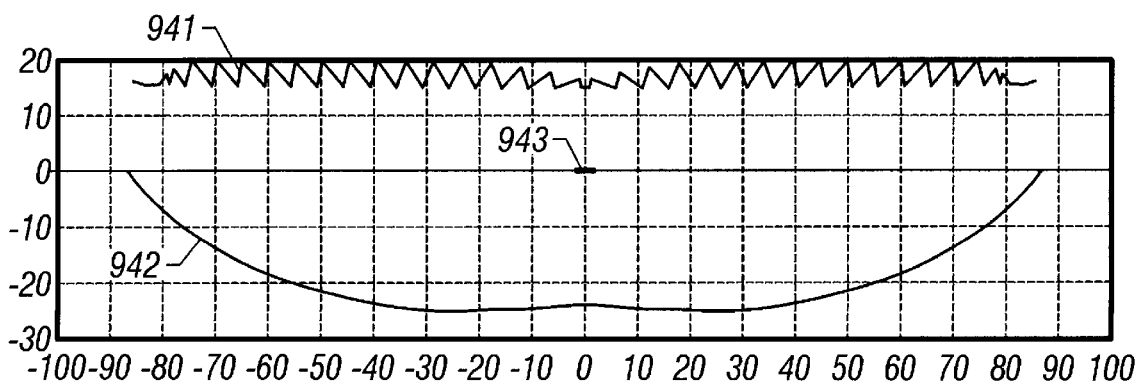
FIG. 94 is a 2D diagram of the optical surfaces of an $F_dX$ device designed to provide a flat emitter with an emission restricted to ±90°.

FIG. 94 is a 2D diagram of the optical surfaces of an $F_dX$ device designed to provide a flat emitter with an emission restricted to ±90 degrees. The $F_dX$ device of FIG. 94 includes a faceted upper refractive surface 941, a smooth lower reflective surface 942, and a focal area 943. Its characteristics are shown in Table XIII.

For the design, the facets size is considered infinitesimal with flat profiles; that is, the facets are very small and not shown to scale. Finite-size facets perform as infinitesimal ones if the size is small compared with the curvature radius of the edge-ray wavefronts at their incidence on the facet.

TABLE XIII

| $F_dX$ flat emitter with emission restricted to ±90 degrees | |
|---|---|
| Aperture radius | 85.95 |
| Emitting disk radius | 1 |
| Half angle of emission outside the device | ±1 degrees |
| Half angle of emission of the emitting disk | ±90 degrees |
| Aspect ratio (depth/aperture diameter) | 0.233 |
| Refractive index | 1.5 |

Figure 95:
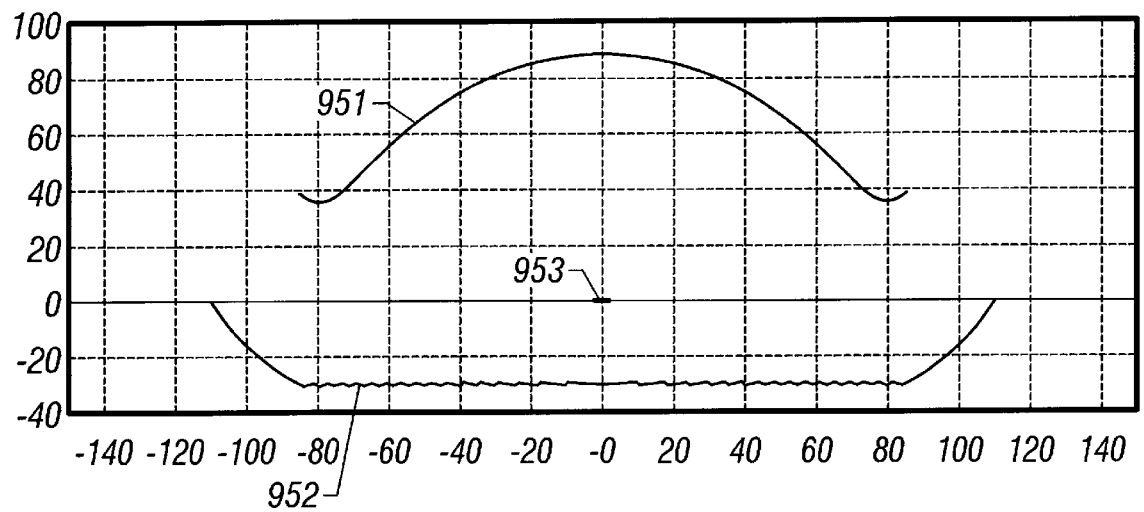
FIG. 95 is a 2D diagram of the optical surfaces of an $RF_m$ device designed to provide a flat emitter with emission restricted to ±90°.

FIG. 95 is a 2D diagram of the optical surfaces of an $RF_m$ device designed to provide a flat emitter with emission restricted to ±90 degrees. The $RF_m$ device of FIG. 95 includes a smooth upper refractive surface 951, a faceted lower reflective surface 952, and a focal area 953. Its characteristics are shown in Table XIV.

For the design, the size of the facets is considered infinitesimal with flat profile; that is, the facets are very small and not to scale. Finite-size facets perform as infinitesimal ones if the size is small compared with the curvature radius of the edge-ray wavefronts at their incidence on the facet.

TABLE XIV

| $F_dX$ flat emitter with emission restricted to ±90 degrees | |
|---|---|
| Aperture radius | 85.95 |
| Emitting disk radius | 1 |
| Half angle of emission outside the device | ±1 degrees |
| Half angle of emission of the emitting disk | ±90 degrees |
| Aspect ratio (depth/aperture diameter) | 0.70 |
| Refractive index | 1.5 |

Figure 96:
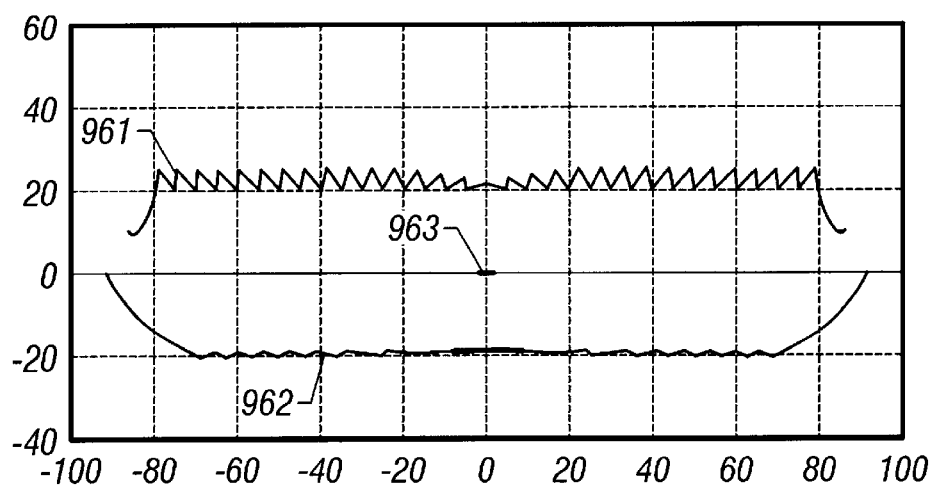
FIG. 96 is a 2D diagram of the optical surfaces of an $F_dF_m$ device designed for a flat emitter with emission restricted to ±90°.

FIG. 96 is a 2D diagram of the optical surfaces of an $F_dF_m$ device designed for a flat emitter with emission restricted to ±90 degrees. The $F_dF_m$ device of FIG. 96 includes a faceted upper refractive surface 961, a faceted lower reflective surface 962, and a focal area 963. Its characteristics are shown in Table XV.

For the design, the size of the facets is considered infinitesimal with flat profiles; that is, the facets are very small and not to scale. Finite-size facets perform as infinitesimal ones if the size is small compared with the curvature radius of the edge-ray wavefronts at their incidence on the facet.

TABLE XV $F_dF_m$ flat emitter with emission restricted to ±90 degrees

| | |
|---|---|
| Aperture radius | 85.95 |
| Emitting disk radius | 1 |
| Half angle of emission outside the device | ±1 degrees |
| Half angle of emission of the emitting disk | ±90 degrees |
| Aspect ratio (depth/aperture diameter) | 0.239 |
| Refractive index | 1.5 |

Alternative Embodiments

It will be appreciated by those skilled in the art, in view of these teachings, that alternative embodiments may be implemented without deviating from the spirit or scope of the invention. This invention is to be limited only by the following claims, which include all such embodiments and modifications when viewed in conjunction with the above specification and accompanying drawings.

What is claimed is:

1. A method of manufacturing an optical device having two opposing active optical surfaces that convert a first distribution of an input radiation to a second distribution of output radiation, comprising:

providing a two-dimensional mathematical model that describes the first distribution of radiation as an input bundle of edge rays and the second distribution of radiation as an output bundle of edge rays, and representing the input and output edge ray bundles each in a phase-space representation in terms of the position of each ray in space and its associated optical cosine, where the locus of the edge rays in the phase-space for the input bundle defines a closed boundary of a first planar shape, and the locus of the edge rays in the phase-space for the output bundle defines a closed boundary of a second planar shape, wherein these two planar shapes have a substantially equal area;

approximating the two-dimensional shape of the outer caustic of said input and output radiation distribution ray bundles, where the outer caustic is defined such that it does not touch any of said active optical surfaces;

defining a two-dimensional representation of said active optical surfaces responsive to the boundary conditions of the phase-space representations and the outer caustics, including defining a focal area spaced apart from, and noncontiguous with, said optical surfaces, said active optical surfaces each having a continuous second derivative, said optical surfaces further formed so that the theoretical transmission efficiency of the said first input radiation distribution to said second input radiation distribution, neglecting attenuation losses in the processing path, is greater than about 80% of the maximum transmission efficiency; and symmetrically extending said two-dimensional representation of said optical surfaces to provide a three-dimensional optical device.

2. The method of claim 1 wherein one of said active optical surfaces is substantially flat.

3. The method of claim 1 further comprising forming said optical surfaces on a transparent dielectric core.

4. The method of claim 1 further comprising situating a receiver approximately at the focal area, thereby providing a concentrator.

5. The method of claim 1 wherein said theoretical transmission efficiency of the said first input radiation distribution to said second input radiation distribution, neglecting attenuation losses in the processing path, is greater than about 90% of the maximum transmission efficiency.

6. The method of claim 1 further comprising forming a diffuser on at least one of said optical surfaces.

7. The method of claim 6 wherein said diffuser transforms incident radiation into a predetermined shape.

8. The method of claim 1 wherein said step of symmetrically extending said two-dimensional representation includes extruding said two-dimensional representation to provide a linearly-symmetric optical device.

9. The method of claim 8 further comprising situating an extended linearly extruded light source approximately at the focal area, thereby providing a collimator with an approximately rectangular cross-sectional output.

10. The method of claim 1 wherein said optical surfaces are formed to define an RR device.

11. The method of claim 1 further comprising forming said optical surfaces to form a folded edge ray device.

12. The method of claim 11 wherein said optical surfaces are formed to define an RX device.

13. The method of claim 11 wherein said optical surfaces are formed to define an RXI device.

14. The method of claim 11 wherein said optical surfaces are formed to define an XX device.

15. The method of claim 11 wherein said optical surfaces are formed to define an XR device.

16. The method of claim 1 wherein said step of symmetrically extending said two-dimensional representation includes rotating said two-dimensional representation so that said optical device is rotationally symmetric about a central axis.

17. The method of claim 16 further comprising forming said optical surfaces on a transparent dielectric core, and forming a cylindrical hole substantially centered about said central axis.

18. The method of claim 17 further comprising the step of inserting a receiver into said cylindrical hole and positioning said receiver approximately at said focal area.

19. The method of claim 18 further comprising the step of attaching said receiver to said dielectric core using a material that has a substantially different index of refraction than said dielectric core.

20. The method of claim 17 further comprising the step of inserting an extended source into said cylindrical hole and positioning said source approximately at said focal area.

21. The method of claim 20 further comprising the step of attaching said source to said dielectric core using a material that has a substantially different index of refraction than said dielectric core.

22. The method of claim 1 wherein at least one of said optical surfaces is formed to comprise facets including an active facet and an inactive facet.

23. The method of claim 22 wherein the optical surfaces are formed to define an aspect ratio that is within a range of about 0.65 to about 0.1.

24. The method of claim 22 wherein one of said active optical surfaces comprises a cuspoid shape that approaches said focal area.

25. The method of claim 1 further comprising situating an extended light source approximately at the focal area, thereby providing a collimator.

26. The method of claim 25 wherein said optical surfaces are formed so that the average angle of the output distribution of radiation is less than about ±15° from normal incidence.

27. The method of claim 25 comprising situating an LED light source approximately at said focal area.

28. The method of claim 25 comprising situating an array of LED light sources approximately at said focal area.

29. An optical device that converts a first distribution of an input radiation to a second distribution of output radiation, comprising:

two opposing active non-spherical optical surfaces defined by a two-dimensional representation that is symmetrically extended to provide a three-dimensional device;

a focal area defined by said two opposing active optical surfaces, said said active optical surfaces each having a continuous second derivative;

said optical surfaces being defined by a polynomial with an order of at least about twenty; and said optical surfaces further providing a theoretical transmission efficiency of said first input radiation distribution to said second input radiation distribution, neglecting attenuation losses in the processing path, of greater than about 80% of the maximum transmission efficiency.

30. The optical device of claim 29 wherein said optical device is rotationally-symmetric.

31. The optical device of claim 29 further comprising a transparent dielectric core, and wherein said optical surfaces are formed on said optical core.

32. The optical device of claim 29 further a receiver situated approximately at the focal area, thereby providing a concentrator.

33. The optical device of claim 29 wherein said theoretical transmission efficiency of said first input radiation distribution to said second input radiation distribution, neglecting attenuation losses in the processing path, is greater than about 90% of the maximum transmission efficiency.

34. The optical device of claim 29 wherein one of said optical surfaces is substantially flat.

35. The optical device of claim 29 wherein said optical device is linearly-symmetric, so that said focal area comprises a linear shape.

36. The optical device of claim 29 further comprising a linear extended light source that extends along said focal area, thereby providing a collimator with an approximately rectangular cross-sectional output.

37. The optical device of claim 29 wherein said optical surfaces define an RR device.

38. The optical device of claim 29 wherein said optical surfaces define a folded edge ray device.

39. The optical device of claim 38 wherein said optical surfaces define an RX device.

40. The optical device of claim 38 wherein said optical surfaces define an RXI device.

41. The optical device of claim 38 wherein said optical surfaces define an XX device.

42. The optical device of claim 38 wherein said optical surfaces define an XR device.

43. The optical device of claim 29 wherein at least one of said optical surfaces comprises facets including an active facet and an inactive facet.

44. The optical device of claim 43 wherein the optical surfaces define an aspect ratio within a range of about 0.65 to about 0.1.

45. The optical device of claim 43 wherein one of said active surfaces comprises a cuspoid shape that approaches said focal area.

46. The optical device of claim 29 wherein at least one of said optical surfaces comprises a diffuser formed thereon.

47. The optical device of claim 46 wherein said diffuser transforms incident radiation into a predetermined shape.

48. The optical device of claim 29 further comprising a light source situated approximately at the focal area, thereby providing a collimator.

49. The optical device of claim 48 wherein said optical surfaces define an average angle of the output distribution of radiation that is less than about ±15° from normal incidence.

50. The optical device of claim 48 wherein said light source comprises an LED.

51. The optical device of claim 48 wherein said light source comprises an array of LEDs.

52. The optical device of claim 29 wherein said optical device comprises a transparent dielectric core and said optical device is rotationally symmetric so that said optical device is rotationally symmetric around a central axis.

53. The optical device of claim 52 wherein said optical device further comprises:

a cylindrical hole centered about said central axis; and a receiver positioned in said cylindrical hole approximately at said focal area.

54. The optical device of claim 53 further comprising an attaching material for attaching said receiver to said dielectric, and wherein said attaching material has a substantially different index of refraction than said dielectric.

55. The optical device of claim 52 wherein said optical device further comprises:

a cylindrical hole centered about said central axis; and an extended light source positioned in said cylindrical hole approximately at said focal area.

56. The optical device of claim 55 further comprising an attaching material for attaching said light source to said dielectric, and wherein said attaching material has a substantially different index of refraction than said dielectric.

* * * * *